(12) United States Patent
Shimano et al.

(10) Patent No.: US 8,274,808 B2
(45) Date of Patent: Sep. 25, 2012

(54) SEMICONDUCTOR SIGNAL PROCESSING APPARATUS

(75) Inventors: Hiroki Shimano, Kanagawa (JP); Kazutami Arimoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 193 days.

(21) Appl. No.: 12/900,915

(22) Filed: Oct. 8, 2010

(65) Prior Publication Data

US 2011/0085364 A1   Apr. 14, 2011

(30) Foreign Application Priority Data

Oct. 8, 2009   (JP) .................................. 2009-234376

(51) Int. Cl.
*G11C 15/00* (2006.01)
(52) U.S. Cl. ............ 365/49.17; 365/189.07; 365/189.15
(58) Field of Classification Search ................ 365/49.17, 365/189.07, 189.15
See application file for complete search history.

(56) References Cited

U.S. PATENT DOCUMENTS

| 5,034,919 | A | 7/1991 | Sasai et al. | |
|---|---|---|---|---|
| 6,081,442 | A | 6/2000 | Igarashi et al. | |
| 6,912,150 | B2 * | 6/2005 | Portman et al. | 365/149 |
| 2002/0101754 | A1 * | 8/2002 | Hidaka et al. | 365/51 |
| 2003/0206472 | A1 * | 11/2003 | Hidaka et al. | 365/205 |
| 2005/0162931 | A1 * | 7/2005 | Portmann et al. | 365/189.01 |
| 2007/0097729 | A1 * | 5/2007 | Otsuka | 365/154 |
| 2009/0273980 | A1 * | 11/2009 | Doyle | 365/185.17 |

FOREIGN PATENT DOCUMENTS

| JP | 02-308499 | 12/1990 |
|---|---|---|
| JP | 09-161488 | 6/1997 |
| JP | 11-273363 | 10/1999 |

OTHER PUBLICATIONS

Yu, F., et al., "Gigabit Rate Packet Pattern-Matching Using TCAM", Proceedings of the 12th IEEE International Conference on Network Protocols (ICNP'04) Digest of Technical Papers, 2004, pp. 174-183, IEEE Computer Society.

Dharmapurikar, S., et al., "Fast and Scalable Pattern Matching for Network Intrusion Detection Systems", IEEE Journal on Selected Areas in Communications, Oct. 2006, pp. 1781-1792, vol. 24 No. 10, IEEE.

* cited by examiner

*Primary Examiner* — Tuan T. Nguyen
(74) *Attorney, Agent, or Firm* — McDermott Will & Emery LLP

(57) ABSTRACT

A pair of operator cells each having a series-coupled circuit of first and second transistors is used as a storage unit. To-be-retrieved data and retrieval data are respectively stored in the first and second transistors, and mutually complementary data items are stored in the operator cells of the storage unit. The operator cells supply currents according to the result of an AND operation between the stored data items to corresponding bit lines, and the read data from the storage unit corresponds to the result of an EXOR operation between the retrieval data and the to-be-retrieved data. The currents flowing in the corresponding bit lines are amplified with sense amplifier circuits to drive local match lines. In the individual sub-blocks of an operator cell array, data items having different pattern lengths can be stored. The potentials of the local match lines are selected according to the data pattern lengths, and match retrieval is performed for the data items having the different pattern lengths.

14 Claims, 64 Drawing Sheets

| SNA WRITE DATA | SNB WRITE DATA | NQA THRESHOLD VOLTAGE | NQB THRESHOLD VOLTAGE | ICEL |
|---|---|---|---|---|
| "0" | "0" | HIGH | HIGH | SMALL |
| "1" | "0" | LOW | HIGH | SMALL |
| "0" | "1" | HIGH | LOW | SMALL |
| "1" | "1" | LOW | LOW | LARGE |

: STATE IN UOE

: SUT

| A | B | SNAL (A) | SNAL (/B) | ICELL | SNAR (/A) | SNBR (B) | ICELR |
|---|---|---|---|---|---|---|---|
| "0" | "0" | "0" | "1" | SMALL | "1" | "0" | SMALL |
| "1" | "0" | "1" | "1" | LARGE | "0" | "0" | SMALL |
| "0" | "1" | "0" | "0" | SMALL | "1" | "1" | LARGE |
| "1" | "1" | "1" | "0" | SMALL | "0" | "0" | SMALL |

: A = B → ICELL = ICELR = "SMALL"

GROUP LOCAL MATCH LINES ML ACCORDING TO PATTERN LENGTHS, AND DETERMINE MATCH/MISMATCH

: SUT

| A | B | SNAL (A) | SNAL (/B) | ICELL | SNAR (/A) | SNBR (B) | ICELR | ISAL | ISAR |
|---|---|---|---|---|---|---|---|---|---|
| "0" | "0" | "0" | "1" | SMALL | "1" | "0" | SMALL | 0 | 0 |
| "1" | "0" | "1" | "1" | LARGE | "0" | "0" | SMALL | LARGE | 0 |
| "0" | "1" | "0" | "0" | SMALL | "1" | "1" | LARGE | 0 | LARGE |
| "1" | "1" | "1" | "0" | SMALL | "0" | "0" | SMALL | 0 | 0 |

: A = B → ISAL = ISAR = "SMALL"

FIG. 38

DPSG

| ENTRY | MAPPING FLAG BITS | MAPPING PATTERN |
|---|---|---|
| ERYa | 0, 0, 0, 0, 0, 0 | |
| ERYb | 0, 0, 0, 0, 0, 0 | "1" IS WRITTEN TO SNR AND SNL |
| ERYc | 0, 0, 0, 0, 0, 0 | |

MFLG

SNA"1"
SNB"0"

FIG. 39

DPSG

| ENTRY | MAPPING FLAG BITS | MAPPING PATTERN |
|---|---|---|
| ERYa | 1, 0, 0, 0, 0, 0 | PATTERN PAT#1 |
| ERYb | 0, 0, 0, 0, 0, 0 | |
| ERYc | 0, 0, 0, 0, 0, 0 | |

MFLG

MFLG

| ENTRY | MAPPING FLAG BITS |
|---|---|
| ERYa | 1, 0, 0, 0, 0, 0 |
| ERYb | 0, 1, 0, 0, 0, 0 |
| ERYc | 0, 0, 0, 0, 0, 0 |

DPSG

MAPPING PATTERN
PATTERN PAT#1
PATTERN PAT#2

MFLG

| ENTRY | MAPPING FLAG BITS |
|---|---|
| ERYa | 1, 0, 0, 0, 0, 0 |
| ERYb | 0, 1, 0, 0, 0, 0 |
| ERYc | 0, 1, 0, 0, 0, 0 |

DPSG

MAPPING PATTERN
PATTERN PAT#1
PATTERN PAT#2
PATTERN PAT#3

DPSG

| ENTRY | MAPPING FLAG BITS | MAPPING PATTERN |
|---|---|---|
| ERYa | 1, 0, 0, 0, 0, 0 | PATTERN PAT#1 |
| ERYb | 0, 1, 1, 0, 0, 0 | PATTERN PAT#2 / PATTERN PAT#4 (RG2: L/4) |
| ERYc | 0, 1, 0, 0, 0, 0 | PATTERN PAT#3 |

MFLG

FIG. 43

DPSG

| ENTRY | MAPPING FLAG BITS | MAPPING PATTERN |
|---|---|---|
| ERYa | 1, 0, 0, 0, 0, 0 | PATTERN PAT#1 |
| ERYb | 0, 1, 1, 1, 0, 0 | PATTERN PAT#2 / PATTERN PAT#4 / PAT#5 (RG3: L/8) |
| ERYc | 0, 1, 0, 0, 0, 0 | PATTERN PAT#3 |

MFLG

| MODE | LSELBj <1> | LSELBj <0> | MULTIPLEXER 154 | MULTIPLEXER 102b | MULTIPLEXER 102d |
|---|---|---|---|---|---|
| RETRIEVAL | 0 | 0 | I1 | I4 | I7 |
| EXTERNAL WRITE | 0 | 1 | I2 | I5 | I8 |
| NON-SELECTION (REWRITE) | 1 | 0 | I1 | I3 | I6 |
|  | 1 | 1 | × | × | × |

↓
LSELBj TO DATA PATH BLOCK FOR FLAG BIT

FIG. 82
492
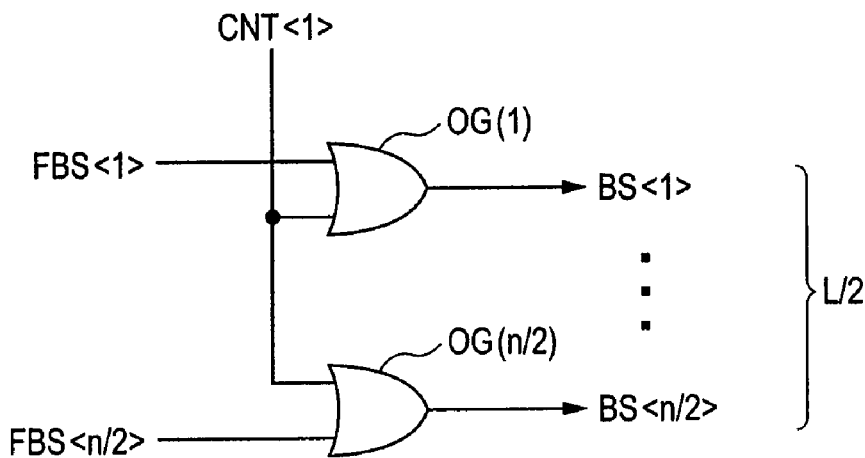
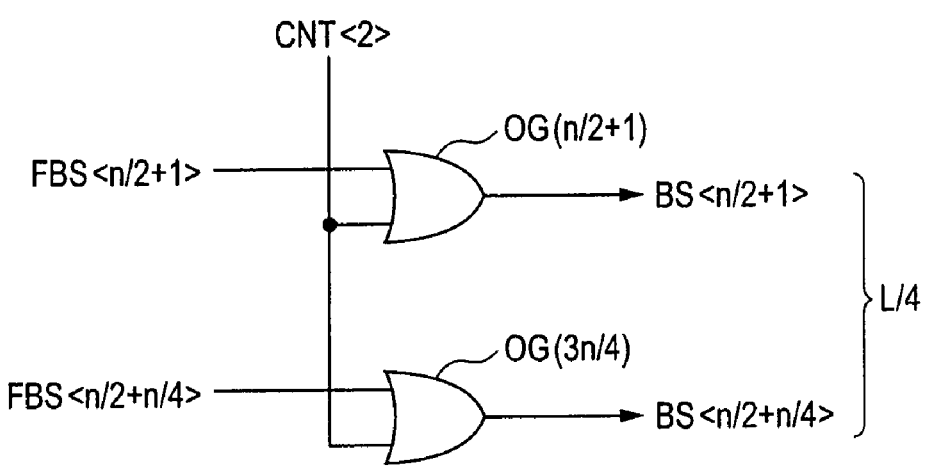
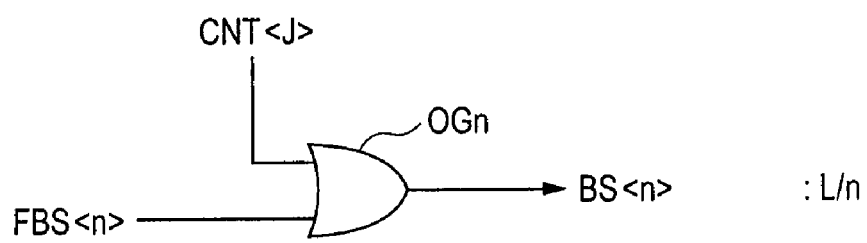

SEMICONDUCTOR SIGNAL PROCESSING APPARATUS

CROSS-REFERENCE TO RELATED APPLICATIONS

The disclosure of Japanese Patent Application No. 2009-234376 filed on Oct. 8, 2009 including the specification, drawings and abstract is incorporated herein by reference in its entirety.

BACKGROUND OF THE INVENTION

The present invention relates to a semiconductor signal processing apparatus, and particularly to a semiconductor signal processing apparatus having the function of executing an arithmetic operation using a semiconductor memory in the inside thereof. More particularly, the present invention relates to a semiconductor signal processing apparatus which detects a match/mismatch between an input data pattern and a registered data pattern.

In data communication via a communication network, data aiming at an unauthorized access is communicated oftentimes. To prevent such an unauthorized access, various security measures are taken in various places such as a network site or a router. As one of such security measures, there is a system called Network Intrusion Detection System (NIDS). The NIDS monitors a data packet flowing over a network, and senses an attack to a processing system (such as a server or a personal computer) such as malicious intrusion or a computer virus. Information on this sensed attack is stored in a log, and an alarm is issued to play a role in maintaining the security of the system.

As a core component of such a NIDS, a character-string pattern retrieving device exists which senses an attack packet (data pattern) in a payload transferred via a network. An example of such a pattern retrieving device is shown in Non-Patent Document 1 (F. Yu, R. H. Katz, T. V. Lakshman, "Gigabit Rate Packet Pattern-Matching Using TCAM," 12th IEEE ICNP' 04 Digest of Technical Papers, pp. 174-pp. 183, 2004). The sensing of this attack packet is performed using a pattern matching method. In Non-Patent Document 1, pattern detection is performed using a ternary content addressable memory or ternary CAM (TCAM). The TCAM is obtained by extending the function of a content addressable memory (CAM) such that retrieval data is given as an input, and a memory address holding the same content as that of the retrieval data is outputted. The TCAM not only allows match/mismatch determination for "1" and "0" bits to be made, but also allows ternary determination to be made which tolerates a "don't care" state in which, whether a bit of interest is either "1" or "0", a data bit match is assumed.

The pattern retrieval shown in Non-Patent Document 1 is executed as follows. That is, patterns to be retrieved (registered patterns) are stored in advance in individual entries in the TCAM according to a predetermined priority scheme. A first w-byte pattern of an inputted string (character string) is compared in parallel with the patterns to be retrieved that are mapped to the individual entries in the TCAM. If there is a matching entry, the corresponding address (index) is reported. When the retrieval to each of the entries is completed, the input string is shifted by 1 byte, and a retrieving operation for the next w-byte pattern is executed. The retrieving operation is repeated. Using the address (record) of the matching entry, a table is referenced, and a matched data pattern is identified.

In general, as described in Non-Patent Document 1 and also in Non-Patent Document 2 (S. Dharmarpuricar et. al., "Fast and Scalable Pattern Matching for Network Intrusion Detection System," IEEE, Journal on Selected Areas in Communications, Vol. 24, No. 10, October 2006, pp. 1781-1792), the length of a string retrieval pattern used in the NIDS or the like is distributed in a range of ten to several thousands of bytes, and there are several hundreds of pattern lengths as candidates for the pattern length. The pattern length has a non-uniform distribution in which retrieval patterns of not more than 20 bytes account for about nearly 80% of all the retrieval patterns (see FIG. 4 of Non-Patent Document 2).

In Non-Patent Document 1, when the length of a to-be-retrieved pattern to be mapped is shorter than a TCAM width determined by the length of a match line (bit width of an entry), information of the "don't care" state is mapped to make the pattern length equal to the TCAM width. In this manner, a variable-length string pattern required in the NIDS is mapped to each of the entries, and retrieval is executed.

Non-Patent-Document 2 discloses a structure aiming at performing retrieval of data of an arbitrary pattern length. Specifically, in Non-Patent Document 2, retrieval is performed as a pre-process using a Bloom filter, and then match retrieval is performed using a hash table. The retrieval is performed by shifting an input data pattern by one byte at a time. As a retrieval algorithm, an algorithm in which pattern retrieval is performed in a tree-like configuration is used.

Also, a structure which performs data retrieval when the bit width of retrieval data is variable is shown in each of Patent Document 1 (Japanese Unexamined Patent Publication No. Hei 09 (1997)-161488), Patent Document 2 (Japanese Unexamined Patent Publication No. Hei 02 (1990)-308499), and Patent Document 3 (Japanese Unexamined Patent Publication No. Hei 11 (1999)-273363).

In the structure shown in Patent Document 1 (Japanese Unexamined Patent Publication No. Hei 09 (1997)-161488), a memory array is divided into a plurality of blocks, and comparators are disposed correspondingly to the individual blocks. Each of the blocks includes a plurality of entries, and the entries are selected in parallel in the plurality of blocks. The bit widths of the entries are fixed, but mask bits are provided among the bits mapped to the entries, thereby allowing the bit width of data to be retrieved to be changed, and changing the bit width of inputted retrieval data in response thereto. By contrast, in Non-Patent Document 1, when the length of a to-be-retrieved pattern to be mapped is shorter than a TCAM width determined by the length of a match line (bit width of an entry), information of the "don't care" state is mapped to make the pattern length equal to the TCAM width. In this manner, a variable-length string pattern required in the NIDS is mapped to each of the entries, and retrieval is executed. In each of the blocks, the retrieval is performed successively on a per-entry basis.

In the structure shown in Patent Document 2 (Japanese Unexamined Patent Publication No. Hei 02 (1990)-308499) also, a memory array is divided into a plurality of cell blocks, and the results of retrieval in the individual cell blocks are combined to produce a final retrieval result. In the structure shown in Patent Document 2, a configuration which allows the bit width of retrieval data to be changed is not shown. In Patent Document 2, only a binary CAM (BCAM) cell structure is shown as a memory cell structure.

In the structure shown in Patent Document 3 (Japanese Unexamined Patent Publication No. Hei 11 (1999)-273363), a plurality of CAM arrays are provided in descending order from top to bottom, and input data is divided and given according to the position of each of the CAM arrays. At the same addresses in the plurality of CAM arrays, data patterns related to the same pattern are stored. During retrieval, when a match is retrieved in a lower-order CAM array, retrieval is performed in a higher-order CAM array using the matching address in the lower-order CAM array and, when the matching address in the higher-order CAM array matches the matching address in the lower-order CAM array, it is determined that retrieval data matches a stored data pattern. When the matching address in the lower-order CAM array does not match the matching address in the higher-order CAM array, retrieval is performed in the lower-order CAM array using the matching address in the higher-order CAM array, and a match/mismatch is determined in the lower-order CAM array. Patent Document 3 described above intends to perform retrieval of a data pattern of an arbitrary bit width by providing the plurality of CAM arrays according to the lengths of retrieval data patterns.

PRIOR ART DOCUMENTS

Patent Documents

[Patent Document 1]
Japanese Unexamined Patent Publication No. Hei 09 (1997)-161488
[Patent Document 2]
Japanese Unexamined Patent Publication No. Hei 02 (1990)-308499
[Patent Document 3]
Japanese Unexamined Patent Publication No. Hei 11 (1999)-273363

Non-Patent Documents

[Non-Patent Document 1]
F. Yu, R. H. Katz, T. V. Lakshman, "Gigabit Rate Packet Pattern-Matching Using TCAM," 12th IEEE ICNP' 04 Digest of Technical Papers, pp. 174-pp. 183, 2004
[Non-Patent Document 2]
S. Dharmarpuricar et. al., "Fast and Scalable Pattern Matching for Network Intrusion Detection System," IEEE, Journal on Selected Areas in Communications, Vol. 24, No. 10, October 2006, pp. 1781-1792

SUMMARY OF THE INVENTION

In each of the structures shown in Non-Patent Documents 1 and 2 and Patent Documents 1 to 3, one to-be-retrieved data pattern (registered pattern) is mapped into one entry. The largest number of to-be-retrieved patterns that can be mapped into a CAM such as a TCAM is determined by the number of entries prepared in the CAM. Accordingly, to further increase the number of the mapped to-be-retrieved patterns (the number of registered patterns), it is necessary to increase the capacity of the CAM. In this case, a layout area and a consumed current increase. Instead of this, it can be considered to reduce the length of a matching line (bit width of an entry) at the cost of the lengths of the to-be-retrieved patterns, and accordingly increase the number of entries. However, in this case, a problem arises that mapping efficiency deteriorates for a string retrieval pattern having a non-uniform pattern length distribution, and accurate retrieval cannot be performed.

In particular, when unauthorized intrusion such as a virus or a worm is detected and the number of patterns to be retrieved is limited, an unauthorized access detection system with high reliability cannot be configured, and the security of the system cannot be guaranteed.

It is therefore an object of the present invention to provide a semiconductor signal processing apparatus which allows efficient mapping of to-be-retrieved patterns having a plurality of pattern lengths to be performed without increasing a memory capacity.

Another object of the present invention is to provide a semiconductor signal processing apparatus which allows efficient mapping of numerous to-be-retrieved patterns to be performed while inhibiting an increase in the number of entries, and also allows reliable match determination to be performed for a retrieval pattern.

In an embodiment, a semiconductor signal processing apparatus according to the present invention includes an operator cell array having a plurality of operator cells arranged in rows and columns, each having first and second SOI transistors coupled in series to each other, and supplying currents each showing a result of an arithmetic operation between data items stored in the first and second transistors. The operator cells are arranged such that the first and second cells disposed to be aligned in a row direction form a storage unit. The operator cell array includes a plurality of data entries capable of storing therein respective data patterns having different pattern lengths. In the first and second transistors of the storage unit, mutually complementary to-be-retrieved data is stored.

In the embodiment, the semiconductor signal processing apparatus further includes a plurality of bit lines disposed correspondingly to the individual columns of the operator cells to receive the respective currents supplied from the operator cells in the corresponding columns, a row select/drive circuit for writing, during a retrieving operation, retrieval data to the second transistors of a selected one of the data entries, and selecting the first and second transistors of the selected data entry to allow currents according to data items stored in the selected first and second transistors to flow to the corresponding bit lines, a plurality of sense amplifier circuits provided correspondingly to the individual bit lines to supply currents according to the respective currents on the corresponding bit lines, and current detection/match determination circuits each disposed according to a pattern length that can be stored in the selected data entry to determine a match/mismatch between data stored in the selected data entry and the retrieval data based on the currents supplied from the sense amplifier circuits for the corresponding data pattern length on a per pattern-length basis, and generate a signal showing a pattern match/mismatch between the data stored in the selected data entry and the retrieval data based on a result of the determination.

In another embodiment, the semiconductor signal processing apparatus according to the present invention includes a memory array having a plurality of memory cells which are arranged in rows and columns and in each of which first and second SOI transistors capable of storing therein information such that the stored information is accessible are coupled in series. The operator cells are arranged such that each pair of the operator cells storing therein complementary data forms a storage unit. The operator cell array is divided into a plurality of sub-blocks along a column direction.

The semiconductor signal processing apparatus in the another embodiment further includes first global write data lines disposed along the column direction commonly to the sub-blocks and correspondingly to the columns of the operator cells so as to transfer write data to the first transistors of the operator cells in the corresponding columns, write row select/drive circuits disposed correspondingly to the rows of the operator cells so as to select the first transistors of the operator cells in the corresponding rows, and write data transferred via the corresponding first global write data lines thereto, second global write data lines for transferring, along a row direction, complementary retrieval data commonly to the operator cell rows on a per sub-block basis, second write row select/drive circuits disposed correspondingly to the operator cell rows to write, during retrieval, data transferred via the second global write data lines to the second transistors in the corresponding memory cell rows, a plurality of bit lines disposed in the individual sub-blocks correspondingly to the operator cell columns, and coupled to the memory cells in the corresponding columns, local read row select/drive circuits for selecting, during the retrieval, the operator cells in parallel in the sub-blocks to read data items stored in the selected operator cells in parallel to the corresponding bit lines, sense amplifier circuits disposed correspondingly to the individual bit lines to read data stored in the operator cells in the corresponding columns according to potentials of the corresponding bit lines, global read data lines disposed commonly to the sub-blocks and correspondingly to the individual operator cell columns to receive data from the sense amplifier circuits in the corresponding columns, and match final determination circuits disposed correspondingly to the individual columns of the storage units of the operator cells and commonly to the sub-blocks to generate respective signals showing matches/mismatches according to data in the global read data lines in the corresponding columns. The operator cell array is further divided into a plurality of regions along the row direction, and retrieval data items having different pattern lengths can be stored in the individual regions.

In the another embodiment, the semiconductor signal processing apparatus according to the present invention further includes a read control circuit for controlling reading of the data from the operator cells, activation of the sense amplifier circuits, and precharging of the global read data lines each according to the pattern lengths of the data items stored in the regions.

In the operator cell array, the storage unit is formed of each pair of the operator cells and, using the series-coupled circuit of the first and second SOI transistors which allow data to be written and read to and from the operator cells, a signal according to a match/mismatch between stored data (to-be-retrieved data) and data (retrieval data) from the outside is generated. Each of the operator cells is formed of four transistors at a maximum, and the layout area of the operator cell array can be reduced to be smaller than in a typical TCAM.

In addition, in each of the entries, one or a plurality of data items (to-be-retrieved data items) can be stored, and it is unnecessary to associate one entry with one data pattern. This allows a reduction in the number of the entries. Therefore, it is possible to inhibit an increase in the number of the entries, efficiently map the to-be-retrieved patterns, and perform a pattern matching process for the retrieval data.

In the case of applying the retrieval data along the column direction, the sub-block is selected according to the data pattern length and data is read to the corresponding global read data lines. As a result, even if a plurality of data patterns having different pattern lengths are stored, a data match/mismatch can be determined according to the pattern lengths. It is also possible to determine a data match/mismatch along the row direction on a per operator-cell-column basis, and more efficiently store the retrieval data.

BRIEF DESCRIPTION OF THE DRAWINGS

FIG. 38 is a view showing an operation sequence during the writing of to-be-retrieved patterns to a data pattern storage region in the semiconductor signal processing apparatus according to Embodiment 3 of the present invention;

FIG. 39 is a view schematically showing a form during the storage of a data pattern of a pattern length L in the structure shown in FIG. 38;

FIG. 40 is a view schematically showing a form during the storage of a data pattern of a pattern length L/2 in the structure shown in FIG. 38;

FIG. 41 is a view showing an example of a form of the storage of a data pattern of a pattern length L/2 in the structure shown in FIG. 38;

FIG. 42 is a view showing an example of a form of the storage of a data pattern of a pattern length L/4 in the structure shown in FIG. 38;

FIG. 43 is a view showing an example of a form of the storage of a data pattern of a pattern length L/8 in the structure shown in FIG. 38;

FIG. 82 is a view schematically showing an example of a structure of the gate circuit shown in FIG. 81;

DETAILED DESCRIPTION OF THE PREFERRED EMBODIMENTS

Embodiment 1

Figure 1:
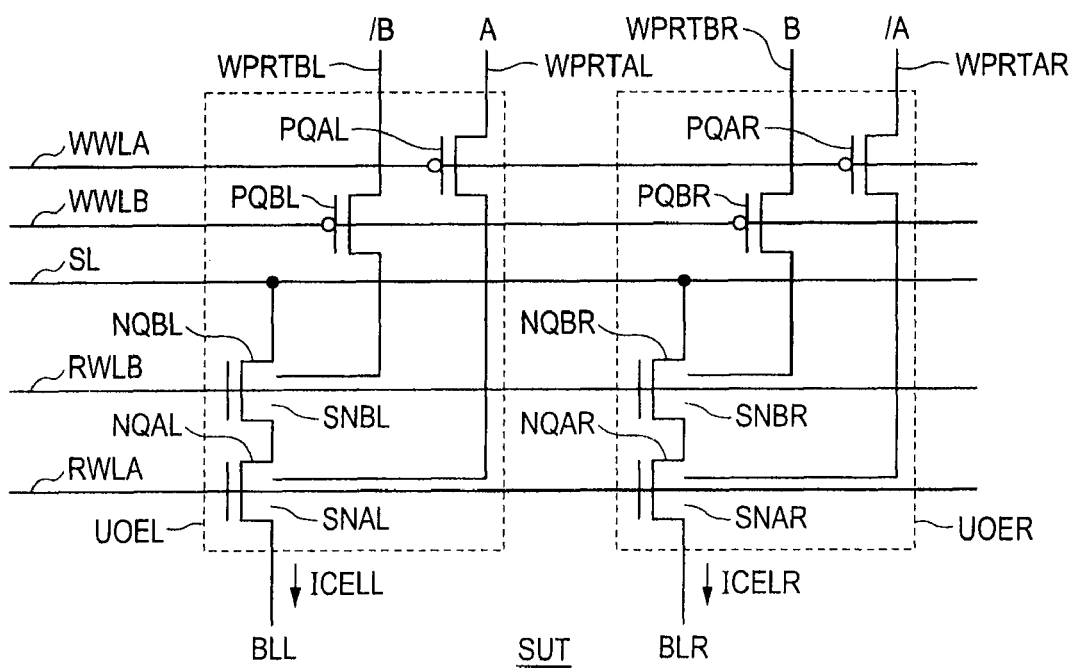
FIG. 1 is a view showing a structure of a storage unit used in a semiconductor signal processing apparatus according to Embodiment 1 of the present invention.

FIG. 1 is a view showing an electrically equivalent circuit of a storage unit as a basic component used in a semiconductor signal processing apparatus according to Embodiment 1 of the present invention. In FIG. 1, a storage unit SUT includes two operator cells UOEL and UOER. The left operator cell UOEL includes two P-channel field effect transistors PQAL and PQBL and two N-channel field effect transistors NQAL and NQBL.

The N-channel field effect transistors (first and second transistors) NQAL and NQBL are formed of Silicon On Insulator (SOI) transistors, and coupled in series between a source line SL and a bit line BLL. The SOI transistors are formed over an insulating film, and the body regions thereof are isolated between the elements in the present invention. The respective body regions of the SOI transistors NQAL and NQBL are used as storage nodes SNBL and SNAL. That is, the threshold voltages of the transistors NQAL and NQBL differ according to the potential states of the storage nodes SNAL and SNBL, and are associated with stored information (data).

The P-channel field effect transistors PQBL and PQAL are also formed of SOI transistors. The P-channel SOI transistor PQBL transmits, during the conduction thereof, a write data item /B transmitted from a write B port WPRTBL to the storage node SNBL of the N-channel SOI transistor NQBL. The P-channel SOI transistor PQAL transmits, during the conduction thereof, a write data item A given to a write A port WPRTAL to the storage node SNAL of the N-channel SOI transistor NQAL. The transistors of the operator cells are hereinafter referred to as the SOI transistors.

The right operator cell UOER includes two P-channel SOI transistors PQAR and PQBR and two N-channel SOI transistors NQAR and NQBR, similarly to the left operator cell UOEL. The N-channel SOI transistors NQAR and NQBR are coupled in series between the source line SL and a bit line BLR.

The P-channel SOI transistor PQAR transmits, during the conduction thereof, a write data item /A given to a write A port WPRTAR to a storage node SNAR of the N-channel SOI transistor NQAR. The P-channel SOI transistor PQBR transmits, during the conduction thereof, a write data item B given to a write B port BPRTBR to a storage node SNBR of the N-channel SOI transistor NQBR.

The gates of the P-channel SOI transistors PQAL and PQAR are coupled commonly to an A-port write word line WWLA extending in a row direction. The gates of the P-channel SOI transistors PQBL and PQBR are coupled commonly to a B-port write word line WWLB extending in the row direction. The gates of the N-channel SOI transistors NQBL and NQBR are coupled commonly to a B-port read word line RWLB extending in the row direction. The gates of the N-channel SOI transistors NQAL and NQAR are coupled commonly to an A-port read word line RWLA extending in the row direction.

By selectively driving each of the write word lines WWLA and WWLB into a selected state, the write data items A and /A from the ports A and the write data items /B and B from the ports B can be respectively written to the A-port storage nodes SNAL and SNAR and to the B-port storage nodes SNBL and SNBR.

During data reading, each of the read word lines RWLB and RWLA is driven into the selected state. Between the source line SL and the bit line BLL and between the source line SL and the bit line BLR, currents according to data stored in the operator cells UOEL and UOER flow. The respective currents in the bit lines BLL and BLR are sensed with sense amplifier circuits not shown so that the data in the operator cells UOEL and UOER is read therefrom.

Figure 2:
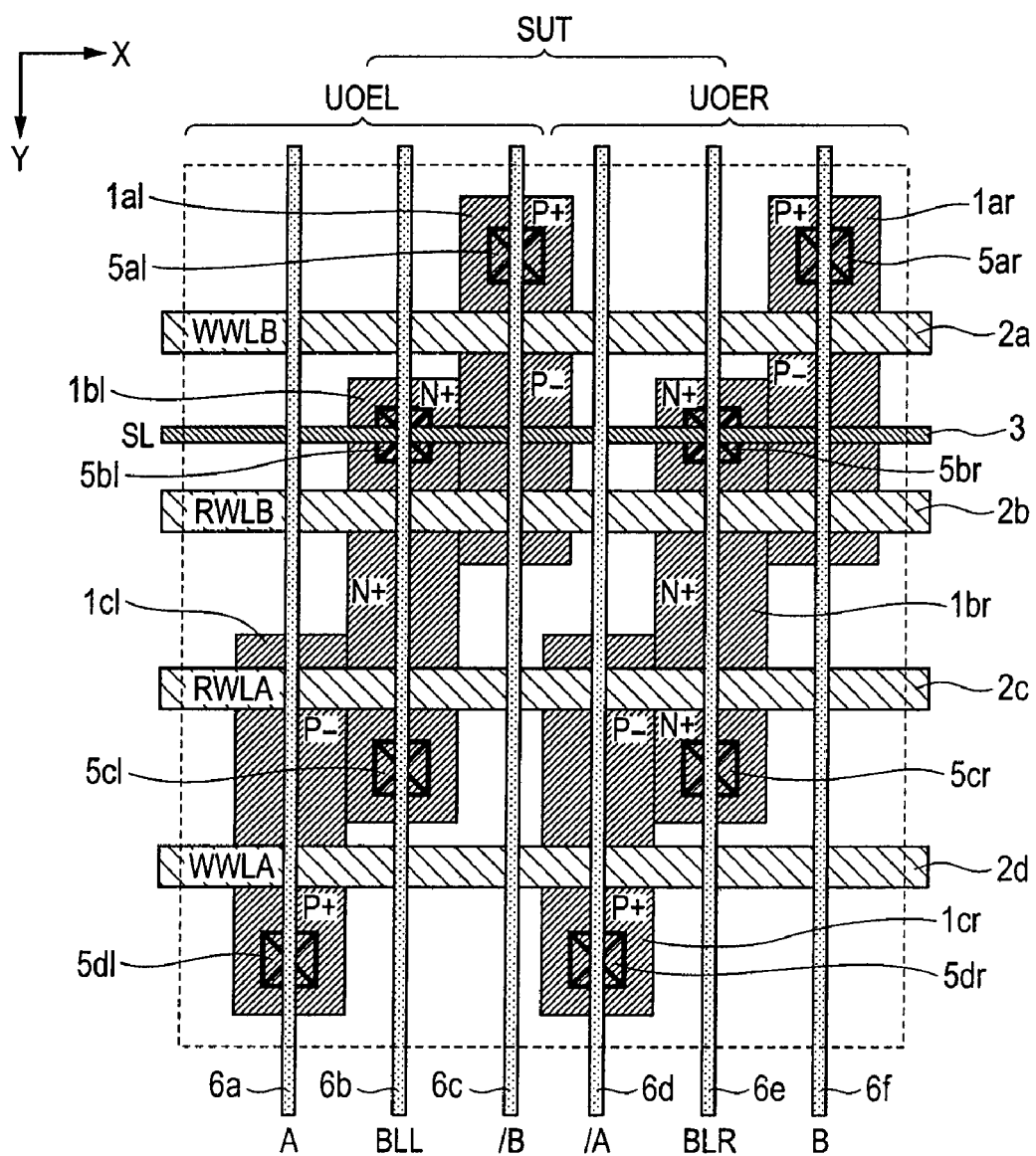
FIG. 2 is a view schematically showing a plane layout of the storage unit shown in FIG. 1.

FIG. 2 is a view schematically showing a plane layout of the storage unit SUT shown in FIG. 1. In FIG. 2, in the region where the operator cell UOEL is formed, active regions 1*al*, 1*bl*, and 1*cl* each having a rectangular shape elongated in a Y-direction are disposed at positions displaced from each other in the Y-direction and adjacent to each other. The active regions 1*al* and 1*cl* are P-type active regions, while the active region 1*bl* is an N-type active region. The N-type active region 1*bl* is disposed between the P-type active regions 1*al* and 1*cl*.

In the region where the right operator cell UOER is formed also, a P-type active region 1*ar*, an N-type active region 1*br*, and a P-type active region 1*cr* each having a rectangular shape elongated in the Y-direction are disposed at positions displaced from each other in the Y-direction and adjacent to each other in the X-direction. The operator cells UOEL and UOER have the same layout patterns. Here, in the P-type active regions 1*al* and 1*ar*, respective impurity concentrations in regions adjacent to the N-type active regions 1*bl* and 1*br* are set low (P⁻ impurity regions are provided), while respective impurity concentrations in regions where contacts 5*al*, 5*dl*, 5*ar*, and 5*dr* are formed are set high (P⁺ impurity regions are provided).

Conductive lines 2*a* and 2*b* are disposed in mutually spaced-apart relation to extend in the direction X, and traverse the active regions 1*al*, 1*ar*, 1*bl*, and 1*br*. The conductive lines 2*a* and 2*b* respectively form the B-port write word line WWLB and the B-port read word line RWLB. Between the conductive lines 2*a* and 2*b*, a conductive line 3 forming the source line SL is disposed. The conductive line 3 is electrically coupled to the active regions 1*bl* and 1*br* via contacts 5*bl* and 5*br* formed in the active regions 1*bl* and 1*br*.

Additionally, a conductive line 2*c* forming the A-port read word line RWLA is disposed to continuously extend in the X-direction, and traverse the active regions 1*cl*, 1*bl*, 1*cr*, and 1*br*. Also, a conductive line 2*d* forming the A-port write word line WWLA is disposed apart from the conductive line 2*c* to extend in the X-direction, and traverse the active regions 1*cl* and 1*cr*.

In the regions of the active regions 1*al* and 1*ar* located under the write word line WWLB, N-type body regions are disposed. In the regions of the active regions 1*al* and 1*ar* located under the read word line RWLB, no body region is provided, but P⁻-type impurity regions are disposed to continuously extend. The P-type active regions 1*al* and 1*ar* respectively form the P-channel SOI transistors PQBL and PQBR.

In the regions of the active regions 1*cl* and 1*cr* located under the A-port write word line WWLA, N-type body regions are formed. In the regions of the active regions 1*cl* and 1*cr* located under the A-port read word line, P⁻-type impurity regions are disposed. In the respective active regions 1*cl* and 1*cr*, the P-channel SOI transistors PQAL and PQAR are formed.

In the active region 1*bl*, the N-type SOI transistors NQBL and NQAL are formed while, in the active region 1*br*, the N-type SOI transistors NQAR and NQBR are formed. In the respective regions of the active regions 1*bl* and 1*br* located under the read word lines RWLB and RWLB, P-type body regions are provided. The body regions are electrically coupled to the respective P⁻-type impurity regions of the P-type active regions 1*al*, 1*ar*, 1*cl*, and 1*cr* disposed in adjacent relation to form the storage nodes SNAL, SNBL, SNAR, and SNBR.

Between the conductive lines 2*c* and 2*d*, contacts 5*cl* and 5*cr* are provided in the respective active regions 1*bl* and 1*br*, while the contacts 5*dl* and 5*dr* are provided at the respective end portions of the active regions 1*cl* and 1*cr* in the Y-direction.

Conductive lines 6*a* to 6*f* in a layer upper than that of the conductive lines 2*a* to 2*d* are disposed in mutually spaced-apart relation to continuously extend in the Y-direction. The conductive line 6*a* forms the write A port WPRTAL, and is coupled to the high-concentration P-type impurity region (P⁺-impurity region) of the active region 1*cl* via the contact 5*dl*. The conductive line 6*b* forms the bit line BLL, and is electrically coupled to the active region 1*bl* via the contact 5*cl*. The conductive line 6*c* forms the write B port WPRTBL, and is coupled to the high-concentration P-type impurity region of the active region 1*al* via the contact 5*al*. The conductive line 6*d* forms the write A port WPRTAR, and is coupled to the active region 1*cr* via the contact 5*dr*. The conductive line 6*e* forms the bit line BLR, and is coupled to the active region 1*br* via the contact 5*cr*. The conductive line 6*f* forms the write B port WPRTBR, and is coupled to the high-concentration P-type impurity region of the active region 1*ar* via the contact 5*ar*.

Figures 3, 4:
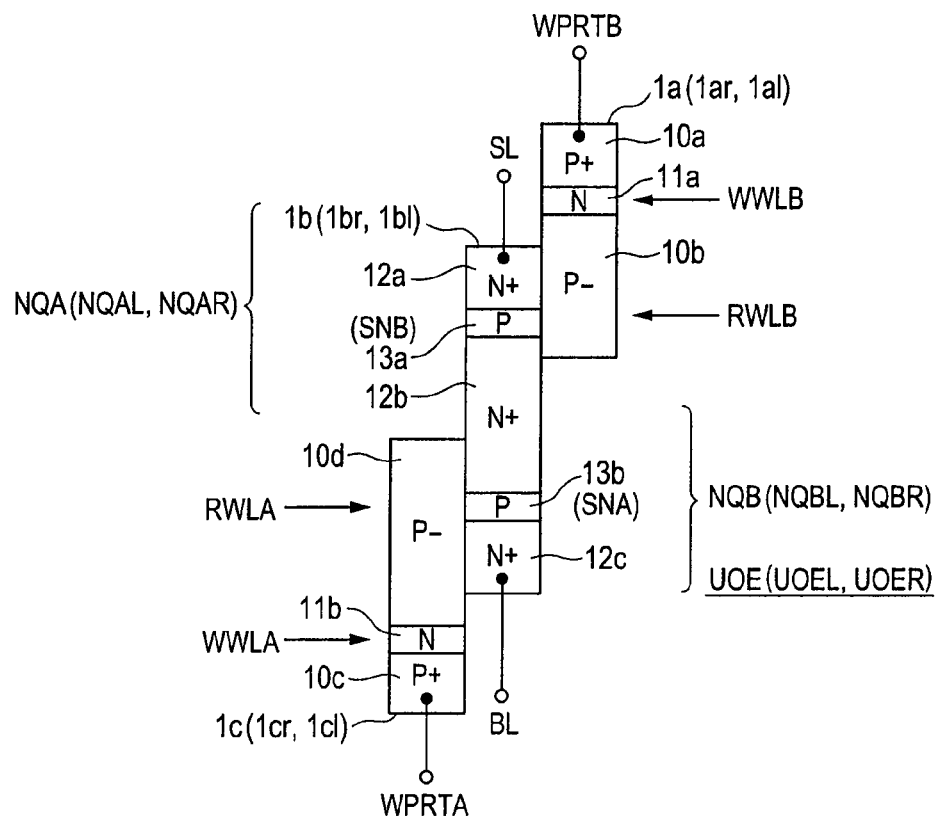
FIG. 3 is a view schematically showing the arrangement of active regions in the plane layout shown in FIG. 2.
FIG. 4 is a view showing a list of correspondences between data stored in operator cells forming the storage unit shown in FIG. 1 and data outputted therefrom.

FIG. 3 is a view schematically showing the arrangement of the impurity regions in the active regions in the operator cells UOEL and UOER of the storage unit SUT shown in FIG. 2. Since the operator cells UOEL and UOER have the same structures, the plane layout of the active regions in one operator cell UOE (UOEL or UOER) is schematically shown in FIG. 3.

In FIG. 3, the active region 1*a* (1*ar* or 1*al*) includes a high-concentration P-type impurity region 10*a*, a low-concentration P-type impurity region 10*b*, and an N-type impurity region 11*a* between the impurity regions 10*a* and 10*b* to form the SOI transistor PQB (PQBL or PQBR). The write B-port word line WWLB is disposed so as to cross the N-type impurity region 11*a*. The N-type impurity region 11*a* forms the body region of the SOI transistor PQB (PQBL or PQBR).

The active region 1*b* (1*br* or 1*bl*) includes N-type impurity regions 12*a*, 12*b*, and 12*c* which are disposed in mutually spaced-apart relation, a P-type body region 13*a* between the impurity regions 12*a* and 12*b*, and a P-type body region 13*b* between the impurity regions 12*b* and 12*c*. The body region 13*a* forms the storage node SNB, and the body region 13*b* forms the storage node SNA. The read word lines RWLB and RWLA are disposed so as to cross the respective body regions 13*a* and 13*b*. In the active region 1*b*, the N-type SOI transistors NQB and NQA coupled in series are formed.

The N-type impurity region 12*a* and the P⁻-type impurity region 10*b* are disposed adjacent to each other. However, the N-type impurity region 12*a* is coupled to the source line SL to be maintained at a predetermined voltage level, e.g., a power-source voltage level so that a PN junction between the impurity regions 12*a* and 10*b* is maintained in a non-conductive state (reverse-biased state). In the region where the N-type impurity region 12*b* and the P⁻-type impurity region 10*b* are adjacent, the P⁻-type impurity region (body region) 10*b*, and the N-type impurity region 12*b*, the voltage level of write data is set at a voltage level at which the PN junction therebetween is in the reverse-biased state, and conduction of the PN junction therebetween is prevented.

The active region is (1*cr* or 1*cl*) includes a P⁻-type impurity region 10*d* and a high-concentration P⁺-type impurity region 10*c* disposed spaced apart from each other, and an N-type body region 11*b* between the impurity regions 10*c* and 10*d*. The A-port write word line WWLA is provided so as to cross the body region 11*b*.

In the active region 1*c* also, the P⁻-type impurity region 10*d* is disposed adjacent to the N-type impurity regions 12*b* and 12*c*. The P-type impurity region 10*c* is coupled to the write A port WPRTA, and the N-type impurity region 12*c* is coupled to the bit line BL. As described above, the H level of the write data given from the write A port WPRTA is a voltage level which maintains each of the PN junctions between the P⁻-type impurity region 10d and the N-type impurity regions 12b and 12c in the non-conductive state.

Over the N-type body region 11b, the write A port write word line WWA is provided. Over the body regions 13b and 13b forming the storage nodes SNA and SNB, the read word lines RWLA and RWLB are respectively provided.

The active regions 1a, 1b, and 1c are formed over an insulating film not shown, and charges can be accumulated in the body regions 13a and 13b forming the respective storage nodes SNA and SNB. The body region of a SOI transistor corresponds to the substrate region of a typical bulk MOS transistor (a MOS transistor formed in a surface of a semiconductor substrate (insulated-gate field effect transistor)). Accordingly, in the SOI transistor NQA (NQAL or NQAR) and the SOI transistor NQB (NQBL or NQBR), the threshold voltages thereof differ according to the voltage levels of the respective body contact regions 13a and 13b thereof.

That is, when the potentials of the body regions 13a and 13b are high in the N-channel SOI transistors NQA and NQB, the back-gate/source region of each of the SOI transistors NQA and NQB is biased in a forward direction with a voltage level of not more than the built-in voltage of the PN junction so that the threshold voltages of the SOI transistors NQA and NQB decrease. On the other hand, when the potentials of the body regions 13a and 13b of the N-channel SOI transistors NQA and NQB are low, the respective threshold voltages thereof increase.

As a result, the SOI transistor NQA and NQB can store information according to the potentials of the body regions 13a and 13b thereof. Moreover, the body regions 13a and 13b of the SOI transistors NQA and NQB are formed over an insulating film, and isolated from other regions during a standby period (when the write word lines WWA and WWB are in a non-selected state), and data can be stored even when a power source is shut off.

The potentials of the body regions 13a and 13b of the SOI transistor PQA and PQB are set by the potential levels of the write data items B (or /B) and A (or /A) given via the write ports WPRTB and WPRTA. Therefore, by adjusting the power source voltage of a write driver (not shown in FIG. 3) which writes data or the like, the potentials of the storage nodes SNB and SNA can be set at a level of not more than the built-in voltages of the PN junctions, and the threshold voltages of the SOI transistors NQA and NQB can be reliably set according to the stored data.

In addition, the impurity concentrations of the P-type impurity regions 10b and 10d can be set at the same levels as those of the P-type impurity regions 13a and 13b forming the body region of the N-channel SOI transistor NQA and NQB. This reduces leakage currents in the PN junctions between the impurity regions 12a and 12b and 10b and in the PN junctions between the impurity regions 10 and 12b and 12c, and prevents the degradation of the property of retaining stored data.

FIG. 4 is a view showing a list of relations between data written (stored) in one operator cell, threshold voltages, and a bit-line read current. In FIG. 4, when each of the SOI transistors for storage is in a high-threshold-voltage state, the state is associated with a state where data "0" is written. When data "1" is written, the threshold voltage of each of the SOI transistors NQA and NQB is in a low state. Thus, there are the two states assumed by each of the SOI transistors NQA and NQB, and there are the total of four states as combinations of the states of the SOI transistors NQAL and NQBL.

When the read word lines RWLA and RWLB are driven in parallel into the selected state, a current according to the data stored in the SOI transistors NQA and NQB flows from the source line SL to the bit line BL. In this case, if the source line SL is set at, e.g., a power source voltage level, a cell current (bit-line read current) ICEL becomes largest when each of the SOI transistors NQA and NQB is in the low-threshold-voltage state. In the states other than that, at least one of the SOI transistors NQA and NQB is in the high-threshold-voltage state so that the current flowing from the source line SL to the bit line BL decreases. That is, if a state where the cell current ICEL flowing to the bit line BL is large is associated with the data "1", a current showing the result of an AND operation between the data items stored in the storage nodes SNA and SNB flows in the operator cell UOE during the selection thereof.

Figures 5, 6:
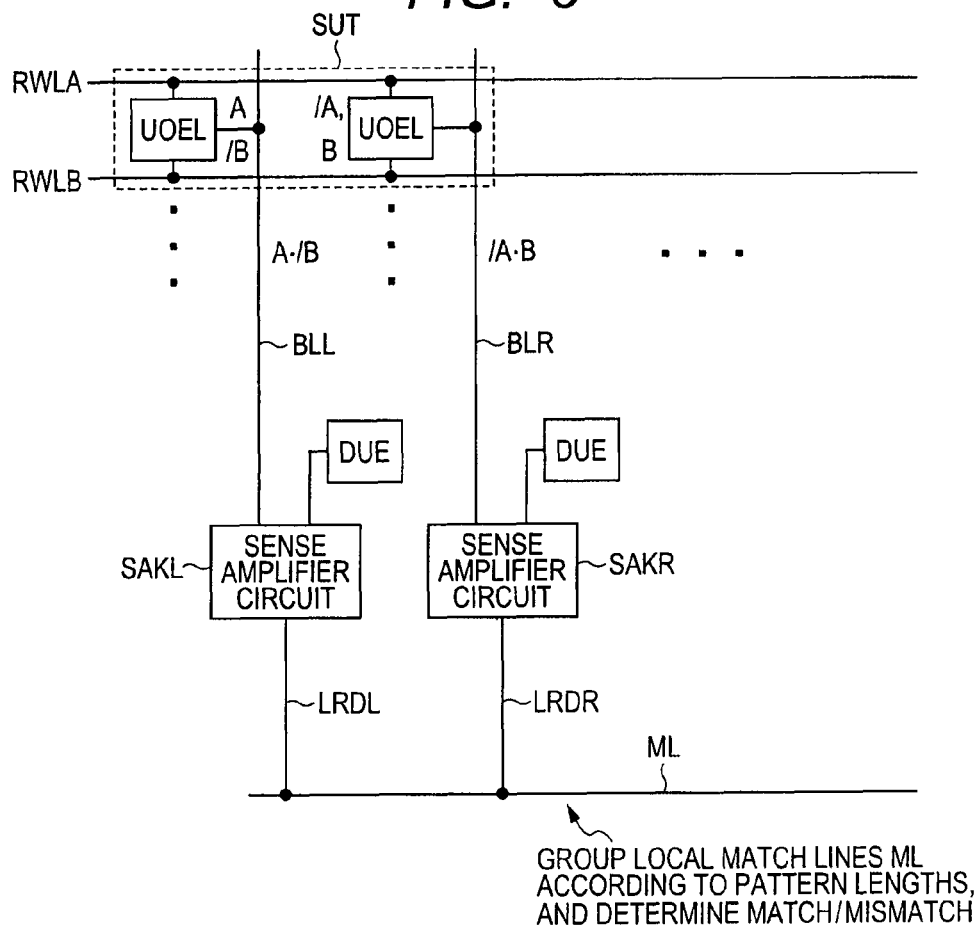
FIG. 5 is a view schematically showing a correspondence between data stored in the storage unit shown in FIG. 1 and data outputted therefrom.
FIG. 6 is a view schematically showing a structure of a data read path in a portion of the semiconductor signal processing apparatus according to Embodiment 1 of the present invention which is related to one storage unit.

FIG. 5 is a view showing a list of relations between data written in the storage unit SUT shown in FIG. 1, data stored therein, and cell currents (bit-line read currents). Each of the data items A and B assumes either of "0" and "1". In the storage nodes SNAL and SNBL, the data items A and /B are stored individually. In the storage nodes SNAR and SNBR, the data items /A and B are stored individually.

Through the extension of the state in the operator UOE shown in FIG. 4, the cell current ICELL of the operator cell UOEL becomes large when the data items A and B are "1" and "0", respectively, and the cell current ICELL becomes small in the states other than that. Likewise, in the operator cell UOER, the cell current ICELR becomes large when the data items A and B are "0" and "1", respectively, and the cell current ICELR becomes small in the states other than that.

Accordingly, when the respective logic values of the data items A and B are equal, the cell currents ICELL and ICELR are each in a smallest state. When the data items A and B do not match, a large current is supplied from one of the operator cells UOEL and UOER to the bit line. Therefore, using the two operator cells as the storage unit, complementary data items are stored in the corresponding transistors. It can be determined that, when the data items are read and each of the cell currents ICELL and ICELR is small, the data items A and B match. If the data item B is associated with to-be-retrieved data (registered data) and the data item A is assumed to be retrieval data, a match/mismatch between the to-be-retrieved data and the retrieval data can be determined.

FIG. 6 is a view schematically showing a structure of a portion of the semiconductor signal processing apparatus according to Embodiment 1 of the present invention which are related to data reading from the operator cells of the storage unit. In FIG. 6, in an operator cell array, the storage units SUT are arranged in rows and columns. In FIG. 6, one storage unit SUT is representatively shown. As described above, the storage unit SUT includes the operator cells UOEL and UOER.

The operator cells UOEL and UOER are coupled individually to the bit lines BLL and BLR. For the bit lines BLL and BLR, sense amplifier circuits SAKL and SAKR are provided respectively. The sense amplifier circuits SAKL and SAKR generate signals according to respective currents flowing in the corresponding bit lines BLL and BLR using currents supplied by respective dummy cells DUE provided correspondingly thereto. The sense amplifier circuits SAKL and SAKR supply currents to respective local read data lines LRDL and LRDR disposed corresponding thereto when the currents flowing in the bit lines BLL and BLR are larger than the reference currents (Iref) supplied by the dummy cells DUE, and otherwise halt the supply of the currents to the corresponding local read data lines LRDL and LRDR.

The local read data lines LRDL and LRDR are wired-OR coupled to a local match line ML commonly provided in the operator cell array. A state where the read currents in the bit lines BLL and BLR are larger than the reference currents supplied by the dummy cells DUE corresponds to a state where the data items A and B do not match, as shown in FIG. 5. At this time, the currents are supplied to the local read data lines LRDL and LRDR. Therefore, when the data items A and B do not match, the currents are supplied from the corresponding sense amplifier circuits to the local match line ML so that the potential level thereof increases. By detecting the potential of the local match line ML, a match/mismatch between the data items A and B is detected.

Figure 7:
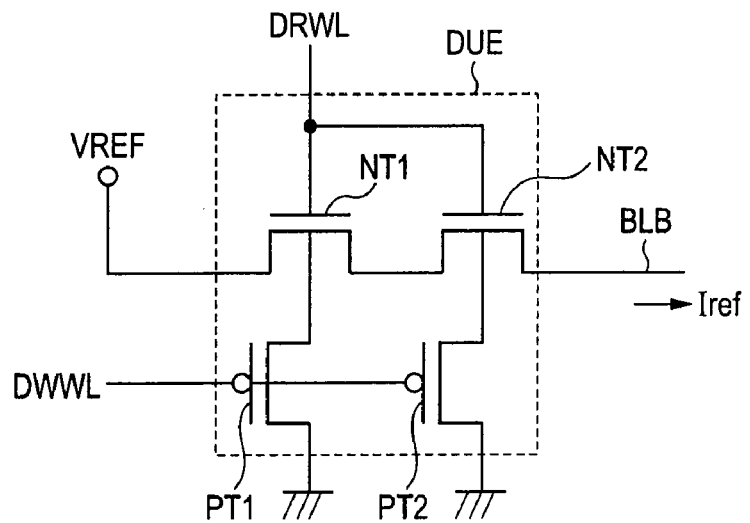
FIG. 7 is a view showing an example of a structure of each of the dummy operator cells shown in FIG. 6.

FIG. 7 is a view showing an example of a structure of each of the dummy cells DUE shown in FIG. 6. In FIG. 7, the dummy cell DUE includes N-channel SOI transistors NT1 and NT2 coupled in series between a reference power source node VREF and a reference bit line BLB and P-channel SOI transistors PT1 and PT2 which transmit a ground voltage (0 V) to the body regions of the SOI transistors NT1 and NT2 according to a signal on a dummy write word line DWWL. The reference bit line BLL is provided correspondingly to each of the bit lines, and coupled to the corresponding sense amplifier circuit.

In each of the operator cells UOEL and UOER, each of the potentials of the storage nodes SNA and SNB is at a negative voltage level in a state where the data "0" is stored. On the other hand, when the data "1" is stored, each of the potentials of the storage nodes SNA and SNB is at a positive voltage lower than the built-in voltage of the PN junction. Here, a state where the threshold voltage of each of the N-channel SOI transistors is high is associated with the state where the data "0" is stored, and a state where the threshold voltage of each of the N-channel SOI transistors is low is associated with the state where the data "1" is stored.

In each of the dummy cells DUE, the potential of each of the body regions of the SOI transistors NT1 and NT2 is set at a ground voltage (0 V). When a dummy read word line DRWL is selected, the SOI transistors NT1 and NT2 are each brought into a conductive state to supply a reference current to the reference bit line BLB. The reference current Iref supplied from the reference power source node VREF is set at a reference current level between those when the data "0" is stored and when the data "1" is stored. By adjusting the voltage level of the reference voltage VREF from the reference voltage source, the reference current Iref can be precisely set at a middle value between those of currents supplied by the operator cells UOER and UOEL.

Figure 8:
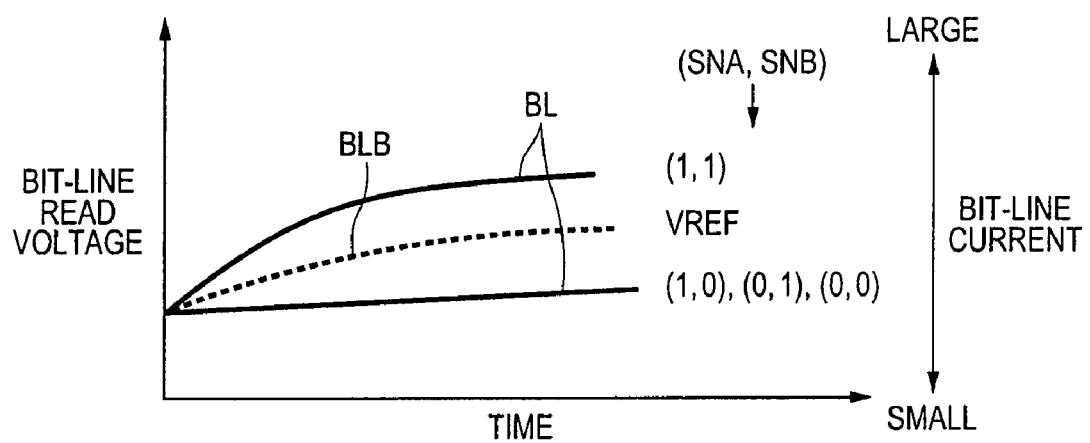
FIG. 8 is a view schematically showing correspondences between data stored in the operator cells and currents read therefrom.

FIG. 8 is a view schematically showing a bit line current and bit line read potentials when the dummy cell DUE shown in FIG. 7 is used. To the bit line BL, the read current (cell current ICEL) from the operator cell UOE (UOEL or UOER) is supplied while, to the reference bit line BLB, the reference current Iref from the dummy cell DUE is supplied. The reference current Iref is a current from the dummy cell having a middle value between those of the cell currents ICEL for the data "0" and the data "1". By comparing or differentially amplifying the potentials or currents of the bit lines BL and BLB with the corresponding sense amplifier circuit, it is possible to discriminate the case where the data items at the storage nodes are (1, 1) from the cases other than that.

That is, when the data "1" is stored in each of the storage nodes SNA and SNB and when the data "0" is stored in each of the storage nodes SNA and SNB, the data items A and B do not match, as shown in FIG. 5. By using the pair of operator cells UOEL and UOER in the storage unit SUT, the complementary data items are stored. When the data items A and B do not match, either of the operator cells UOEL and UOER shows a match, and supplies a cell current larger than the reference current Iref. In the storage unit SUT, the result of an arithmetic operation A·/B+A·B is transmitted to the corresponding local match line LM via the sense amplifier circuits SAKL and SAKR. The arithmetic operation is an EXOR operation which is equivalent to a process of detecting a mismatch between the data items A and B. As a result, by recognizing the potential of the local match line LM, a match/mismatch between the data items A and B can be precisely recognized.

Figures 9, 10:
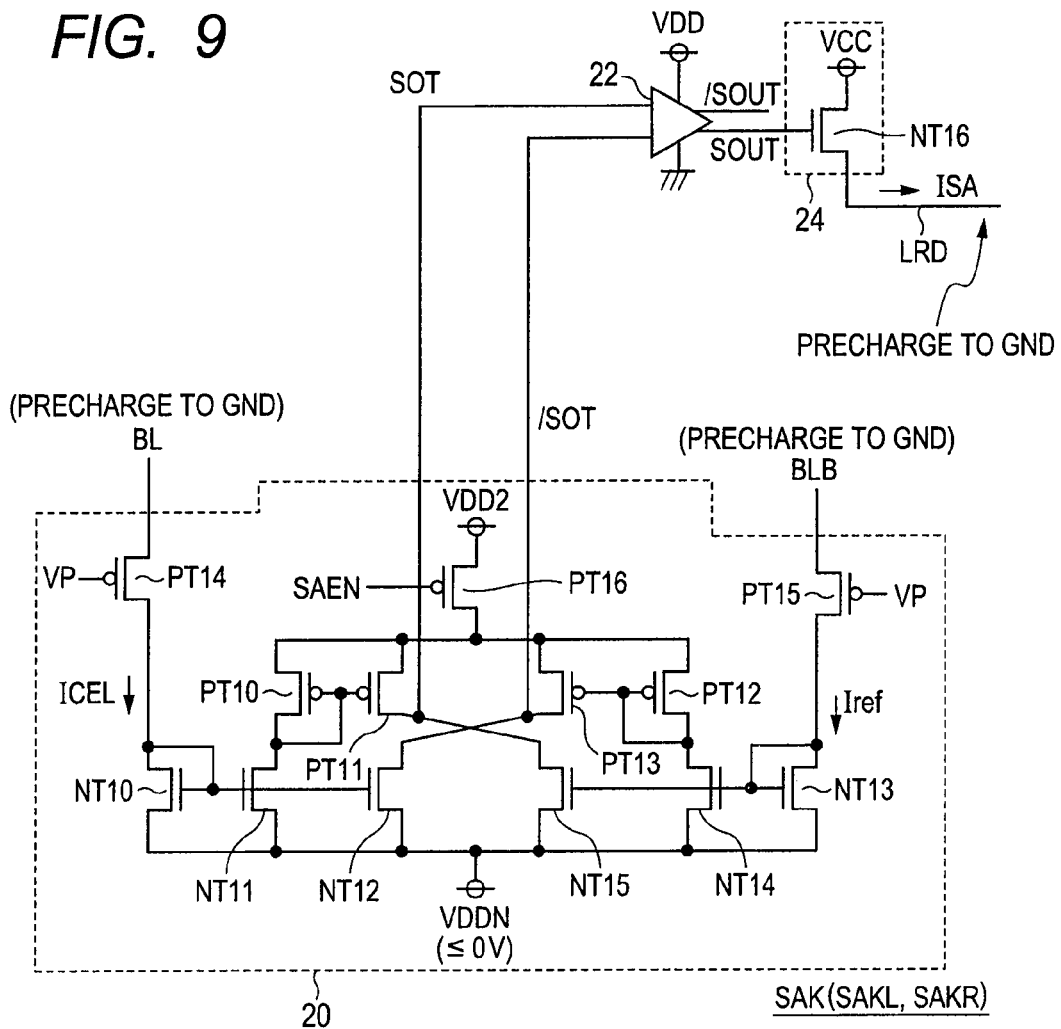
FIG. 9 is a view showing an example of a structure of each of the sense amplifier circuits shown in FIG. 6.
FIG. 10 is a view showing a list of correspondences between data stored in the storage unit shown in FIG. 1 and sense currents.

FIG. 9 is a view schematically showing an example of a structure of each of the sense amplifier circuits shown in FIG. 6. Since the sense amplifier circuits SAKL and SAKR have the same structures, FIG. 9 shows a sense amplifier circuit SKA as a representative thereof.

In FIG. 9, the sense amplifier circuit SAK includes a current-detection sense amplifier 20 for differentially amplifying the currents ICEL and Iref in the bit lines BL and BLB, a clock-coupled secondary sense amplifier 22 for amplifying an output signal from the current-detection sense amplifier 20, and a current supply circuit 24 for supplying a current to a local read data line LRD according to an output signal from the driver amplifier 22.

The current-detection sense amplifier 20 includes N-channel MOS transistors NT10 and NT11 forming a current mirror stage for generating a mirror current of the cell current ICEL flowing in the bit line BL, N-channel MOS transistors NT13 and NT14 forming a current mirror stage for generating a mirror current of the reference current Iref flowing in the reference bit line BLB, P-channel MOS transistors PT10 and PT12 which supply respective currents to the MOS transistors NT11 and NT14, P-channel MOS transistors PT11 and PT13 forming a current mirror stage in conjunction with the MOS transistors PT10 and PT12, N-channel MOS transistors NT12 and NT15 forming a current mirror stage in conjunction with the MOS transistors NT10 and NT13, P-channel MOS transistors PT14 and PT15 which adjust the respective currents flowing in the bit lines BL and BLB, and a P-channel MOS transistor PT16 which activates the current-detection sense amplifier 20 according to a sense amplifier activation signal SAEN.

The MOS transistor NT10 has a gate and a drain each coupled to the bit line BL via the MOS transistor PT14, and operates as the master of the current mirror stage. During the operation thereof, the MOS transistor NT10 allows the mirror current of the cell current ICEL supplied thereto from the bit line BL via the MOS transistor PT14 to flow to the MOS transistor NT11. The MOS transistor NT12 is supplied with a current from the MOS transistor PT13 upon activation of the sense amplifier activation signal SAEN.

The MOS transistor NT13 has a gate and a drain coupled to each other, and also coupled to the reference bit line BLB via the MOS transistor PT15. The MOS transistor NT13 operates as the master of the current mirror stage to allow, upon activation of the sense amplifier activation signal SAEN, the mirror current of the reference current Iref given thereto via the MOS transistor PT15 to the MOS transistor NT14. The MOS transistor NT15 is supplied with a current from the MOS transistor PT11 upon activation of the sense amplifier activation signal SAEN.

The MOS transistor PT11 has a source coupled to a power source node (VCC), and a gate and a drain each coupled to the drain of the MOS transistor NT14. The MOS transistor PT11 operates as the master of the current mirror stage to allow the mirror current of the current flowing in the MOS transistor NT14 to the MOS transistor PT10. The MOS transistor PT10 supplies a current from the power source node (VCC) to the MOS transistor NT11.

The MOS transistors PT14 and PT15 receive a constant voltage VP at the gates thereof to inhibit abrupt changes in the bit line currents ICEL and Iref, and prevent the potentials of the bit lines BL and BLB from rising to levels higher than needed by source follower operation.

The MOS transistor PT16 is brought into an ON state upon activation of the sense amplifier activation signal SAEN, and supplies the current from the power source node to the MOS transistors PT10 to PT13. On the other hand, the MOS transistors NT10 to NT15 have respective sources coupled to a LOW-side power source node VDDN.

A voltage VDD2 at the power source node is an adjustable voltage level, and a voltage VDDN given to the LOW-side power source node of the sense amplifier also has an adjustable voltage level of not more than 0 V.

By using the voltages VDD2, VDDN, and VP, the sense amplifier 20 is allowed to reliably operate in a saturation region according to the bit line current. That is, a case can be considered where, to improve the property of retaining data written in the operator cell, a middle voltage VDD/2 is applied to the source line SL. Under this condition, the LOW-side power source voltage VDDN and the HIGH-side power source voltage VDD2 are respectively set to a negative voltage −VDD/2 and a positive middle voltage level VDD/2 to allow the sense amplifier 20 to operate and ensure the operation of the current mirror stage in the saturation region. In addition, it is possible to set the precharge voltage level of each of the bit lines BL and BLB to a desired level (e.g., ground voltage).

Output signals (middle sense signals) SOT and /SOT from the sense amplifier 20 are generated from the coupling node between the MOS transistors PT11 and NT15 and the coupling node between the MOS transistors PT13 and NT12.

The secondary sense amplifier 22 is formed of a cross-coupled sense amplifier, and performs inverting differential amplification with respect to the complementary middle sense signals SOT and /SOT from the sense amplifier 20 to generate complementary final sense signals SOUT and /SOUT at the power source voltage level and the ground voltage GND level. That is, the secondary sense amplifier 22 sets the final sense signal SOUT at the L level when the middle sense signal SOT is higher than the middle sense signal /SOT complementary thereto, and sets the final sense signal SOUT at the H level in the reverse situation.

The current supply circuit 24 includes an N-channel MOS transistor NT16 which supplies a current ISA from the power source node to the local read data line LRD according to the output signal SOUT from the second sense amplifier 22. The current supply circuit 24 supplies the current to the corresponding local read data line LRD when the output signal from the secondary sense amplifier 22 is at the H level. The secondary sense amplifier 22 maintains the output signal SOUT therefrom at the L level when the sense amplifier circuit SAK is inactive. In this state, the MOS transistor NT16 of the current supply circuit 24 is in an OFF state. The voltage level at the power source node VCC of the current supply circuit 24 may be the same as or different from the level of the power source voltage VDD or VDD2. The power source node VCC may be set appropriately at a proper voltage level according to the magnitude of the current ISA supplied when the MOS transistor NT16 in the current supply circuit 24 is in the ON state.

Note that the final sense signal SOUT of the secondary sense amplifier 22 is given to the current supply circuit 24, and the complementary final sense signal /SOUT is not used. To equalize the output load of the secondary sense amplifier 22 for the signals SOUT and /SOUT, the complementary final sense signal /SOUT may also be given to the gate of a dummy N-channel MOS transistor.

In the sense amplifier circuit SAK shown in FIG. 9, each of the transistors may be formed of a SOI transistor or a bulk transistor. Next, the operation of the sense amplifier circuit SAK will be described.

In a standby state, the bit lines BL and BLB and the local read data line LRD are each precharged to the ground voltage (GND: 0 V) by a precharge circuit not shown. The sense amplifier activation signal SAEN is at the H level, and the MOS transistor PT16 is in the OFF state. In this state, each of the middle sense signals SOT and /SOT is maintained at the LOW-side power source voltage VSS level by the MOS transistors NT15 and NT12. In response thereto, the output signal SOUT of the secondary sense amplifier 22 is at the L level, and the MOS transistor NT16 of the current supply circuit 24 is in the OFF state so that the current is not supplied to the local read data line LRD.

Note that, in the standby state, to reliably maintain the final sense signal SOUT at the L level, a final sense activation signal may also be given to the secondary sense amplifier 22 such that the secondary sense amplifier 22 outputs an L-level signal during a standby period.

When a read operation is started, the read word lines (RWLA and RWLB) are driven in parallel into the selected state. In response thereto, the cell current ICEL and the reference current Iref flow in the respective bit lines BL and BLB so that the potential of the bit line BL changes in response to the cell current ICEL (ICELL or ICELR).

Next, with a predetermined timing, the sense amplifier activation signal SAEN is activated. In response thereto, the MOS transistor PT16 is set into the ON state to enable the sense operation of the current-detection sense amplifier 20. During the sense operation, the mirror current of the cell current ICEL supplied from the bit line BL flows in the MOS transistor NT11, and the mirror current of the reference current Iref flowing in the reference bit line BLB flows in the MOS transistor NT14. Here, it is assumed that, in the current-detection sense amplifier 20, each of the mirror ratios in the current mirror stages is 1. The timing for the activation of the sense amplifier 20 may be before the cell current is read into the bit line or after the bit line current is stabilized.

In the MOS transistors PT10 and PT11, the MOS transistor PT10 operates as the master of the current mirror stage. The MOS transistor PT10 supplies the mirror current of the reference current Iref to the MOS transistor NT11. In the MOS transistor PT11, therefore, the mirror current of the cell current ICEL flows. The MOS transistor PT10 supplies the mirror current of the reference current Iref to the MOS transistor NT11. On the other hand, the MOS transistor PT12 supplies the mirror current of the reference current Iref to the MOS transistor NT14. Therefore, in the MOS transistor PT13, the mirror current of the reference current Iref flows.

The MOS transistor NT12 forms the current mirror stage in conjunction with the MOS transistor NT10, and can allow the cell current ICEL to flow. However, the MOS transistor NT12 is supplied with the mirror current of the reference current Iref from the MOS transistor PT13. Therefore, in the MOS transistor NT12, the smaller one of the cell current ICEL and the reference current Iref flows.

Likewise, the MOS transistor NT15 forms the current mirror stage in conjunction with the MOS transistor NT13, and can allow the mirror current of the reference current Iref to flow. To the MOS transistor NT15, the mirror current of the cell current ICEL is supplied from the MOS transistor PT11. Therefore, in the MOS transistor NT15 also, the smaller one of the cell current ICEL and the reference current Iref flows.

Accordingly, when the cell current ICEL is larger than the reference current Iref, the MOS transistor NT12 discharges the entire mirror current of the current Iref supplied from the MOS transistor PT13 so that the voltage of the middle sense signal SOT remains at the L level. The MOS transistor NT15 cannot discharge the entire cell current ICEL supplied from the MOS transistor PT11 so that the voltage level of the middle sense signal /SOT rises.

In the secondary sense amplifier 22, the middle sense signals SOT and /SOT are subjected to inverting differential amplification. In this state, the final sense signal SOUT is at the H level, and the sense current ISA supplied from the current supply circuit 24 onto the local read data line LRD has a large value.

On the other hand, when the cell current ICEL is smaller than the reference current Iref, the MOS transistor NT12 cannot discharge the entire current supplied from the MOS transistor PT13 so that the voltage level of the middle sense signal SOT rises. On the other hand, the MOS transistor NT15 discharges the entire current supplied from the MOS transistor PT11 so that the middle sense signal /SOT remains at the L level.

The final sense signal SOUT from the secondary sense amplifier 22 maintains the L level so that a current is not supplied from the current supply circuit 24 to the corresponding local read line LRD and the sense current ISA is approximately zero. In this state, the local read data line LRD is maintained at the ground voltage (GND: 0 V) in the precharged state.

Thus, to the local read data line LRD, a current according to a combination of the data items stored in the storage nodes SNA and SNB of the operator cell is supplied. That is, when each of the data items stored in the storage nodes SNA and SNB is "1", the cell current ICEL becomes larger than the reference current Iref, and a current is supplied from the current supply circuit 24 to the local read data line LRD so that the voltage level thereof rises. On the other hand, when at least one of the data items stored in the storage nodes SNA and SNB is "0", the cell current ICEL becomes smaller than the reference current Iref. In this state, the current supply circuit 24 does not supply a current to the local read data line LRD so that the local read data line LRD is maintained at the ground voltage level of the precharged voltage.

FIG. 10 is a view showing a list of correspondences between data stored in the storage unit SUT, the cell currents, and the sense currents. The storage unit includes the operator cells UOER and UOEL in the same manner as in the table shown in FIG. 4. The correspondences between the data items A and B, the storage nodes SNAL, SNBL, SNAR, and SNBR, and the cell currents ICELL and ICELR are the same as in the table shown in FIG. 4.

As shown in FIG. 10, the cell current ICELL from the operator cell UOEL becomes large when the data "1" is stored in each of the storage nodes SNAL and SNBL, and the cell current ICELR from the operator cell UOER becomes large when the data "1" is stored in each of the storage nodes SNBL and SNBR. When the cell currents ICELL and ICELR are large, the corresponding sense currents ISAL and ISAR are large.

The local read data lines LRD are coupled in parallel to the local match line, and read currents (sense currents) from the storage units disposed to be aligned in the row direction are supplied in parallel to the local match line ML so that, in each of the local match lines, the currents corresponding to the read currents from the plurality of storage units SUT are added up. Therefore, as will be described below, the potential of the local match line ML allows match/mismatch recognition to be performed for the data patterns of the entire data items stored in the storage units disposed to be aligned in the row direction In the notation shown in FIG. 10, the data items /B and B are defined as to-be-retrieved data stored in advance in the operator cells UOEL and UOER. The data item A is defined as retrieval data supplied to the operator array at the time of retrieval. At the time of retrieval, the retrieval data items A and /A are written to the storage nodes SNAL and SNAR of the operator cells UOEL and UOER, and then the data items stored in the storage nodes SNA and SNB of the operator cell UOE are read therefrom. When the data items A and B match, each of the sense currents ICELL and ICELR is small so that the voltage level of the corresponding local read data line LRD does not rise, and is maintained at the precharged voltage level. On the other hand, when the data items A and B do not match, one of the sense currents ICELL and ICELR has a large value so that the voltage level of the local read data line LRD rises. This allows a match/mismatch between the to-be-retrieved data B and the retrieval data A to be determined.

The local read data lines LRD are coupled in parallel to the corresponding local match line M. Accordingly, when the potential of the local match line ML rises, it shows that there is a data mismatch in a data pattern. On the other hand, when the voltage in the local match line ML is maintained at the precharged voltage level, it shows that all the data items in the data pattern are in a matching state. Therefore, by detecting the potential of the local match line ML, it is possible to detect a match/mismatch between a retrieval data pattern and a registered data pattern (to-be-retrieved data pattern).

When the data "0" is written in each of the storage nodes SNBL and SNBR of the operator cells UOEL and UOER, each of the cell currents ICELL and ICELR becomes smaller than the reference current Iref irrespective of the logic value of the retrieval data item A so that each of the sense currents ICELL and ICELR has a small value. In this state, a current is not supplied to the local match line ML via the local read line LRD, and a "don't care" state ("X" or "?") can be implemented. Therefore, by using the unit operator cells UOEL and UOER as the storage unit SUT, a TAM operation which effects ternary determination can be implemented.

Note that, as the sense amplifier 20, instead of the current-detection sense amplifier, a latch sense amplifier using cross-coupled P-channel MOS transistors and cross-coupled N-channel MOS transistors may also be used. In this case, the bit line current corresponds to the bit lines BL and BLB, and the potential of the bit line BL is received by the secondary sense amplifier 22, which drives the current supply circuit 24.

Figure 11:
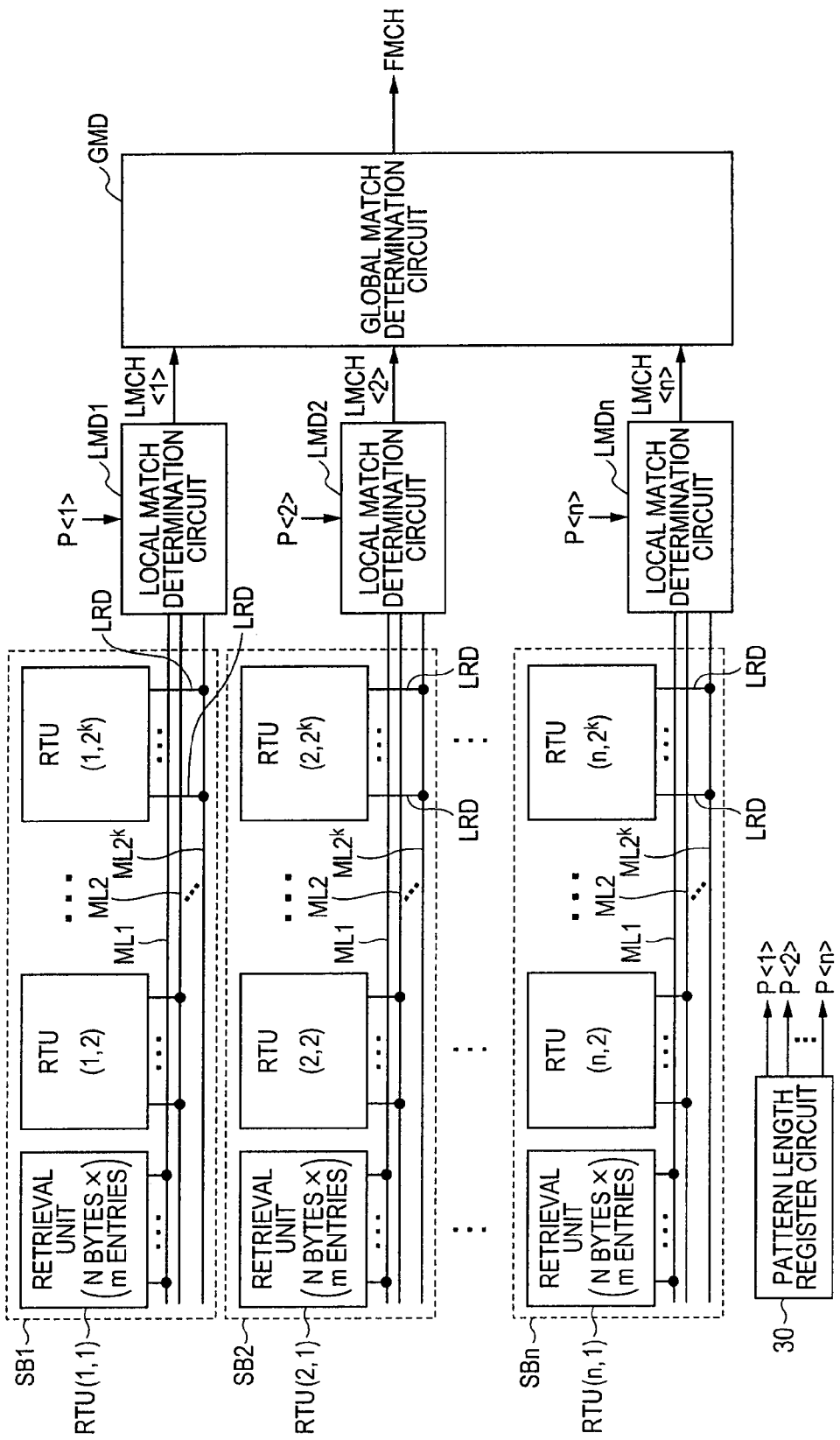
FIG. 11 is a view schematically showing a structure of a portion of the semiconductor signal processing apparatus according to Embodiment 1 of the present invention which is related to the reading of data.

FIG. 11 is a view schematically showing a structure of an operator cell mat in the semiconductor signal processing apparatus according to Embodiment 1 of the present invention. In FIG. 11, the operator cell mat is obtained by dividing the operator cell array into a plurality of sub-bocks SB1 to SBn. Each of the sub-blocks SB1 to SBn is divided into (k+1) retrieval units RTUs.

For example, the sub-block SB1 is divided into retrieval units RTU(1,1) to RTU(1,2^k), where ^ represents involution or exponentiation. The sub-block SB2 is divided into retrieval units RTU(2,1) to RTU(2,2^k), and the sub-block SBn is divided into retrieval units RTU(n,1) to RTU(n,2^k). Each of the retrieval units includes m entries each having an N-byte width.

In each of the sub-blocks SB1 to SBn, local match lines ML1, ML2, ..., and ML2^k are disposed correspondingly to the respective (k+1) retrieval units RTU(i,1) to RTU(i,2^k). The local match lines ML1 to Ml2^k are coupled to the respective local read data lines which receive respective outputs of the sense amplifier circuits of the corresponding retrieval units RTU(i,1) to RTU(i,2^k).

In each of the sub-blocks SB1 to SBn, local match determination circuits LMD1 to LMDn are provided correspondingly to the individual groups of local match lines ML1 to ML2^k. The local match determination circuits LMD1 to LMDn respectively select the corresponding groups of local match lines according to pattern length indication signals P<1> to P<n>, and generate local match determination signals LMCH<1> to LMCH<n> according to the potentials of the selected group of local match lines.

Commonly to the local match determination circuits LMD1 to LMDn, a global match determination circuit GMD is provided. The global match determination circuit GMD generates a final match determination signal FMCH according to the local match determination signals LMCH<1> to LMCH<n> from the local match determination circuits LMD1 to LMDn.

The pattern lengths of to-be-retrieved data patterns (registered patterns) stored in the respective sub-blocks SB1 to SBn are determined in advance. The pattern lengths of the to-be-retrieved data patterns (hereinafter referred to as the registered patterns) stored in the individual sub-blocks are stored in a pattern length register circuit 30. According to the pattern length indication signals P<1> to P<n> from the pattern length register circuit 30, signals paths for combinational logic gates in the local match determination circuits are selected.

Figure 12:
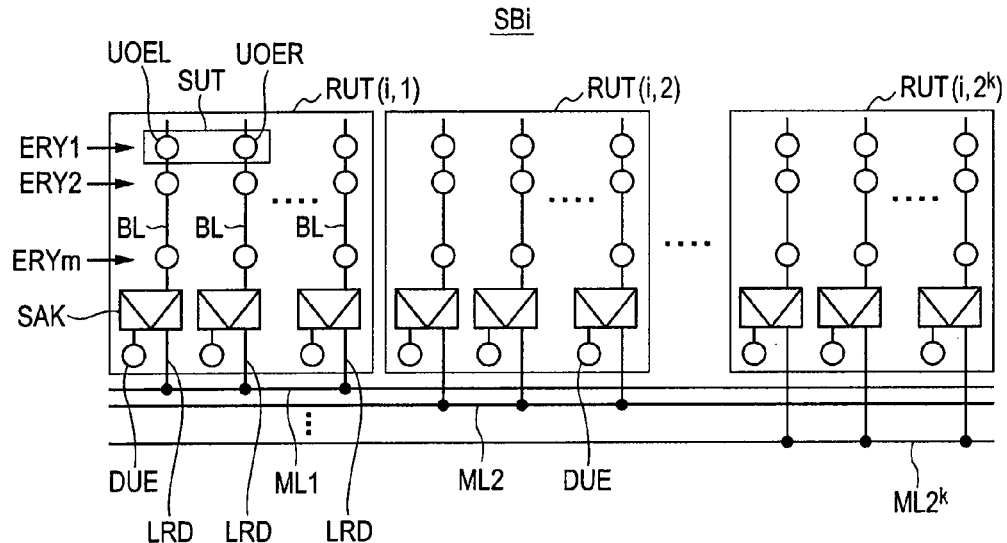
FIG. 12 is a view schematically showing a structure of each of the sub-blocks shown in FIG. 11.

FIG. 12 is a view more specifically showing a structure of each of the sub-blocks shown in FIG. 11. In FIG. 12, a sub-block SBi includes (k+1) retrieval units RUT(i,1) to RUT(i,2^k). For each of the retrieval units RUT(i,1) to RUT(i,2^k), the bit lines BL are disposed correspondingly to the respective columns of the operator cells UOEL and UOER. The pairs of operator cells UOEL and UOER form the individual storage units SUT. In the column direction, each of the retrieval units RUT(i,1) to RUT(i,2^k) is divided into m entries ERY1 to ERYm.

In FIG. 12, each of the retrieval units RUT(i,1) to RUT(i,2^k) has the same structure so that the same reference marks are given to the components of the retrieval unit RUT(i,1).

To the individual bit lines, a sense amplifier circuits SAK (SAKL or SAKR) are provided correspondingly. To the individual sense amplifier circuits SAK, the dummy cells DUE are disposed correspondingly. Output signals from the sense amplifier circuits SAK are transmitted to the local read data lines LRD provided correspondingly thereto.

To the individual retrieval units RUT(i,1) to RUT(i,2^k), the local match lines ML1 to ML2^k are provided correspondingly. To the local match line MLj, the local read data lines LRD of the corresponding retrieval unit RUT(i,j) are wired-OR coupled. Here, j is any of 1 to 2^k.

When the registered data pattern stored in each of the entries in the corresponding retrieval unit RUT(i,j) and the retrieval data pattern do not match, the voltage level of the local match line MLj rises. When the registered pattern and the retrieval data pattern match, the potential of the corresponding local match line MLj is maintained at the L level as the precharged voltage level.

Figure 13:
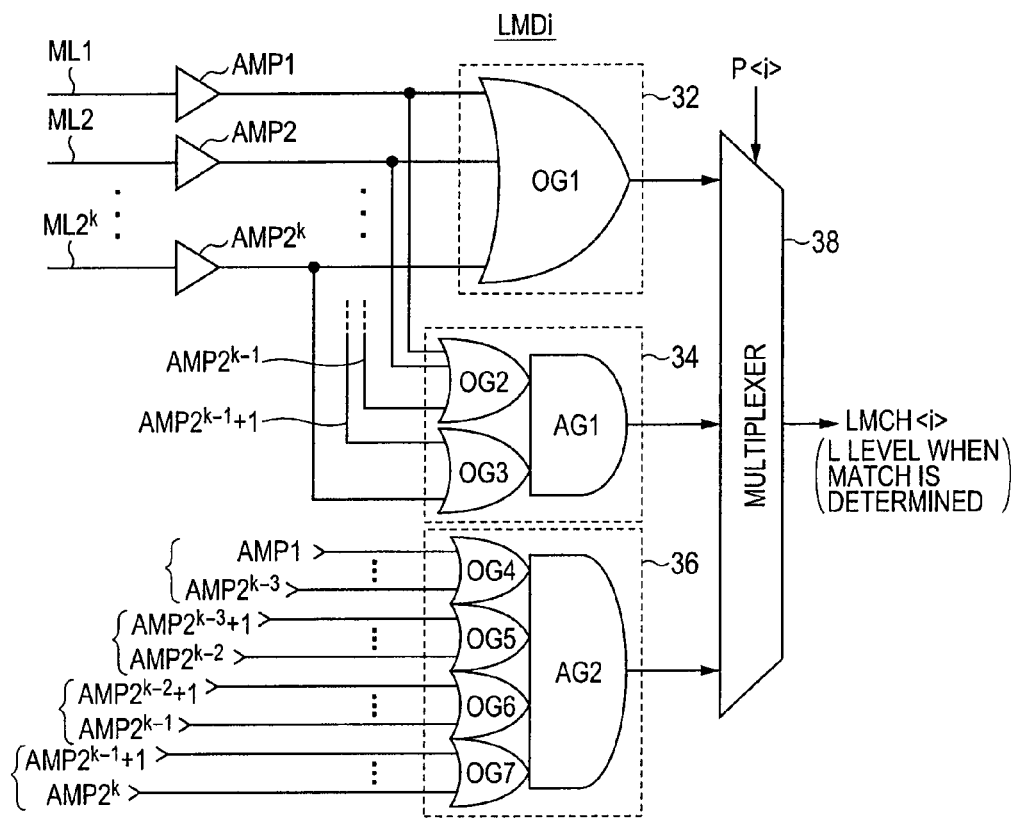
FIG. 13 is a view schematically showing a structure of each of the local match determination circuits shown in FIG. 11.

FIG. 13 is a view schematically showing a structure of each of the local match determination circuits shown in FIG. 11. In FIG. 13, a structure of a local match determination circuit LMDi disposed correspondingly to the sub-block SBi is representatively shown. Referring to FIG. 13, the local match determination circuit LMDi includes match line amplifiers AMP1 to AMP2^k provided correspondingly to the local match lines ML1 to ML2^k. The match line amplifiers AMP1 to AMP2^k amplify the potentials of the corresponding match lines ML1 to ML2^k upon activation thereof.

The local match determination circuit LMDi further includes, by way of example, an entire-pattern-length determination circuit 32, a L/2-pattern-length determination circuit 34, and a L/4-pattern length determination circuit 36 which are provided correspondingly to the output nodes of the match line amplifiers AMP1 to AMP2^k.

The entire-pattern-length determination circuit 32 includes an OR gate OGi which receives all the output signals from the match line amplifiers AMP1 to AMP2^k.

The L/2-pattern-length determination circuit 34 is formed of an AND/OR composite gate, and equivalently includes an OR gate OG2 which receives the output signals from the match line amplifiers AMP1 to AMP2^(k-1), an OR gate OG3 which receives the output signals from the match line amplifiers AMP2^((k-1)+1) to AMP2^k, and an AND gate AG1 which receives output signals from the OR gates OG2 and OG3.

The L/4-pattern-length determination circuit is formed of an AND/OR composite gate, and equivalently includes an OR gate OG4 which receives the output signals from the match line amplifiers AMP1 to AMP2^(k-3), an OR gate OG5 which receives the output signals from the match line amplifiers AMP2^((k-3)+1) to AMP2^(k-2), an OR gate OG6 which receives the output signals from the match line amplifiers AMP2^((k-2)+1) to AMP2^(k-1), an OR gate OG7 which receives the output signals from the match line amplifiers AMP2^((k-1)+1) to AMP2^k, and an AND gate AG2 which receives output signals from the OR gates OG4 to OG7.

In the local match determination circuit LMDi, a multiplexer 38 is further provided which selects among output signals from the determination circuits 32, 34, and 36 according to the pattern length indication signal P<i>, and generates the local match determination signal LMCH<i>.

The match line amplifiers AMP1 to AMP2^k amplify the respective output signals from the corresponding local match lines ML1 to ML^k. When each of the output signals from the local match lines ML1 to ML2^k is at the L level, it shows that the registered data pattern in each of the same entries in the corresponding retrieval units RUT(i,1) to RUT(i,2^k) matches the retrieval data pattern. When the registered data pattern and the retrieval data pattern match for the pattern of the entire pattern length L (=N·2^k) in this sub-block, an output signal from the entire-pattern-length determination circuit 32 is set at the L level.

When the length of the registered data pattern is L/2, and the registered data pattern and the retrieval data pattern match, an output signal from the L/2-pattern-length determination circuit 34 is set at the L level because the output signal from one of the OR gates OG2 and OG3 is set at the L level. As a result, it is detected that the retrieval data pattern matches the registered data pattern of the pattern length L/2.

When the length of the registered data pattern is L/4, in the L/4-pattern-length determination circuit 36, either of the output signals from the OR gates OG4 to OG 7 is set at the L level during retrieval, and the output signal is set at the L level. As a result, it is recognized that the given retrieval data pattern matches the registered data pattern of the L/4 pattern length.

In the multiplexer 38, by selecting among the output signals from the determination circuits 32, 34, and 36 according to the pattern length indication signal P<i> and thereby viewing the logic level of the local match determination signal LLCH<i>, it is possible to recognize a match/mismatch between the registered data pattern and the retrieval pattern for any of the registered data pattern lengths L, L/2, and L/4.

This allows a match between the retrieval data of an arbitrary pattern length and the registered data pattern to be detected.

Note that, the structure shown and described above is a structure when the pattern lengths are L, L/2, and L/4 and three. The number of the determination circuits varies depending on the types of the pattern lengths. When a minimum data pattern is L/2^M, (M+1) determination circuits are disposed, and 2^M OR gates are provided in each of the determination circuits to receive the output signals from the match line amplifiers disposed correspondingly to the different groups of local match lines. Each of the groups of local match lines include 2^k/2^M local match lines.

Figure 14:
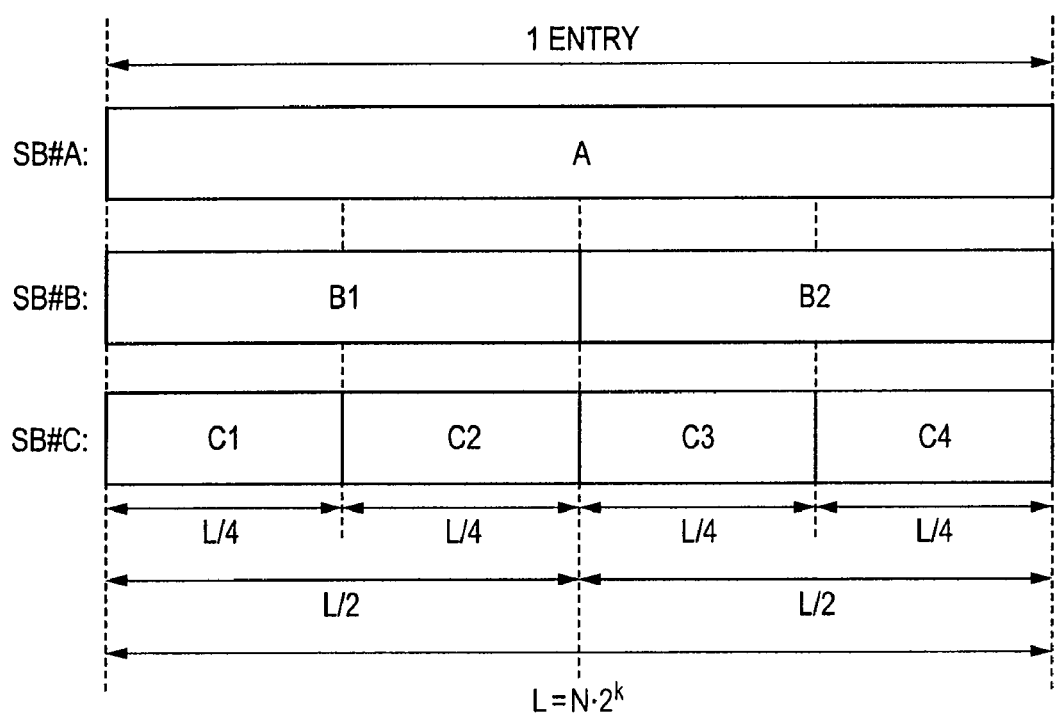
FIG. 14 is a view showing the pattern lengths of data patterns stored in entries in each of the sub-blocks.

FIG. 14 is a view schematically showing a to-be-retrieved data pattern (registered data pattern) which can be mapped into each of the entries in one sub-block. In FIG. 14, in a sub-block SUB#A, the registered data pattern A has the length L (=N·2^K bytes), and one pattern is stored in one entry.

In a sub-block SUB#B, patterns B1 and B2 each of the pattern length L/2 are stored in one entry so that the two registered patterns are stored in one entry. In a sub-block SUB#C, registered patterns C1 to C4 each of the pattern length L/4 are stored in one entry.

Thus, a plurality of to-be-retrieved data patterns can be mapped into one entry. Compared with the case where one to-be-retrieved data pattern (registered data pattern) is mapped into one entry, the number of the entries can be significantly reduced.

Figure 15:
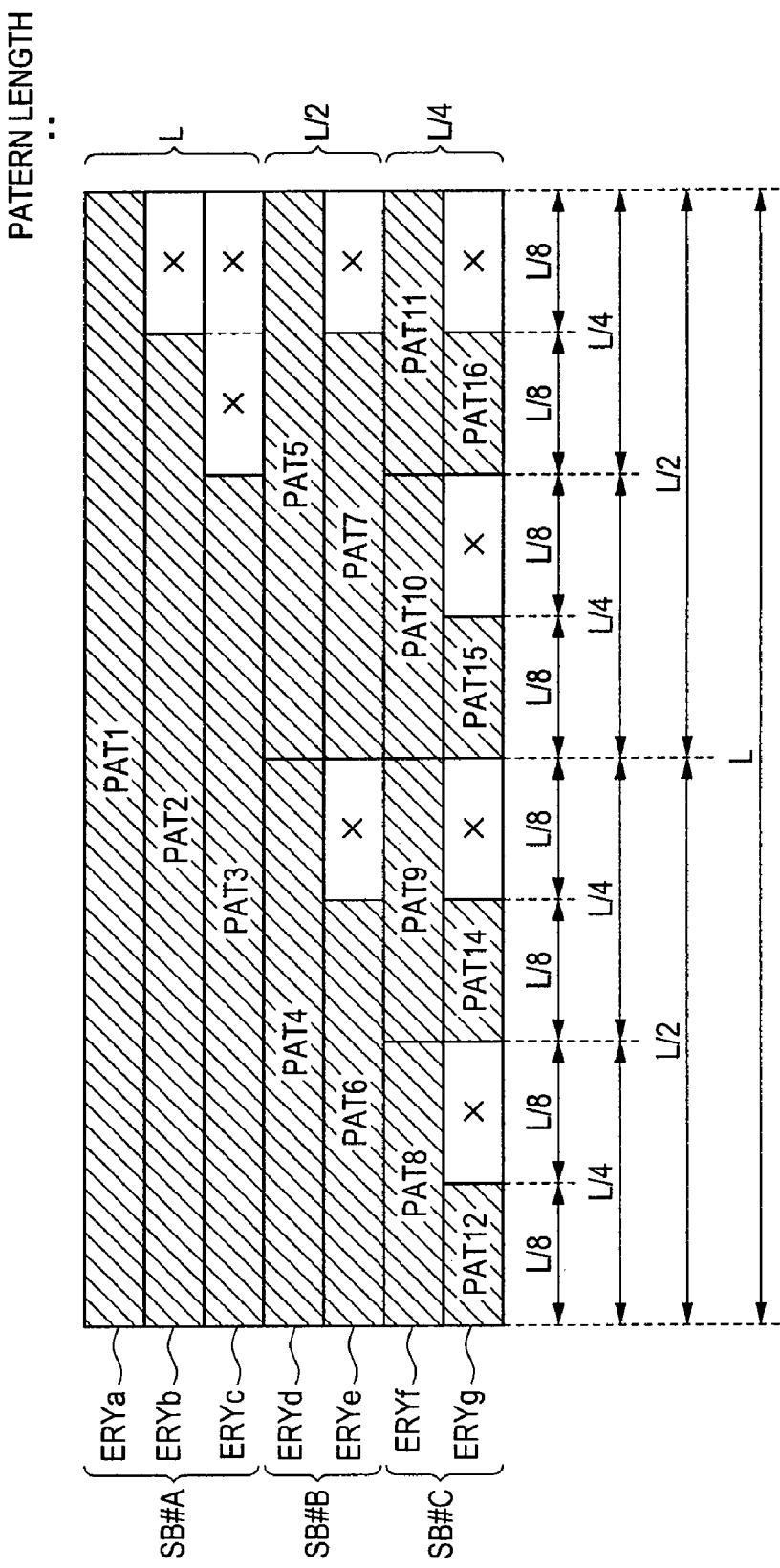
FIG. 15 is a view showing an example of the arrangement of to-be-retrieved data patterns stored in each of the sub-blocks.

FIG. 15 is a view showing a specific example of the mapping of a registered data pattern. In FIG. 15, by way of example, the pattern length L is allocated to the sub-block SB#A, and the pattern length L/2 is allocated to the sub-block SB#B. To the sub-block SB#C, the pattern length L/4 is allocated.

In the sub-block SB#A, in an entry ERYa, a registered data pattern PAT1 has the pattern length L so that the effective data is stored over the entire entry ERYa. A pattern PAT2 mapped into an entry ERYb has a length 7·L/8. In an entry ERYb, the remaining L/8 region is set into the "don't care (X)" state (the data "0" is stored in the storage node SNB of each of the operator cells UOEL and UOER). As for the setting of the "don't care" state, it will be described later in Embodiment 3. In an entry ERYc, a data pattern PAT3 to be registered has a length 3·L/4, and the remaining L/4-byte region is set into the "don't care" state. Accordingly, in the sub-block SB#A, the to-be-retrieved data patterns each of a pattern length ranging from L to L/2 can be stored.

In the sub-block SB#B, into an entry ERYd, to-be-retrieved patterns PAT4 and PAT5 each of the pattern length L/2 are mapped. Into an entry ERYe, a to-be-retrieved pattern of a pattern length 3·L/8 is mapped, and the remaining L/8-byte region is set into the "don't care" state. Into the second-half L/2 region, a to-be-retrieved pattern PAT7 of the pattern length 3·L/8 is mapped, and the remaining L/8-byte region is set into the "don't care" state.

In a sub-block SB#C, into an entry ERYf, to-be-retrieved patterns PAT8 to PAT11 each of the pattern length L/4 are mapped. In an entry ERYg, into the individual L/4-byte regions, to-be-retrieved patterns PAT12, PAT14, PAT15, and PAT16 each of the pattern length L/8 are stored. The remaining L/8-byte region is set into the "don't care" state. Accordingly, in the sub-block SB#C, the patterns each of a pattern length ranging from L/4 to L/8 can be stored.

As specifically shown in FIG. 15, in the seven entries ERYa to ERYg, the sixteen to-be-retrieved patterns PAT1 to PAT16 can be stored. This can significantly reduce the number of the entries compared with that in a structure in which one to-be-retrieved pattern is stored in one entry, and sixteen entries are needed.

Figure 16:
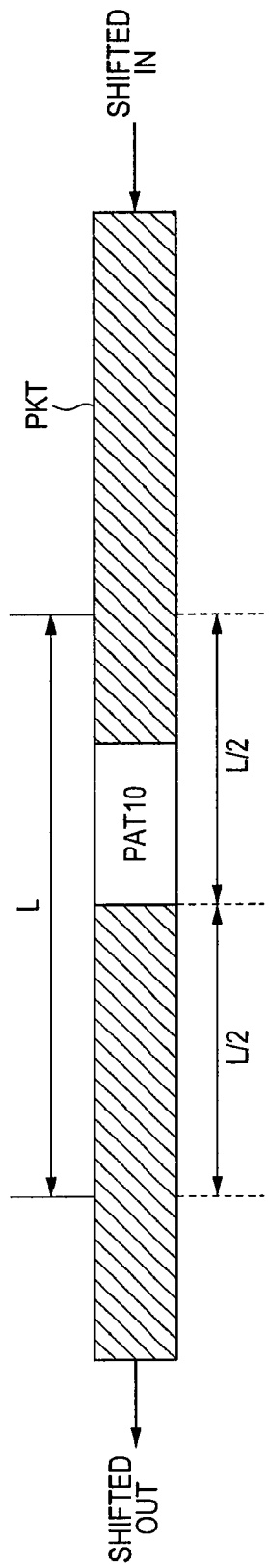
FIG. 16 is a view schematically showing an input sequence of retrieval data during a retrieving operation.

FIG. 16 is a view schematically showing a form of the inputting of a retrieval pattern during a retrieving operation. In FIG. 16, an L-byte data pattern is taken in from a data packet PKT included in a payload, and given in parallel as retrieval data to the individual sub-blocks. The data packet PKT is shifted in and shifted out by, e.g., 1 byte in each retrieving operation. Accordingly, when the data pattern PATIO is included in the retrieval data pattern and located at a position away from the head position by L/2 bytes, a match can be detected in the entry ERYf shown in FIG. 15, and it can be detected that the same pattern as the registered pattern PATIO is included in the data packet PKT. As a result, the data packet can be identified as a malicious unauthorized access data packet.

Figure 17A:
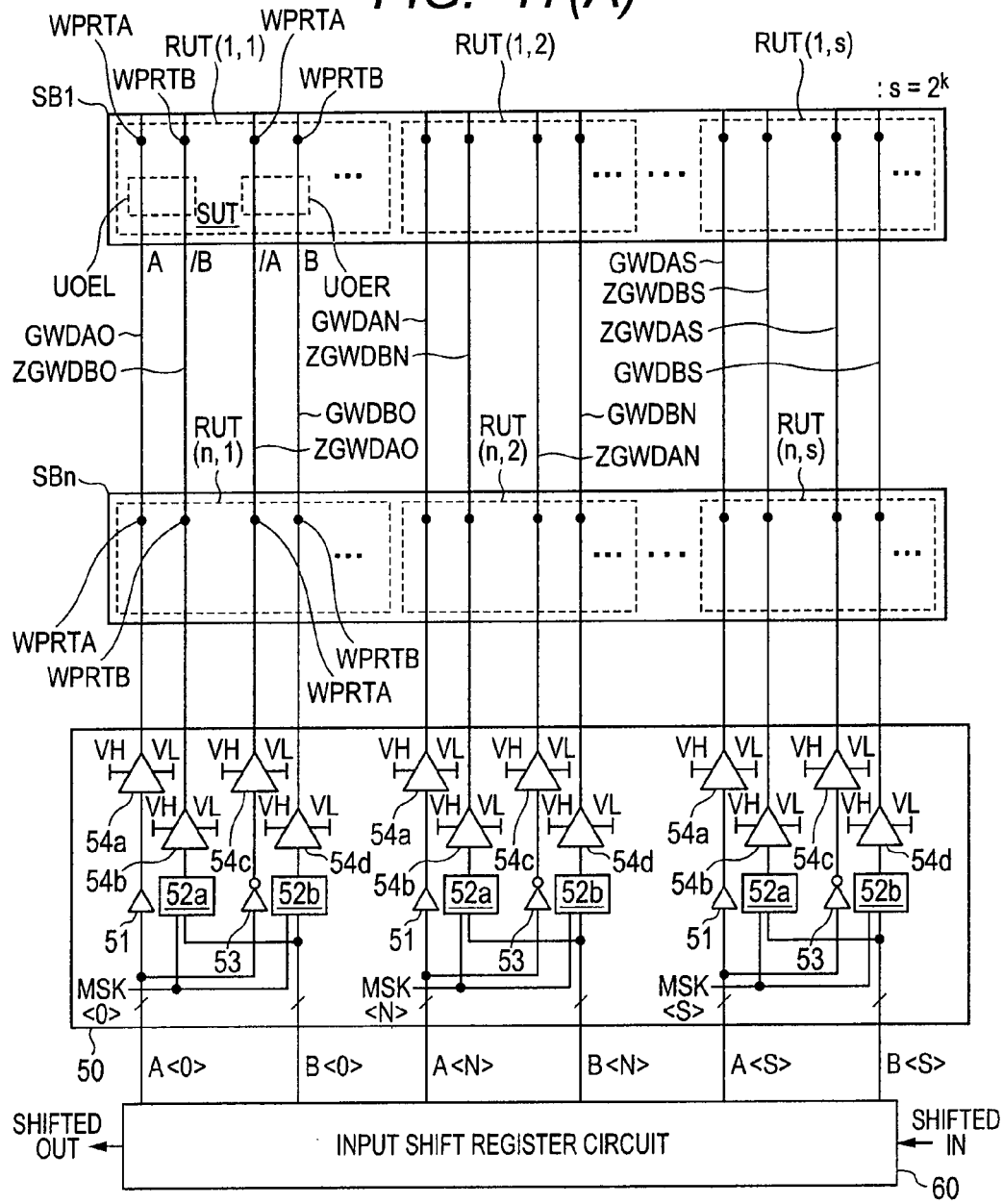
FIG. 17(A) is a view showing a structure of a portion of the semiconductor signal processing apparatus according to Embodiment 1 of the present invention which is related to the writing of data.
Figure 17B:
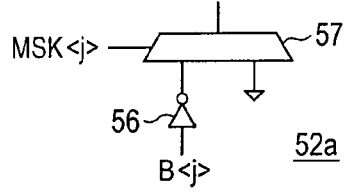
FIG. 17(B) is a view showing a structure of the L-select masking circuit shown in FIG. 17(A)
Figure 17C:
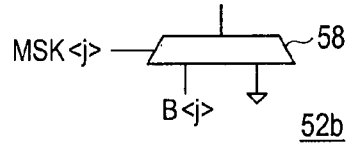
FIG. 17(C) is a view showing a structure of the R-select masking circuit shown in FIG. 17(A)

FIGS. 17(A) to 17(C) are views each schematically showing a structure of a data writing portion of the semiconductor signal processing apparatus according to Embodiment 1 of the present invention. In FIG. 17(A), a data path 50 is provided commonly to the sub-blocks SB1 to SBn. To the data path 50, data bits A<0>, B<0>, ..., A<N>, B<N>, ..., A<S>, B<S> ... are given from an input shift register circuit 60. By a shifting operation in the input shift register circuit 60, an input packet is shifted on a per byte basis, and a match/mismatch between a registered data pattern and an input data pattern is detected.

The sub-block SB1 is divided into retrieval units RUT(1,1) to RUT(1,s) each having an N-byte width. Likewise, the sub-block SBm is also divided into retrieval units RUT(n,1) to RUT(n,s) each having an N-byte width. Here, s is 2^k.

Commonly to the retrieval units RUT(1,1) to RUT(n,1) disposed to be aligned in the column direction, global write data lines GWDA0, ZGWDB0, ZGWDA0, and GWDB0 are provided, and correspondingly to the storage unit of the operator cells UOEL and UOER. The global write data line GWDA0 is coupled to the write A port WPRTA of the left operator cell UOEL, and the global write data line ZGWDB0 is coupled to the write B port WPRTB of the left operator cell UOEL. The global write data line ZGWDA0 is coupled to the write A port WPRTA of the right operator cell UOER, and the global write data line GWDB0 is coupled to the write B port WPRTB of the right operator cell UOER.

Commonly to the retrieval units RUT(1,2) to RUT(n,2) disposed to be aligned in the column direction, global write data lines GWDAN, ZGWDAN, ZGWDBN, and GWDBN are provided. Commonly to the retrieval units RUT(1,s) to RUT(n,s) disposed to be aligned in the column direction, global write data lines GWDAS, ZGWDAS, ZGWDBS, and GWDBS are provided. Global write data is coupled to the write A port and write B port of the corresponding column. However, in FIG. 17(A), for simpler illustration, the coupling is not shown clearly in each of the retrieval unit columns.

In the data path 50, write circuits having individual structures are provided correspondingly to the respective storage unit columns of the retrieval unit columns. In FIG. 17(A), components corresponding to each of the storage unit columns of the retrieval unit columns are provided with same reference numerals.

The data path 50 includes a buffer 51 which receives the data bit A<0>, an L-select masking circuit 52a which receives the data bit B<0>, an inverter 53 which receives the data bit A<0>, an R-select masking circuit 52b which receives the data bit B<0>, and level shifters 54a to 54d which level-shift the data bits given individually thereto.

As shown in FIG. 17(B) which shows a structure of the L-select masking circuit 52a, the L-select masking circuit 52a includes an inverter 56 which receives a data bit B<j> (=B<0>), and a multiplexer 57 which selectively passes one of the ground voltage (GND) and an output signal from the inverter 56 according to a masking indication signal MSK<j> (j=0). When the masking indication signal MSK<j> is, e.g., "1", and indicates data write masking, the multiplexer 57 selects the ground voltage. When the masking indication signal MSK<j> is, e.g., "0", and indicates non-masking, the multiplexer 57 selects inverted data /B<j> from the inverter 56.

As shown in FIG. 17(C) which shows an example of a structure of the R-select masking circuit 52b, the R-select masking circuit 52b includes a multiplexer 58 which selectively passes one of the data bit B<j> and the ground voltage according to the masking indication signal MSK<j>. The multiplexer 58 selects the ground voltage when the masking indication signal MSK<j> indicates write masking, and otherwise selects the data bit B<j>.

By transferring data at the ground voltage level during write masking, the data "0" is written to the corresponding operator cell, and set into the same state as the initially set state. Each of the storage nodes SNBL and SNBR is set to a state where the data "0" is stored, and data writing is equivalently prohibited. By masking a region where to-be-retrieved data is not written during the registration of a data pattern (during the writing of the to-be-retrieved data pattern), the no registration region is set into the "don't care" state to be prevented from affecting a retrieving operation. The masking indication signal MSK<j> is set for each data bit B<j> on a one-by-one basis.

The level shift circuit 54a receives an output signal (data bit) from the buffer 51, and transfers the level-shifted signal to the global write data line GWDA0. The level shift circuit 54b receives an output signal from the L-select masking circuit 52a, and transfers the level-shifted signal onto the global write data line ZGWB0. The level shift circuit 54c receives an output signal from the inverter 53, and transfers the level-shifted signal onto the global write data line ZGWDA0. The level shift circuit 54d receives an output signal from the R-select masking circuit 52b, and transfers the level-shifted signal onto the global write data line GWDB0.

The HIGH-side power source voltage of each of the level shift circuits 54a to 54d is a voltage VH, while the LOW-side power source voltage thereof is a voltage VL. The voltage VH is a positive voltage lower than the built-in voltage of the PN junction of a SOI transistor, while the voltage VL is a negative voltage. In this manner, the voltage levels of the storage nodes (SNA and SNB) are to "0" and "1", and a leakage current is prevented from occurring due to the conduction of the PN unction in the body region and destroying stored data.

For the data bits A<N> and B<N> also, the buffer 51, the inverter 53, the select masking circuits 52a and 52b, and the level shift circuits 54a to 54d are similarly provided. For the data bits A<S> and B<S> also, the buffer 51, the inverter 53, the select masking circuits 52a and 52b, and the level shift circuits 54a to 54d are similarly provided.

With the structure of each of the write circuits in the data path 50, the data items A and /B are stored in the storage nodes SNAL and SNBL of the left operator cell UOEL, and the data items /B and A are stored in the storage nodes SNBR and SNAR of the right operator cell UOER.

Note that, when the length of a registered data pattern is shorter than the allocated pattern length in each of the sub-blocks, the region where effective data is not stored is set into the "don't care" state by write masking, as described above.

In the initial state, all the operator cells UOE are set into the "don't care" state. During the mapping of the to-be-retrieved data pattern, the no write region is masked during data writing. The masking indication signal MSK<j> can be set on a per bit basis. Therefore, the pattern length of the registered data pattern is also adjusted on a per bit basis, and various data patterns can stored.

As a structure for generating the masking indication signal MSK on a per bit basis, the following structure is used. That is, in the input shift register circuit 60, circuits for transferring mask bits correspondingly to the individual data pattern bits are provided, and the masking indication signals MSK for the individual bits are generated with the mask bit transfer paths.

Figure 18:
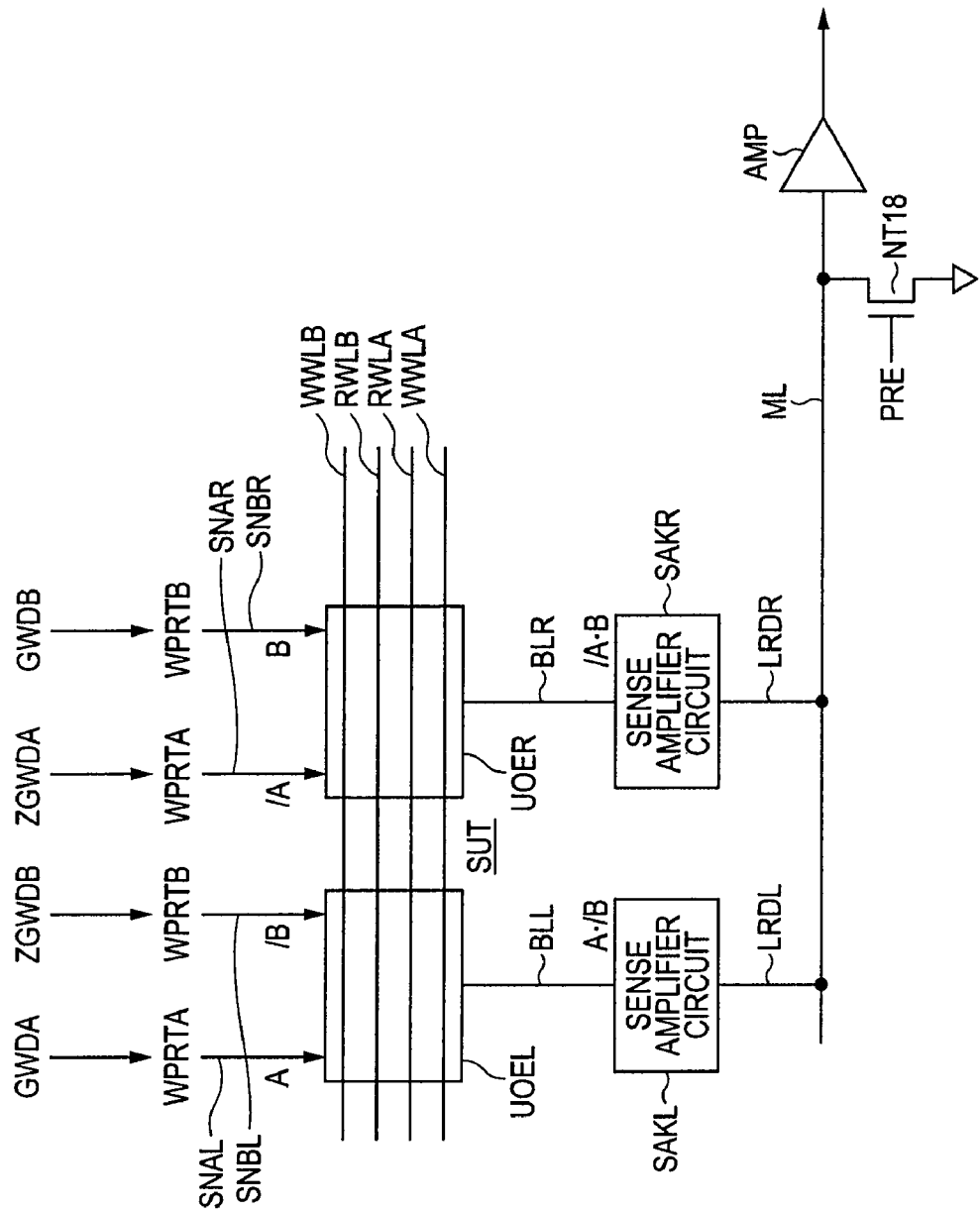
FIG. 18 is a view schematically showing a transfer path for write data and read data in the semiconductor signal processing apparatus according to Embodiment 1 of the present invention.

FIG. 18 is a view schematically showing the paths of data writing and reading to and from the one storage unit SUT. In FIG. 18, the global write data line GWDA and ZGWDB transmit the data items A and /B to the storage nodes SNAL and SNBL of the left operator cell UOEL via the respective write ports WPRTA and WPRTB. The global write data lines ZGWDA and GWDB transmit the data items /A and B to the storage nodes SNAR and SNBR of the right operator cell UOER via the respective write ports WPRTA and WPRTB.

Commonly to the operator cells UOEL and UOER, the write word lines WWLB and WWLA and the read word lines RWLA and RWLB are provided. The operator cells UOEL and UOER are coupled to the respective bit lines BLL and BLR, and transmit currents corresponding to the data items A·/B and /A·B to the respective bit lines BLL and BLR during data reading (during retrieval). The bit lines BLL and BLR are coupled to the respective sense amplifier circuits SAKL and SAKR. The sense amplifier circuits SAKL and SAKR selectively supply currents to the corresponding local match line ML via the corresponding local read data lines LRDL and LRDR based on the result of retrieval. For the local match line ML, the match line amplifier AMP is provided to amplify the result of retrieval.

The local match line ML is precharged by a precharge transistor NT18 to, e.g., the ground voltage level. During a retrieving operation, a precharge indication signal PRE is set at the L level, the precharge transistor NT18 is brought into the OFF state, and the local match line ML is brought into a floating state at the precharge voltage level. If a current is selectively supplied from the sense amplifier circuit SAKL or SAKR to the local match line ML brought into the floating state based on the result of retrieval, the potential of the local match line ML rises. On the other hand, when the retrieval data matches the to-be-retrieved data, a current is not supplied to the local match line ML so that the local match line ML maintains the precharged voltage level. As a result, the potential of the local match line ML is amplified by the match line amplifier AMP so that a binary signal is generated. Therefore, when there is a match, an output signal from the match line amplifier AMP is at the L level, and the occurrence of a match can be recognized.

Accordingly, in the structure of the memory mat shown in FIG. 18, the local match lines (ML1 to ML2^k) are provided in each of the sub-blocks SB1 to SBn, and retrieving operations can be executed in parallel. In each of the sub-blocks SB1 to SBn, m entries are successively selected and retrieval is performed. By performing retrieval to one entry in one clock cycle, the results of retrieval for retrieval data can be produced in m clock cycles.

Figure 19:
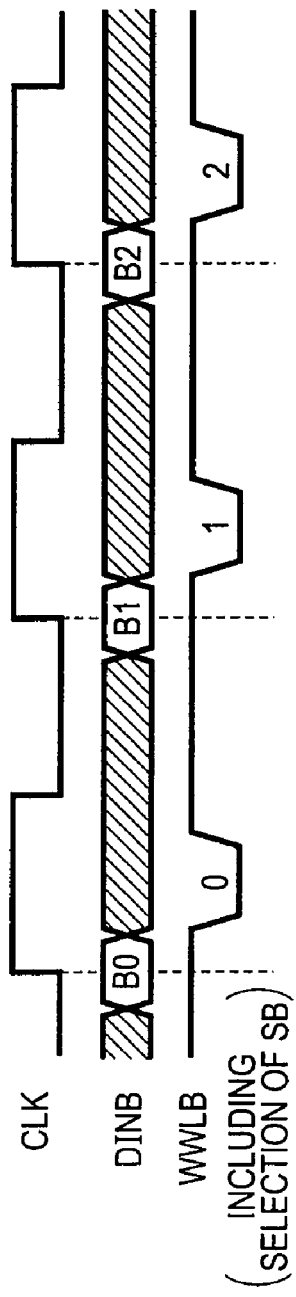
FIG. 19 is a timing chart showing an operation of writing a to-be-retrieved pattern in Embodiment 1 of the present invention.

FIG. 19 is a timing chart showing a write operation during the mapping of to-be-retrieved data. As shown in FIG. 19, during the writing of the to-be-retrieved data, data items B0, B1, and B2 are each loaded as to-be-retrieved data DINB from the outside into the input shift register circuit 60 in synchronization with the rising edges of a clock signal CLK. When write data is transmitted from the data path 50 to each of the corresponding global write data lines according to write data from the input shift register circuit 60, the B-port write word lines WWLB are successively driven into the selected state, and the data items B0, B1, B2, . . . are each written into the storage nodes SNBL and SNBR of the operator cells UOEL and UOER via the write B ports WPRTB.

During the selection of the write word lines WWLB, the writing of retrieval data is performed to one entry in one sub-block so that the one sub-block SB is selected according to a block select signal, and the B-port write word lines are selected in the selected sub-block.

During the data writing, it is also possible that the input data DINB may be formed of a plurality of data patterns, and the plurality of to-be-retrieved patterns each having a pattern length different from the size of one entry may be stored in parallel in one entry in the corresponding sub-block. As described above, during the registration of the data pattern having a pattern length different from the size of one entry, the no write region is masked from writing with the masking indication signal MSK, and maintained in the "don't care" state.

Figure 20:
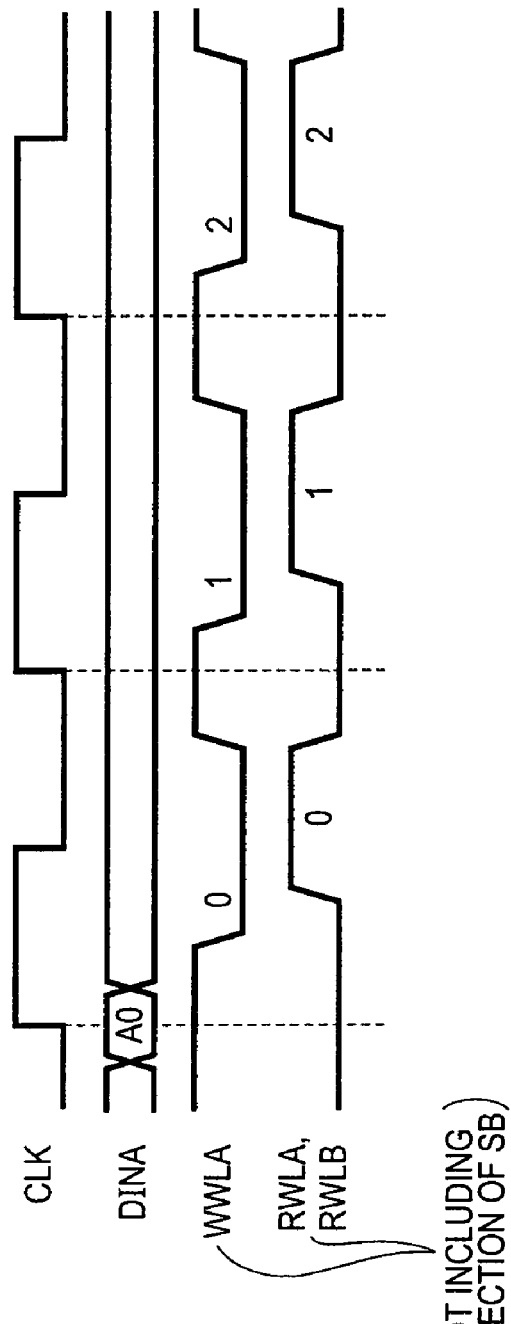
FIG. 20 is a timing chart showing a retrieving operation in Embodiment 1 of the present invention.

FIG. 20 is a timing chart showing an operation during a retrieval mode. In the retrieval mode, in synchronization with the clock signal CLK, the retrieval data DINA is loaded into the input shift register circuit on the rising edge of the clock signal CLK. At this time, in the input register circuit, shift-in and shift-out operations are performed so that the retrieval data is successively extracted, and given to the data path 50. In FIG. 20, the case where a retrieval data item A0 is given is shown as an example.

Thereafter, the A-port write word line WWLA is driven into the selected state, and complementary bits for the data item A0 are written to the storage nodes SNAL and SNAR of the operator cells UOEL and UOER. After the writing, in a state where the data items written in the storage nodes SNAL and SNAR are stabilized, the read word lines RWLA and RWLB are driven into the selected state. By maintaining the write word line WWLA in the selected state during reading, it is possible to prevent a potential change in the write word line WWLA from affecting the data items stored in the storage nodes SNAL and SNAR due to capacitive coupling, and stably and accurately read cell currents corresponding to the written data and the registered data to the corresponding bit lines BLL and BBLR.

During the retrieval, when the retrieval data A0 is given, the selection of the write word line WWLA and the read word lines RWLA and RWLB is repeatedly executed with respect to different entries till the retrieval to each of the m entries is completed (the m entries are successively selected).

During the retrieving operation, retrieval is executed in parallel in the sub-blocks SB1 to SBn so that, in an address signal for selecting the A-port write word lines and the read word lines RWLA and RWLB, information specifying the sub-block SB is not included. This allows retrieval of registered patterns having different pattern lengths to be executed in parallel in the individual sub-blocks.

Figure 21:
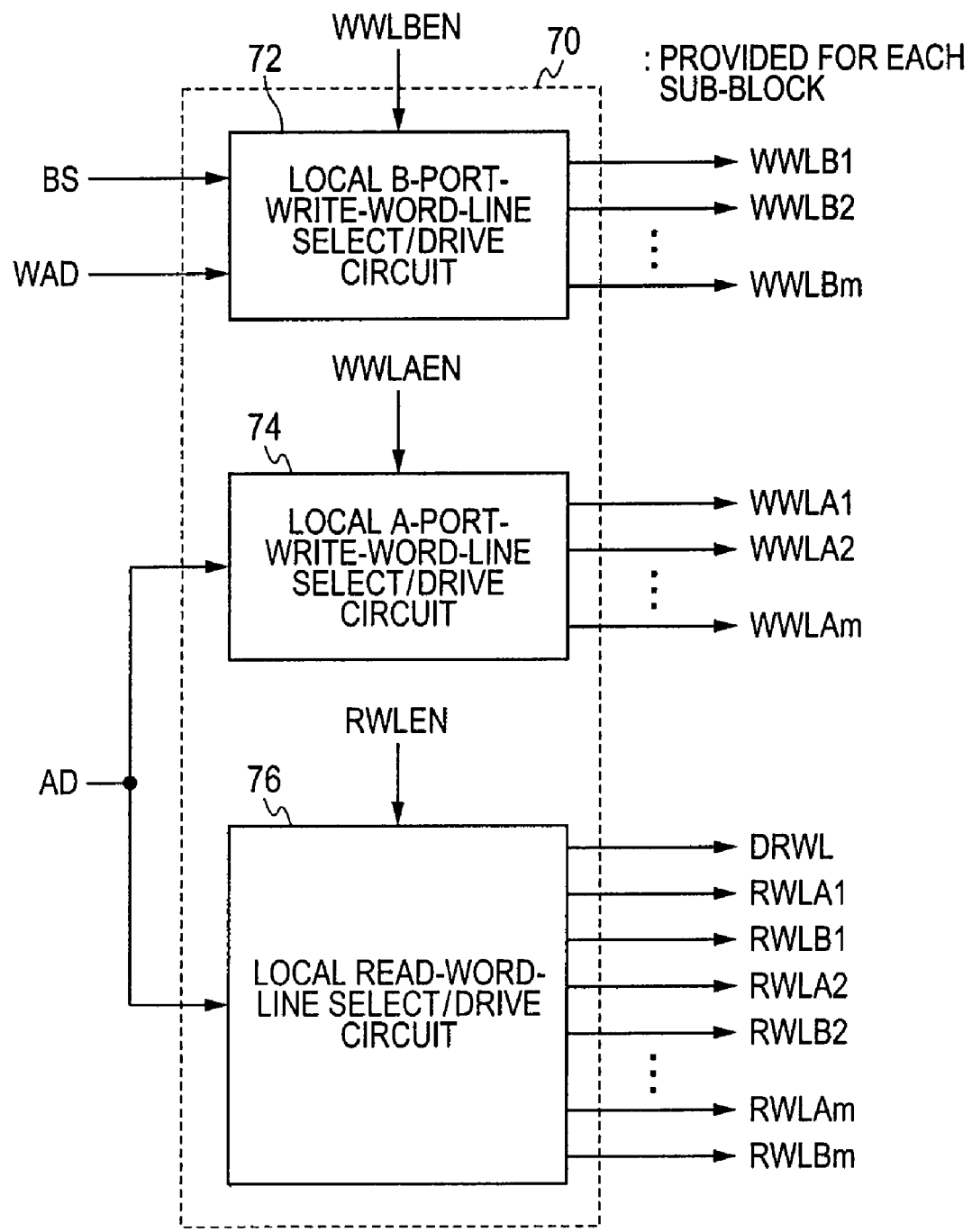
FIG. 21 is a view schematically showing an example of a structure of a local row select/drive circuit in the semiconductor signal processing apparatus according to Embodiment 1 of the present invention.

FIG. 21 is a view schematically showing a structure of a local row select/drive circuit provided correspondingly to each of the sub-blocks. In FIG. 21, a local row select/drive circuit 70 includes a local B-port-write-word-line select/drive circuit 72, a local A-port-write-word-line select/drive circuit 74, and a local read-word-line select/drive circuit 76. The local B-port-write-word-line select/drive circuit 72 is enabled when a block select signal BS shows the corresponding sub-block, decodes a write address signal WAD in response to the activation of a B-port-write-word-line enable signal WWBEN, and drives the B-port write word line among B-port write word lines WWLB1 to WWLBm that corresponds to the specified row into the selected state. The block select signal BS specifies any of the sub-blocks SB1 to SBn. In this manner, in the selected sub-block, to-be-retrieved data B transmitted via the global write word lines can be stored in the selected entry.

The local A-port-write-word-line select/drive circuit 74 decodes a word-line address signal AD given in response to the activation of an A-port-write-word-line enable signal WWAEN, and drives the A-port write word line among A-port write word lines WWA1 to WWAm that corresponds to the specified row into the selected state. To the local A-port-write-word-line select/drive circuit 74, the block select signal SB is not given. During a retrieving operation, in the plurality of sub-blocks SB1 to SBn, the A-port write word lines are driven in parallel into the selected state.

The local read-word-line select/drive circuit 76 decodes the word-line address signal AD in response to the activation of a read-word-line enable signal RWLEN, and drives the read word lines (A-port and B-port) among read word lines RWLA1 and RWLB1 to RWLAm and RWLBm) that correspond to the specified row into the selected state.

The word-line address signal AD during retrieval corresponds to the write-word-line address signal WAD and, in the same manner as to the local A-port-word-line select/drive circuit 74, the block select signal BS is not given to the local read-word-line select/drive circuit 76. As a result, in the sub-blocks SB1 to SBn, the word lines (write and read word lines) positioned in the same row are driven into the selected state, and the writing of the retrieval data and the reading of the results of retrieval are performed in parallel.

Figure 22:
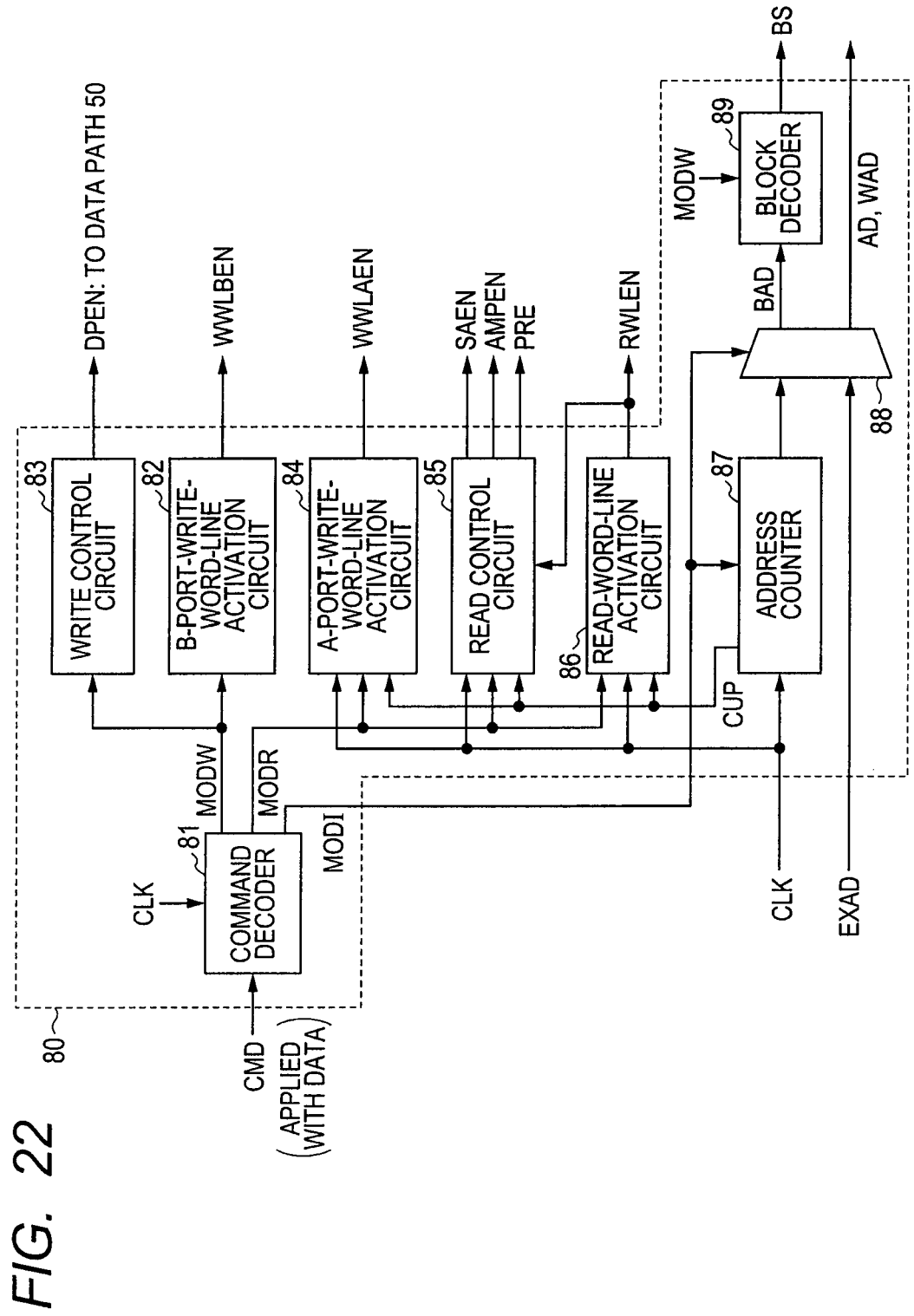
FIG. 22 is a view schematically showing an example of a structure of a control circuit in the semiconductor signal processing apparatus according to Embodiment 1 of the present invention.

FIG. 22 is a view schematically showing a structure of a control circuit provided commonly to the sub-blocks SB1 to SBn. In FIG. 22, a control circuit 80 includes a command decoder 81 for decoding a command CMD given with data in synchronization with the rising edge of the clock signal CLK, and a write control circuit 83 and a B-port-write-word-line activation circuit 82 which are enabled following a write mode indication MODW from the command decoder 81.

The write control circuit 83 gives a data path enable signal DPEN to the data path 50 with a predetermined timing upon activation of the write mode indication MODW to enable the level shift circuits (54a to 54d), the buffers 51, and the inverters 53 that are included in the data path 50 (in the structure of the data path shown in FIG. 17, the data path enable signal DPEN is not shown). The B-port-write-word-line activation circuit 82 asserts (activates) a B-port-write-word-line enable signal WWBEN with a predetermined timing for a predetermined period upon activation of the write mode indication MODW.

The control circuit 80 further includes an A-port-write-word-line activation circuit 84, a read control circuit 85, and a read-word-line activation circuit 86. When activated, the A-port-write-word-line activation circuit 84 asserts an A-port-word-line activation signal WWLAEN with a predetermined timing. The read control circuit 85 activates the sense amplifier activation signal SAEN and a match-line-amplifier enable signal AMPEN each with a predetermined timing, and inactivates the match-line precharge indication signal PRE upon activation of a read mode indication MODR. The read control circuit 85 activates the sense amplifier activation signal SAEN and the match-line-amplifier enable signal AMPEN using the activation timing of the read-word-line enable signal RWEN from the read-word-line activation circuit 86 as a reference. The match-line amplifier AMP disposed correspondingly to each of the local match lines ML is enabled when the match-line-amplifier enable signal AMPEN is asserted, and amplifies the voltage in the corresponding local match line, though not shown in the drawings described heretofore.

Note that, when the activation of the secondary sense amplifier (22) included in the sense amplifier circuit SAK is performed in accordance with the activation of the sense amplifier activation signal SAEN, the read control circuit 85 generates an activation control signal for the secondary sense amplifier (22).

The control circuit 80 further includes an address counter 87, a multiplexer 88 which selects one of an output address signal from the address counter 87 and an address signal EXAD from the outside, and a block decoder 89 which decodes a block address BAD from the multiplexer 88 upon activation of the write mode indication MODW.

The address counter 87 is enabled when an internal address generation indication MODI from the command decoder is asserted, performs a counting operation in synchronization with the clock signal CLK, outputs the count value thereof as an address, and asserts a count-up signal CUP when the count value becomes equal to the number m of the entries. Before the count-up CUP from the address signal 87 is asserted, the activation circuits 84 and 86 and the read control circuit 85 are enabled by the clock signal CLK as a trigger, and individually assert the corresponding enable signal/activation signals each with a predetermined timing. The internal address generation indication MODI is asserted during successive writing of to-be-retrieved data to the individual entries and during a retrieving operation. During additional registration of a to-be-retrieved data pattern, the internal address generation indication MODI is not asserted.

The multiplexer 88 selects the output address from the address counter 87 when the internal address generation mode MODI is asserted. The counter address from the address counter 87 includes a block address specifying a sub-block and a word line address specifying an entry in the sub-block. The block address BAD from the selection circuit 88 is given to the block decoder 89. The block decoder 89 is enabled when the write mode indication MODW is asserted, and decodes the given block address signal to generate the block select signal BS. During data reading, the block decoder 89 does not perform a decoding operation so that the block select signal BS is not generated.

The lower-order address of the counter address from the counter 87 is used as the write-word-line address AD during the application of the read indication signal and as the write-word-line address WAD during writing. Here, the purpose for using the mark AD during reading and using the mark WAD during writing each for the word-line address signal is to show that the block select signal is not generated during reading, but the block select signal is generated during writing. These are the same word-line address signal.

The purpose for using the external address signal EXAD is to specify, when a new to-be-retrieved pattern is additionally mapped, for example, an address where the additional to-be-retrieved pattern is registered according to the external address signal EXAD. Accordingly, the external address signal EXAD includes the block address. The internal mode indication MODI is asserted when writing for additionally registering the new to-be-retrieved pattern or an operation of reading the content of a specified entry during testing is executed.

The command CMD is given in synchronization with the data item A or B from the outside. As a result, during data writing, i.e., during the writing of to-be-retrieved patterns, the write control circuit 83 and the B-port-write-word-line activation circuit 82 are each activated following the write mode indication MODW generated following a write command from the command decoder to activate the data path enable signal DPEN and the B-port-write-word-line enable signal WWBEN. In each cycle, a to-be-retrieved data pattern can be written to the storage node SNB of each of the entries.

On the other hand, during a mode in which retrieval is performed, the read mode indication MODR is asserted. At this time, the individual entries are successively specified according to the count value from the address counter 87, and retrieving operations are successively performed in the entries ERY1 to ERYm. When retrieval in the final entry ERYm is completed, the count-up signal CUP from the address counter 87 is asserted. While the count-up indication signal CUP is in a negated state, the A-port-write-word-line activation circuit 84, the read control circuit 85, and the read-word-line activation circuit 86 assert the respective corresponding control signals using the rising edge of the clock signal CLK as a trigger. As a result, when one retrieval data item DINA is given, retrieving operations are performed successively in the individual entries ERY1 to ERYm, the count-up signal CUP is asserted after the completion of the retrieving operations in the m entries, and selecting operations are halted in the entries in the individual sub-blocks. In a halt cycle, new retrieval data is given with a read command. Retrieving operations for the new retrieval data are repeatedly executed to the m entries.

Note that the lengths of the registered data patterns in the individual sub-blocks are stored in the pattern length register circuit 30 shown in FIG. 11. In this case, written data items from the outside are successively transferred to the pattern length register circuit according to a command or, when the lengths of the registered data patterns are fixedly determined, they are fixedly programmed using a fuse element or the like.

Thus, according to Embodiment 1 of the present invention, the pattern lengths of to-be-retrieved patterns stored in the entries can be changed, and the plurality of to-be-retrieved data patterns can be stored in one entry. This allows a larger number of to-be-retrieved data patterns to be stored without increasing the number of the entries, and allows match/mismatch detection to be performed for numerous patterns without increasing an area occupied by the operator cell array. By applying Embodiment 1 of the present invention, a system with higher reliability can be configured in a NIDS or the like.

Note that the pattern length of to-be-retrieved data is not limited to the pattern lengths described above. Depending on a use application, a shorter pattern length such as L/32 may also be used. The determination circuits in the local match determination circuit LMDi may be provided appropriately according to pattern lengths.

In addition, when a match occurs, by reading the corresponding entry address (generated from the address counter) to the outside of the apparatus, it is possible to recognize in which entry the match has occurred. When a plurality of data patterns are stored in one entry, candidates for a matching data pattern can be extracted.

Embodiment 2

Figure 23:
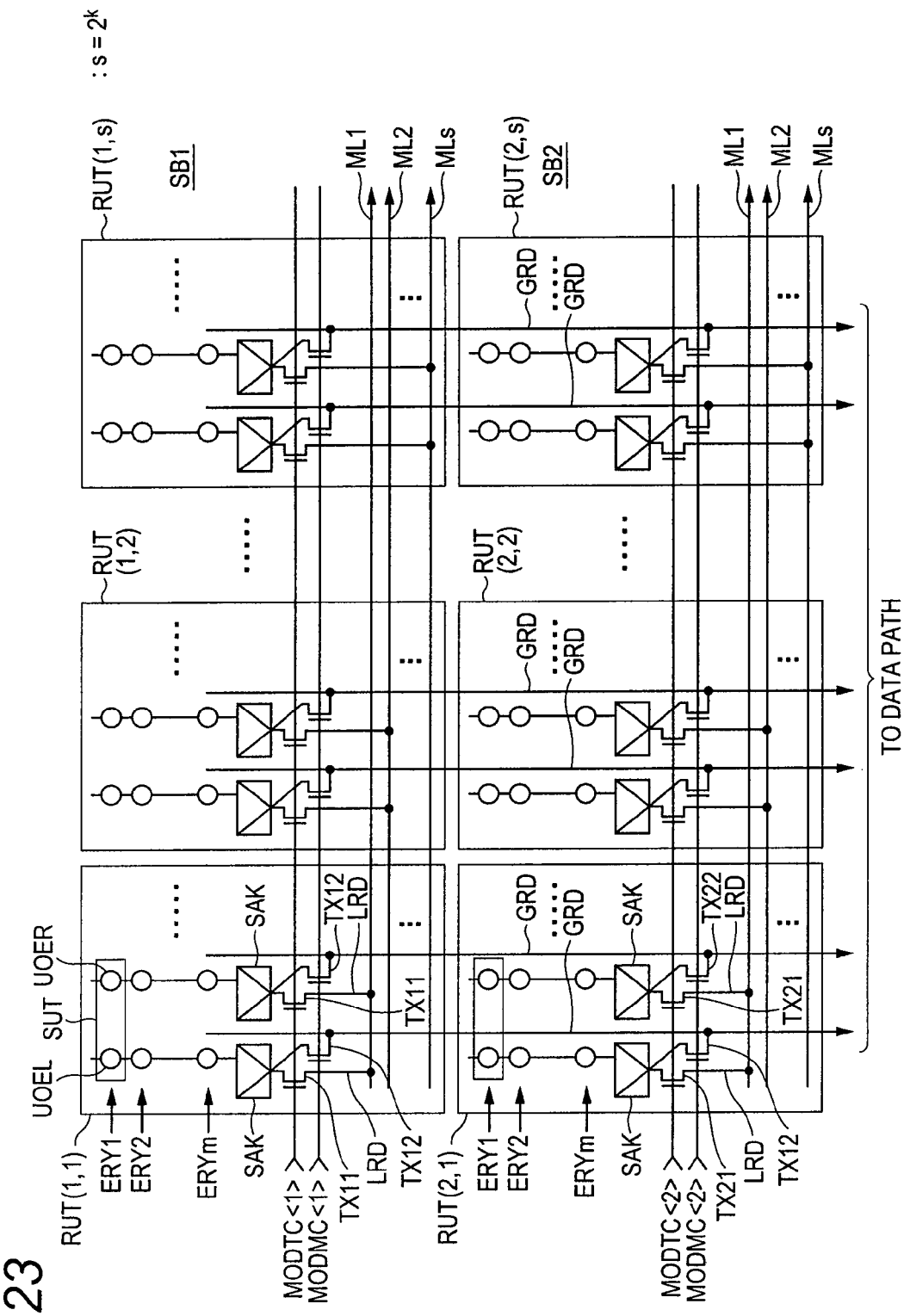
FIG. 23 is a view schematically showing a structure of each of sub-array blocks in a semiconductor signal processing apparatus according to Embodiment 2 of the present invention.

FIG. 23 is a view schematically showing a structure of a main portion of a semiconductor signal processing apparatus according to Embodiment 2 of the present invention. In the semiconductor signal processing apparatus shown in FIG. 23, global read data lines GRD are disposed commonly to the sub-blocks SB1, SB2, ... and corresponding to the individual operator cell columns. The sub-blocks SB1 to SBn are provided but, in FIG. 23, the sub-blocks SB1 and SB2 are representatively shown.

The sub-block SB1 is divided into retrieval units RUT(1,1) to RUT(1,s), and the sub-block SB2 is divided into retrieval units RUT(2,1) to RUT(2,s). Here, s is equal to $2^k$ (s=$2^k$). Correspondingly to the individual sub-blocks SB1 and SB2, local match lines ML1 to MLs are disposed.

In the individual retrieval units, the respective local read data lines LRD are disposed correspondingly to the sense amplifier circuits SAK. The local read data lines LRD are coupled to the local match lines ML (ML1 to MLs) disposed correspondingly thereto.

To change the paths of data reading for the local read data lines LRD and the global read data lines GRD, switching transistors TXi1 and TXi2 for changing read paths are provided for each of the sense amplifier circuits SAK. In the sub-block SB1, switching transistors TX11 and TX12 are provided correspondingly to each of the sense amplifier circuits SAK. In the sub-block SB2, switching transistors TX21 and TX22 for switching read paths are provided correspondingly to each of the sense amplifier circuits SAK. In general, in a sub-block SBi, switching transistors TXi1 and TXi2 are provided in the output portions of the sense amplifier circuits SAK. Here, i is an integer of any of 1 to n.

In the sub-block SB1, each of the switching transistors TX11 becomes conductive in response to each of TCAM mode indication signals MODTC<1> and MODTC<2> to couple the output of the corresponding sense amplifier circuit SAK to the corresponding local read data line LRD. Each of the switching transistors TX12 becomes conductive in response to a memory mode indication signal MODMC<1> to couple the output of the corresponding sense amplifier circuit SAK to the global read line GRD. In the sub-bock SB2, in response to a memory mode indication signal MODMC<2>, each of the switching transistors TX22 couples the output signal of the corresponding sense amplifier circuit SKA to the global read data line GRD. In the sub-block SBi (i is an integer of any of 1 to n), each of the switching transistors TXi1 selectively becomes conductive in response to a TCAM mode indication signal MODTC<i>, and each of the switching transistor TXi2 selectively becomes conductive in response to a memory mode indication signal MODMC<i>.

By using the memory mode indication signal MODMC<i>, it is possible to transmit the output signals from the sense amplifier circuits to the corresponding global read data lines GRD on a per sub-block basis.

Figure 24:
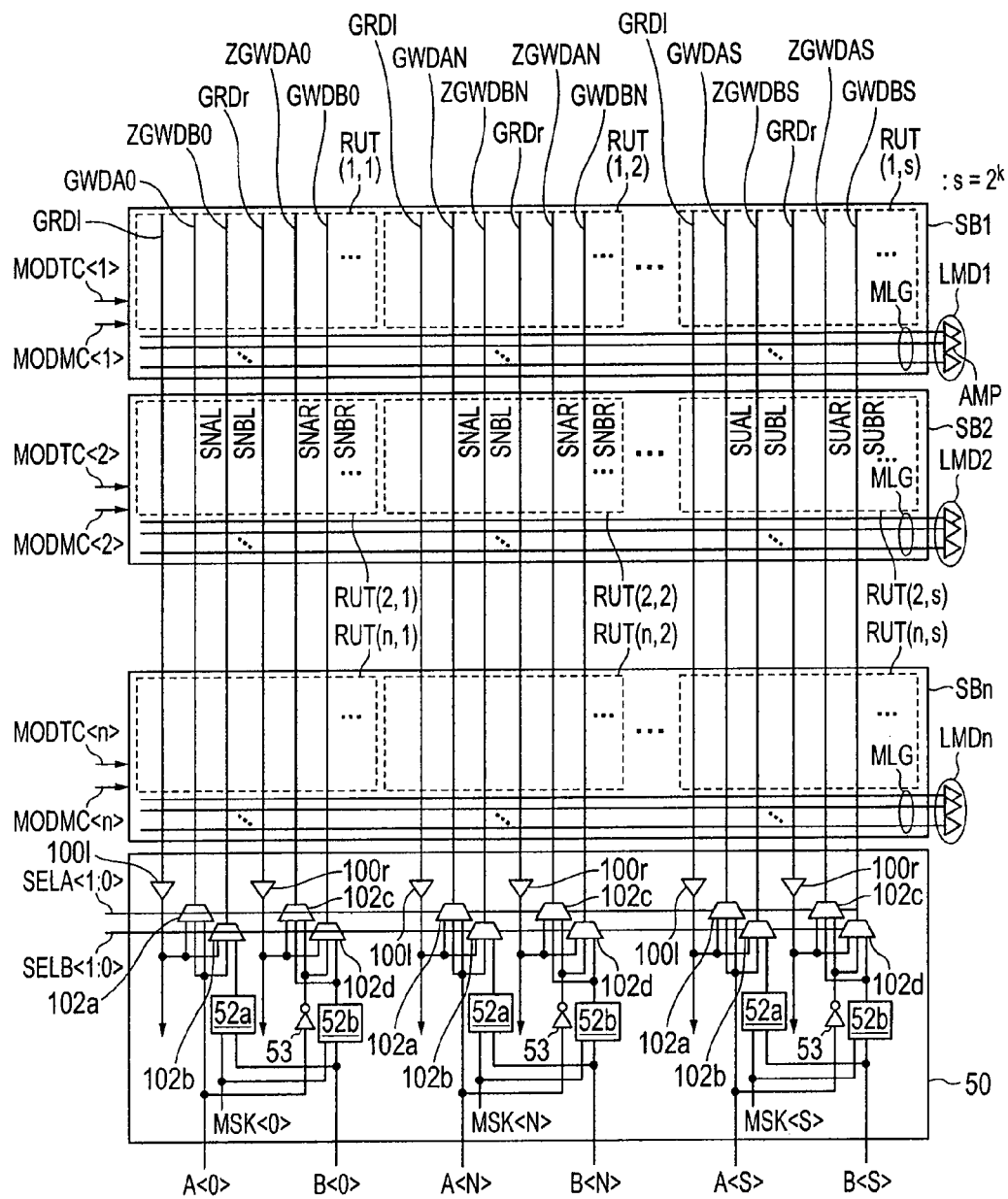
FIG. 24 is a view schematically showing a structure of a data path in the semiconductor signal processing apparatus according to Embodiment 2 of the present invention.

FIG. 24 is a view schematically showing a structure of a data path in the semiconductor signal processing apparatus according to Embodiment 2 of the present invention. In FIG. 24, global write data lines GWDA (GWDA0, GWDAN, and GWDAS), ZGWDB (ZGWDB0, ZGWDBN, and ZGWDBS), ZGWDA (ZGWDA0, ZGWDAN, and ZGWDAS), and GWDB (GWDB0, GWDBN, and GWDBS) are provided commonly to the sub-blocks SB1 to SBn.

For each of the sub-blocks SB1 to SBn, a local match line group MLG including the local match lines ML1 to MLs (s=$2^k$) is provided. To the local match line groups MLG, the local match determination circuits LMD (LMD1 to LMDn) are provided commonly. The local match determination circuits LMD1 to LMDn include the match line amplifiers AMP provided correspondingly to the individual local match lines.

Commonly to the sub-blocks SB1 to SBn, global read data lines GRD1 and GRDr are provided. To the global read data lines GRD1, the output signals from the respective sense amplifier circuits provided correspondingly to the left operator cells (UOEL) are transmitted. To the global read data lines GRDr, the output signals from the respective sense amplifier circuits provided correspondingly to the right operator cells (UOER) are transmitted.

To switch the transmission paths of the output signals from the sense amplifier circuits for the sub-blocks SB1 to SBn, the mode indication signals MODTC<1> and MODMC<1>, . . . , and MODTC<n> and MODMC<n> are given. The mode indication signals are given by drivers provided correspondingly to the sub-blocks to the corresponding switching transistors TXi1 and TXi2 for switching paths. In FIG. 24, for simpler illustration, the switching transistors for switching paths are not shown.

In the data path 50, data amplifiers 100*l* and 100*r* are provided correspondingly to the respective global read data lines GRD1 and GRDr. Multiplexers 102*a* to 102*d* are provided correspondingly to the global write data lines GWDA, ZGWDB, ZGWDA, and GWDB. In FIG. 24, components provided for each of the storage unit columns of the individual retrieval unit columns in the data path 50 are provided with the same reference numerals.

The multiplexer 102*a* selects one of an output signal from the corresponding sense amplifier 100*l* and the corresponding input data bit A<j> according to a 2-bit select signal SELA<1:0>, and transmits the selected one to the corresponding global write data line GWDAj. j is an integer of any of 1 to N·$2^k$. The multiplexer 102*a* receives the same signal at the different inputs thereof. This is for implementing a 3-input multiplexing configuration in the same manner as in each of the other multiplexers 102*b* to 102*d*, and providing each of the multiplexers 102*a* to 102*d* with the same configuration.

The multiplexer 102*b* selects one of the output signal from the corresponding data amplifier 100*l*, the input write data bit A<j>, and the inverted to-be-retrieved data bit /B<j> or the ground voltage given via the L-select masking circuit 52*a* according to a 2-bit select signal SELB<1:0>, and transmits the selected one to the global write data line ZGWDBj.

The multiplexer 102*c* selects one of an output signal from the corresponding data amplifier 100*r*, an inverted retrieval data bit /A<i> given via an inverter 53, and the write data bit B<j> or the ground voltage given via the R-select masking circuit 52*b* according to the select signal SELA<1;0>, and transmits the selected one onto the corresponding global write data line ZGWDAj. The multiplexer 102*d* selects one of the output signal from the corresponding data amplifier 100*r*, the inverted retrieval data bit /A<j> given via the inverter 53, and the write to-be-retrieved data bit B<j> or the ground voltage given via the L-select masking circuit 52*b* according to the 2-bit select signal SELB<1:0>, and transmits the selected one onto the corresponding global write data line GWDBi.

The structures of the select masking circuits 52*a* and 52*b* are the same as the structures shown in FIGS. 17(B) and 17(C), and selectively transmit the inverted to-be-retrieved data bit /B<j> and the to-be-retrieved data bit B<j> or the ground voltage (data "0") according to the masking indication signal MSK<j>.

Also in the data path 50, level shift circuits 54*a* to 54*d* as shown in FIG. 17 are provided correspondingly to the respective output portions of the multiplexers 102*a* to 102*d*. However, in FIG. 24, the level shift circuits for adjusting the voltages defining the H level and the L level of the write data bits are not shown for simpler illustration.

As shown in FIG. 24, by using the multiplexers 102*a* to 102*d*, it is possible to write the input retrieval data A from the outside to one sub-block, read back the retrieval data stored in the sub-block therefrom, and transmit the retrieval data to another sub-block. Therefore, a retrieving operation can be performed using a predetermined number of sub-blocks as a First-in First-out (FIFO) region. As a result, even when the rate of the retrieving operation in the semiconductor signal processing apparatus is lower than the rate of transfer of the input data, by queuing the input retrieval data using the FIFO region as a buffer region, the retrieving operation can be performed without reducing the speed of transfer of the input data. As a result, it is possible to prevent the occurrence of penalty in traffic due to the retrieving operation.

Figure 25:
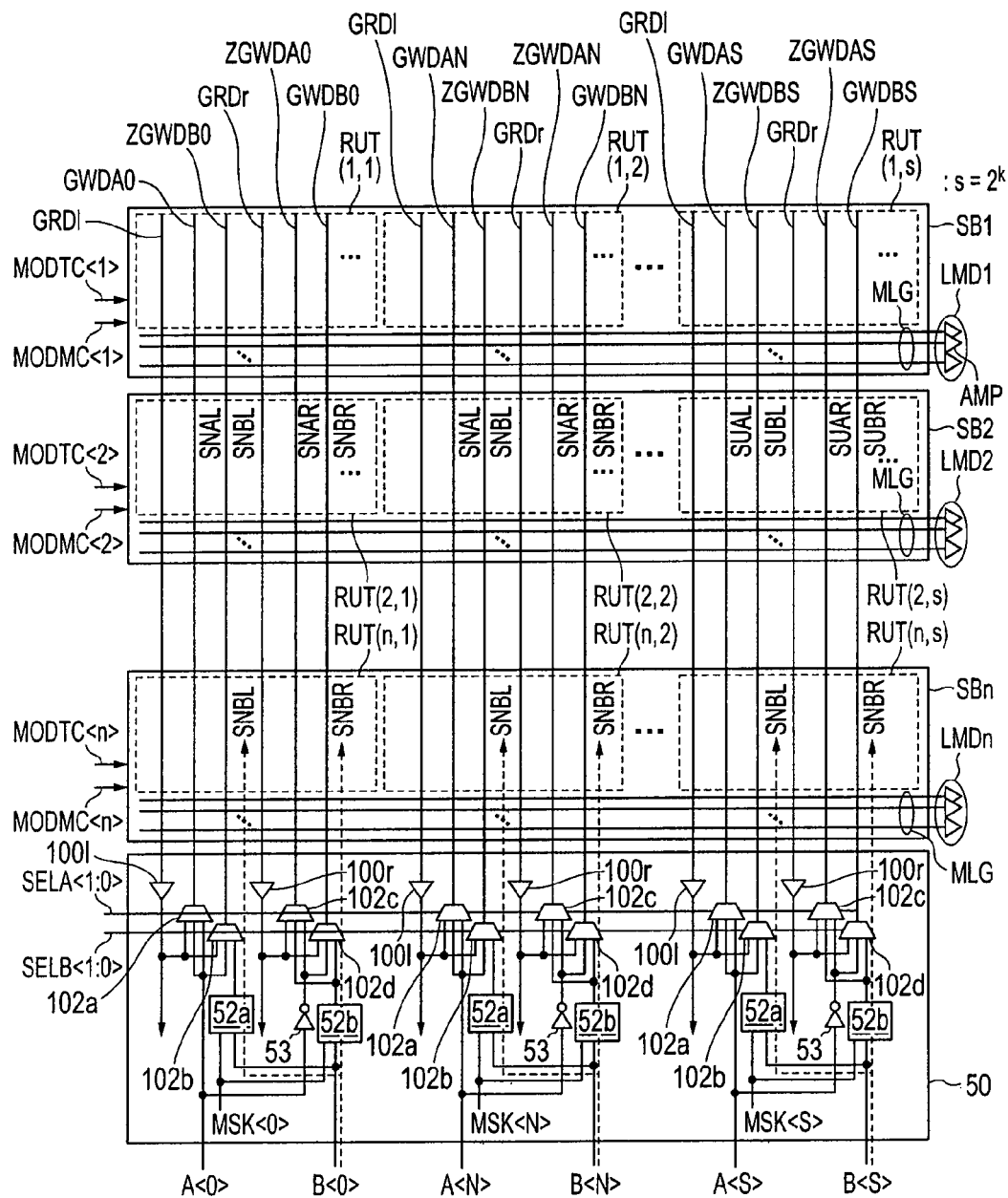
FIG. 25 is a view schematically showing a transfer path for write data in the data path in the configuration shown in FIG. 24.

FIG. 25 is a view schematically showing a data transfer path during the writing of a to-be-retrieved data pattern in the semiconductor signal processing apparatus according to Embodiment 2 of the present invention. In FIG. 25, during the writing of the to-be-retrieved data pattern, the 2-bit select signal SELB<1:0> is set into a state where the multiplexers 102b and 102d select the data bit B<j> (B<0>, B<N>, B<S>, . . . ) from the outside. At this time, in the select masking circuits 52a and 52b, the masking indication signal MSK (=MSK<0>, MSK<N>, MSK<S>, . . . ) is set according to the data pattern length. For a non-masked memory cell, the write data bit B<j> from the outside is transferred onto the global write data lines ZGWDB and GWDB via the multiplexers 102b and 102d, and the data bits /B<j> and B<j> are stored in the respective storage nodes SNBL and SNBR of the corresponding storage unit. For a memory cell masked from writing, the data "0" is transferred and written to each of the storage nodes SNBL and NSBR so that the memory cell is set into the "don't care" state.

At this time, the A-port write word line WWLA is maintained in the non-selected state so that the state of the select signal SELA<1:0> is arbitrary.

Figure 26:
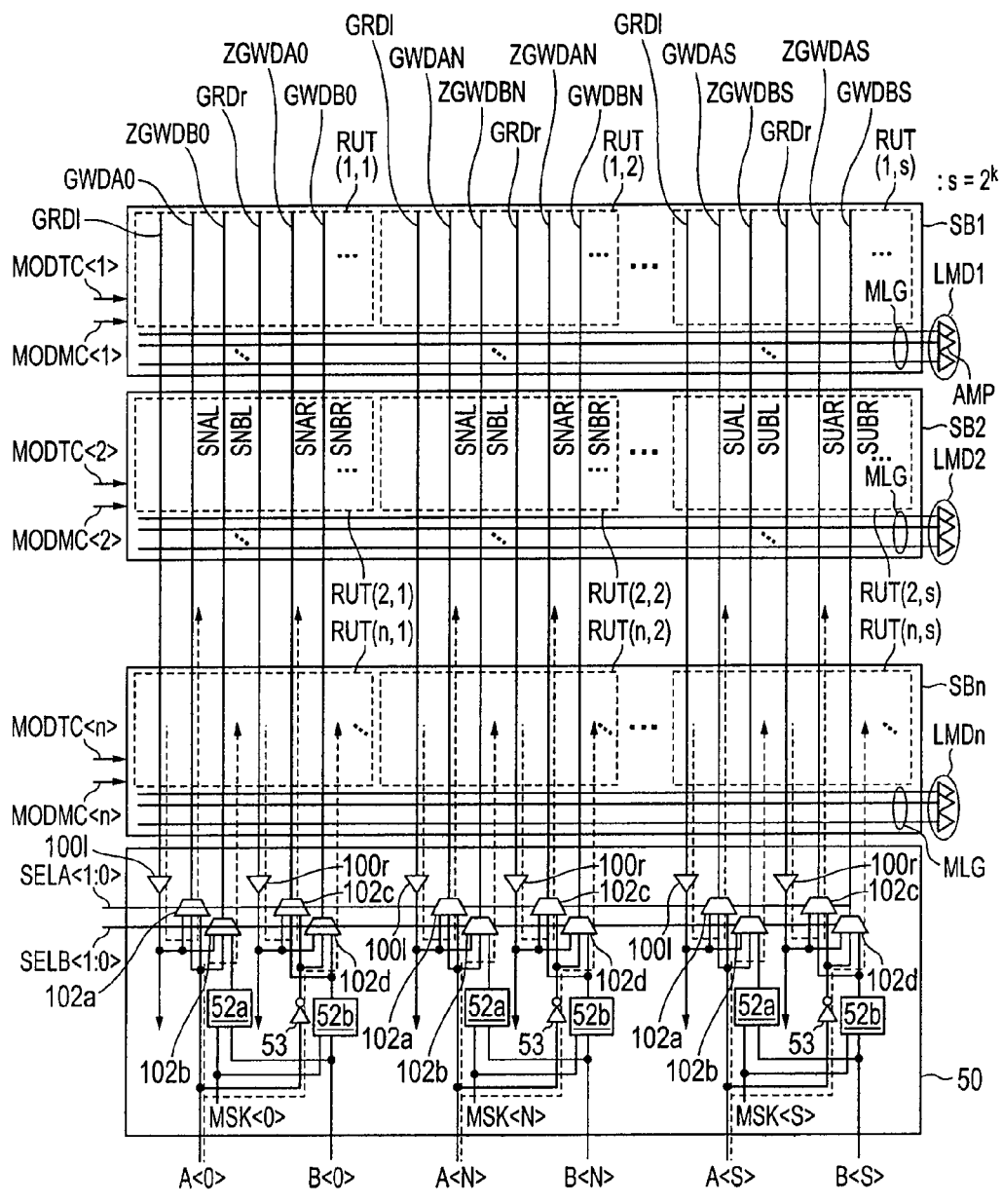
FIG. 26 is a view schematically showing the transfer path for the write data during a retrieving operation in the configuration shown in FIG. 24.

FIG. 26 is a view schematically showing the path of data transfer during a retrieving operation. In FIG. 26, by way of example, the sub-block SBn is used as the FIFO buffer region, and data packets transferred from the outside for which retrieval is to be performed are successively stored.

During the retrieving operation, the select signal SELA<1:0> is set into a state where read data is selected, and the multiplexers 102a and 102c select the output signals from the corresponding data amplifiers 100l and 100r, and transmit the output signals onto the corresponding global write data lines GWDA and ZGWDA.

On the other hand, the multiplexers 102b and 102d select the retrieval data A<j> (A<0>, . . . , A<N>, . . . , A<S>, . . . ) from the outside and the inverted retrieval data /A<j> from the inverter 53 according to the 2-bit select signal SELB<1:0>, and transfer the data bits A<j> and /A<j> onto the respective corresponding global write data lines ZGWDB and GWDB.

The data items selected by the multiplexers 102b and 102d are stored in the sub-block SBn defined as the FIFO region. On the other hand, the data items selected by the multiplexers 102a and 102c are transferred to another sub-block region for storing to-be-retrieved data patterns which is defined as the TCAM region, and stored in the storage nodes SNAL and SNAR. Next, the data items transferred from the FIFO region are successively compared with the data patterns registered in the entries ERY1 to ERYm in each of the TCAM sub-blocks.

In the FIFO region, as will be described later, the data "1" is stored in each of the storage nodes SNAL and SNAR in the initial state. As a result, the retrieval data is stored in the storage nodes SNBL and SNBR. Then, when the retrieval data is read, the result of an AND operation between the data "1" and the retrieval data bit A<j> and the result of an AND operation between the data "1" and the inverted retrieval data bit /A<j> are outputted from the sense amplifier circuits. That is, the data bits A<j> and /A<j> that are previously stored are read and transferred. This allows the queued retrieval data to be precisely read, and transferred to the TCAM region.

Figure 27:
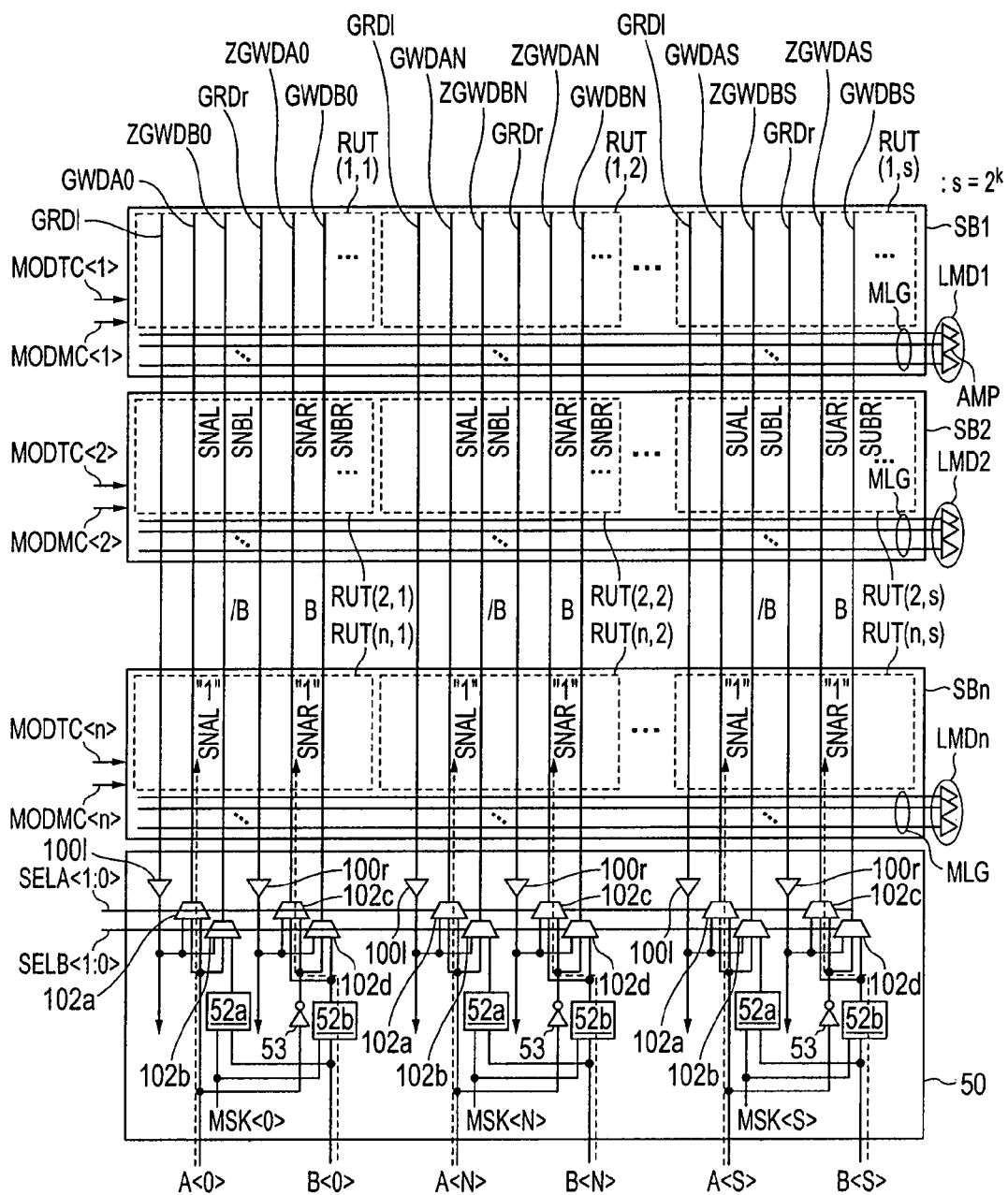
FIG. 27 is a schematically view showing a transfer path for initially set data during initial setting in the configuration shown in FIG. 24.

FIG. 27 is a view schematically showing a data transfer path during the storage of initial data to the sub-blocks. When the initial data is written to each of the sub-blocks, the multiplexers 102a and 102c are caused to select the corresponding data bits A<j> and B<j> by the select signal SELA<1:0> so that the data bit "1" is transferred to each of the corresponding global write data lines GWDAi and ZGWDAj. As a result, each of the sub-blocks as the FIFO region is initially set into a state where the data "1" is stored in each of the storage nodes SNAL and SNAR of the operator cells. During a buffering process, retrieval data is stored in the storage nodes SNBL and SNBR of the operator cells in the sub-block as the FIFO region. Therefore, during the reading of the internal data, in the FIFO region, the retrieval data can be subjected to the buffering process, read, and transferred to the corresponding global write data lines via the sense amplifier circuits.

In the TCAM region, the multiplexers 102b and 102d are caused to select the corresponding data bits A<j> and B<j>. As a result, "0" is stored in each of the storage nodes SNBL and SNBR of the operator cells in each of the sub-blocks so that the operator cells are each set into the "don't care" state. At this time, it is also possible that the data bit "0" may be generated from the select masking circuits 52a and 52b using the masking indication signal MSK<j>, and transferred to each of the storage nodes SNBL and SNBR of each of the operator cells in the TCAM region via the multiplexers 102b and 102d.

As described above, the path of transfer of the internal data is switched according each operation mode. As a result, during the buffer processing (queuing) of input data when a data packet is transferred, it is possible to write the data of the to-be-transferred packet to the storage nodes SNBL and SNBR of the operation cells in the FIFO buffer region, read the buffered data bits A and /A in the FIFO region, and transfer the buffered data bits A and /A as retrieval data to the TCAM region. This allows the process of buffering the to-be-transferred retrieval data and a retrieving operation to be performed in parallel, and allows the retrieving operation to be executed at a high speed by hiding the difference between the rate of packet transfer and the rate of the retrieving operation.

Figure 28:
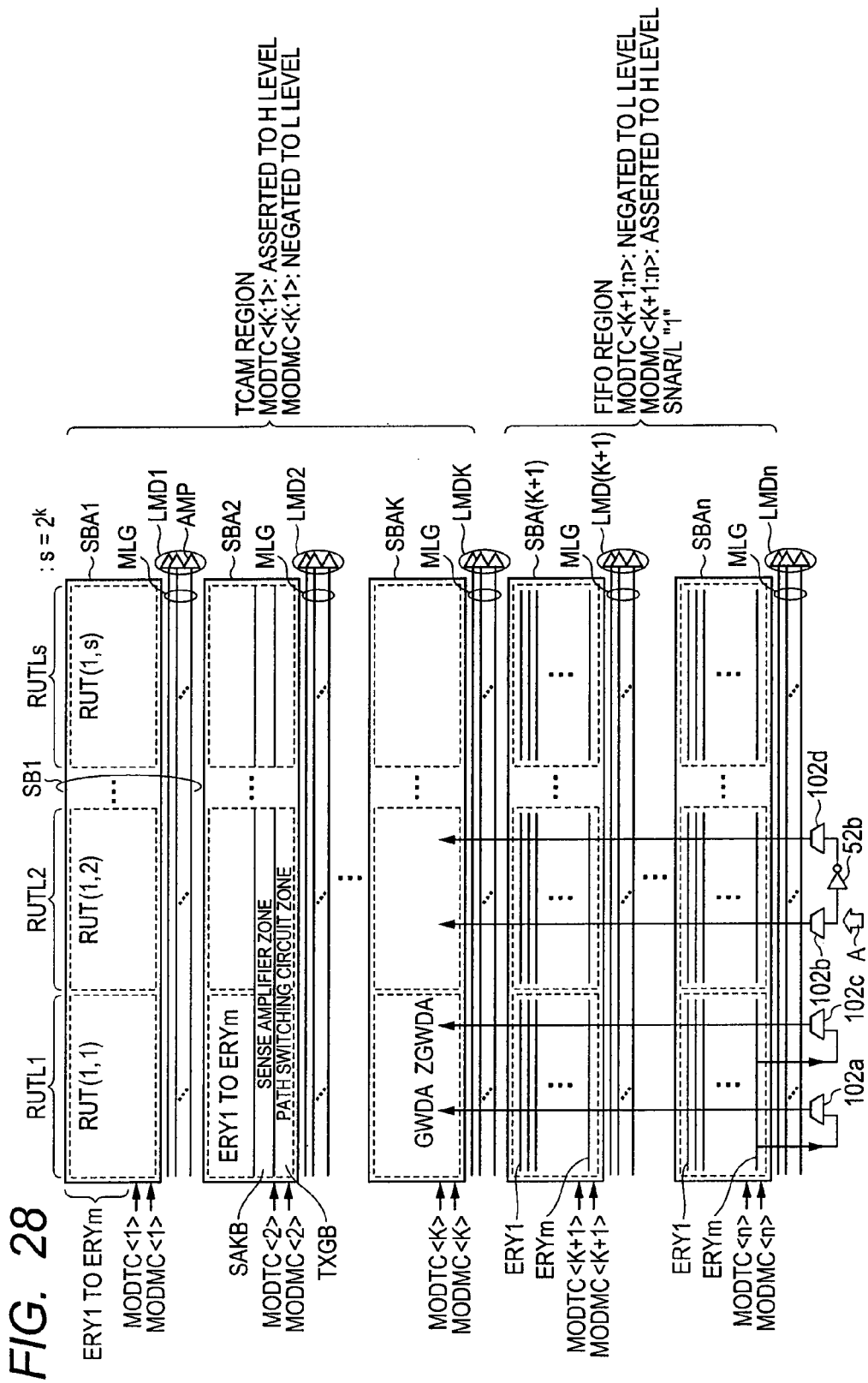
FIG. 28 is a view schematically showing the respective configurations of a TCAM region and a FIFO region in the semiconductor signal processing apparatus according to Embodiment 2 of the present invention.

FIG. 28 is a view schematically showing a structure of an operator cell array in the semiconductor signal processing apparatus according to Embodiment 2 of the present invention. In FIG. 28, the operator cell array is divided into a plurality of sub-array blocks SBA1 to SBAn. The sub-array blocks SBA1 to SBAn form the sub-blocks SB1 to SBn in conjunction with the respective corresponding local match line groups MLG.

Each of the sub-array blocks SBA1 to SBAn has an operator cell region having the entries ERY1 to ERYm, a sense amplifier band SAKB in which the sense amplifier circuits are disposed, and a path switching circuit band TXGB including the switching transistors TX1 and TX2 for switching paths. In FIG. 28, the layout of the entries, the sense amplifier band, and the path switching circuit band in the sub-array block SBA2 are representatively shown.

The sub-array blocks SBA1 to SBAK are used as the TCAM region where to-be-retrieved data patterns are stored. Correspondingly to the individual local match line groups MLG, local match determination circuits LMD1 to LMDK are provided. In the TCAM region, a TCAM mode indication signal MODTC<K:1> is fixedly asserted to the H level, and a memory-cell-mode indication signal MODMC<K:1> is fixedly negated to the L level. As a result, as shown in FIG. 23, the output signals from the sense amplifier circuits SAK are selected by the switching transistors TXi1 (X11, TX21, . . . ) and transmitted to the local match lines included in the corresponding local match line groups MLG.

On the other hand, as the FIFO region where the retrieval data patterns of the to-be-transferred data packets are stored, the sub-array blocks SBA(K+1) to SBAn are used. In the FIFO region, the sub-array blocks SBA(K+1) to SBAn are used as temporary storage regions where the to-be-transferred data packets are merely buffered so that the TCAM mode indication signal MODTC<K+1:n> is fixedly negated to the L level, while the memory-cell-mode indication signal MODMC<K+1:n> is fixedly asserted to the H level. As a result, the output signals from the sense amplifier circuits (SAK) are transferred onto the global read data lines GRD1 and GRDr. In the FIFO region, the storage nodes SNAR and SNAL (SNAR/L) of the operator cells are each initially set into the state where the data "1" is stored (see FIG. 27). During a retrieving operation, the retrieval data subjected to the buffering process and stored in the storage nodes SNBL and SNBR can be transferred to the global data lines GWDA and ZGWDA.

As shown in FIG. 28, during the retrieving operation, the buffered data stored in the FIFO region is transferred by the multiplexers 102a and 102c onto the global write data lines GWDA and ZGWDA, and the retrieving operation is executed in the sub-array blocks SBA1 to SBAK as the TCAM region. In parallel with the retrieving operation, the input data item A from the outside is transferred by the multiplexers 102b and 102d into the next entry (which is the entry ERY1 in the sub-array block SBA(K+1) in the FIG. 28) in the FIFO region via the global write data lines GWDB and ZGWDB, and stored in the storage nodes SNBL and SNBR of the selected entry.

Figure 29:
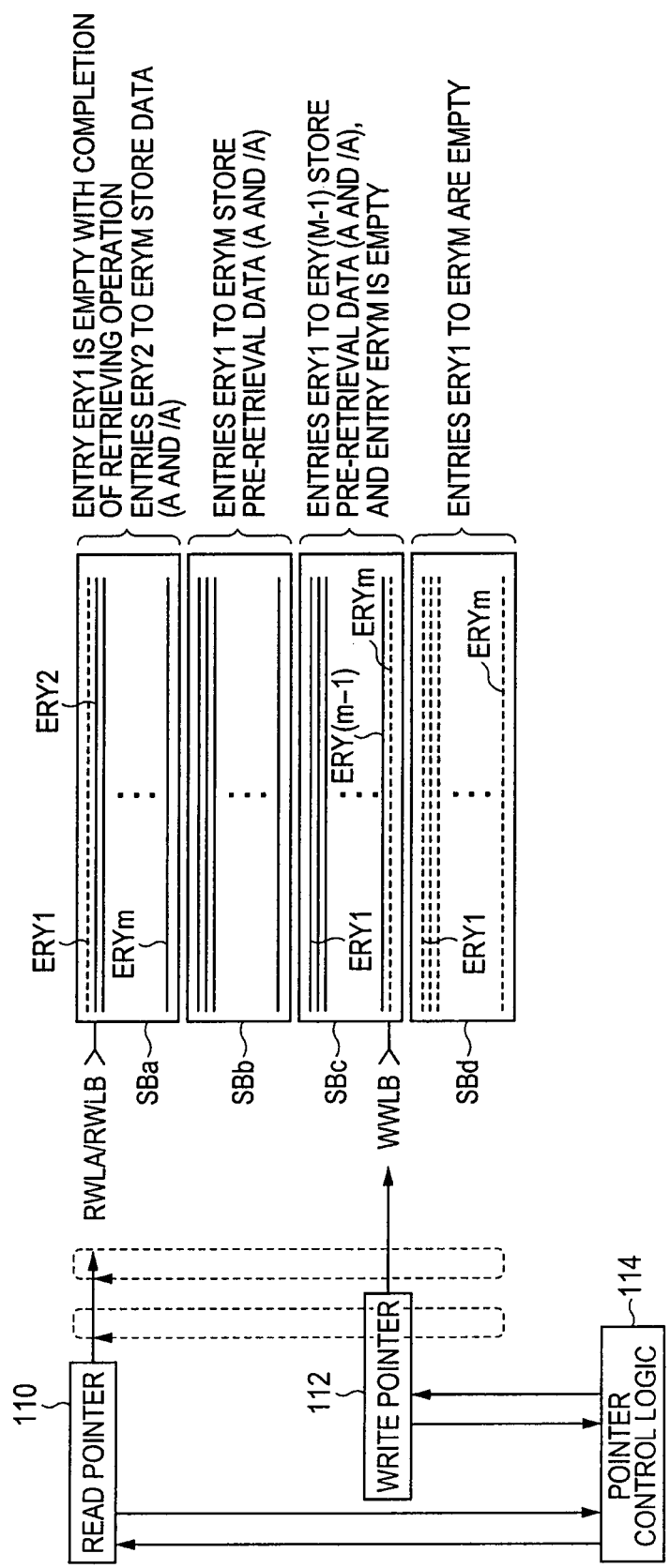
FIG. 29 is a view schematically showing a sequence of pointer generation for the FIFO region shown in FIG. 28.

FIG. 29 schematically shows an example of a sequence of data accesses to the FIFO region. In FIG. 29, the FIFO region includes four sub-blocks SBa to SBd. Each of the sub-blocks SBa to SBd includes the m entries ERY1 to ERYm. In the sub-block SBa, the entry ERY1 is accessed, and in an empty state with the completion of the retrieving operation. In the remaining entries ERY2 to ERYm, pre-retrieval data (A and /A) is stored.

In the sub-block SBb, in each of the entries ERY1 to ERYm, pre-retrieval data (A and /A) is stored.

In the sub-block SBc, in each of the entries ERY1 to ERY (m−1), pre-retrieval data (A and /A) is stored, and the entry ERYm is in a pre-write state and in the empty state. In the sub-block SBd, the entries ERY1 to ERYm are each in the empty state.

To specify word lines for the writing/reading of data to and from the sub-blocks SBa to SBd, a read pointer 110, a write pointer 112, and a pointer control logic 114 are provided. The read pointer 110 generates a pointer specifying the read word lines RWLA and RWLB included in the sub-blocks SBa to SBd. The write pointer 112 generates a pointer specifying the B-port write word line WWLB. The pointers generated by the read pointer 110 and the write pointer 112 cyclically specify the entries in the sub-blocks SBa to SBd.

The pointer control logic 114 successively increments the pointers of the read pointer 110 and the write pointer 112, and adjusts the pointers generated by the read pointer 110 and the write pointer 112 such that an overflow and an underflow do not occur. That is, the pointer control logic 114 detects the read pointer generated by the read pointer 110 and the pointer generated by the write pointer 112. When the read pointer overtakes the write pointer, an underflow may occur so that an underflow indication is generated. On the other hand, when the pointer generated by the write pointer 112 overtakes the pointer generated by the read pointer 110, an overflow may occur so that the pointer control logic 114 generates an overflow indication signal. In this manner, a data overflow and a data underflow are prevented from occurring in the FIFO region.

The read pointer 110 and the write pointer 112 generate the pointers so as to cyclically specify the total of 4m entries in the sub-blocks SBa to SBd. A configuration may be used appropriately in which, when a block address and an entry address are allocated to each of the sub-blocks SBa to SBd, and the entry address reaches a maximum value at the block address having a maximum value, the pointers generated by the pointers 110 and 112 are each reset to an initial value.

The bit widths of the pointers generated by the pointers 110 and 112 are each determined by the FIFO depth (the total number of the entries) of the FIFO region. As previously shown in Embodiment 1, the data packets are successively shifted in by the input shift register circuit, and the data held by the input shift register circuit is written to be temporarily stored as retrieval data in the FIFO region. In this case, the FIFO depth may be appropriately determined from the relations among the minimum data pattern length (e.g., L/8), the rate of transfer of the data packets (e.g., GB bits/sec), and access times in the TCAM region and the FIFO region. That is, a retrieving operation for one retrieval data pattern is performed to the m entries. Accordingly, the FIFO depth may be determined appropriately according to a time m-fold longer than an access time in the operator cell array and to the data packet transfer rate.

Figure 30:
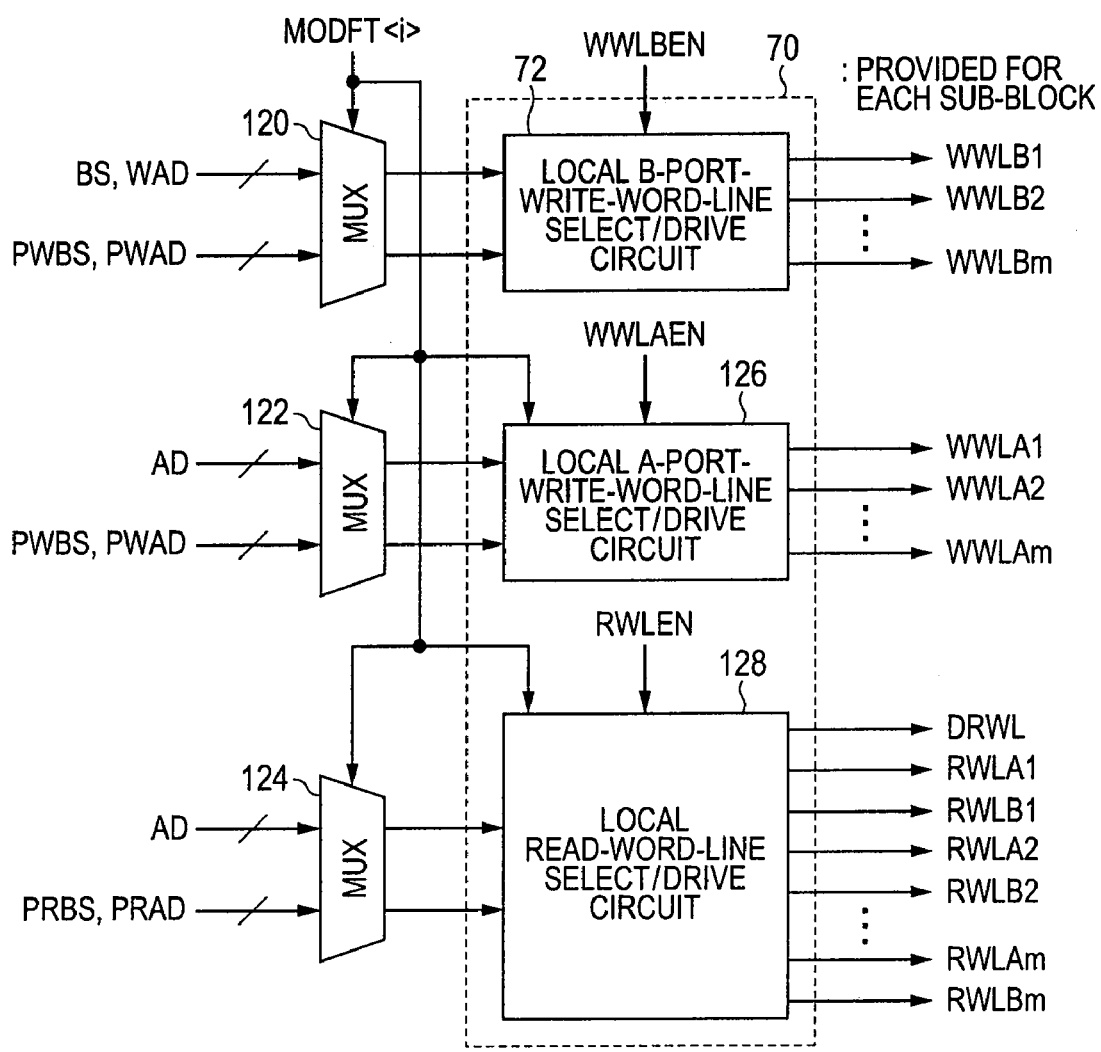
FIG. 30 is a view schematically showing a structure of the control circuit in the semiconductor signal processing apparatus according to Embodiment 2 of the present invention.

FIG. 30 is view schematically showing a structure of a local row select/drive circuit provided correspondingly to each of the sub-blocks in the semiconductor signal processing apparatus according to Embodiment 2 of the present invention. In the local row select/drive circuit shown in FIG. 30, a multiplexer 120 is provided in a stage previous to the local B-port-write-word-line select/drive circuit 72, and a multiplexer 122 is provided in a stage previous to a local A-port-write-word-line select/drive circuit 126. In a stage previous to a local read-word-line select/drive circuit 128, a multiplexer 124 is provided. In the structure of the sub-row select/drive circuit 70, the local A-port-write-word-line select/drive circuit 126 and the local read-word-line select/drive circuit 128 respectively correspond to the local A-port-write-word-line select/drive circuit 74 and the local read-word-line select/drive circuit 76 shown in FIG. 21.

The multiplexer 120 selects one of a pair of the block select signal BS and the write-word-line address WAD from the address counter and a pair of a write block select signal PWBS and a write-word-line address signal PWAD from the write pointer 112 according to a sub-block attribute indication signal MODFT<i>. The sub-block attribute indication signal MODFT<i> specifies whether the corresponding sub-block SBi is used as the TCAM region or as the memory region.

The local B-port-write-word-line select/drive circuit 72 drives one of the B-port write word lines WWLB1 to WWLBm into the selected state according to the block select signal and the write-word-line address signal given via the multiplexer 120. When it is specified that the corresponding sub-block SB<i> is used as the TCAM region, the multiplexer 120 selects the block select signal BS and the write-word-line address signal WAD each from the address counter. When the corresponding sub-block SB<j> is the FIFO region, the multiplexer 120 selects the pointer block select signal PWBS and the pointer write-word-line address signal PWAD each from the write pointer 112.

When the block attribute indication signal MODFT<i> specifies the TCAM region, the multiplexer 112 selects the address signal AD from the address counter. When the block attribute indication signal MODFT<i> specifies the FIFO region, the multiplexer 112 selects the pointer write block select signal PWBS and the pointer write-word-line address signal PWAD.

When the block attribute indication signal MODFT<i> specifies the TCAM region, the local A-port-write-word-line select/drive circuit 126 is activated according to a word-line enable signal WWLEN irrespective of the block select signal to perform a decoding operation to the counter address signal AD given via the multiplexer, and drive any of the A-port write word lines WWLA1 to WWLAm into the selected state. On the other hand, when the block attribute indication signal MODFT<i> specifies the FIFO region, the local A-port-write-word-line select/drive circuit 126 is activated when the pointer write-block-address select signal PWBS from the multiplexer 122 specifies the corresponding sub-block to decode the pointer write address signal PWAD in response to the A-port-write-word-line enable signal WWLE, and drive any of the A-port write word lines WWLA1 to WWLAm into the selected state.

When the block attribute indication signal MODFT<i> specifies the TCAM region, the multiplexer 124 selects the address signal AD from the address counter. On the other hand, when the block attribute indication signal MODFT<i> specifies the FIFO region, the multiplexer 124 selects a pointer read block select signal PRBS and a pointer read address signal PRAD each from the read pointer.

When the block attribute indication signal MODFT<i> specifies the TCAM region, the local read-word-line select/drive circuit 128 is activated according to the read-word-line enable signal RWLEN to drive any of the read word line pairs RWLA1 and RWLB1 to RWLAm and RWLBm and the dummy read word line DRWL into the selected state according to the address signal AD given via the multiplexer 124. On the other hand, when the block attribute indication signal MODFT<i> specifies the FIFO region, and when the pointer block select signal PRBS given via the multiplexer 124 specifies the corresponding sub-block, the local read-word-line select/drive circuit 128 drives the dummy read word line DRWL and any of the read word line pairs RWLA1 and RWAB1 to RWLAm and RWLBm according to the pointer read-word-line address signal PRAD and in response to the activation of the read-word-line activation signal RWEN.

Figure 31:
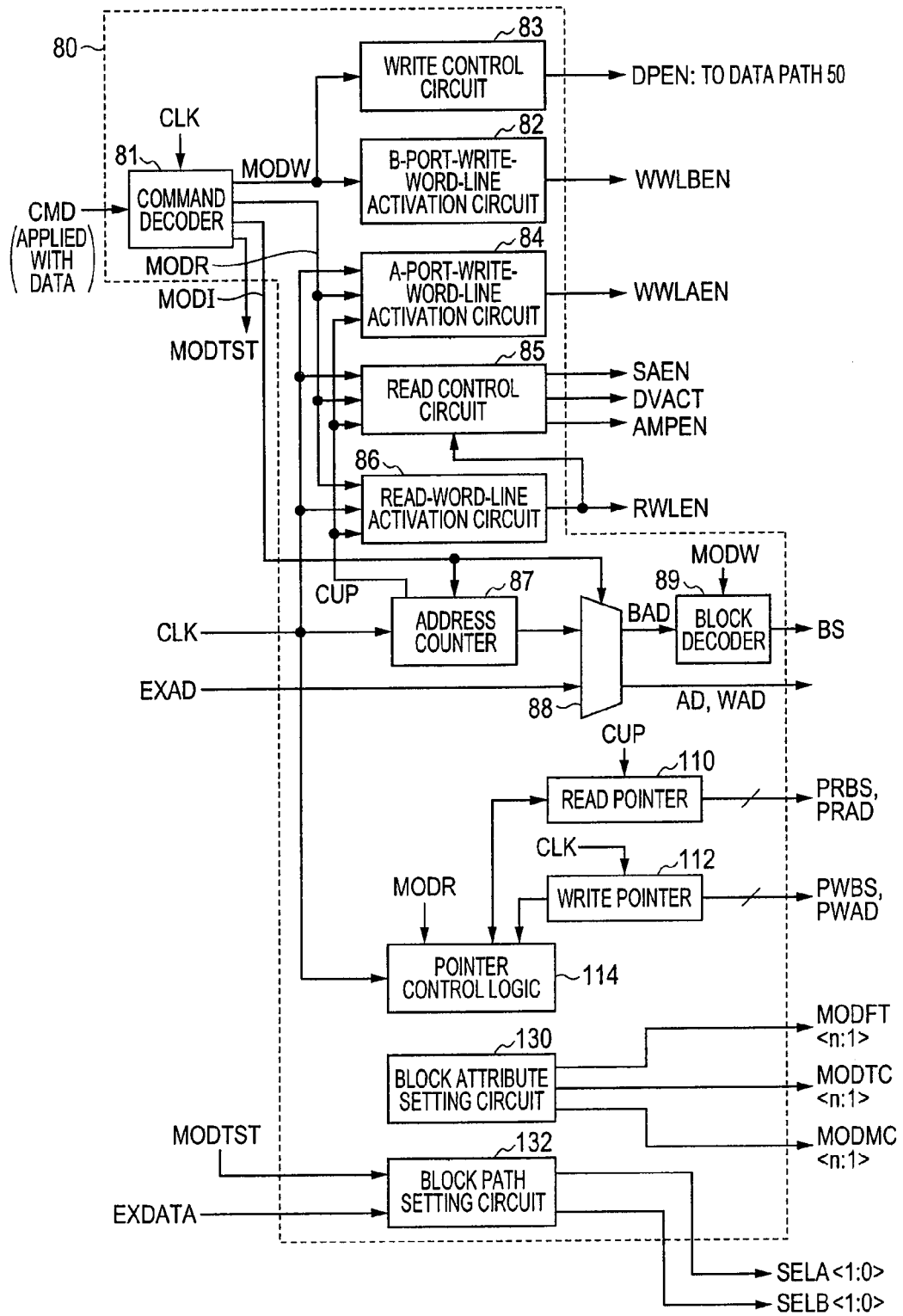
FIG. 31 is a view schematically showing a structure of a sub-row select/drive circuit in the semiconductor signal processing apparatus according to Embodiment 2 of the present invention.

FIG. 31 is a view schematically showing a structure of the control circuit 80 in the semiconductor signal processing apparatus according to Embodiment 2 of the present invention. The control circuit 80 shown in FIG. 31 has a structure different from that of the control circuit 80 shown in FIG. 22 in the following point. That is, the read pointer 110, the write pointer 112, and the pointer control logic 114 are further provided, and a block attribute setting circuit 130 is further provided. The pointer control logic 114 controls the pointers of the read pointer 110 and the write pointer 112 in response to the assertion of the read mode indication MODR from the command decoder 81. The read pointer 110 increments the pointer thereof by one according to the count-up signal CUP from the address counter 87, and generates the read sub-block select signal PRBS and the read-sub-block-word-line address signal PRAD as the read pointer. As a result, after retrieval to the m entries in the TCAM region is completed, the next queued retrieval data can be read and transferred to the TCAM region.

The write pointer 112 generates the write block select signal PWBS and the write-word-line address signal PWAD as the write pointer in synchronization with the clock signal CLK under the control of the pointer control logic 114. As a result, every time a data pattern of a predetermined bit width is extracted from the input data packet, the data pattern can be written in the FIFO region.

The pointer control logic 114 updates the pointer of the write pointer 112 in synchronization with the read-word-line activation circuit 86 and the A-port-write-word-line activation circuit 84.

A block attribute setting circuit 132 generates, for each of the sub-blocks, a block attribute indication signal MODST<n:1> indicating the attribute of the block, a TCAM mode indication signal MODTC<n:1>, and a memory mode indication signal MODMC<n:1>. The block attribute setting circuit 132 may be formed of, e.g., a fuse program circuit to fixedly set the attribute of each of the sub-blocks. The block attribute setting circuit 132 may also be such that, upon activation, a signal showing the attribute of each of the sub-blocks is set from the outside according to a test mode indication signal MODTST from the command decoder 81 (in this case, the block attribute setting circuit 132 is formed of a register circuit).

Note that, in the structure shown in FIG. 31, the read pointer 110 increments the pointer thereof according to the count-up signal CUP from the address counter 81. However, it is also possible that the count-up signal CUP from the address counter 87 may be given to the pointer control logic 114, and the pointer control logic 114 may update the pointer of the read pointer 110 according to the count-up signal CUP from the counter.

As previously described, the pointer control logic 114 monitors the pointers of the read pointer 110 and the write pointer 112, and prevents the overflow or underflow from occurring in the data stored in the FIFO region. When the overflow or underflow has occurred, the pointer control logic 114 may also output the overflow or underflow indication signal to the outside.

The block path setting circuit 132 generates the select signals SELA<1:0> and SELB<1:0> according to the test mode indication signal MODTST from the command decoder 81 and to data EXDATA from the outside. During the initial setting, the select signal SELA<1:0> is set into a state where the multiplexers 102a and 102c select the data items A and B from the outside, and transmit the selected data items to the global write data lines GWDA and ZGEDA. As a result, during the initial setting, the data bit "1" can be set into each of the storage nodes SNAL and SNAR in the sub-block set in the FIFO region.

It is also possible that the block path setting circuit 132 may include a fuse element and, after the initial setting, the state of each of the select signals SELA<1:0> and SELB<1:0> may be fixedly set according to the program of the fuse element. However, in this case, additional registration of to-be-retrieved data cannot be performed, and only a retrieving operation is executed (writing to the FIFO region, transfer from the FIFO region to the TCAM region, and the reading of data from the operator cells are performed).

It is also possible that, similarly to the block attribute setting circuit 130, the block path setting circuit 132 may receive path setting data from an externally provided register as the external data EXDATA, and the state of each of the path select signals SELA<1:0> and SELB<1:0> may be set. In this case, the external register fixedly stores path setting information.

The structure of the control circuit shown in FIG. 31 is otherwise the same as the structure of the control circuit shown in FIG. 22, and a detailed description thereof is omitted by providing the corresponding portions with the same reference numerals.

Thus, according to Embodiment 2 of the present invention, the operator cell array is divided into the TCAM region and the FIFO region, the data patterns from the outside are successively stored in the FIFO region, and the data items stored in the FIFO region are successively transferred to the TCAM region where matching pattern retrieval is performed. This eliminates the need for an additional external FIFO memory for storing a to-be-transferred data packet, and allows a reduction in the area occupied by the apparatus.

In the operator cell array of the semiconductor signal processing apparatus, the transfer of internal data and the retrieval of a matching pattern are performed. This allows high-speed data transfer to be performed and can reduce the time required for match determination.

In addition, the depth of the FIFO region can be arbitrarily changed on a per sub-block basis, and an optimum FIFO buffer capacity can be implemented.

Note that, in the semiconductor signal processing apparatus of the present invention, the mapping of to-be-retrieved patterns can be performed at a high density. However, depending on pattern species to be mapped, the required number of entries greatly changes. Accordingly, the size of each of the sub-blocks to be allocated to the TCAM region is also optimized according to the patterns to be mapped, and the sub-blocks are allocated to the remaining FIFO region (sub-blocks). Instead of this, when the speed of transfer of retrieval data from the outside is high, it is possible to limit the TCAM region to a degree by sacrificing some of all the to-be-retrieved patterns to be mapped, and increase the capacity of the FIFO region using the limited region as the FIFO region. As a result, it is possible to optimize the configuration of the TCAM region and the FIFO region in the operator cell array, and implement efficient string pattern retrieval.

Embodiment 3

Figure 32:
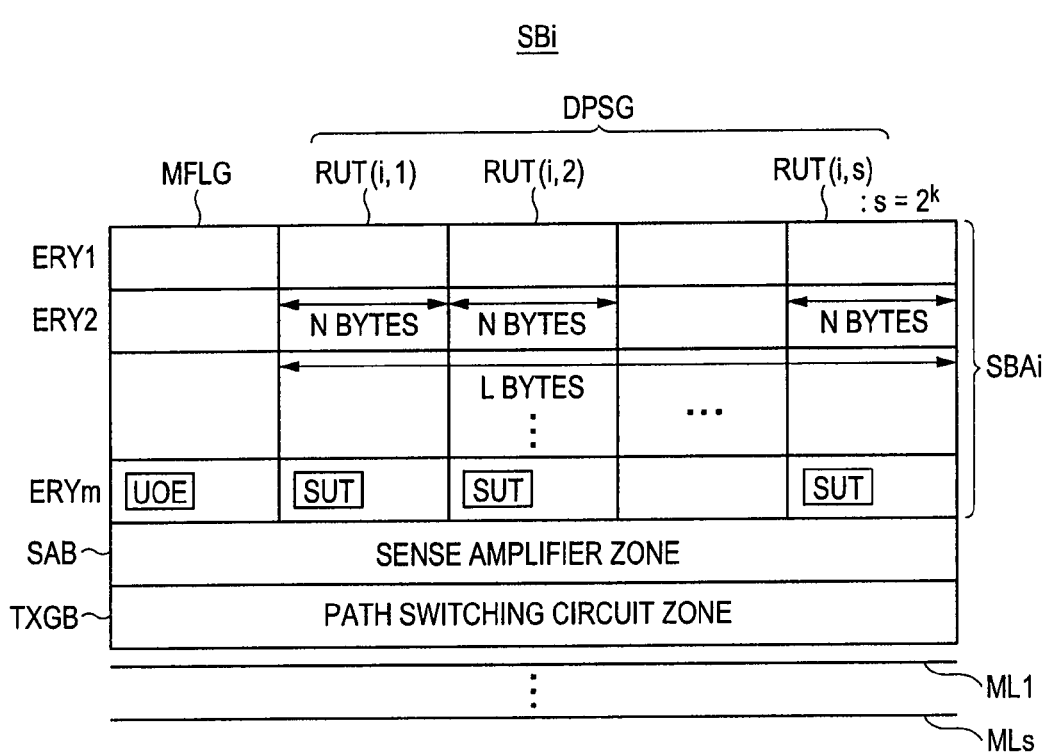
FIG. 32 is a view schematically showing a structure of each of the sub-blocks in a semiconductor signal processing apparatus according to Embodiment 3 of the present invention.

FIG. 32 is a view schematically showing a structure of one sub-block SBi in a semiconductor signal processing apparatus according to Embodiment 3 of the present invention. In FIG. 32, the sub-block SBi includes the m entries ERY1 to ERYm. Each of the m entries ERY1 to ERYm is divided into a data pattern storage region DPSG including s (=2^k) retrieval units RUT(i,1) to RUT(i,s) and a mapping flag memory region MFLG.

Each of the retrieval units RUT(i,1) to RUT(i,s) has an N-byte width, and stores complementary registered pattern data bits in each of the storage units SUT. In the mapping flag memory region MFLG, data showing the pattern lengths of data patterns stored in the corresponding entry is stored in the operator cell UOE. Outside the sub-array block SBAi of the sub-block SBi, the sense amplifier band SAB, the path switching circuit band TXGB, and the local match lines ML1 to MLs are provided. The internal structure of the sub-block SBi is the same as the structure previously described in Embodiment 2.

Figure 33:
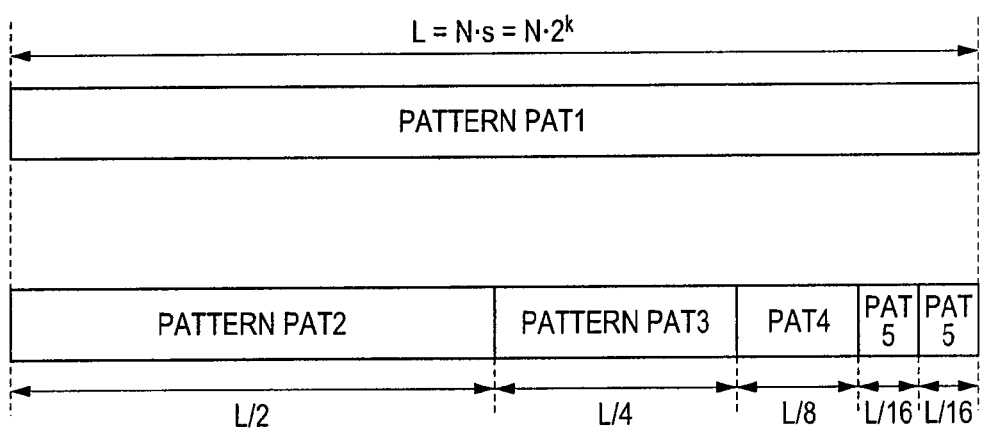
FIG. 33 is a view schematically showing pattern lengths which can be stored in one entry in the structure shown in FIG. 32.

FIG. 33 is a view showing data patterns which can be stored in one entry in Embodiment 3 of the present invention. In FIG. 33, the data pattern PAT1 has the pattern length L (=N·s=N·2^k bytes). The data pattern PAT2 has the pattern length L/2, the data pattern PAT3 has the pattern length L/4, and the data pattern PAT4 has the pattern length L/8. Each of the data patterns PAT5 and PAT6 has a pattern length L/16. Locations where the data patterns of the pattern lengths L, L/2, L/4, L/8, and L/16 are stored in one entry are determined in advance. In this manner, to-be-retrieved data items having different pattern lengths can be stored on a per entry basis.

Figure 34:
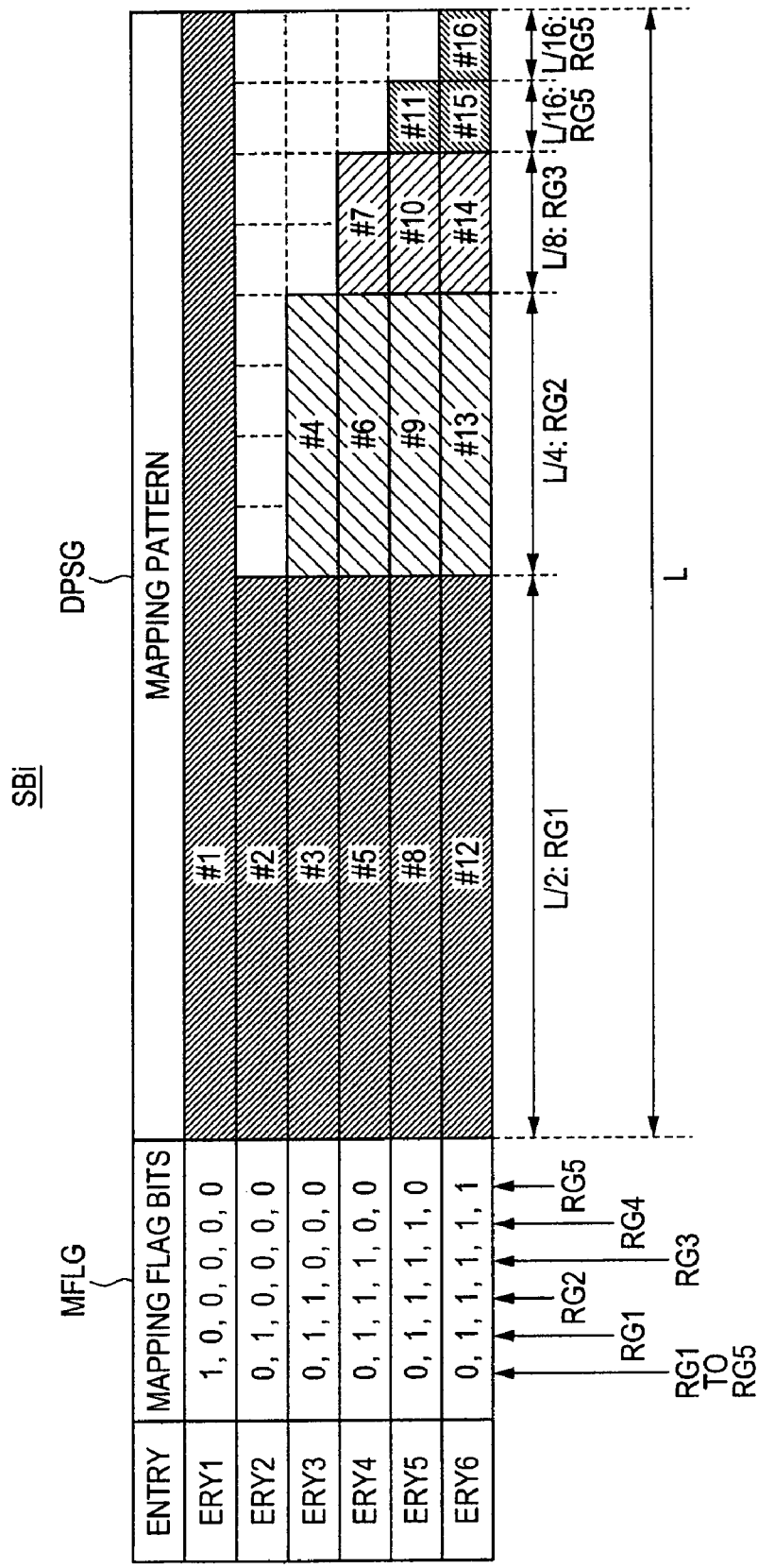
FIG. 34 is a view showing an example of the arrangement of data patterns stored in the individual entries in Embodiment 3 of the present invention.

FIG. 34 is a view showing an example of the mapping of the to-be-retrieved data in the one sub-block SBi. In FIG. 34, the sub-block SBi includes the six entries ERY1 to ERY6. Each of the data pattern storage regions DPSG can be divided into data storage regions RG1 to RG5 the respective positions of which are fixedly determined. The region RG1 is allocated to a region where a data pattern of the pattern length L/2 is stored. The region RG2 is allocated to a region where a data pattern of the pattern length L/4 is stored. The region RG3 is allocated to a region where a data pattern of the pattern length L/8 is stored. Each of the regions RG4 and RG5 is allocated to a region where a data pattern of the pattern length L/16 is stored. Using the entire regions RG1 to RG5, a data pattern of the pattern length L is stored.

In FIG. 34, in the entry ERY1, a data pattern #1 of the pattern length L is stored. In this case, in the mapping flag memory region MFLG, the most significant bit is set at "1", which shows that the effective data pattern of the pattern length L is stored.

In the entry ERY2, a data pattern #2 of the pattern length L/2 is stored in the region RG1. In this case, to show that the effective data pattern of the pattern length L/2 is stored, in the mapping flag memory region MFLG of the entry ERY2, the second most significant bit is set at "1". The remaining bits are each at "0".

In the entry ERY3, in the regions RG1 and RG2, data patterns #3 and #4 of the pattern lengths L/2 and L/4 are stored respectively. In the mapping flag memory region MFLG, the second and third most significant bits of the corresponding mapping flag bits are each set at "1", and the remaining bits are each set at "0". This shows that, in the regions RG2 and RG3, the effective data patterns of the respective data pattern lengths L/2 and L/4 are stored.

In the entry ERY4, in the data storage regions RG1, RG2, and RG3, data patterns #5, #6, and #7 of the pattern lengths L/2, L/4, and L/8 are stored respectively. In this case, in the corresponding mapping flag bits, the second to fourth most significant bits are each set at "1". This shows that, into the regions RG1, RG2 and RG3, the effective data items of the respective data pattern lengths L/2, L/4, and L/8 are mapped.

In the entry ERY5, a data pattern #8 of the pattern length L/2, a data pattern #9 of the pattern length L/4, a data pattern #10 of the pattern length L/8, and a data pattern #11 of the pattern length L/16 are stored respectively in the data storage regions RG1 to RG4. In the corresponding mapping flag bits, the second to fifth flag bits are each set at "1", while the most significant bit and the least significant flag bit are each set at "0". This shows that, in the regions RG1 to RG4, the data patterns of the respective data pattern lengths L/2, L/4, L/8, and L/16 are stored.

In the entry ERY6, in the regions RG1, RG2, RG3, RG4, and RG5, a data pattern #12 of the pattern length L/2, a data pattern #13 of the pattern length L/4, a data pattern #14 of the pattern length L/8, and data patterns #15 and #16 each of the pattern length L/16 are stored respectively. In this case, in the corresponding mapping flag bits, all the flag bits except for the most significant bit are each set at "1". This shows that, in the regions RG1 to RG5, the effective data patterns of the respective data pattern lengths L/2, L/4, L/8, L/16, and L/16 are stored.

As shown in FIG. 34, in the data pattern storage regions DPSG, storage locations in the entries are fixedly determined in advance on a per pattern-length basis and, when effective data is stored in each of the regions, "1" is set to the corresponding mapping flag bit. This allows a plurality of data patterns having different pattern lengths to be mapped on a per entry basis.

At this time, by using the masking indication signal MSK, it is possible to adjust the length of a to-be-retrieved data pattern within a specified pattern length on a per bit basis.

Figure 35:
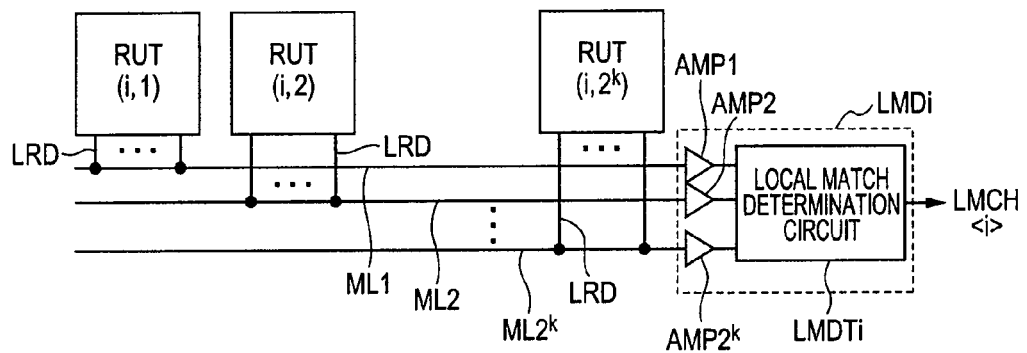
FIG. 35 is a view schematically showing the configuration of local match lines and a local match determination circuit in the semiconductor signal processing apparatus according to Embodiment 3 of the present invention.

FIG. 35 is a view schematically showing a form of coupling between local match lines and individual retrieval units in one sub-block in the semiconductor signal processing apparatus according to Embodiment 3 of the present invention. In FIG. 35, correspondingly to respective retrieval units RUT(i,1) to RUT(i,2^k), local match lines ML1 to ML2^k are provided. The respective local read data lines LRD of the retrieval units RUT(i,1) to RUT(i,2^k) are coupled individually to the corresponding local match lines ML1 to ML2^k.

The local match determination circuit LMDi includes match line amplifiers AMP1 to AMP2^k provided correspondingly to the respective local match lines ML1 to ML2^k, and a local match determination portion LMDTi which determines a match/mismatch in each of the regions RG1 to RG5 according to each of output signals from the match line amplifiers AMP1 to AMP2^k, and generates a local match determination signal LMCH<i>.

Figure 36:
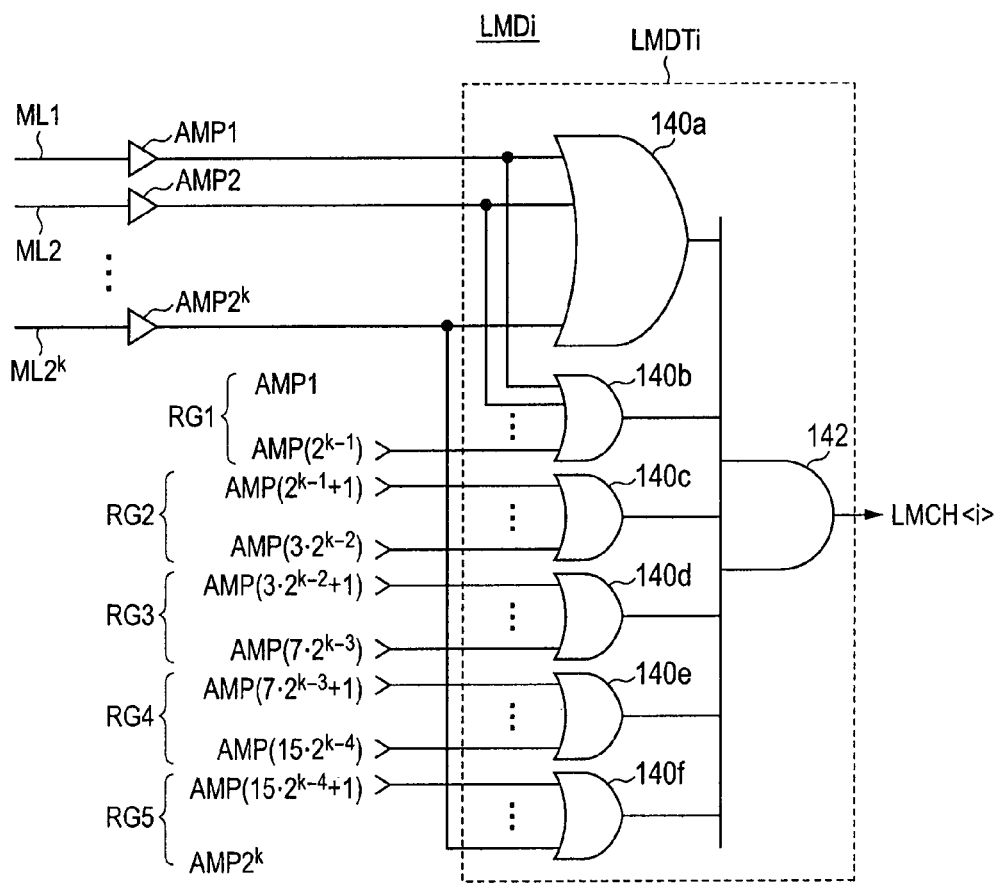
FIG. 36 is a view schematically showing an example of a structure of the local match determination circuit shown in FIG. 35.

FIG. 36 is a view schematically showing a structure of the match determination portion LMDTi shown in FIG. 35. In FIG. 36, the match determination portion LMDTi includes an OR gate 140a which receives the output signals from the match line amplifiers AMP1 to AMP2^k, OR gates 140b to 140f provided correspondingly to the regions RG1 to RG5, and an AND gate 142 which receives output signals from the OR gates 140a to 140f, and generates the local match determination signal LMCH<i>.

The OR gate 140b receives the output signals from the match line amplifiers AMP1 to AMP2^(k-1). The OR gate 140c receives the output signals from the match line amplifiers AMP(2^(k-1)+1) to AMP3·2^(k-2). The OR gate 140d receives the output signals from the match line amplifiers AMP(3·2^(k-2)+1) to AMP7·2^(k-3). The OR gate 140e receives the output signals from the match line amplifiers AMP(7·2^(k-3)+1) to AMP15·2^(k-4). The OR gate 140f receives the output signals from AMP(15·2^(k-4)+1) to AMP2^k.

By grouping the output signals from the match line amplifiers AMP1 to AMP2^k correspondingly to all the regions RG1 to RG5, and receiving the grouped output signals, it is possible to recognize a match occurring in any of the regions in a certain entry. That is, in the case of a match determination in a certain region, the output signals from the match line amplifiers corresponding to the region are each at the L level so that the output signal from the corresponding OR gate is also at the level, and the local match determination signal LMCH<i> from the AND gate 142 is also at the L level. As a result, it is possible to recognize the occurrence of a match in the data pattern of any of the pattern lengths. When a match is detected, by reading the corresponding mapping flag bits together with the entry address, even when data of various pattern lengths is stored in each of the entries, candidates for the matching data pattern can be limited. It is possible to, e.g., take efficient measures against an unauthorized access.

In this case, by reading the entry address generated by the address counter to the outside of the apparatus, it is possible to recognize in which entry a match has occurred.

—Variation of Configuration of Match Lines—

Figure 37:
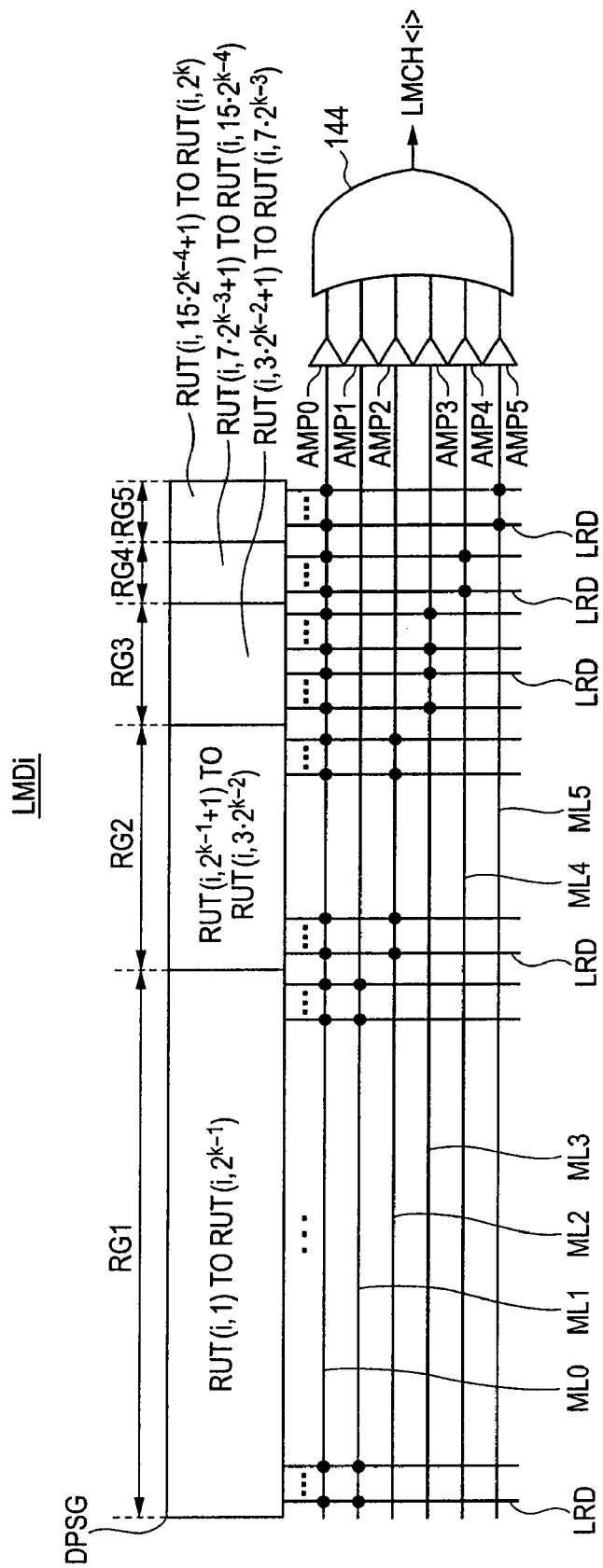
FIG. 37 is a view schematically showing a variation of the configuration of the local match lines and the local match determination circuit in the semiconductor signal processing apparatus according to Embodiment 3 of the present invention.

FIG. 37 is a view schematically showing a variation of the configuration of the local match lines in the semiconductor signal processing apparatus according to Embodiment 3 of the present invention. In FIG. 37, the data pattern storage region DPSG is divided into the data storage regions RG1 to RG5 according to the data pattern lengths. Correspondingly to the respective regions RG1 to RG5, the local match lines ML1 to ML5 are provided, and a local match line ML0 is provided commonly to the regions RG1 to RG5.

In the region RG1, retrieval units RUT(i,1) to RUT(i,2^(k-1)) are disposed, and the local read data lines LRD are coupled individually to the local match lines ML0 and ML1.

In the region RG2, retrieval units RUT(i,2^(k-1)+1) to RUT(i,3·2^(k-1)) are provided, and the local read data lines LRD are coupled individually to the local match lines ML0 and ML2.

In the region RG3, retrieval units RUT(i,3·2^(k-2)+1) to RUT(i,7·2^(k-3)) are disposed, and the local read data lines LRD are coupled individually to the local match lines ML0 and ML3.

In the region RG4, retrieval units RUT(i,7·2^(k-3)+1) to RUT(i,15·2^(k-4)) are included, and the local read data lines LRD are coupled individually to the local match lines ML0 and ML4.

In the region RG5, retrieval units RUT(i,15·2^(k-4)+1) to RUT(i,2^k) are included, and the local read data lines LRD are coupled individually to the local match lines ML0 and ML5.

In the local match determination circuit LMDi, match line amplifiers AMP0 to AMP5 are provided correspondingly to the respective local match lines ML0 to ML5. The output signals from the match line amplifiers AMP0 to AMP5 are given to a 6-input OR circuit 144. The 6-input OR circuit 144 sets the corresponding local match determination signal LMCH<i> at the L level when the output signals from the match line amplifiers AMP0 to AMP5 are each at the L level.

In the case of the structure shown in FIG. 37, the local match lines are provided correspondingly to the data pattern lengths, and the output signals from the sense amplifier circuits in the regions allocated to the individual data pattern lengths are coupled to the corresponding local match lines. In this manner, it is possible to generate the result of match/mismatch determination for each of the data patterns having the different pattern lengths without increasing the number of the local match lines.

FIGS. 38 to 44 are views each schematically showing an example of a sequence of the writing of to-be-retrieved data patterns having the different pattern lengths. In FIGS. 38 to 44, the sequence of an operation of writing the to-be-retrieved data patterns to the three entries ERYa to ERYc is shown as an example.

In FIG. 38, in the data pattern storage region DPSG, the to-be-retrieved data patterns are not registered yet. In this case, the data "1" is written to each of the storage nodes SNAR and SNAL. In the mapping flag storage region MFLG also, "1" is written to each of the storage nodes SNA, and a data bit "0" is written to each of the storage nodes SNB. As a result, each of the mapping flag bits is set into the "0" state. The flag bit is updated by writing the data "1" to the storage node SNB.

In FIG. 39, a data pattern PAT#1 of the pattern length L is stored in the entry ERYa. During the storage of the data, as previously described in Embodiments 1 and 2, the to-be-retrieved data pattern is written to the storage nodes SNBR and SNBL. In this case, in the mapping flag memory region MFLG of the entry ERYa, the most significant bit is set at "1".

In FIG. 40, a data pattern PAT#2 of the pattern length L/2 is written to the region RG1 of the data storage region DPSG of the entry ERYb. At this time, in the mapping storage region MFLG, the corresponding bit (second bit) is set at "1".

In FIG. 41, the writing of a data pattern PAT#3 of the pattern length L/2 is performed. In this case, the entry having an empty region present in the region RG1 where data of the pattern length L/2 is stored is the entry ERYc. Accordingly, in the region RG1 of the entry ERYc, the to-be-retrieved data pattern PAT#3 is written. At this time, in the mapping flag memory region MFLG also, the second most significant bit of the corresponding entry ERYc is set at "1".

In FIG. 42, the writing of a data pattern PAT#4 of the pattern length L/4 is performed. In this case, in the data pattern storage region DPSG, the data storage region RG2 of the pattern length L/4 in the entry ERYb is a head empty region so that writing to the entry ERYb is performed, and the data pattern PAT#4 is stored in the region RG2. In response thereto, in the mapping flag memory region MFLG also, the corresponding mapping flag bit (third most significant bit) is set at "1".

In FIG. 43, the writing of a data pattern PAT#5 of the pattern length L/8 is performed. In this case, to the region RG3 of the head entry ERYb where an empty region exists, the data pattern PAT#5 is written. In parallel with the writing of the data pattern PAT#5, the corresponding bit (fourth most significant bit) in the mapping flag memory region MFLG of the entry ERYb is set at "1".

Figure 44:
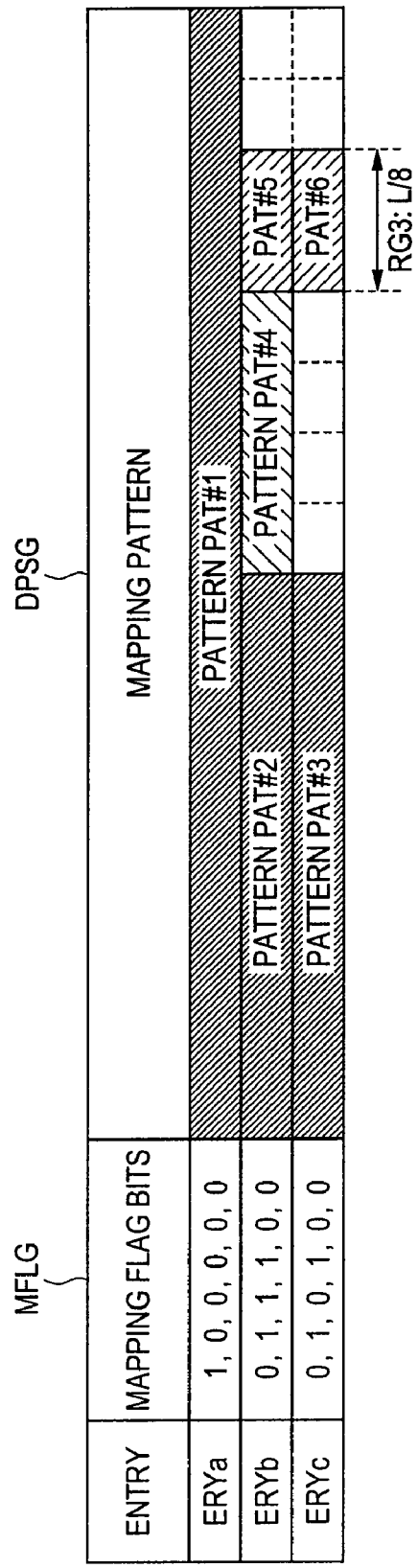
FIG. 44 is a view showing a form of the storage of the pattern length L/8 in the structure shown in FIG. 38.

In FIG. 44, the writing of a data pattern PAT#6 of the pattern length L/8 is performed. In this case, the head entry having an empty region in the region RG3 is the entry ERYc. Accordingly, to the region RG3 of the data pattern storage region DPSG of the entry ERYc, the data pattern PAT#6 is written. At this time, in the mapping flag memory region MFLG of the entry ERYc, the corresponding bit is set at "1".

As described above, according to the pattern lengths of a write data pattern, the write data is successively stored in the head empty region. In this case, to prevent the rewriting of the already written data pattern, in the no write region of the selected entry, an operation of reading and rewriting the data stored therein is performed. As a result, even when the to-be-retrieved data patterns are successively written in the individual entries according to the data pattern lengths, the destruction of the registered data patterns is prevented. In this method, even when the writing of the to-be-retrieved data patterns having different pattern lengths is performed on a per sub-block basis in Embodiments 1 and 2, similar internal reading and rewriting is performed to the no write region of the selected entry.

Figure 45:
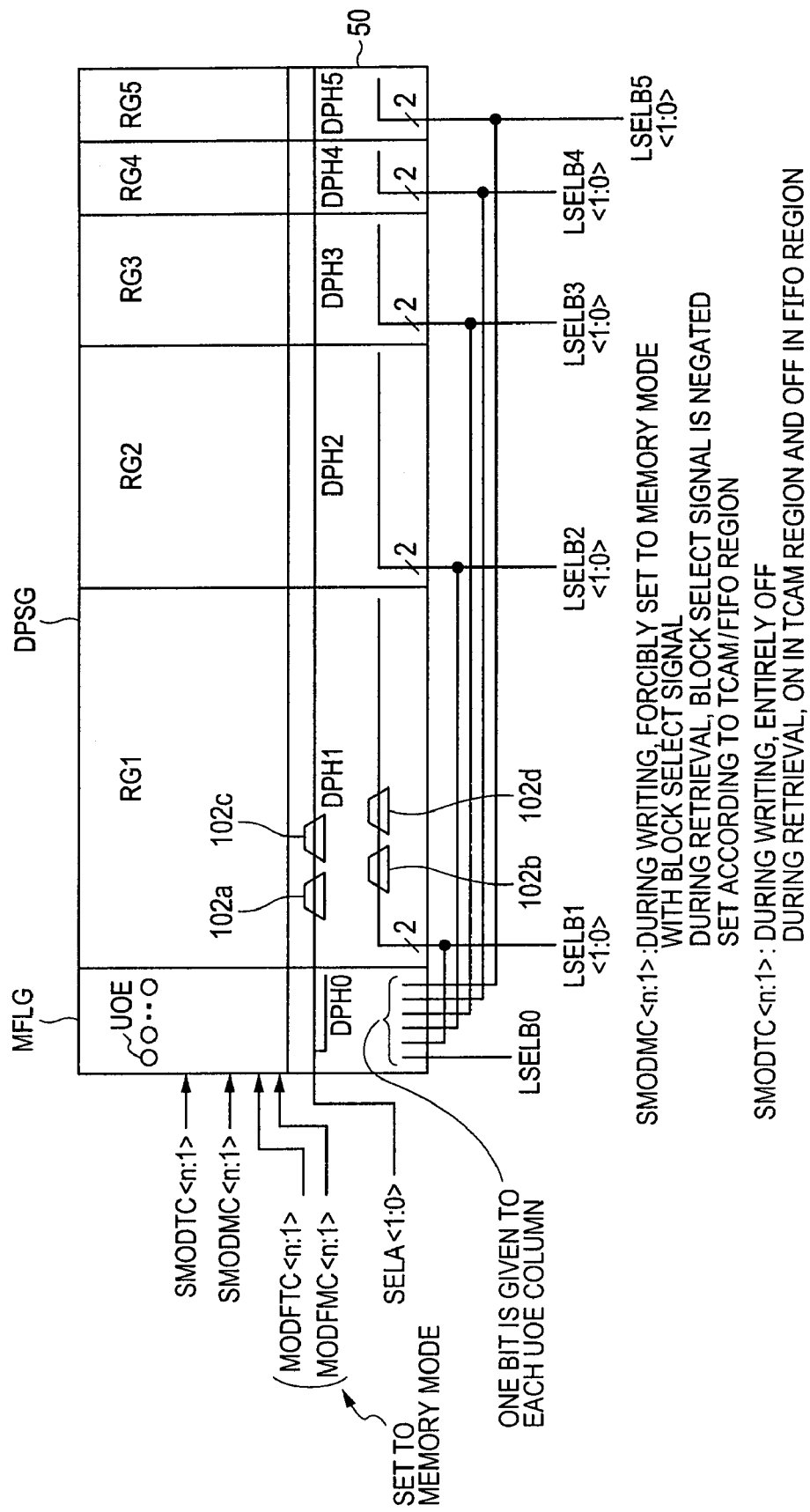
FIG. 45 is a view schematically showing a structure of the data path in Embodiment 3 of the present invention.

FIG. 45 is a view schematically showing a structure of the data path and the allocation of path select signals to multiplexers in Embodiment 3 of the present invention. In FIG. 45, the data pattern storage region DPSG is divided into the regions RG1 to RG5. The data path 50 is also divided into data path blocks DPH1 to DPH5 correspondingly to the regions RG1 to RG5. For the mapping flag memory region MFLG, a data path block DPH0 is provided. As the internal structure of the data path 50, the same structure as each of the structures shown in FIGS. 17 and 24 is used. In FIG. 45, in the data path 50, the multiplexers 102a to 102d are representatively shown.

As a structure of the operator array, the structure of Embodiment 2 that can be divided into the FIFO region and the TCAM region is used. With regard to the switching transistors TXi1 and TXi2 (not shown in FIG. 45) for switching the propagation paths of the output signals from the sense amplifier circuits, select signals MODFTC<n:1> and MODFMC<n:1> are given respectively as a TCAM mode indication signal and a memory mode indication signal to the mapping flag memory region MFLG. For the mapping flag memory region MFLG, the mode indication signal MODFTC<n:1> and MODFMC<n:1> are each set to a state specifying a memory mode. Accordingly, in the mapping flag memory region MFLG, the output signals from the sense amplifier circuits are constantly transmitted to the global read data lines.

To the data pattern storage region DPSG, a block TCAM mode indication signal SMODTC<n:1> and a block memory mode indication signal SMODMC<n:1> are given. The block TCAM mode indication signal SMODTC<n:1> is generated according to the data-write-mode indication signal (MODW) and the TCAM mode indication signal MODTC<n:1> used in Embodiment 2. During data writing, the block TCAM mode indication signal SMODTC<n:1> is entirely set into the OFF state so that the outputs of the sense amplifier circuits are disconnected from the local match lines. During a retrieving operation, the block TCAM mode indication signal SMODTC<n:1> is generated according to the TCAM mode indication signal MODTC<n:1>.

The block TCAM mode indication signal SMODTC<n:1> is generated by an AND operation between the inverted signal of the write-mode indication signal (MODW) and the TCAM mode indication signal MODTC<n:1>.

The block memory mode indication signal SMODMC<n:1> is generated by an OR operation between the memory mode indication signal MODMC<n:1> and the block select signal. Depending on whether a region of interest is allocated as the TCAM region or the FIFO region, the logic values of the TCAM mode indication signal MODTC<n:1> and the memory mode indication signal MODMC<n:1> are set.

The block memory mode indication signal SMODMC<n:1> is generated by an OR operation between the data-write-mode indication signal (MODW), the block select signal, and the memory mode indication signal MODMC<n:1>. During data writing, the block memory mode indication signal SMODMC<n:1> is set to the memory mode according to the block select signal (BS) specifying a selected sub-block. During a retrieving operation, the block select signal is negated, and the block memory mode indication signal SMODMC<n:1> is generated according to the memory mode indication signal MODMC<n:1>. During data writing, in the sub-block including an entry as a data write target, the output signals from the sense amplifier circuits are transmitted to the corresponding global read data lines GRD. In this manner, paths are ensured through which the stored data is rewritten during data writing in terms of the individual non-selected storage units of the selected entry.

For each of the data pattern storage region DPSG and the mapping flag storage region MFLG, the paths of propagation of the output signals from the sense amplifier circuits are set. In this manner, during the writing of to-be-retrieved data and during a retrieving operation, the rewriting of the mapping flag bits is prevented.

On the other hand, commonly to the data path blocks DPH0 to DPH5, the select signal SELA<1:0> is given. In the data path block DPH0, 1 bit of the select signal SELA<1:0> is given, and the coupling path for the multiplexers 102a and 102c is set. On the other hand, in the data path blocks DPH1 to DPH5, the coupling path for the multiplexers 102a and 102c is commonly set according to the select signal SELA<1:0>.

To the data path blocks DPH1 to DPH5, local select signals LSELB1<1:0> to LSELB5<1:0> are given individually. By the local select signal LSELB1<1:0>, the path for the multiplexers 102b and 102d disposed correspondingly to the region RG1 is set. In the respective remaining data path blocks DPH2 to DPH5 also, the paths for the multiplexers 102b and 102d are set individually according to the local select signals LSELB2<1:0> to LSELB5<1:0>.

In the data path block DPH0 provided for the mapping flag storage region MFLG, to each of the columns of the operator cells UOE in the mapping flag memory region MFLG, one bit of the corresponding one of local select signals LSELB0 and LSELB1<1:0> to LSELB5<1:0> is given. In this manner, in the mapping flag memory region MFLG, data write paths to the operator cells UOE disposed in one entry are set individually.

With the data path structure, during the mapping of to-be-retrieved data patterns, the patterns of the to-be-retrieved data can be written in units of the data storage regions RG1 to RG5, and the values of the mapping flag bits can be individually written correspondingly to the respective data storage regions. In addition, during retrieval, by writing the data "1" to the storage node SNA of each of the operator cells where the mapping flag bits are stored, the rewriting of the mapping flag bits is prevented.

Figure 46:
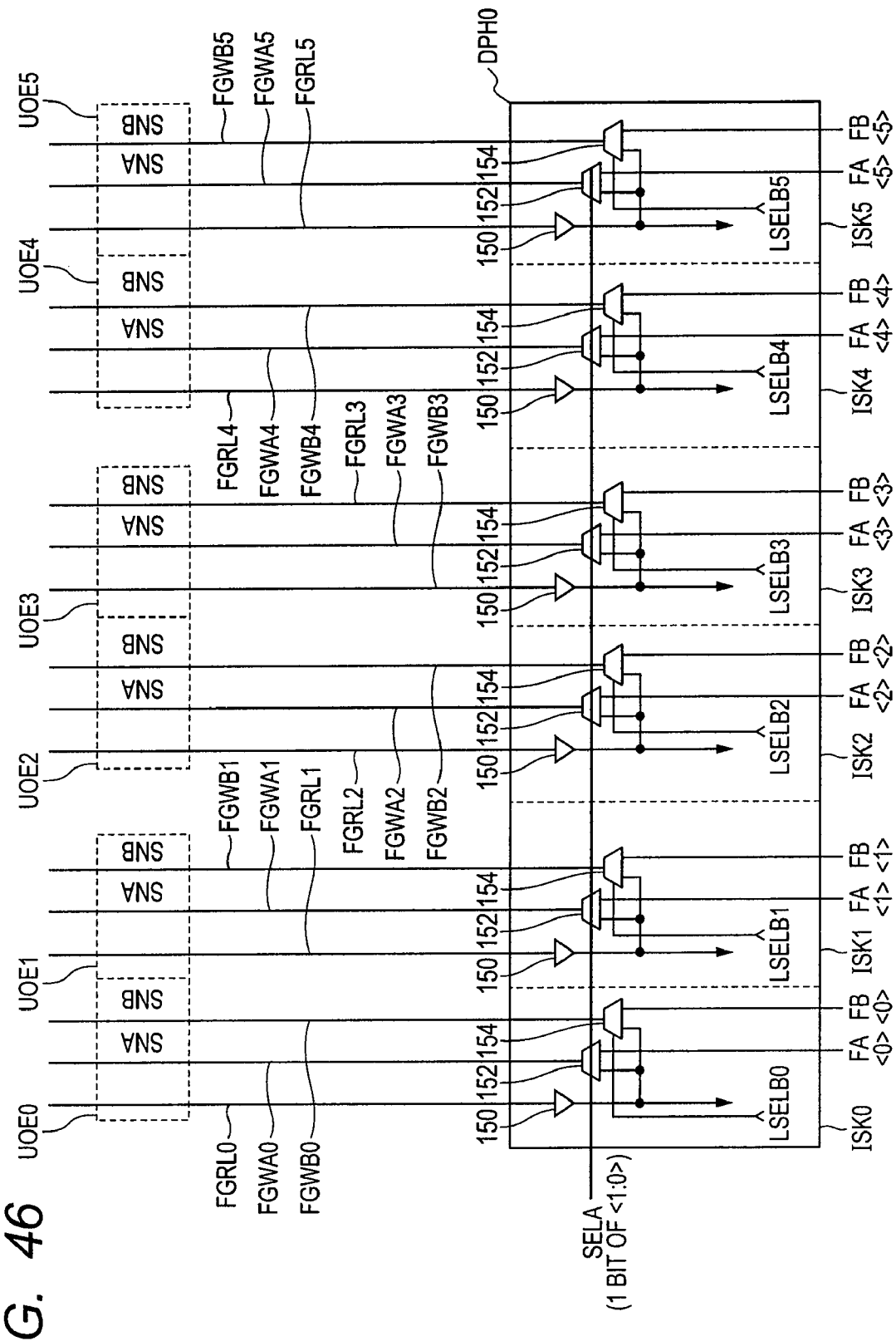
FIG. 46 is a view schematically showing a structure of a portion corresponding to a mapping flag storage portion in the data path shown in FIG. 45.

FIG. 46 is a view schematically showing a structure of the data path block DPH0 in the data path structure. The data path block DPH0 includes six input switching circuits ISK0 to ISK5 correspondingly to six operator cells UOE0 to UOE5 disposed in one entry in the mapping flag memory region. Each of the input switching circuits ISK0 to ISK5 has the same structure, and includes a data amplifier 150 and switching circuits 152 and 154.

The data amplifier 150 of the input switching circuit ISKi (i=an integer of any of 0 to 5) amplifies a signal on the corresponding global read data line FGRLi. The switching circuit 152 selects one of an output signal from the data amplifier 150 and a write bit FA<i> from the outside according to a 1-bit SELA of the select signal SELA<1:0>, and transmits the selected one to a corresponding global write data line FGWAi.

The switching circuit 154 selects one of the output signal from the data amplifier 150 and a given flag bit FB<i> according to a 1-bit LSELBi of the local path select signal LSELBi<1:0>, and transmits the selected one to a corresponding global write data line FGWBi. The data on the global write data line FGWAi is written to the storage node SNA of each of the operators UOEi in the corresponding column. The data on the global write data line FGWBi is written to the storage node SNB of the corresponding operator.

As shown in FIG. 46, by individually setting coupling paths for the switching circuits 154 in the respective input switching circuits ISK0 to ISK5 according to select signals LSELB0 to LSELB5, the writing of the flag bits can be performed on a per bit basis.

Figure 47:
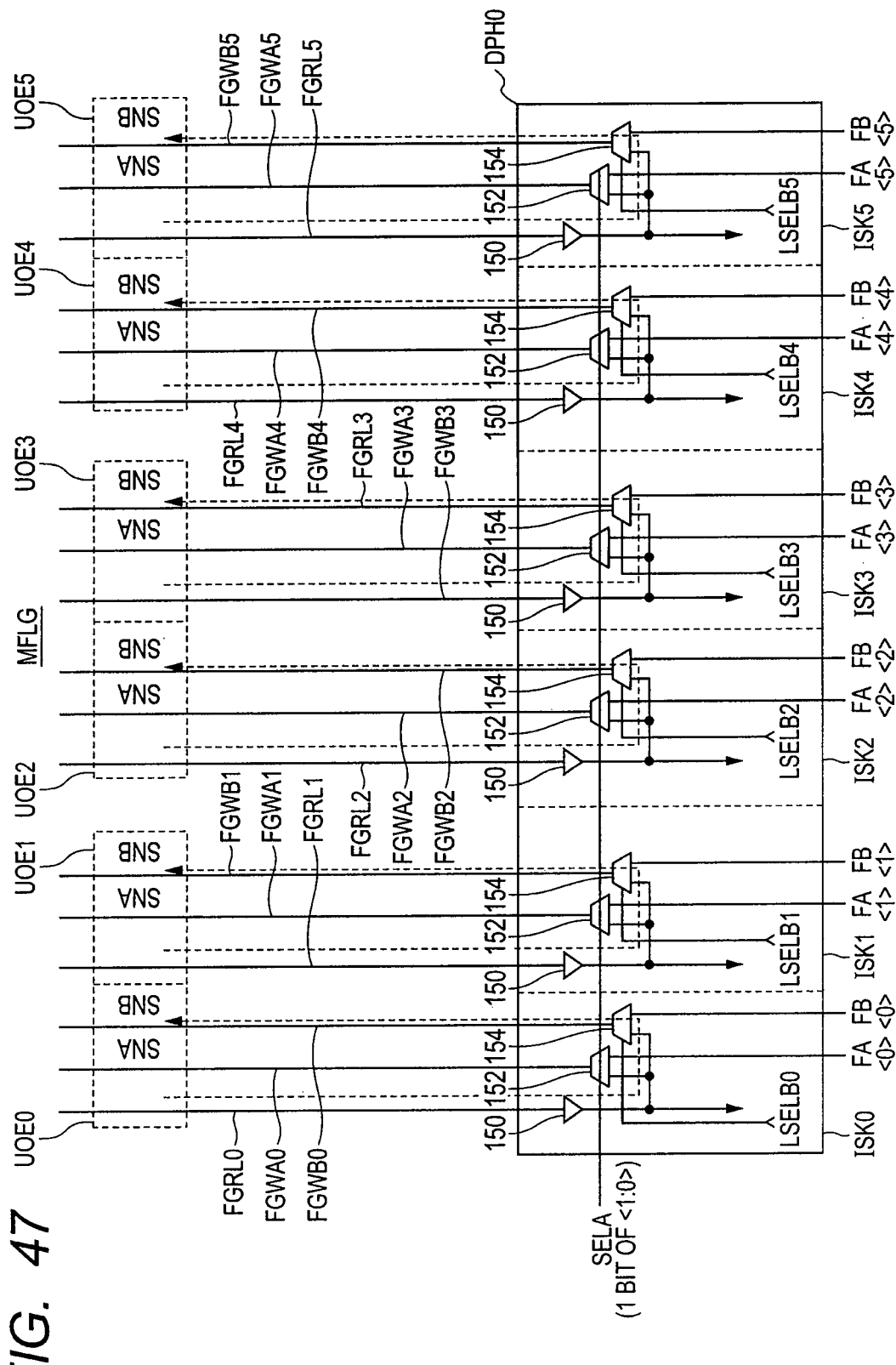
FIG. 47 is a view schematically showing a data transfer path during the writing of data in the data path block shown in FIG. 46.

FIG. 47 is a view schematically showing a flow of data during the rewriting of the mapping flag bits in the data path block DPH0 to the mapping flag memory region shown in FIG. 46. In FIG. 47, the writing of the mapping flag bits when the writing of to-be-retrieved data to the region RG2 of the data pattern length L/4 is performed is shown as an example.

In this case, the select signals ISELB0 to ISELB1 and ISELB3 to ISELB5 show that the writing of data of the corresponding pattern length is not performed to any of the corresponding regions RG1 and RG3 to RG5. In the input switching circuits ISK0, ISK1, and ISK3 to ISK5, the multiplexers 154 select the output signals from the corresponding data amplifiers 150, and transmit the output signals onto the global write data lines FGWB0, FGWB1, and FGWB3 to FGWB5. On the other hand, in the input switching circuit ISK2, the select signal LSELB2 shows data writing to the corresponding region so that the switching circuit 154 selects the mapping flag bit FB<2>, and transfers it onto the global write data line FGWB2.

In the operator cells UOE0 to UOE5, the data bit "1" is stored in each of the storage nodes SNA upon initialization. Accordingly, in the input switching circuits ISK0, ISK1, ISK3, and ISK4, the data stored in each of the storage nodes SNB of the operator cells is rewritten to the storage node SNB. On the other hand, in the operator cell UOE2, the given mapping flag bit FB<2> is written to the storage node SNB of the operator cell UOE2, and the stored data is set to "1". This allows only the value of that one of the mapping flag bits which corresponds to the pattern length of the region where writing is performed to be written to "1". During the writing, the state of the select signal SELA is arbitrary since the writing of the flag bits FA<0> to FA<5> is not performed.

Figure 48:
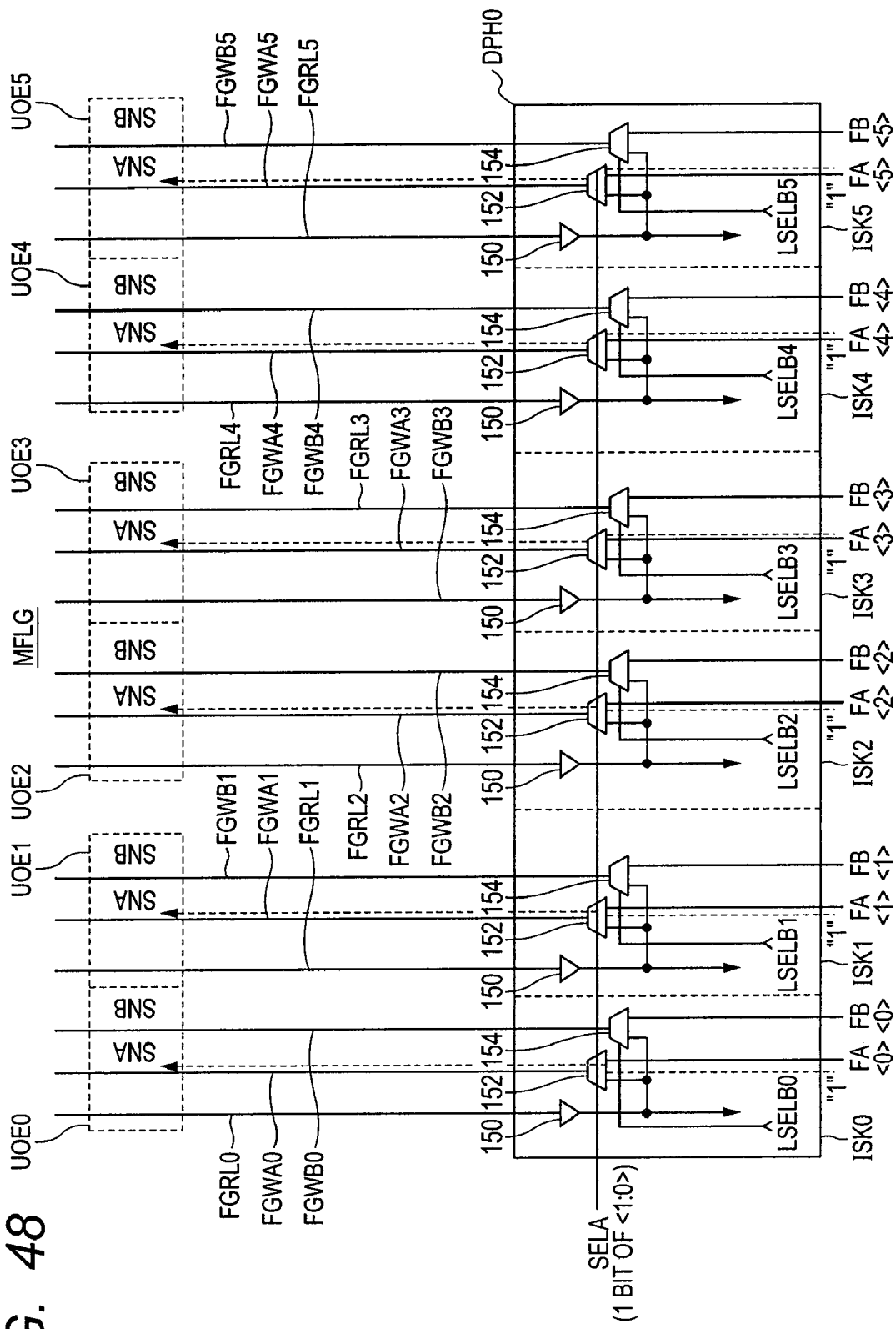
FIG. 48 is a view schematically showing the data transfer path during a retrieving operation in the data path block shown in FIG. 46.

FIG. 48 is a view schematically showing the paths of transfer of the flag bits in a retrieving operation mode. During the retrieval mode, all the fag bits FA<5:0> are each set to "1". The multiplexers 152 are set to a state where the flag bits FA<5:0> are selected according to the select signal SELA. The multiplexers 154 select the flag bits FG<5:0> according to the select signal LSELB<5:0>, and transmit the flag bits FG<5:0> to the corresponding global write data lines FGWB0 to FGWB5, though not particularly limited thereto. That is, during the retrieving operation, in the entry to which retrieval is performed, writing to each of the nodes SNB is not performed (the B-port write word line WWLB is in a non-selected state), and therefore the coupling paths for the multiplexers 154 can be set into an arbitrary state.

In the mapping flag memory region, the data "1" is transmitted to each of the global write data lines FGWA0 to FGWA5. During retrieval, the A-port write word line WWLA is driven into the selected state, while the B-port write word line WWLB is in the non-selected state. Accordingly, in the mapping flag memory region, the data "1" is stored in the storage node SNA of each of the operator cells UOE in the entry to which retrieval is performed, and the updating of the flag bits stored in the storage nodes SNB is not performed. As a result, even when the A-port write word line WWLA is selected and the writing of retrieval data is performed during a retrieving operation, no problem occurs.

In a structure in which the queued retrieval data is read from the FIFO region, and transferred to each of the sub-blocks also, the flag bits in the mapping flag memory region corresponding to the FIFO region are prevented from being transferred and written. In this case, even when the writing of the flag bits FB<5:0> is performed in the flag memory region corresponding to the FIFO region, the flag bits in the region are not transferred to a mapping flag storage entry disposed correspondingly to the TCAM region so that no problem occurs.

Upon initialization, the multiplexers 150 and 152 are set to respective states where the flag bits FA<5:0> and FB<5:0> are selected, though not shown in the drawing. This allows the data "1" and "0" to be written to the storage nodes SNA and SNB in the mapping flag memory region.

The coupling path for the data path block DPH0 disposed correspondingly to the mapping flag memory region is the same even in the case where all the sub-blocks SB1 to SBn are used as the TCAM region as the operation array structure where a flag bit FA<i> is set to "1", and writing is performed to the storage node SNA of each of the operator cells in the selected entry. Therefore, the coupling path for the data path block DPH0 can be applied to either of the cases. In that case, the operator array is used only as the TCAM region and where the operator array is used as the TCAM region and the FIFO region.

Figure 49:
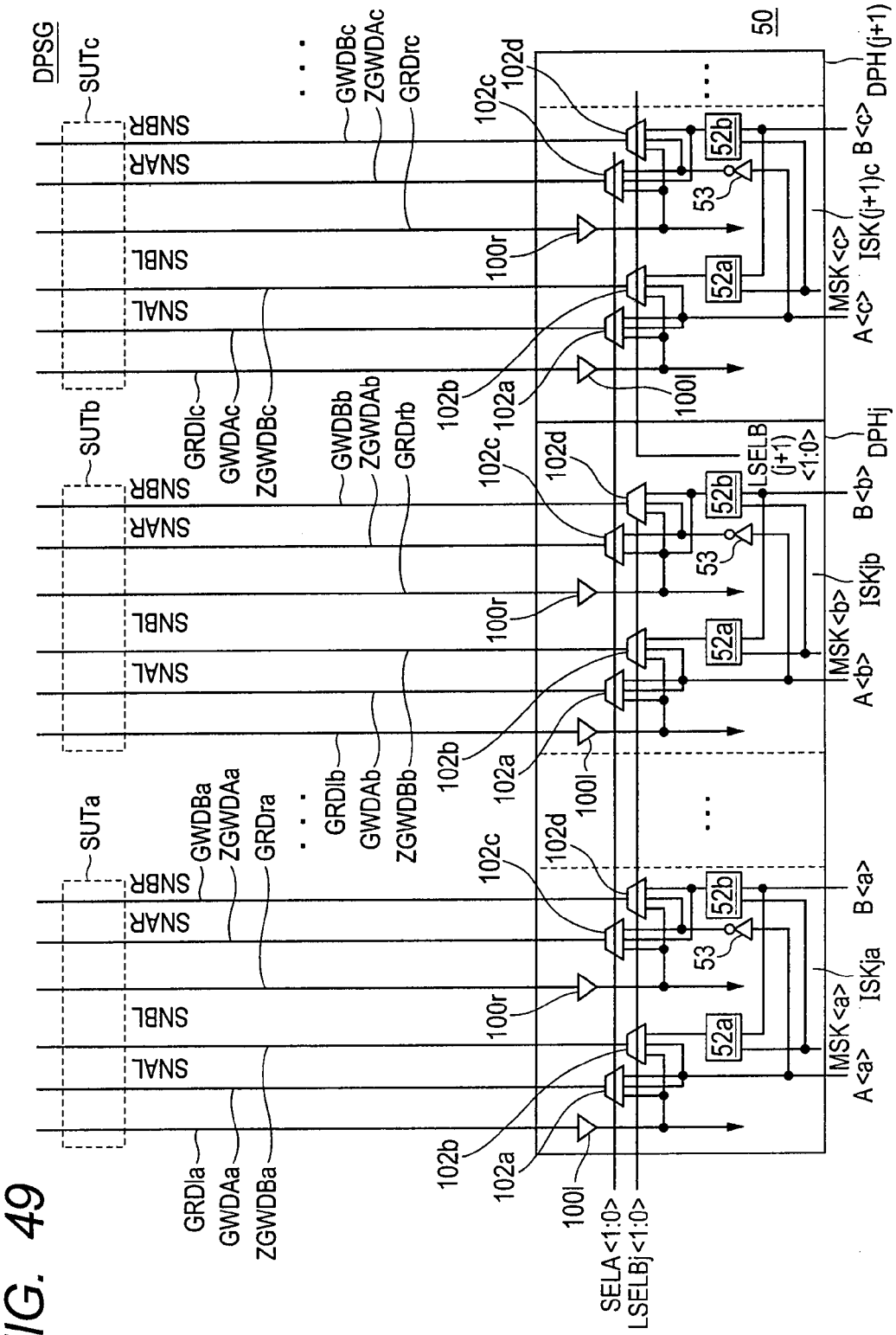
FIG. 49 is a view specifically showing structures of data path blocks each corresponding to the pattern data storage region in the data path shown in FIG. 45.

FIG. 49 is a view schematically showing structures of data path blocks DPHj and DPH(j+1) in the data path 50. The data path block DPHj includes input switching circuits ISKja to ISKjb. The data path block DPH(j+1) includes the input switching circuit ISK(j+1)c, . . . . In the data pattern storage region DPSG, the storage units SUTa and SUTb are provided correspondingly to the input switching circuits ISKja and ISKjb, and a storage unit SUTc is provided correspondingly to the input switching circuit ISK(j+1)c.

The structure of each of the input switching circuits ISKja and ISKjb, ISK(j+1)c, . . . is the same as the structure of the data path shown in FIG. 24, and includes the data amplifiers 100*l* and 100*r*, the multiplexers 102*a* and 102*b*, the select masking circuits 52*a* and 52*b*, and the inverter 53.

In the data path block DPHj, a local select signal LSELBj<1:0> is given commonly to the multiplexers 102*b* and 102*d*. To the multiplexers 102*b* and 102*d* of the data path block DPH(j+1), a local select signal LSELB(j+1)<1:0> is given.

The select signal SELA<1:0> is given commonly to all the multiplexers 102*a* and 102*c* in the data path 50.

In the data pattern storage region DPSG, for the storage unit SUTa, global read data lines GRD1a and GRDra and global write data lines GWDAa, ZGWDAa, ZGWDBa, and GWDBa are provided. For the storage unit SUTb, global read data lines GRD1*b* and GRDrb and global write data lines GWDAb, ZGWDBb, ZGWDAb, and GWDBb are provided. For the storage unit SUTc, global read data lines GRD1*c* and GRDrc and global write data lines GWDAc, ZGWDBc, ZGWDAc, and GWDBc are provided.

In the structure of the data path 50 shown in FIG. 48, in each of the data path blocks DPHj and DPH(j+1), select paths for the multiplexers 102*b* and 102*d* are individually set according to the local select signals LSELBj<1:0> and LSELB(j+1)<1:0>.

Figure 50:
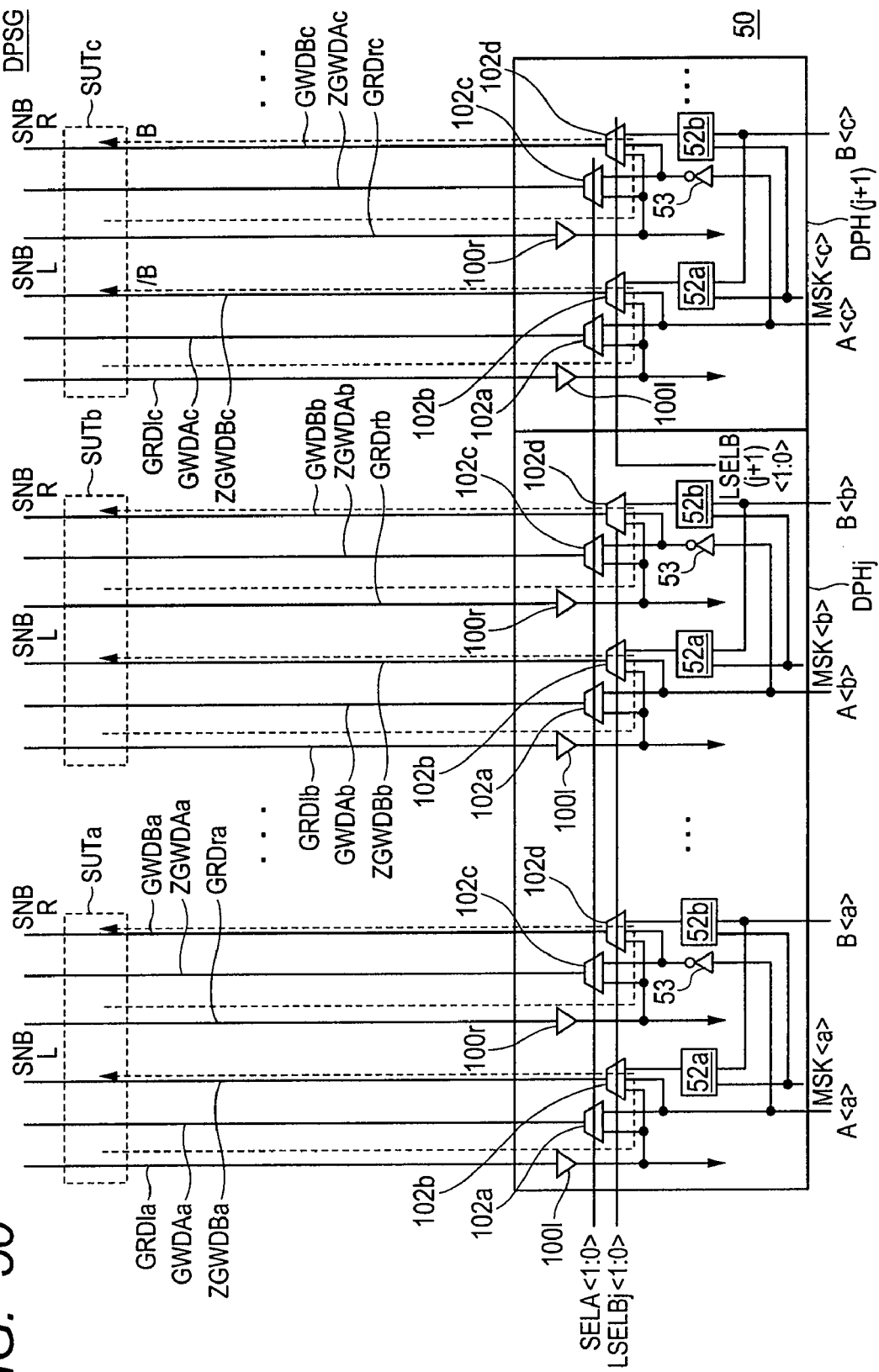
FIG. 50 is a view schematically showing write data transfer paths during the writing of masked data in the data path blocks shown in FIG. 49.

FIG. 50 is a view schematically showing data transmission paths during data writing in the data path blocks DPHj and DPH(j+1) shown in FIG. 49. In the transmission data paths shown in FIG. 50, the writing of a to-be-retrieved data pattern to the data path block DPHj is not performed, but the writing of a to-be-retrieved data pattern to the data path block DPH (j+1) is performed.

In this case, according to the local select signal LSELBj<1:0>, the multiplexers 102*b* and 102*d* of the data path block DPHj are set into respective states where output signals from the corresponding data amplifiers 100*l* and 100*r* are selected. On the other hand, the local select signal LSELB(j+1)<1:0> is set into a state where the multiplexers 102*b* and 102*d* of the data path block DPH(j+1) select output signals from the select masking circuits 52*a* and 52*b* each of which receives a write data bit B<c> from the outside. The select masking circuits 52*a* and 52*b* select data bits /B<c> and B<c> according to a masking indication signal MSK<c>, and transmit the data bits.

In the state of path setting, after the read word lines RWLA and RWLB are driven into the selected state in the selected entry, the B-port write word line WWLB is driven into the selected state. Accordingly, in the storage units SUTa and SUTb each provided for the data path block DPHj, the data items stored in the storage nodes SNBL and SNBR thereof are only rewritten to the corresponding storage nodes SNBL and SNBR. That is, in each of the storage nodes SNA (SNAL and SNAR), the data "1" is written in the initial state. As a result, in the storage units SUTa and SUTb, rewriting of the stored data items is performed, and destruction of the stored data items does not occur.

On the other hand, in the data path block DPH(j+1), the inverted bit /B<c> of the data bit B<c> and the write bit B<c> from the select masking circuits 52*a* and 52*b* are selected by the corresponding multiplexers 102*b* and 102*d*, and stored in the storage nodes SNBL and SNBR of the storage unit SUTc. At this time, the internal reading of the stored data from the storage unit SUTc is performed via the data amplifiers 100*l* and 100*r*, but the A-port write word line WWLA is in the non-selected state so that the internal read data exerts no influence.

As a result, as previously described with reference to FIGS. 38 to 44, the data patterns having different pattern lengths can be successively stored in empty regions without causing the rewriting of the already registered data patterns.

Although data transmission paths during a retrieving operation are not shown, as shown in FIG. 26, they are set in the same manner as in Embodiment 2. That is, in each of the data path blocks DPH1 to DPH5, the multiplexers 102*a* to 102*c* are set into the states where the output signals from the corresponding data amplifiers 100*l* and 100*r* are selected. On the other hand, the multiplexers 102*b* and 102*d* are set into the states where the retrieval data A<j> from the outside and the inverted retrieval data /A<j> from the inverter 53 are selected. In this manner, the given retrieval data is transferred to the FIFO region via the multiplexers 102*b* and 102*d*, stored, and queued, and the queued retrieval data is transferred to the TCAM region via the multiplexers 102*a* and 102*c* to allow retrieving operations to be successively executed.

Note that, when all the sub-blocks SB1 to SBn are each used as the TCAM region, the state is set where the retrieval data items A and /A are selected in each of the data path blocks DPH1 to DPH5 in the same manner as in Embodiment 1. Therefore, according to the array structure, the logics of the select signals may be determined appropriately, and the coupling path for the multiplexers 102*b* and 102*d* may be set appropriately.

In addition, by performing the setting of the local select signals SELA<1:0> and SELB<1:0> for each of the sub-blocks and executing rewriting on a per sub-block basis, it is possible to store data items having different pattern lengths on a sub-block basis, and store a plurality of data patterns in one entry. As a result, even when pattern lengths are different in the individual sub-blocks during the registration of to-be-retrieved data patterns in Embodiments 1 and 2, the plurality of data patterns can be mapped into one entry without causing the overwriting of the previously registered to-be-retrieved data patterns. Moreover, as described below in detail, the empty regions can be maintained in the "don't care" state in the data pattern storage region DPSG.

Furthermore, by using the masking indication signal MSK<j> in the data path block, the pattern length of to-be-retrieved data can be set on a per bit basis.

Figure 51:
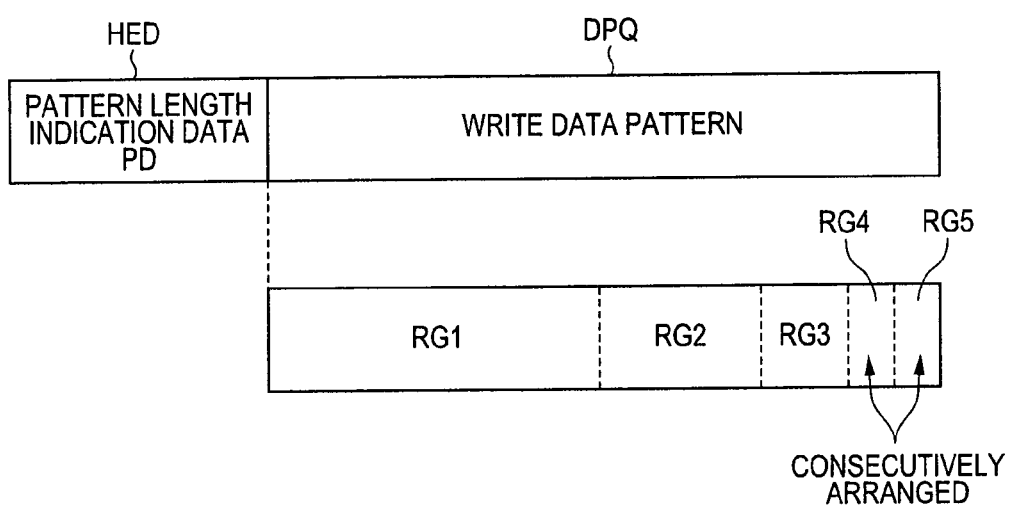
FIG. 51 is a view schematically showing a packet configuration during the transfer of the write data in Embodiment 3 of the present invention.

FIG. 51 is a view schematically showing a structure of a to-be-retrieved data pattern supplied to the semiconductor signal processing apparatus according to Embodiment 3 of the present invention. In FIG. 51, the inputted write data packet includes a header HED and a data region DPQ. In the header HED, pattern length indication data PD indicating the pattern length of data to be stored in the data region DPQ is stored. In the data region DPQ, the write data pattern is stored. The data region DPQ is disposed in the regions correspondingly to the respective regions RG1 to RG5 of the operator cell array, and the write data pattern is stored in each region corresponding to the pattern length. The pattern length indication signal PD stored in the header HED is decoded, a write region is specified, and a write data transfer path is set.

Figure 52:
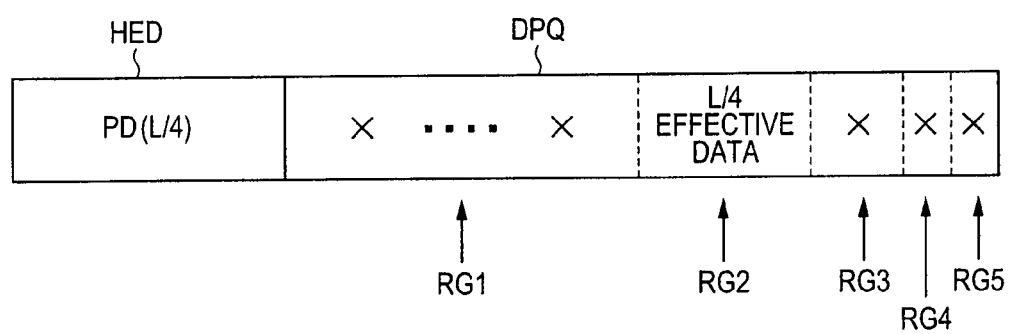
FIG. 52 is a view schematically showing a specific example of a structure of the data packet shown in FIG. 51.

FIG. 52 is a view showing a specific example of a structure of the write data shown in FIG. 51. In FIG. 52, in the header HED, the pattern length indication data PD (L/4) showing the pattern length L/4 is stored. In the data region DPQ, in the region corresponding to the data storage region RG2, effective data of the pattern length L/4 is stored. Data items stored in the remaining regions RG1 and RG3 to RG5 are arbitrary (X).

As shown in FIGS. 51 and 52, by extracting the pattern length indication data PD included in the header HED and disposing the write data in the regions of the data region DPQ corresponding to the data storage regions RG1 to RG5, it is possible to precisely write the write data in the data storage regions of the entries in the operator array corresponding to the pattern lengths, as will be described below. By generating effective/ineffective bit indications for individual data bits in a coupling manner in the effective data regions, a masking indication signal MSK<j> can be generated on a per bit basis.

Figure 53:
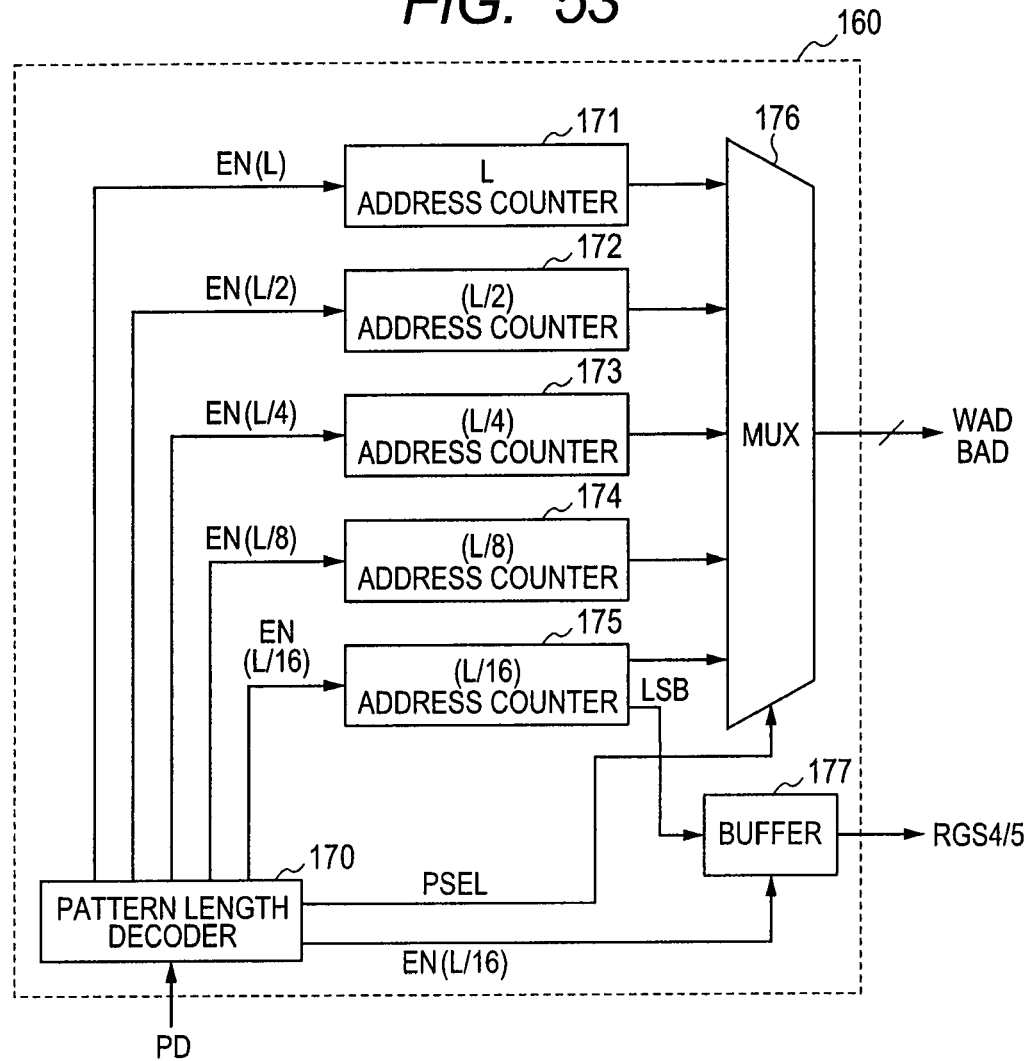
FIG. 53 is a view schematically showing a structure of a write address generation portion in the semiconductor signal processing apparatus in Embodiment 3 of the present invention.

FIG. 53 is a view schematically showing an example of a structure of a write address generation circuit 160 in the semiconductor signal processing apparatus according to Embodiment 3 of the present invention. In FIG. 53, the write address generation circuit 160 includes a pattern length decoder 170 for decoding the pattern length indication data PD, address counters 171 to 175 for selectively performing counting operations according to a decode signal from the pattern length decoder 170, a selection circuit (MUX) 176 for selecting one of output address signals from the address counters 171 to 175 according to a multi-bit select signal PSEL from the pattern length decoder 170, and generating the write address WAD and a block address signal, and a buffer 177 for selectively passing the least significant bit LSBB of the address counter 175 according to an indication signal EN (L/16) from the pattern length decoder 170, and generating a region specification signal RGS4/5.

The pattern length decoder 170 decodes the pattern length indication data PD included in the header HED, and selectively asserts any of pattern length enable signals EN(L), EN(L/2), EN(L/4), EN(L/8), and EN(L/16) according to the decoding result. The pattern length enable signal EN(L) is asserted when the pattern length indication data PD specifies the pattern length L. The pattern length enable signal EN(L/2) is asserted when the pattern length indication data PD specifies the pattern length L/2. The pattern length enable signal EN(L/4) is asserted when the pattern length indication data PD specifies the pattern length L/4. The pattern length enable signals EN(L/8) and EN(L/16) are asserted when the pattern length indication data PD specifies the pattern length L/8 and L/16.

The L address counter 171 updates the count value thereof in response to the assertion of the pattern length enable signal EN(L), and outputs the count value thereof as an address signal specifying the write address of the data of the pattern length L. The L/2 address counter 172 updates the count value thereof in response to the assertion of the pattern length enable signal EN(L/2), and generates the write address of the write data of the pattern length L/2.

The L/4 address counter 173 performs a counting operation in response to the assertion of the pattern length enable signal EN(L/4), and outputs the count value thereof as the write address of the write data of the pattern length L/4. The L/8 address counter 174 performs a counting operation in response to the assertion of the pattern length enable signal EN(L/8), and generates the write address of the data of the pattern length L/8 with the count value thereof. The L/16 address counter 175 performs a counting operation in response to the assertion of the pattern length enable signal EN(L/16), specifies the write region of the data pattern of the pattern length L/16 with the least significant address bit LSBB, and generates the write address (entry address) of the data pattern of the pattern length L/16 with the remaining higher-order bits.

The selection circuit 176 selects the one of the output signals from the address counters 171 to 175 that corresponds to the asserted pattern length enable signal according to a pattern select signal PSEL from the pattern length decoder 170, and generates the pattern length write address WAD and a write block address.

The buffer 177 performs a buffering process to the least significant bit LSBB of the (L/16) address counter 175 when the pattern length enable signal EN(L/16) from the pattern length decoder 170 is asserted, and generates the region specification signal RGS4/5. By the region specification signal RGS4/5, it is specified whether the write region is the region RG4 or the region RG5. Accordingly, the (L/16) address counter 175 has the count value thereof one bit larger than that of each of the address counters 171 to 174 to specify each of the write entry and the write data storage region, and the least significant bit LSBB is used as a region specification bit specifying either of the regions RG4 and RG5. This allows the write data of the data pattern length L/16 to be stored in each of the regions RG4 and RG5 of the same entry.

Note that the region specification signal RGS4/5 may also be generated in such a manner as to be separated into a region specification signal RGS4 specifying the region RG4 and a region specification signal RGS5 specifying the region RG5.

To use the least significant bit LSBB of the (L/16) address counter 175 for specifying a region, in the regions of the data region DPQ of the input data packet corresponding to the regions RG4 and RG5, data patterns each of the pattern length L/16 are consecutively arranged. The consecutive arrangement of the data patterns each of the pattern length L/16 in the regions of the data region DPQ corresponding to the regions RG4 and RG5 may also be performed such that, by merely using a complier or the like outside the apparatus, the positions are changed according to the data pattern lengths. Instead of this, it is also possible that the pattern length indication data PD may be decoded using a data array conversion circuit such as a barrel shifter not shown, and the data patterns may be stored consecutively in the regions corresponding to the regions RG4 and RG5 when the pattern length is L/16.

Figure 54:
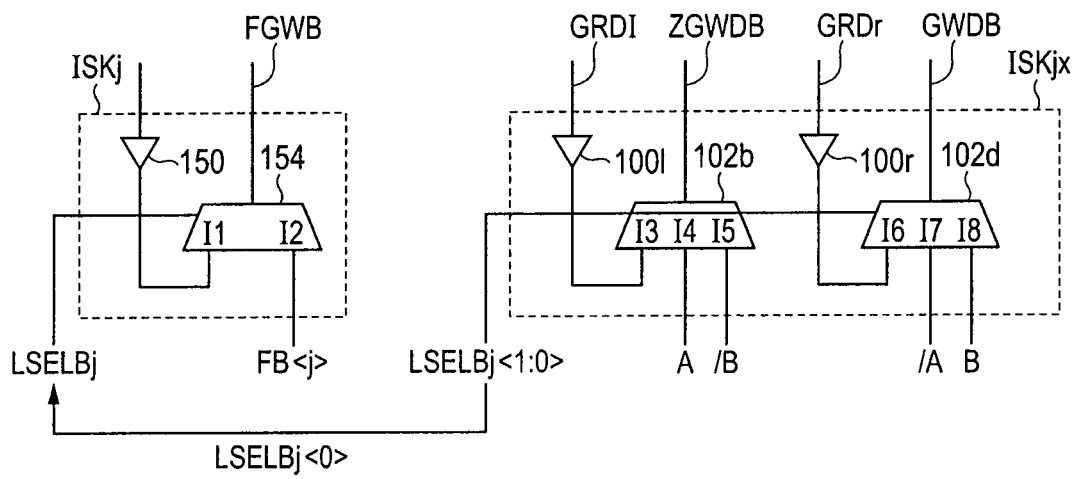
FIG. 54 is a view schematically showing a structure of each of the data path blocks in the semiconductor signal processing apparatus according to Embodiment 3 of the present invention.

FIG. 54 is a view schematically showing correspondences between inputs from the multiplexers to the respective B ports of the input switching circuits ISKj and ISKjx and the local select signals. In FIG. 54, the input switching circuit ISKj is provided correspondingly to a mapping flag bit FB<j>, and the multiplexer 154 thereof selects one of the output signal from the data amplifier 150 given to an input I1 and the mapping flag bit FB<j> given to an input I2 according to the local select signal LSELBj, and transmits the selected one to the corresponding global write data line FGWB. j is any of 1 to 5. The local select signal LSELBj is generated from the lower-order bit LSELBj<0> of the 2-bit local select signal LSELBj<1:0>. The multiplexer 150 provided for the most significant flag bit has a path thereof set according to a select signal LSBL0 described later. The select signal LSBL0 is brought into the selected state when each of region specification signals RG1 to RG5 is in the selected state.

In the input switching circuit ISKjx provided for a to-be-retrieved data bit, the multiplexer 102b selects one of the output signal from the corresponding data amplifier 100l given to an input I3, the to-be-retrieved data bit A given to an input I4, and an inverted write data bit (to-be-retrieved data bit)/B given to an input I5 according to the 2-bit local select signal LSELBj<1:0>, and transmits the selected one onto the corresponding global write data line ZGWDB.

Likewise, the multiplexer 102d selects one of the output signal from the corresponding data amplifier 100r given to an input 16, the to-be-retrieved data bit /A given to an input 17, and the write data bit B given to an input 18 according to the local select signal LSELBj<1:0>, and transmits the selected one onto the global write data line GWDB.

As shown in FIG. 54, in the semiconductor signal processing apparatus in Embodiment 3, the operator cell array corresponds to the structure including the TCAM region and the FIFO region described in Embodiment 2. However, the FIFO region need not particularly be used. All the sub-blocks SB1 to SBn may be each used as the TCAM region. However, the global read data lines and the path switching transistors are provided for the sense amplifier circuits.

The following is the summary of the foregoing operation. In the mapping flag memory region, during a retrieval mode, each of the read word lines RWLA and RALB is driven into the selected state, and the stored data items are read into the global read lines. At this time, the data "1" is selected by the multiplexer (152), and transmitted to the global write data line GWDA. Thereafter, a retrieving operation, i.e., the writing of data items on the global write data lines FGWA and GWDA to each of the storage nodes SNA of the selected entry and the reading of data items stored in the operator cells are executed. As a result, in the entry to which retrieval is performed, the mapping flag bits are only rewritten.

In the data pattern storage region, during retrieval, retrieval data is transferred by the multiplexers (102a and 102c) to the global write data lines GWDA. Thereafter, the writing of the retrieval data to the storage nodes SNA in the TCAM region, the reading of the data stored in the operator cells therefrom, and the transfer of the output signals from the sense amplifier circuits to the corresponding local match lines are executed. The retrieval data is retrieval data from the outside or retrieval data queued in the FIFO region.

During data writing, write data is transferred to the global write data line GWDB so that the writing of the write data to each of the storage nodes SNB of the selected entry is performed. The write data is the stored data read from the selected entry or write data from the outside.

Figures 55, 56:
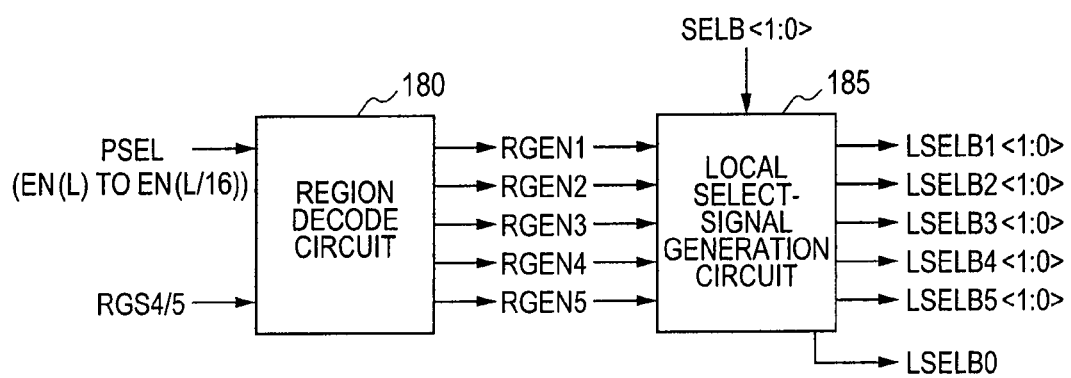
FIG. 55 is a view showing a list of forms of coupling between a local select signal to each of the data path blocks that is shown in FIG. 54 and individual multiplexers.
FIG. 56 is a view schematically showing a structure of a local select-signal generation portion in the semiconductor signal processing apparatus according to Embodiment 3 of the present invention.

FIG. 55 is a view showing a list of correspondences between the logics of the local select signals in the multiplexers of the input switching circuits shown in FIG. 54 and inputs selected at that time. During a retrieval mode, the local select signal LSELBj<1:0> is set to (0,0). j is an integer of 1 to 5. In this case, the multiplexer 154 selects the output signal from the data amplifier 150 given to the input I1, the multiplexer 102b selects the retrieval data A given to the input I4, and the multiplexer 102d selects the retrieval data /A given to the input 17. During the retrieval mode, the internal read bit from the data amplifier 150 may also be read to the outside. At this time, the multiplexers (102a and 102b) select the output signals from the data amplifiers 100l and 100r, and transfer the retrieval data to the global write data lines GWDA and ZGWDA not shown.

During the writing of the external data, in the case of the selected data path block, the local select signals LSELBj(1,0) is set at (0,1). In this case, the multiplexer 154 selects the input 12, and selects the mapping flag bit FB<j> from the outside. The multiplexers 102b and 102d respectively select the inputs 15 and 18, and select write data bits /B and B from the outside.

During the external write mode, for the non-selected data path block, the local select signal LSELBj<1:0> is set to (1,0). In this case, the multiplexer 154 selects the internal read data from the data amplifier 150 given to the input I1. The multiplexers 102b and 102d respectively select the internally read data items from the corresponding data amplifiers 100l and 100r.

The state of (1,1) of the local select signal LSLBj<1:0> is an unused state, and is stored so as to correspond to another mode extension.

As shown as the list in FIG. 54, during a retrieval mode, the multiplexers 102b and 102d select the retrieval data bits A and /A from the outside, whereby the buffer writing of the retrieval data bits to the FIFO region is implemented. At this time, in the input switching circuit ISKj for the mapping flag bits, the internally read flag bits are read and transmitted to the global write data line ZGWB. As a result, during the retrieving operation, the flag bits are only read and rewritten (in parallel with the retrieving operation).

For the select signal SELA<1:0>, the following logic is satisfied, though not shown. During a retrieving operation, to the multiplexers 152 for the mapping flag memory region, the output signals from the data amplifiers 150 are selected and transmitted to the global write data lines FGWA. In the data pattern storage region, the multiplexers 102a and 102b select the output signals from the data amplifiers 100l and 100r, and transmit the output signals to the corresponding global write data lines GWDA.

During data writing (during the registration of a to-be-retrieved data patterns), a coupling path for the multiplexers 152, 102c, and 102c is arbitrary. This is because, during data writing, the A-port write word line WWLA is maintained in the non-selected state.

Note that the foregoing logic is satisfied when the sub-blocks are used as the TCAM region and the FIFO region. When all the sub-blocks are each used as the TCAM region, during a retrieving operation, the multiplexers 102a and 102c select the retrieval data items A and /A from the outside. The multiplexers 152 select the output signals from the data amplifiers 150.

According to the structure of the operator array, the logics of the select signals SELA<1:0> and SELB<1:0> may be set appropriately.

Note that, instead of using the structure described above, it is also possible that a hierarchical word line structure may be used for the write word lines, and local write word lines may be disposed separately and individually for the mapping flag memory region and the data pattern storage region. During a retrieving operation, the write word lines WWLA and WWLB provided for the mapping flag region are constantly set in the selected state and, in the data pattern storage region, the write word line WWLA is driven into the selected state according to the counter address signal. In this case, even in a structure in which the sub-blocks SB1 to SBn are divided into the TCAM region and the FIFO region, the rewriting of the mapping flag does not occur during the retrieving operation, and the mapping flag can be stably maintained.

FIG. 56 is a view schematically showing an example of a structure of a portion which generates a local select signal. In FIG. 56, a local select-signal generating portion includes a region decode circuit 180 for decoding the pattern length select signals PSEL (pattern length enable signal EN(L) to EN(L/16)) and the region specification signal RGS4/5, and generating region activation signals RGEN1 to RGEN5, and a local select-signal generation circuit 185 for generating the local select signals LSELB1<1:0> to LSELB5<1:0> and LSELB0 according to the region activation signals RGEN1 to RGEN5 and the main select signal SELB<1:0>.

The region decode circuit 180 activates the region activation signals RGEN1 to RGEN3, RGEN4, and RGEN5 each specifying a region to be activated according to the data pattern length specified by the pattern length select signal PSEL. When the data pattern length is L, all the region activation signals RGEN1 to RGEN5 are asserted. When the data pattern length is L/2, the region activation signal RGEN1 is asserted to specify the data path block DPH1. When the data pattern length is L/4, the region activation signal RGEN2 is asserted to specify the data path block DPH2. When the data pattern length is L/8, the region activation signal RGEN3 is specified, and the writing of data from the outside to the region corresponding to the data path block DPH3 is performed. When the data pattern length is L/16, either of the region activation signals RGEN4 and RGEN5 is asserted according to the bit value of the region specification signal RGS4/5. As a result, one of the data path blocks DPH4 and DPH5 is asserted, and the region to which the data pattern of the pattern length L/16 is written is specified.

The local select-signal generation circuit 185 generates the local select signals correspondingly to the selected data path block and the non-selected data path block according to the region activation signals RGEN1 to RGEN5. The local select signal LSELB0 is asserted when all the region activation signals RGEN1 to RGEN5 are asserted.

Figure 57:
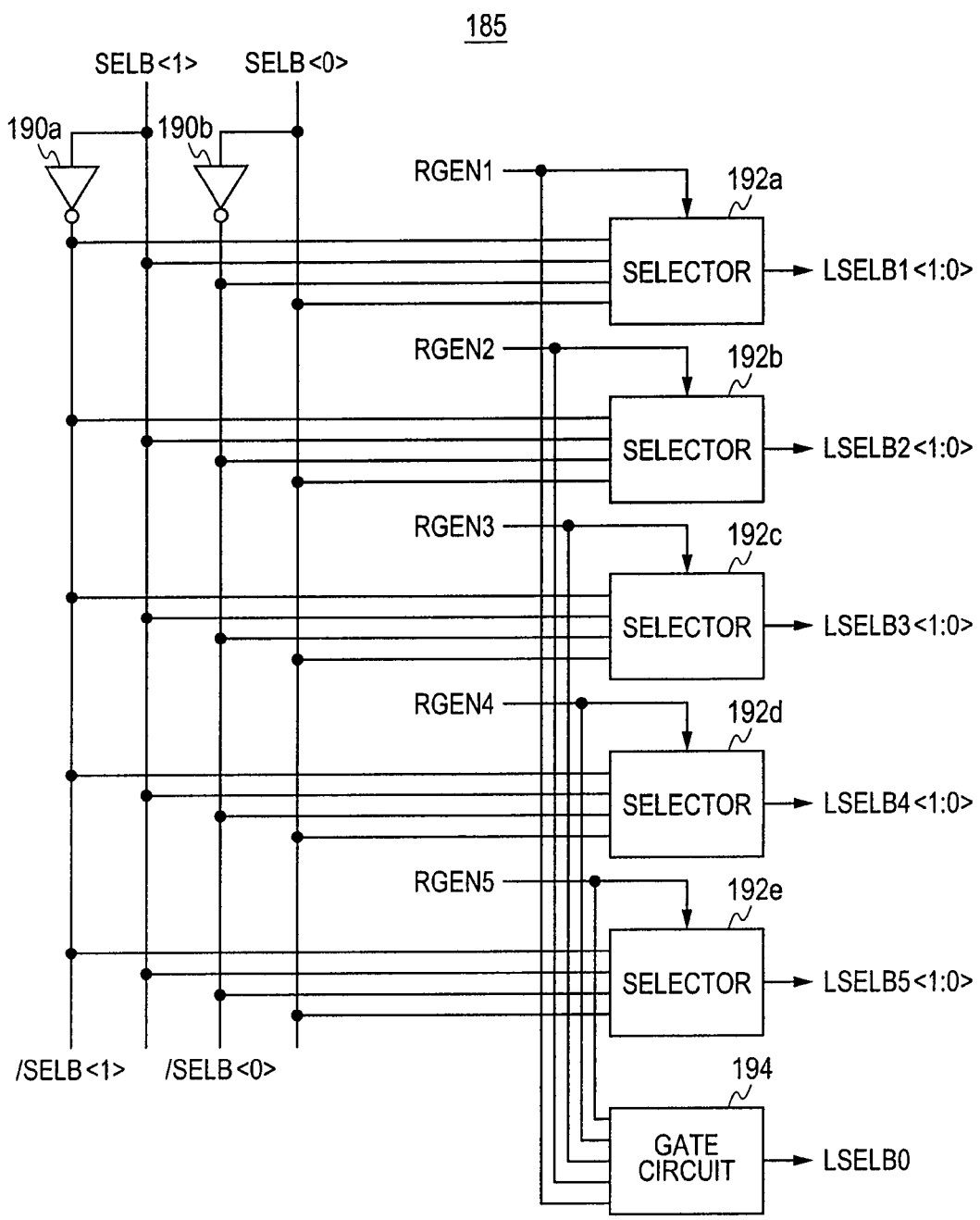
FIG. 57 is a view schematically showing an example of a structure of the local select-signal generation portion shown in FIG. 56.

FIG. 57 is a view schematically showing an example of a specific structure of the local select-signal generation circuit 185 shown in FIG. 56. In FIG. 57, the bits SELB<1> and SELB<0> of the main select signal are inverted by respective inverters 190a and 190b, and complementary data bit pairs are generated. Correspondingly to the respective local select signals LSELB1<1:0> to LSELB5<1:0>, selectors 192a to 192e are provided. The selector 192a receives the select bits SELB<1> and SELB<0> and the main select signal bits /SELB<1> and /SELB<0>, selects one of the complementary bits in each of the pairs according to the region activation signal RGEN1, and generates the 2-bit local select signal LSELB1<1:0>.

In each of the remaining selectors 192b to 192e also, respective 1-bit signals are selected from the complementary bits SELB<1> and /SELB<1> forming the pair and from the complementary bits SELB<0> and /SELB<0> according to the region activation signals RGEN2 to RGEN5 to generate the local select signals LSELB2<1:0> to LSELB5<1:0>.

In the structure shown in FIG. 57, as is obvious from the logic table shown in FIG. 54, the selectors 192a to 192e select the select bits SELB<1> and SELB<0> when the corresponding region activation signals RGEN1 to RGEN5 are asserted, and generate the corresponding local select signals. On the other hand, when the corresponding region activation signals RGEN1 to RGEN5 show the non-selected state, the selectors 192a to 192e select the complementary select bits /SELB<1> and /SELB<0>, and generate the corresponding local select signals LSELB1<1:0> to LSELB5<1:0>.

By a gate circuit 194 which receives the region activation signals RGEN1 to RGEN5, the select signal LSELB0 for the most significant bit of the mapping flag bits in the mapping flag memory region is generated. The gate circuit 194 asserts the corresponding region select signal LSELB0 to "1" when all the region activation signals RGEN1 to RGEN5 are asserted.

Figure 58:
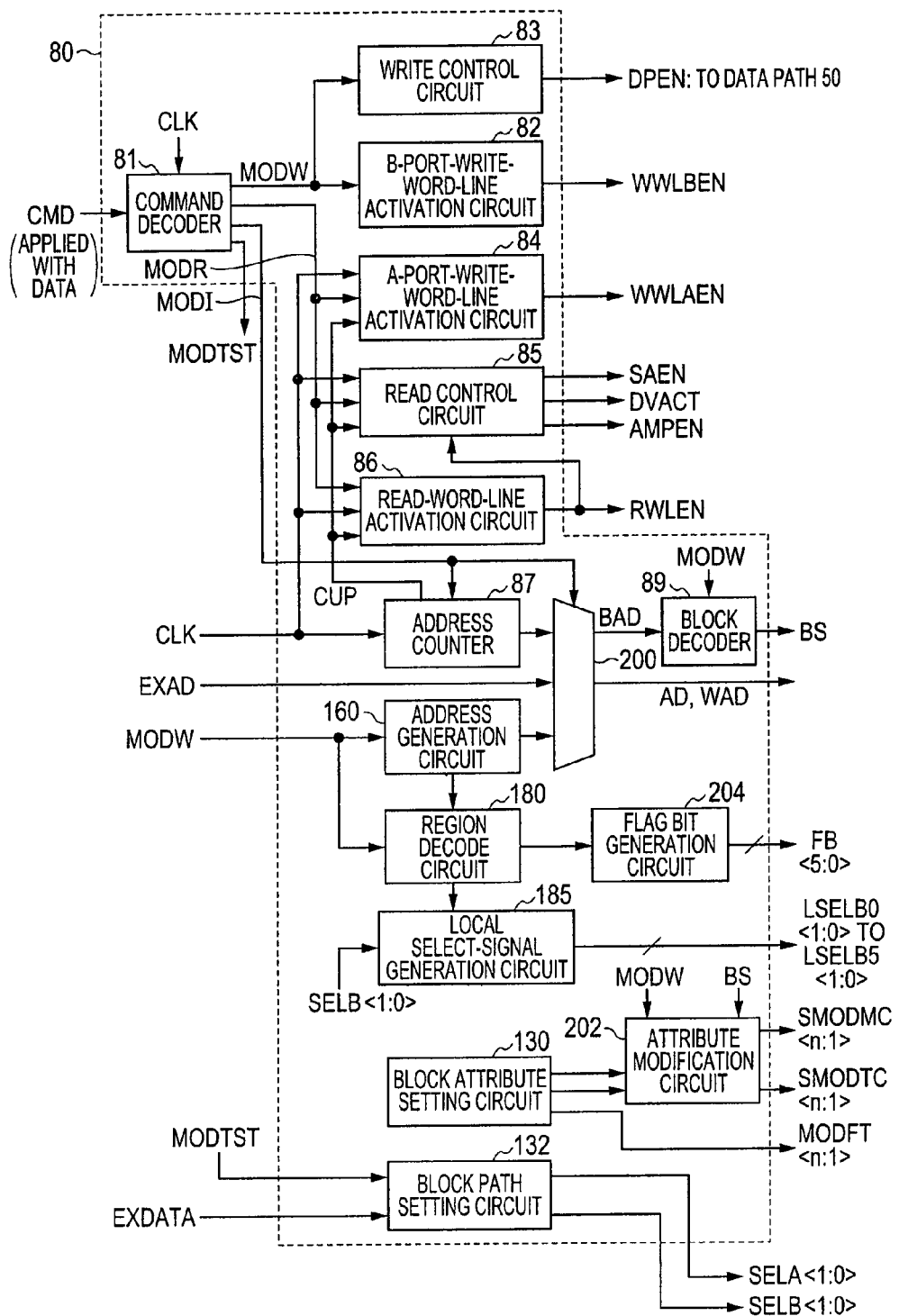
FIG. 58 is a view schematically showing a structure of the control circuit in the semiconductor signal processing apparatus according to Embodiment 3 of the present invention.

FIG. 58 is a view schematically showing a structure of the control circuit of the semiconductor signal processing apparatus according to Embodiment 3 of the present invention. The structure of the control circuit shown in FIG. 58 is different from the structure of the control circuit 80 shown in FIG. 22 in the following point. That is, a multiplexer 200 is provided which selects either the address counter 87 and the external address signal EXAD or the address from the address generation circuit 160 according to the mode indication signal MODI. The address generation circuit 160 is asserted when the write mode indication signal MODW is asserted to generate a to-be-retrieved data write address according to the pattern length indication data PD, as shown in FIG. 52. At this time, the multiplexer 200 selects the output signal from the address generation circuit 160. On the other hand, during a retrieval mode, the multiplexer 200 selects an address count value generated by the address counter 87, and selects the external address EXAD during additional registration of a to-be-retrieved data pattern.

The internal address signal from the address generation circuit 160 includes the write-word-line address signal WAD and the write block address signal BAD, and the block select signal BS is generated by the block decoder 89.

The block attribute setting circuit 130 fixedly generates the mode indication signals MODTC<n:1>, MODMC<n:1>, and MODFT<n:1> for each of the memory sub-blocks in the same manner as in the structure shown in FIG. 31. An attribute modification circuit 203 generates the block TCAM mode indication signal SMODTC<n:1> and the block memory mode indication signal SMODMC<n:1> according to the block select signal BS and the write mode indication MODW.

The attribute modification circuit 202 modifies the mode indication signals MODTC<n:1> and MODMC<n:1> from the block attribute setting circuit 130 according to the block select signal BS and the write mode indication MODW, and generates the block TCAM mode indication signal SMODTC<n:1> and the block memory mode indication signal SMODMC<n:1>.

A flag-bit generation circuit 204 generates the flag bits FB<5:0> according to the region activation signals RGEN1 to RGEN5 from the region decoder 180. When the region activation signals RGEN1 to RGEN5 are each in an active state, the most significant bit FB<0> is set. In other situations, the flag bits FB<1> to FB<5> corresponding to the regions specified by the region activation signals RGEN1 to RGEN5 are set. In this manner, the flag bit for the region where effective data is written is set to "1".

According to the select signals SELA<1:0> and SELB<1:0> generated by the block path setting circuit 132, from the select signal SELB<1:0>, the local select signals LSELB1<1:0> to LSELB5<1:0> and LSELB0 are generated by the region decode circuit 180 and the local select-signal generation circuit 185.

The structure of the control circuit 80 shown in FIG. 57 is otherwise the same as the structure of the control circuit shown in FIG. 22, and a detailed description thereof is omitted by providing the corresponding portions with the same reference numerals.

The sub-blocks SB1-SBn can be divided into the TCAM region and the FIFO region. Accordingly, in the control circuit 80, the lead pointer 110, the write pointer 112, and the pointer control logic 114 are disposed in the same manner as in the structure shown in FIG. 31, though not shown in FIG. 58, and read and write addresses for the FIFO region are generated during a retrieving operation.

Note that a structure using hierarchical word lines may also be used in which the local write word lines WWLA and WWLB are disposed separately and individually for the mapping flag memory region MFLG and the data pattern storage region DPSG, and main write word lines MWLLA and MWWLB are disposed commonly to these regions.

The structure of the operator cell array according to Embodiment 3 of the present invention is also applicable to the structure of each of Embodiments 1 and 2. In Embodiments 1 and 2, the pattern lengths are set on a per sub-block basis. Therefore, by applying the structure according to Embodiment 3 described heretofore thereto without any modification, when a data pattern having a pattern length shorter than the bit width of the entry is written, it is possible to prevent data in the region where the data is already written from being rewritten, and maintain the empty regions in the "don't care" state.

In this case, by generating the block select signal and the word line address as the write address signal, data patterns having different pattern lengths can be written on a per block basis.

Note that, during data writing, the operation of the sense amplifier circuit and/or data amplifier may also be halted with respect to the region where data writing is performed. It is also possible that, by combining the region activation signals RGEN1 to RGEN5 and the sense amplifier activation signal or the data amplifier activation signal, the operation of the sense amplifier circuit or the data amplifier may also be controlled on a per region basis.

Thus, according to Embodiment 3 of the present invention, the length of the data pattern to be stored is set changeable on a per entry basis, and the plurality of to-be-retrieved data patterns are stored in one entry. This can reduce the empty regions in the sub-blocks, and allows to-be-retrieved data patterns to be mapped more efficiently and at a higher density.

Note that the number of the types of the data pattern lengths is arbitrary as long as the minimum pattern length is not less than the bit width of the retrieval unit.

Note that, in Embodiment 3 also, during match detection, candidates for a matching data pattern can be extracted by detecting the address of the corresponding entry.

Embodiment 4

Figure 59:
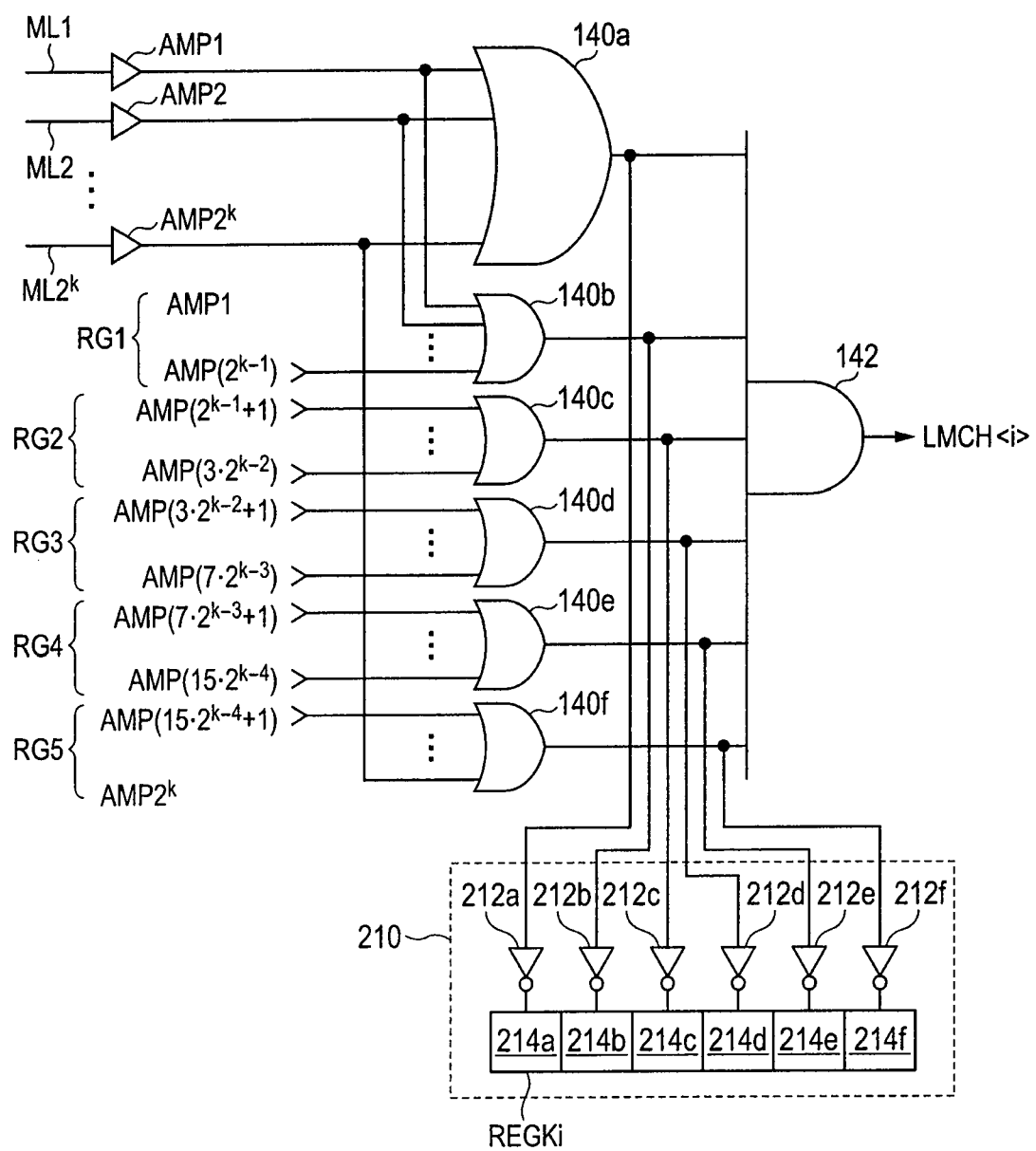
FIG. 59 is a view schematically showing a structure of a main portion of a semiconductor signal processing apparatus according to Embodiment 4 of the present invention.

FIG. 59 is a view schematically showing a structure of a main portion of a semiconductor signal processing apparatus according to Embodiment 4 of the present invention. In FIG. 59, a matching-pattern-length determination circuit 210 is provided for the local match determination circuit LMDi shown in FIG. 36. The matching-pattern-length determination circuit 210 includes inverters 212a to 212f for inverting respective output signals from the OR gates 140a to 140f, and a register circuit 214 for storing respective output signals from the inverters 212a to 212f. The register circuit 214 includes registers 214a to 214f provided correspondingly to the respective inverters 212a to 212f.

A structure of the local match determination circuit shown in FIG. 59 is the same as the structure shown in FIG. 36, and a detailed description thereof is omitted by providing the corresponding portions with the same reference numerals.

As previously described in Embodiment 3, in the local match determination circuit LMDi, the output signals from the OR gates 140a to 140f show the results of match/mismatch determination for the to-be-retrieved data patterns having different pattern lengths. Accordingly, by storing the inverted signals of the output signals from the individual OR gates 140a to 140f in the register circuit 214, it is shown that, when the value stored in the register 214f is "1", a match is detected for the to-be-retrieved data of the corresponding pattern length.

As a result, in the case where the to-be-retrieved data patterns of the plurality of pattern lengths are stored in one entry, when the local match determination signal LMCH<i> is at the L level and shows a match, by viewing the values stored in the registers 214a to 214f of the register circuit 214, the pattern length of the matching data pattern can be recognized.

Figure 60:
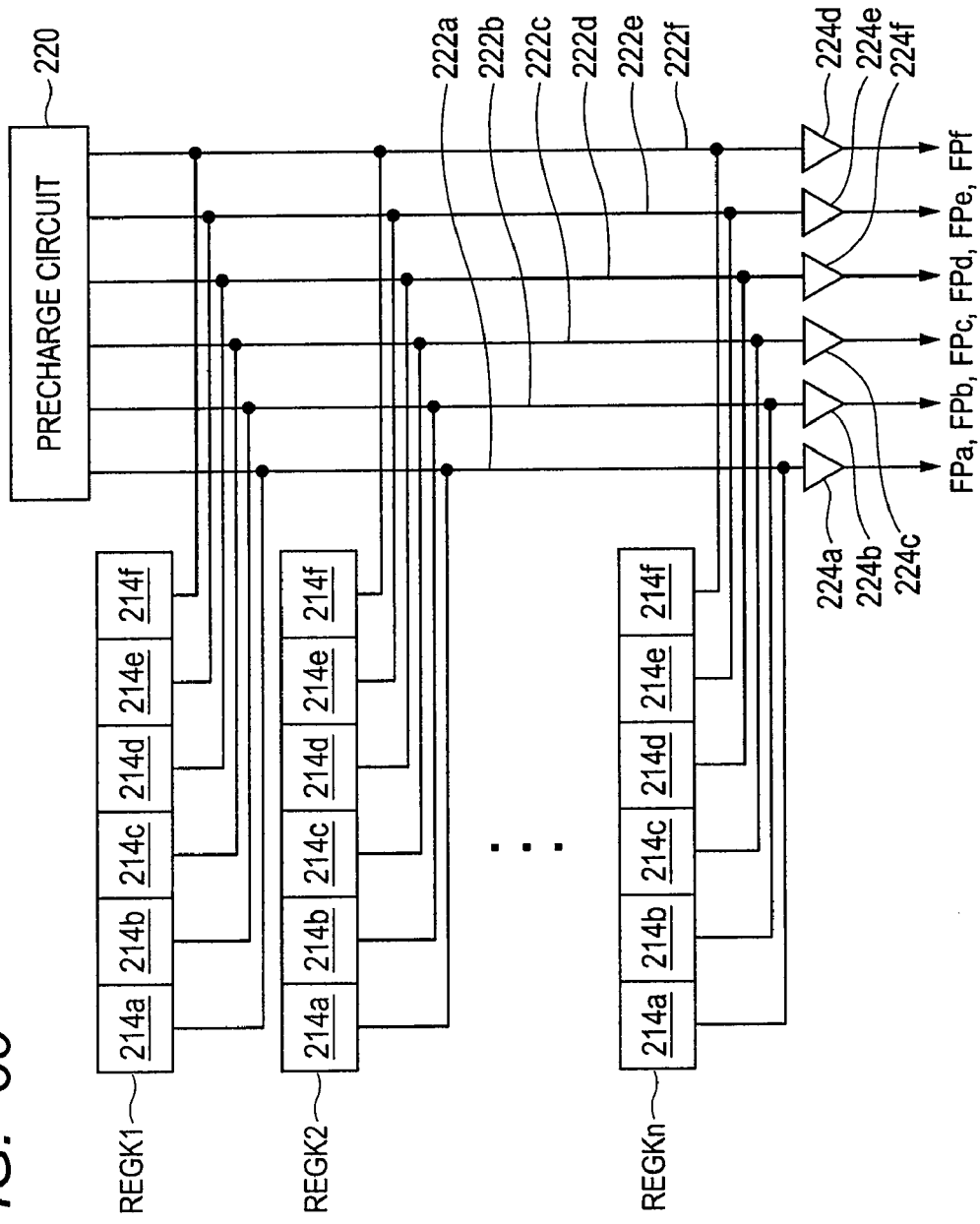
FIG. 60 is a view schematically showing a structure of a final-retrieval-determination-flag generation portion having the structure shown in FIG. 59.

FIG. 60 is a view schematically showing a portion which finally detects the pattern length of a matching pattern. In FIG. 60, the matching-pattern-length determination circuits are disposed correspondingly to the individual sub-blocks, but register circuits REGK1 to REGKn are representatively shown FIG. 60. Correspondingly to the respective registers 214a to 214f included individually in the register circuits REGK1 to REGKn, pattern-length-match detection lines 222a to 222f are provided. To the pattern-length-match detection lines 222a to 222f, the corresponding registers 214a to 214f of the register circuits REGK1 to REGKn are wired-OR coupled.

For the pattern-length-match detection lines 222a to 222f, a precharge circuit 220 for precharging each of the pattern-length-match detection lines 222a to 222f to the ground voltage level upon initialization is provided on one side thereof. For the pattern-length-match detection lines 222a to 222f, pattern length detection amplifiers 224a to 224f are provided on the other side thereof.

The pattern length detection amplifiers 224a to 224f amplify the potentials of the corresponding pattern-length-match detection lines 222a to 222f, and output final matching-pattern-length indication flags FPa to FPf.

In the case of the structure shown in FIG. 60, when a matching pattern is detected in a certain sub-block, the value stored in the corresponding one of the registers 214a to 214f is set at the H level ("H"), and the potential level of the corresponding pattern-length-match detection line rises. In the pattern-length-detection amplifiers 224a to 224f, by amplifying the potentials of the pattern-length-match detection lines 222a to 222f, the corresponding one of the final matching-pattern-length indication flags FPa to FPf is set at the H level ("H"), and the pattern length of the matching data pattern can be reported to the outside.

Note that the final matching-pattern-length indication flags FPa to FPf may also be outputted in parallel to the outside, or successively shifted out on a bit-by-bit basis using a shift register not shown.

In the structure shown in FIG. 59, instead of the individual pattern-length-matching detection lines 222a to 222f, OR gates may also be used. In each of the OR gates, an OR operation of the value stored in the corresponding register is performed, and a match/mismatch signal is generated with an OR signal. In the case of using the OR gates, the pattern length determination amplifiers need not particularly be provided.

Variation of Embodiment 4

Figure 61:
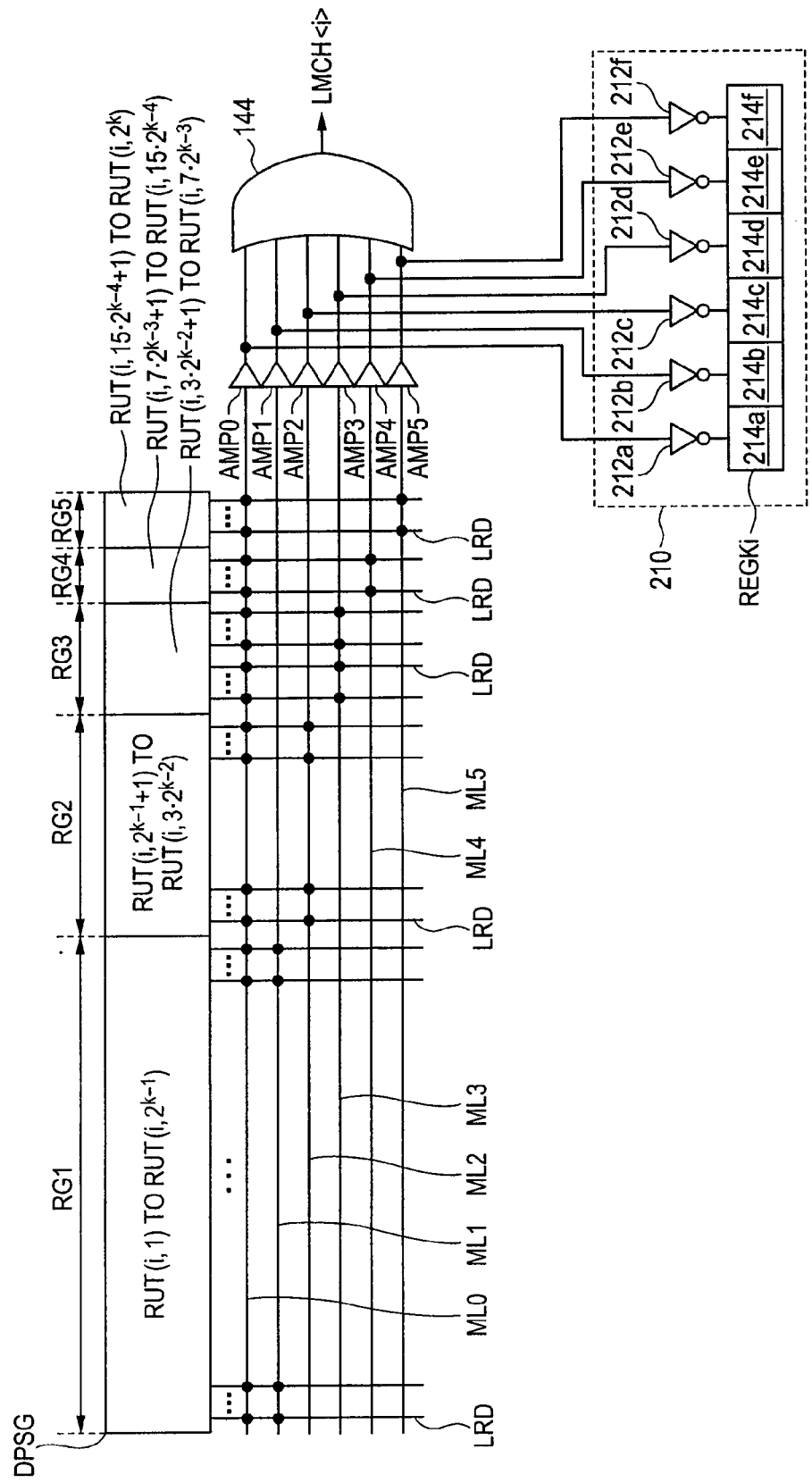
FIG. 61 is a view schematically showing a structure of a main portion of a variation of the semiconductor signal processing apparatus according to Embodiment 4 of the present invention.

FIG. 61 is a view schematically showing a structure of a variation of Embodiment 4 of the present invention. In the structure shown in FIG. 61, the matching-pattern-length determination circuit 210 is provided for the configuration of the local match lines shown in FIG. 37. That is, the output signals from the match line amplifiers AMP0 to AMP5 are given to the respective inverters 212a to 212f of the matching-pattern-length determination circuit 210. A structure of the matching-pattern-length determination circuit 210 is the same as the structure shown in FIG. 59 previously described so that a detailed description thereof is omitted by providing the corresponding portions with the same reference numerals.

In the structure shown in FIG. 61 also, the match line amplifiers AMP0 to AMP5 are provided correspondingly to the individual pattern lengths so that each of the output signals therefrom is set at the L level when a match occurs. Therefore, by viewing the logic values of the bits stored in the registers 214a to 214f of the register circuit REGKi, the pattern length of a matching data pattern can be recognized.

In the configuration of the local match lines shown in FIG. 61 also, as a structure for generating the final matching-pattern-length indication flag, the structure shown in FIG. 60 can be used.

As described above, according to Embodiment 4 of the present invention, data showing the result of match determination on a per pattern-length basis is stored and, even when the plurality of data patterns are stored in one entry, the matching pattern length when there is a matching data pattern can be easily recognized. As a result, through a combination with the address of a matching entry, the matching data pattern can be recognized. Therefore, by, e.g., recognizing the corresponding data pattern of the matching pattern length, it is possible to identify the type of a virus in an unauthorized access or the like.

Embodiment 5

Figure 62:
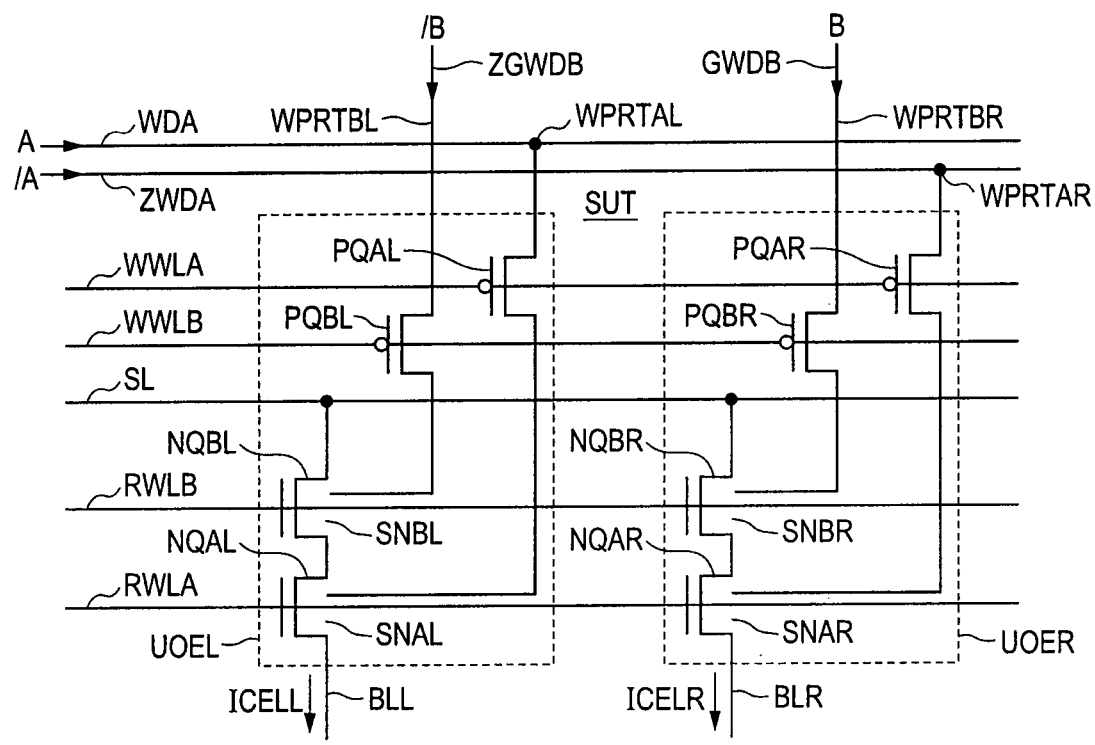
FIG. 62 is a view showing a structure of the storage unit in a semiconductor signal processing apparatus according to Embodiment 5 of the present invention.

FIG. 62 is a view showing an electrically equivalent circuit of the storage unit SUT in a semiconductor signal processing apparatus according to Embodiment 5 of the present invention. The storage unit SUT shown in FIG. 62 is different from the storage unit shown in FIG. 1 and used in Embodiments 1 to 4 in the following point. That is, the A-port write data lines WDA and ZWDA which transmits the retrieval data items A and /A are disposed so as to be orthogonal to the B-port write data lines GWDB and ZGWDB. That is, the global write data lines ZGWDB and GWDB coupled to the write B ports WPRTBL and WPRTBR are provided commonly to the plurality of sub-blocks, while the A-port write data lines WDA and ZWDA coupled to the write A ports WPRTAL and WPRTAR are disposed correspondingly to a row of the operator cells in each of the sub-blocks.

In Embodiment 5, the layout of the entries is different from the layout previously used in Embodiments 1 to 4, and the operator cells aligned in the column direction form an entry. In one sub-block, all the word lines and bit lines are brought into the selected state, and a retrieving operation (two-dimensional retrieval) is executed in parallel in all the entries.

The storage unit SUT includes the operator cells UOEL and UOER. The structure of each of the operator cells UOEL and UOER is the same as the structure of each of the operator cells UOEL and UOER shown in FIG. 1 so that a detailed description thereof is omitted by providing the corresponding portions with the same reference numerals.

Figure 63:
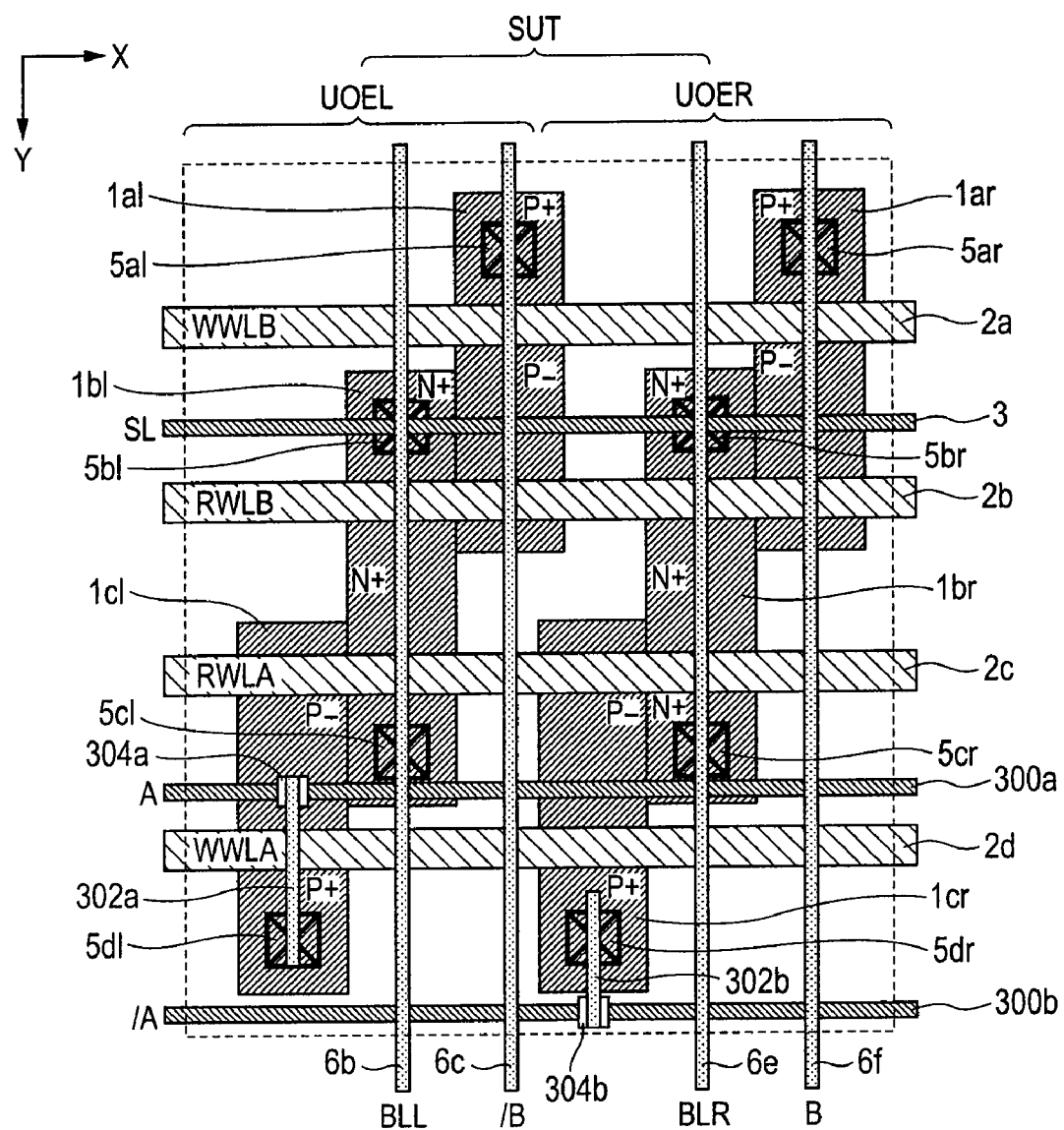
FIG. 63 is a view schematically showing a plane layout of the storage unit shown in FIG. 62.

FIG. 63 is a view schematically showing a plane layout of the storage unit shown in FIG. 62. The plane layout of the storage unit SUT shown in FIG. 63 is different from the plane layout of the storage unit shown in FIG. 2 in the following point. That is, conductive lines 300a and 300b forming write data lines which transmit the retrieval data items A and /A are disposed to extend in the X-direction in mutually spaced-apart relation. The conductive line 300a is coupled to a branch line 302a via a via 304a. The branch line 302a is coupled to a P-type active region 1cl formed in a lower layer via a contact/via 5dl. On the other hand, the conductive line 300b is electrically coupled to a branch line 302b via a via 304b. The branch line 302b is electrically coupled to a P-type active region 1cr in a lower layer via a via/contact 5dr.

The conductive lines 300a and 300b forming the A-port write data lines are each in the same wiring layer as that of the conductive line 3 forming the source line SL. The branch lines 302a and 302b are each in the same wiring layer as that of the conductive lines 6b, 6c, 6e, and 6f forming the bit lines and the global B-port write data lines. By using the branch lines 302a and 302b, even when the conductive line 2d forming the A-port write word line WWLA is provided, it is possible to implement a structure in which the A-port and B-port write data lines are disposed in orthogonal relation without causing a collision between the lines.

Another plane layout of the storage unit shown in FIG. 63 is the same as the plane layout of the storage unit shown in FIG. 2 so that a detailed description thereof is omitted by providing the corresponding portions with the same reference numerals. Accordingly, the three-dimensional arrangement of the active regions of the storage unit SUT shown in FIG. 63 is the same as the structure shown in FIG. 3. Therefore, in the P-type active regions 1ar, 1al, 1cr, and 1cl, the regions adjacent to the N-type active regions are formed of low-concentration $P^-$-type impurity regions, and the regions where contacts are formed are formed of high-concentration $P^+$-type impurity regions.

Figure 64:
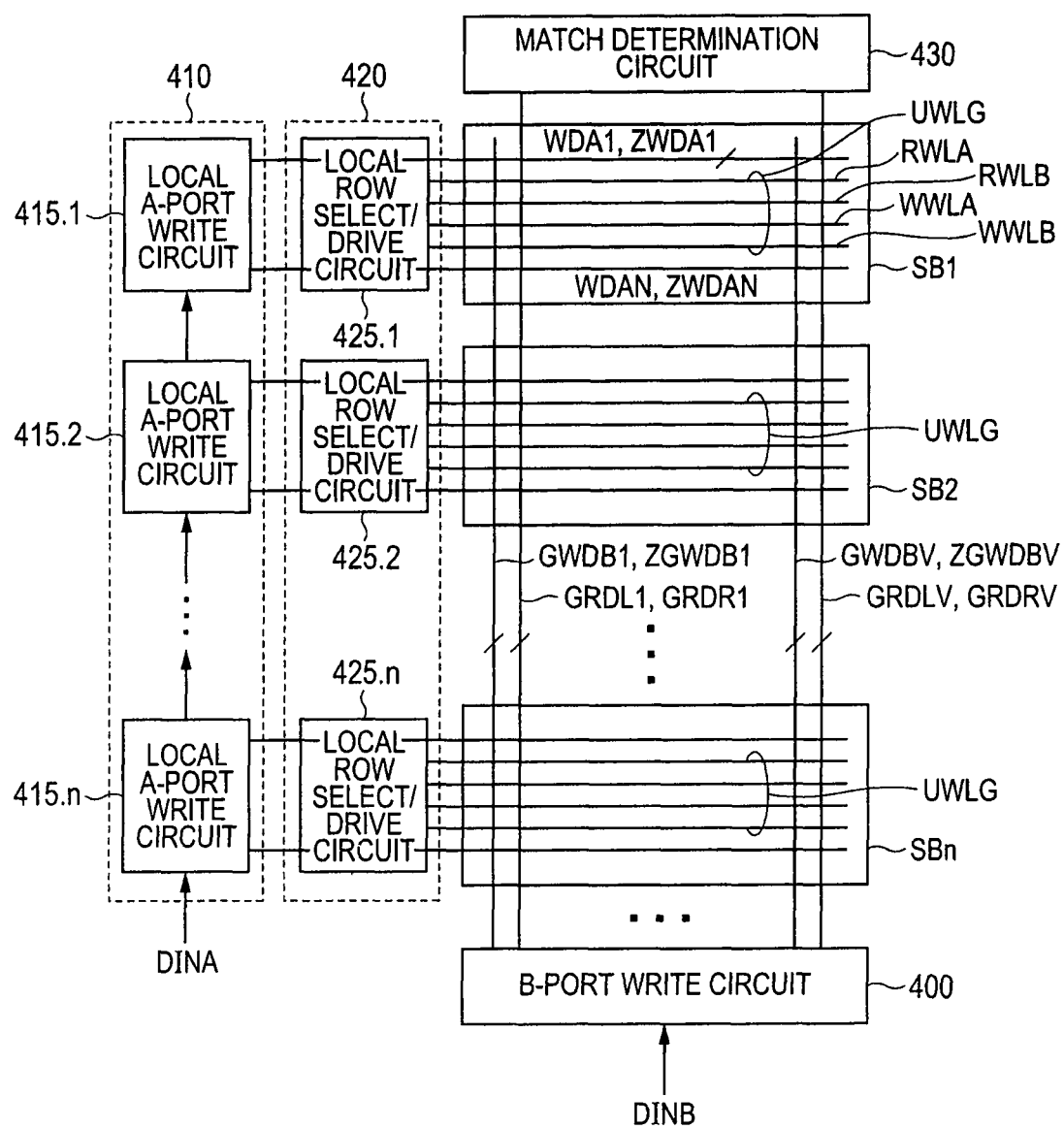
FIG. 64 is a view schematically showing an overall structure of the semiconductor signal processing apparatus according to Embodiment 5 of the present invention.

FIG. 64 is a view schematically showing the overall structure of the semiconductor signal processing apparatus according to Embodiment 5 of the present invention. In FIG. 64, the operator cell array is divided into the plurality of sub-blocks SB1 to SBn in the same manner as divided previously in Embodiments 1 to 4.

Commonly to the sub-blocks SB1 to SBn, a B-port write circuit 400 is provided. The B-port write circuit 400 generates the internal write data from input data (to-be-retrieved data) DINB, and transmits the internal write data onto global B-port write data lines GWDB1 and ZGWDB1 to GWDBV and ZGWDBV. Here, V is determined appropriately depending on the number of the registered data patterns (to-be-retrieved data patterns).

For the sub-blocks SB1 to SBn, an A-port write circuit 410 and a row select/drive circuit 420 are provided. The A-port write circuit 410 includes local A-port write circuits 415.1 to 415.n provided correspondingly to the respective sub-blocks SB1 to SBn. From the local A-port write circuits 415.1 to 415.n, the retrieval data A is transmitted to the A-port write data lines WDA1 and ZWDA1 to WDAN and ZWDAN. In FIG. 63, the A-port write data lines WDA and ZWDA are shown only for the sub-block SB1, and are not shown in the remaining sub-blocks SB2 to SBn for simpler illustration.

The row select/drive circuit 420 includes local row select/drive circuits 425.1 to 425.n provided correspondingly to the respective sub-blocks SB1 to SBn. The local row select/drive circuits 425.1 to 425.n drive the read word lines RWLA and PWLB and the write word lines WWLA and WWLB into the selected state according to an address signal not shown. In FIG. 64, a group of the word lines RWLA, RWLB, WWLA, and WWLB provided for one entry is shown as a unit wordline group UWLG.

Commonly to the sub-blocks SB1 to SBn, global read data lines GRDL1 and GRDR1 to GRDLV and GRDRV are provided. The global read data lines GRDL1 and GRDR1 to GRDLV and GRDRV selectively receive read data from the sense amplifier circuits included in the sub-blocks SB1 to SBn according to the ON/OFF states of respective block select gates included in the individual sub-blocks SB1 to SBn.

For the global read data lines GRDL1 and GRDR1 to GRDLV and GRDRV, a match determination circuit 430 is provided. The match determination circuit 430 includes local match determination circuits provided correspondingly to the respective global read data lines GRDL1 and GRDR1 to GRDLV and GRDRV, and determines a match/mismatch between the to-be-retrieved data pattern and the retrieval data pattern on a per storage-unit-column basis. Accordingly, the respective pairs of the global read data lines GRDL1 and GRDR1 to GRDLV and GRDRV are used as match lines.

Note that, in FIG. 64, the match determination circuit 430 disposed in opposing relation to the B-port write circuit 400 is shown. However, the match determination circuit 430 may also be disposed adjacent to or on the same side as the B-port write circuit 400.

Figure 65:
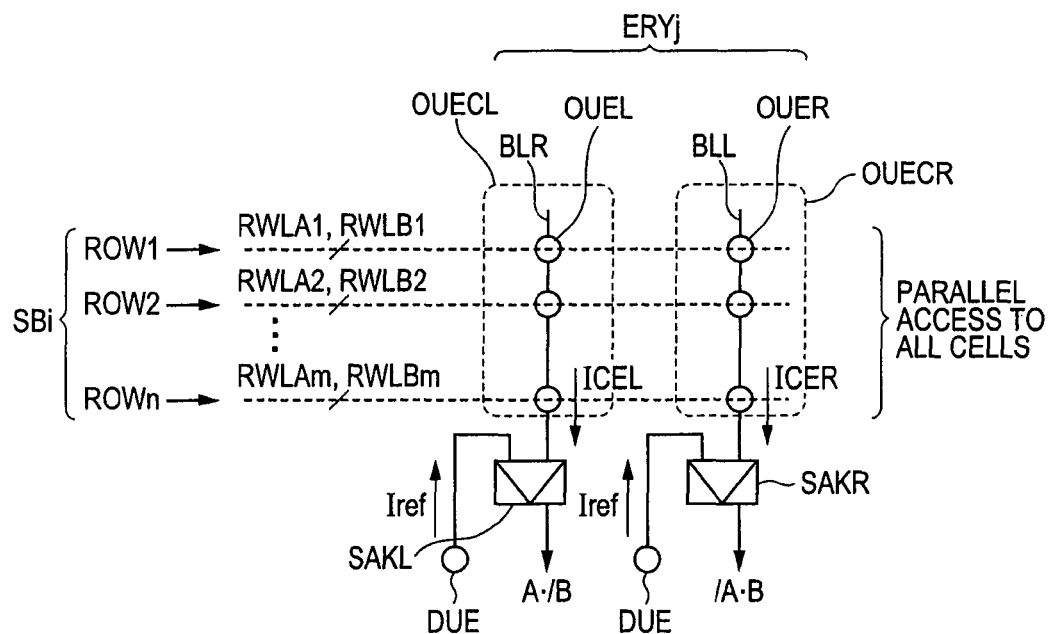
FIG. 65 is a view schematically showing a form of the storage of data patterns in one sub-block in Embodiment 5 of the present invention.

FIG. 65 is a view showing the principle of a retrieving operation in the semiconductor processing apparatus according to Embodiment 5 of the present invention. In FIG. 65, a structure in one sub-block SBi is representatively shown. The operator cells UOEL are disposed to be aligned in the column direction to form a left operator cell column OUECL. Likewise, right operator cells UOER are disposed to be aligned in the column direction to form a right operator cell column OUECR.

In the sub-block SBi, the entry ERYj is formed of the pair of operator cell columns OUECL and OUECR. In the sub-block SBi, operator cell rows ROW1 to ROWm are provided. Correspondingly to an operator cell row ROWk, read word lines RWLAk and RWLBk are disposed.

Correspondingly to the left operator cell column OUECL and the right operator cell column OUECR, the sense amplifier circuits SAKL and SAKR are provided. The sense amplifier circuits SAKL and SAKR differentially amplify, during the operation thereof, the reference currents Iref from the corresponding dummy operator cells DUE and cell currents ICEL and ICER flowing in the corresponding bit lines.

During the operation of the sense amplifier circuits SAKL and SAKR, the read word lines RWLA2 and RWLB1 to RWLAm and RWLBm disposed correspondingly to the entries ERY1 to ERYm are driven in parallel into the selected state. In this case, the A-port write word lines WWLA1 to WWLAm are also driven into the selected state, though not shown in FIG. 65.

That is, to the storage nodes SNAL and SNAR of the operator cells UOEL and UOER, the retrieval data items A and /A are written, and then the read word lines RWLA and RWLB are driven into the selected state. In response thereto, in each of the operator cell columns OUECL and OUECR, currents according to the data items stored in the operator cells UOEL and UOER of the entry ERYj flow in the bit lines BLR and BLL.

Figure 66:
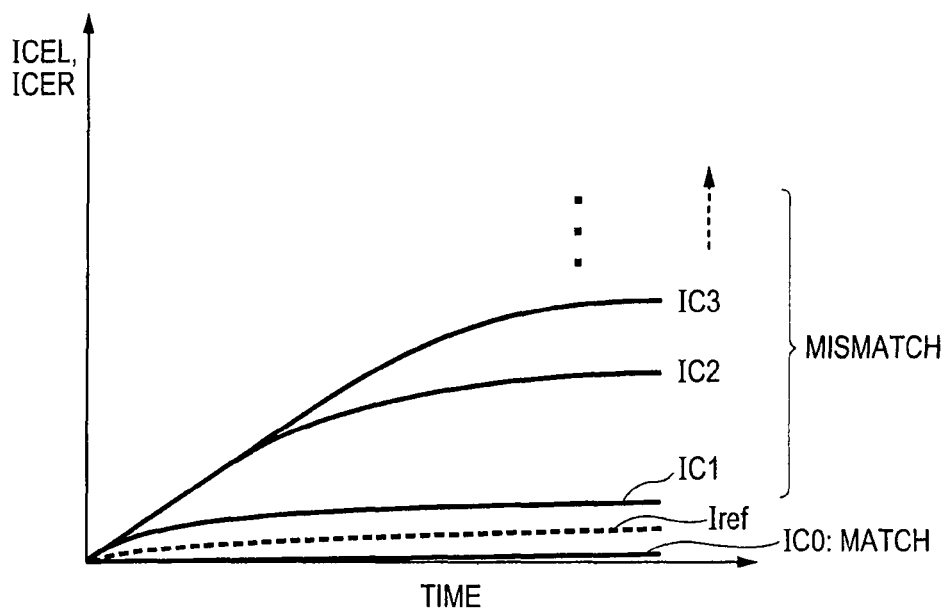
FIG. 66 is a view schematically showing bit line currents during retrieval in the configuration shown in FIG. 65.

FIG. 66 is a view showing the relationship between the cell currents ICEL and ICER flowing in the bit lines during the sense operation. The operator cells UOEL and UOER store therein data items A and /B and /A and B. When the operator cells UOEL and UOER are selected, currents according to the results of operations A·/B and /A·B flow in the corresponding bit lines. Accordingly, when there is a match between the multi-bit data items A and B in the operator cell columns OUECL and OUECR, the cell currents ICEL and ICER scarcely flow, and a current shown as the current IC0 in FIG. 66 flows. On the other hand, when there is a 1-bit mismatch between the multi-bit data items A and B, a current flows from the one operator cell in the mismatching state in the operator cell column OUECL or OUECR and, in FIG. 66, a current of the magnitude shown by IC1 flows as the cell current ICEL or ICER.

When there is a mismatch between stored data bits and retrieval data bits in the two operator cells, currents flow from the two operator cells in the mismatching state to the bit lines, and the current shown by IC2 flows as a cell current. Likewise, when three operator cells are in the mismatching state, the current shown by IC3 flows. Accordingly, as the number of the operator cells where the data items A and B do not match in the operator cell column OUECL or OUECR increases, the cell currents ICEL and ICER increase.

As the reference current Iref supplied by each of the dummy operator cells DUE, a current between the currents IC0 and IC1 is supplied. The dummy cell DUE has the same structure as that described previously with reference to FIG. 7. By adjusting the level of the reference voltage VREF, the reference current Iref can be set at a desired level.

Therefore, in Embodiment 5, the data patterns of the retrieval data item A and the to-be-retrieved data B are arranged in the entries each extending in the column direction and, in each of the storage unit column, a data pattern match/mismatch is determined.

Figure 67:
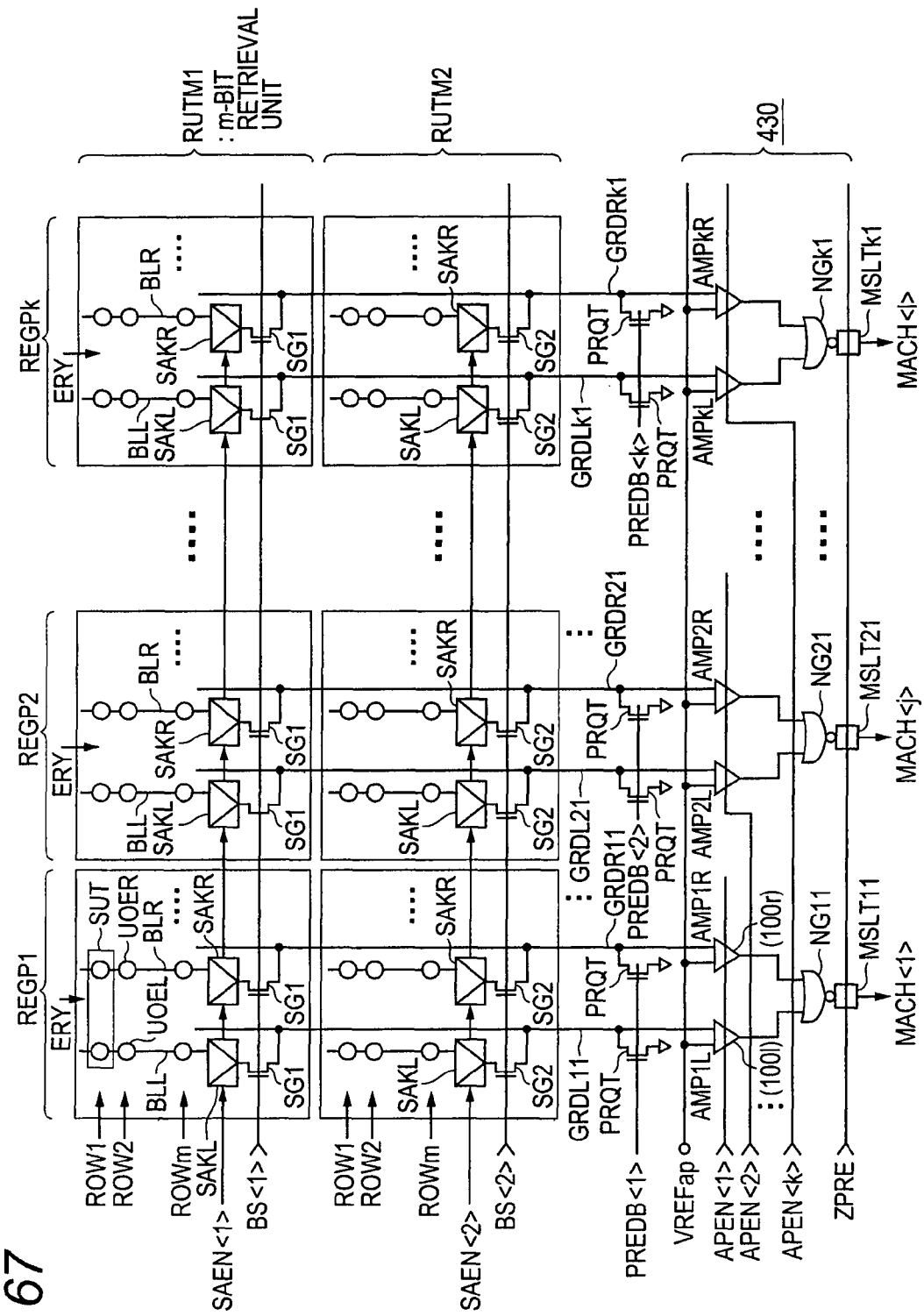
FIG. 67 is a view schematically showing a structure of a portion of the semiconductor signal processing apparatus according to Embodiment 5 of the present invention which is related to retrieval.

FIG. 67 is a view more specifically showing a structure of a main portion of the semiconductor signal processing apparatus according to Embodiment 5 of the present invention. In FIG. 67, m-bit retrieval units RUTM1, URTM2, . . . are provided. Each of the m-bit retrieval units RUTM1, URTM2, . . . includes the operator cell rows ROW1 to ROWm. The retrieval units RUTM1, RUTM2, . . . correspond to the sub-blocks SB1, SB2, . . . .

The retrieval units RUTM1, RUTM2, . . . are each divided commonly to regions REGP1, REGP2, . . . , and REGPk. Each of the regions REGP1, REGP2, . . . , and REGPk in the retrieval units includes the storage units SUT arranged in rows and columns, and the storage units SUT include the left operator cells UOEL and the right operator cells UOER. The bit lines BLL and BLR coupled to the operator cells UOEL and UOER are coupled to the respective sense amplifier circuits SAKL and SAKR. The columns of the storage units SUT over the entire m-bit retrieval units RUT1, RUTM2, . . . form the entries ERY.

In a m-bit retrieval unit RUTMi, block select gates SGi are provided for the sense amplifier circuits SAKL and SAKR. The block select gates SGi become conductive according to a corresponding block select signal BS<i>, and couple outputs of the corresponding sense amplifier circuits SAKL and SAKR to global read data lines GRDL disposed commonly to the plurality of m-bit retrieval units RUTM1, RUTM2, . . . to extend in the column direction.

Here, in FIG. 67, in the region REGP1, global read data lines GRDL11, GRDR11, . . . are provided and, in the region REGP2, global read data lines GRDL21, GRDR21, are provided. In the region REGPk, global read data lines GRDLk1, DRDRk1, . . . are provided. Here, k has no particular relation to k of 2^k showing the number of the retrieval units shown previously in Embodiment 1.

In the regions REGP1, REGP2, . . . and REGPk, the pattern lengths of retrieval data patterns stored in the corresponding entries ERY are fixedly determined in advance.

The match determination circuit 430 includes data amplifiers AMPL and AMPR provided correspondingly to the respective global read data lines GRDL and GRDR. In FIG. 67, data amplifiers AMP1R, AMP1L, AMP2L, AMP2R, AMPkL, and AMPkR provided correspondingly to the respective global read data lines GRDL11, GRDR11, GRDL21, GRDR21, GRDLk1, and GRDRk1 are representatively shown.

The data amplifiers AMP1L and AMP1R are provided as a pair corresponding to the entry, and activated in response to a data amplifier enable signal APEN<1> to amplify data on the corresponding global read data lines upon activation.

The data amplifiers AMP2L and AMP2R disposed for the region REGP2 are disposed as a pair corresponding to the entry, and activated in response to the activation of a data amplifier enable signal APEN<2> to differentially amplify potentials on the global read data lines corresponding to an amplification reference voltage VREFap.

The data amplifiers AMPkL and AMPkR disposed for the region REGPk are disposed as a pair corresponding to the entry, and activated in response to the activation of a data amplifier enable signal APEN<k> to differentially amplify potentials on the global read data lines GRDLk1 and GRDRk1 corresponding to the amplification reference voltage VREFap upon activation.

For an entry not shown also, a data amplifier pair is disposed, and activated according to the corresponding data amplifier enable signal APEN<*> to differentially amplify potentials on global read data lines disposed for the corresponding entry and the amplification reference voltage VREFap. Here, * is any of 1 to k.

The data pattern lengths allocated to the individual regions are different. A retrieving operation is performed two-dimensionally. That is, the operator cell rows ROW1 to ROWm are selected in parallel, and operator cell data items are read in the column direction. During the retrieving operation, in each of the regions REGP1 to REGPk, the data amplifiers are individually activated. Even when the data pattern lengths are different from one region to another, matches/mismatches between the retrieval data patterns and the to-be-retrieved data patterns can be precisely determined. The retrieving operation will be described later in detail.

For the data amplifier pairs AMP1L and AMP1R, AMP2L and AMP2R, ... and AMPkL and AMPkR that are disposed for the individual storage unit columns (entries), NOR gates NG11, NG21, ... and NGk1 are provided respectively. Each of the NOR gates NG11, NG21, ... and NGk1 outputs a H-level signal when output signals from the corresponding pair of data amplifiers are each at the L level. That is, a match/mismatch between the patterns of the data items A and B is determined on a per storage-unit-column (entry) basis.

For the NOR gates NG11, NG21, ..., and NGk1, match signal final determination circuits MSLT11, MSLT21, ..., and MSLTk1 are provided respectively. The match signal final determination circuits MSLT11, MSLT21, and MSLTk1 selectively operate according to a precharge indication signal ZPRE and, during the operation thereof, generate match determination signals MACH<1>, MACH<j>, and MACH<1> according to output signals from the corresponding NOR gates NG11, NG21, ..., and NGk1. Therefore, in each of the regions REGP1, REGP2, ..., and REGPk, a match/mismatch between the respective patterns of to-be-retrieved data B and the retrieval data A is determined on a per storage-unit-column (entry) basis, and a signal MACH<i> showing the result of the match/mismatch determination is generated for each of the entries.

For the individual global read data lines GRDL and GRDR, respective recharge gates PRQT are provided. The precharge gates PRQT are selectively brought into the ON state in the respective regions REGP1 to REGPk according to respective precharge indication signals PREDP<1> to PREDP<k> to precharge the corresponding global read data lines GRDL and GRDR to the ground voltage level. Thus, in each of the regions REGP1 to REGPk, the precharging of the global read data lines GRDL and GRDR is executed individually.

Figure 68:
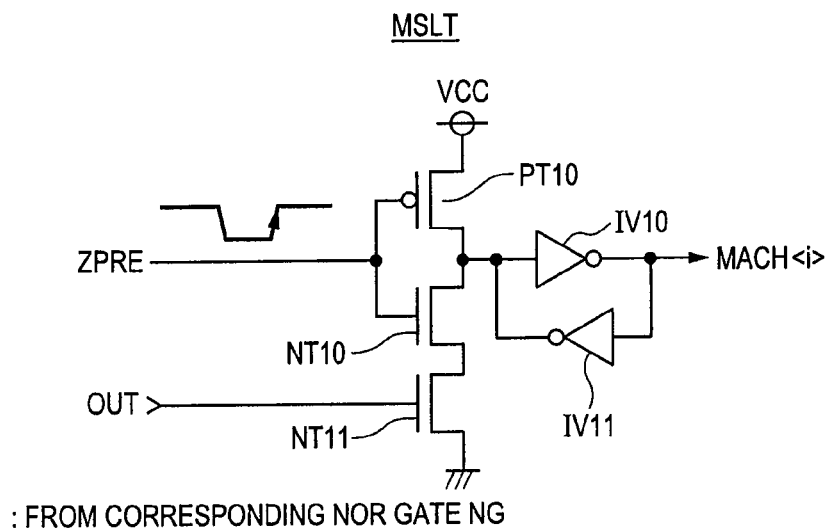
FIG. 68 is a view specifically showing an example of a structure of each of the match signal final determination circuits shown in FIG. 67.

FIG. 68 is a view showing an example of a structure of each of the match signal final determination circuits MSLT11, MSLT21, ..., and MSLTk1. In FIG. 68, the match signal final determination circuit is shown representatively by the mark MSLT.

In FIG. 68, the match signal final determination circuit MSLT includes a P-channel MOS transistor PT10 and an N-channel MOS transistor NT10 each of which receives the precharge indication signal ZPRE at a gate thereof, and an N-channel MOS transistor NT11 which receives an output signal from the corresponding NOR gate NG at a gate thereof. The P-channel MOS transistor PT10 has a source coupled to the power source node, and the MOS transistors NT10 and NT11 are coupled in series between the P-channel MOS transistor PT10 and a ground node.

The match signal final determination circuit MSLT further includes an inverter IV10 for inverting a signal at a coupling node between the MOS transistors PT10 and NT10, and an inverter IV11 for inverting an output signal from the inverter IV10 and transmitting the inverted output signal to the input of the inverter IV10. The output drive force of the inverter IV10 is set larger than that of the inverter IV11. As a result, the match signal MACH<i> from the inverter IV10 changes according to the output signal from the corresponding NOR gate NG (when the precharge indication signal ZPRE is at the H level).

In the match signal final determination circuit MSLT, when the precharge indication signal ZPRE is at the L level, the MOS transistor PT10 becomes conductive and the N-channel MOS transistor NT10 is brought into the OFF state so that the match determination signal MACH<i> from the inverter IV10 is precharged to the L level. When the precharge indication signal ZPRE shifts to the H level, the MOS transistor PT10 is brought into the OFF state so that the output node of the inverter IV10 is disconnected from the power source node. At this time, when the output signal from the corresponding NOR gate NG shifts to the H level and shows a match, the MOS transistors NT10 and NT11 are each brought into the ON state so that the input of the inverter IV10 is discharged to the ground voltage level. In response thereto, the match determination signal MACH<i> shifts to the H level, and shows a pattern match.

When the precharge indication signal ZPRE is at the H level and a retrieving operation is performed, once the output signal from the NOR gate NG shows a match, the match determination signal MACH<i> is maintained thereafter in a state showing a matching state irrespective of the logic level of the output signal from the corresponding NOR gate.

Note that the match signal final determination circuit MSLT formed of the MOS transistors is shown, and the match signal final determination circuit MSLT is formed of SOI transistors similar to the transistors forming the operator cells. However, the match signal final determination circuit MSLT may also be formed of bulk transistors outside the operator cell array.

Figure 69:
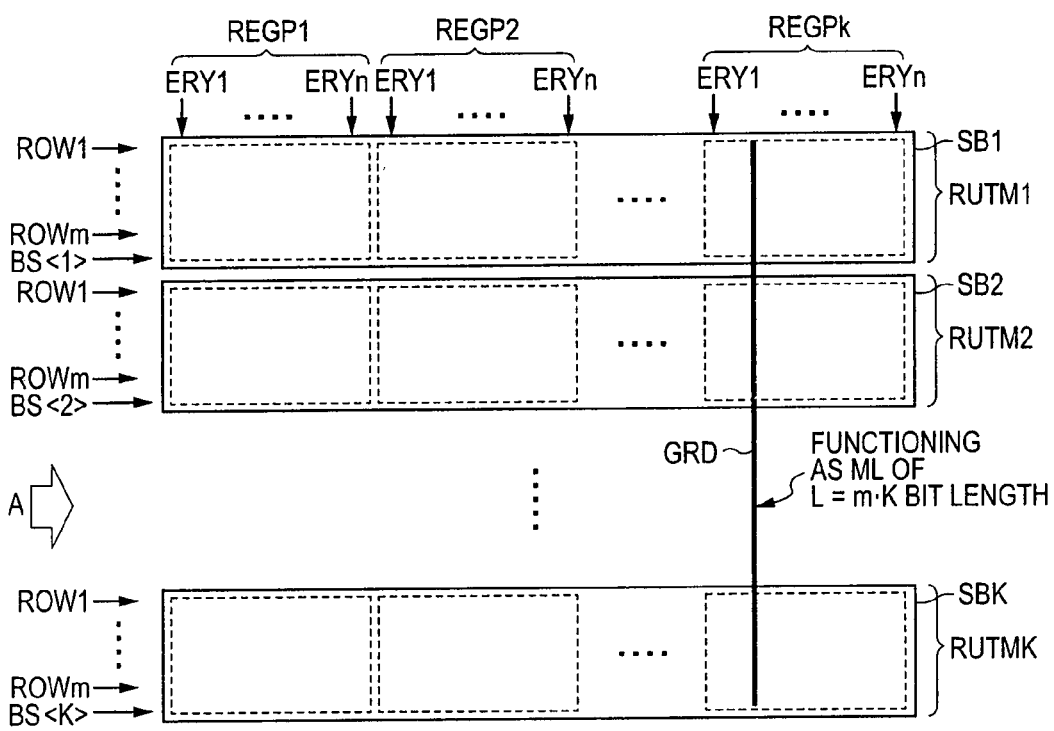
FIG. 69 is a view schematically showing a form of each of sub-blocks and a match line the semiconductor signal processing apparatus according to Embodiment 5 of the present invention.

FIG. 69 is a view schematically showing the arrangement of data patterns in Embodiment 5 of the present invention. As shown in FIG. 69, the sub-blocks SB1 to SBK are each divided into the m-bit retrieval units RUTM to RUTMK. Each of the m-bit retrieval units RUTM1 to RUTMK includes the operator cell rows ROW1 to ROWm.

Each of the retrieval units RUTM1 to RUTMK is divided into the regions REGP1, REGP2, ..., and REGPk. In each of the regions REGP1, REGP2, ..., and REGPk, individual operator cell columns form the respective entries ERY1 to ERYn. The global read data lines GRD (GRDL and GRDR) are provided correspondingly to the entries ERY1 to ERYn in each of the regions, and commonly to the m-bit retrieval units RTUM1 to RUTMK. To the global read data lines GRD, output signals from the sense amplifier circuits of the corresponding operator cell column (entry) are read in parallel. Accordingly, the output signals from the sense amplifier circuits SAK (SAKL and SAKR) show a match/mismatch for the data patterns stored in the corresponding entry in the corresponding sub-block and aligned in the column direction. Since the outputs of the sense amplifier circuits SAKL and SAKR are wired-OR coupled to the corresponding global read data lines GRD (GRDL and GRDR), the pairs of global read data lines GRD function as the individual local match lines ML each of the m·K (=L) bit length.

In this case, according to the data pattern lengths, the data A is given in parallel in the regions REGP1 to REGPk, and retrieving operations are executed. According to the data pattern lengths, the block select signals BS<1> to BS<K> are selectively set into the ON state, and match retrieval is executed for the patterns according to the data pattern lengths.

Figure 70:
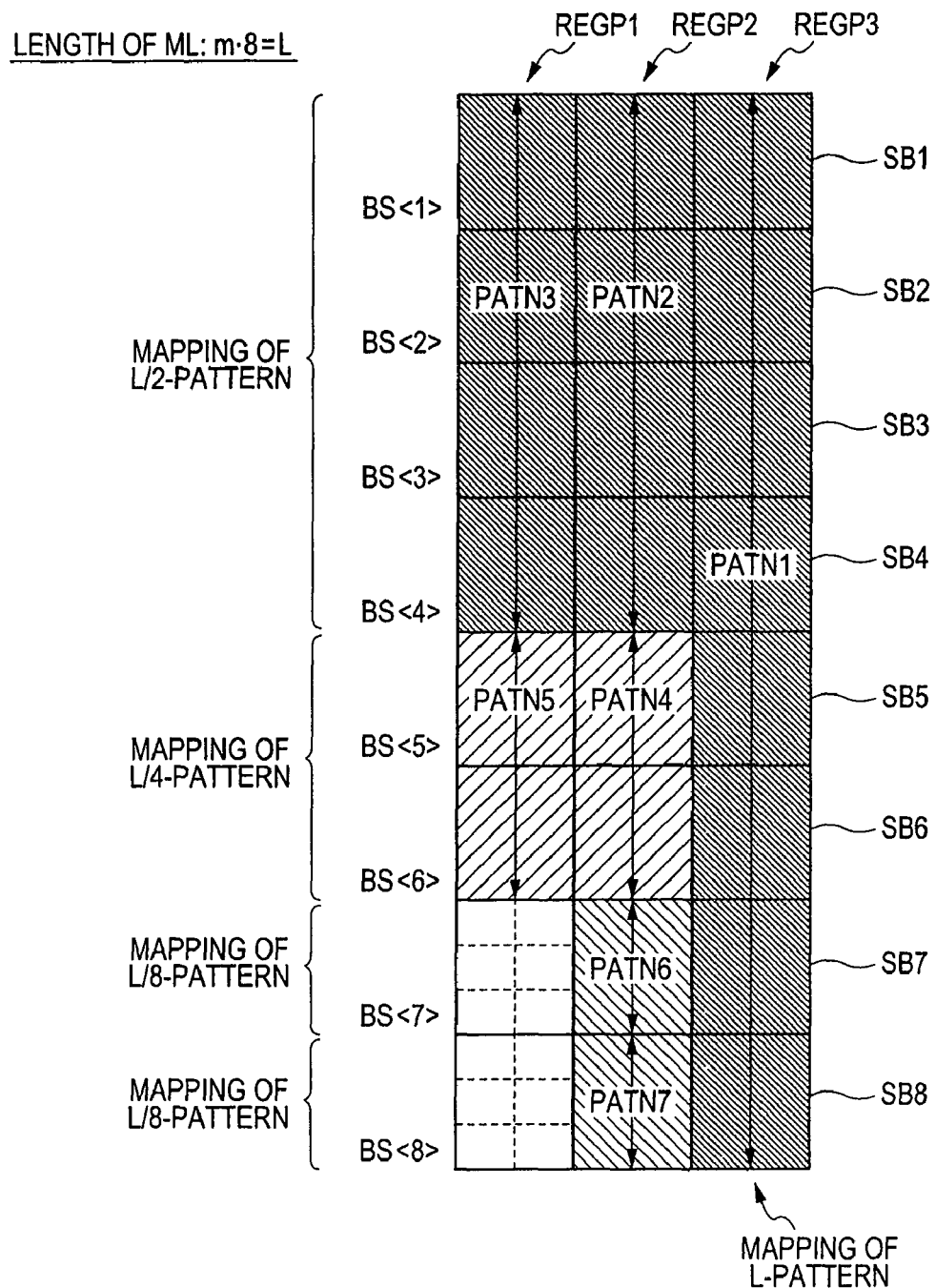
FIG. 70 is a view showing an example of a form of the storage of to-be-retrieved data patterns in Embodiment 5 of the present invention.

FIG. 70 is a view showing an example of the storage of data patterns stored in the operator cell array shown in FIG. 69. In FIG. 70, each of the regions REGP1 to REGP3 is divided into the individual sub-blocks SB1 to SB8. The sub-blocks SB1 to SB8 correspond to the m-bit retrieval units RUTM1 to RUTM8.

In the sub-blocks SB1 to SB8, according to the respective block select signals BS<1> to BS<8>, the output signals from the corresponding sense amplifier circuits are transmitted to the corresponding global read data lines GRD (GRDL and GRDR). As a result, currents according to pattern match/mismatch results are transmitted to the corresponding global read data lines on a per block (m-bit retrieval unit) basis.

Referring to FIG. 70, in the region REGP3, a data pattern of the pattern length L (=8·m bits) is mapped. In FIG. 70, a pattern PATN1 is stored.

In the region RAGP2, a data pattern of the pattern length L/2 is stored using the sub-blocks SB1 to SB4, and a data pattern PATN4 of the pattern length L/4 is mapped into the sub-blocks SB5 and SB6. In the sub-blocks SB7 and SB8, data patterns PATN6 and PATN7 each of the pattern length L/8 are mapped respectively.

In the region REGP1 also, in the same manner as in the region REGP2, the sub-blocks SB1 to SB4 are used as a region where a data pattern of the pattern length L/2 is mapped, and a data pattern PATN3 is stored. The sub-blocks SB5 and SB6 are used as a region where a data pattern of the pattern length L/4 is mapped, and a data pattern PATN5 is stored. In this case, in the region REGP1, the sub-blocks SB7 and SB8 are also each used as a data pattern storage region. However, in this case, the sub-blocks SB7 and SB8 are each used as a region where a data pattern of the pattern length L/4 is mapped or as a region where a data pattern of the pattern length L/8 is mapped.

By changing the number of the selected sub-blocks for retrieval data patterns, a match retrieving operation can be performed for the data patterns having the different pattern lengths.

Note that the form of the storage of the to-be-retrieved data patterns shown in FIG. 70 is only exemplary. If the types and number of the to-be-retrieved data pattern lengths to be used differ, the allocation and number of the pattern lengths to each of the regions REGP and the number of the retrieval units (sub-blocks) also differ accordingly.

Figure 71:
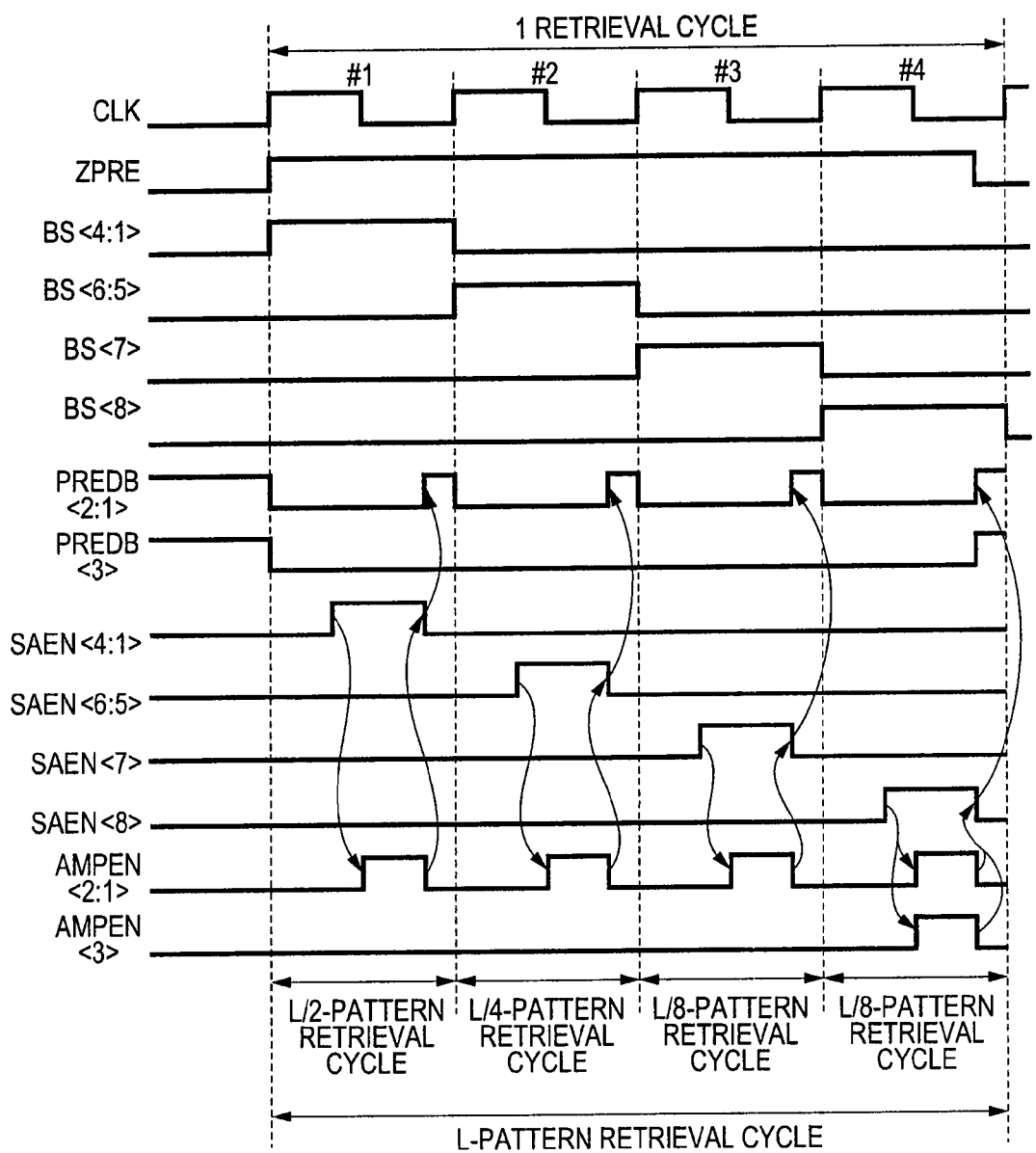
FIG. 71 is a timing chart showing a retrieving operation during the storage of the patterns shown in FIG. 70.

FIG. 71 is a view showing a data retrieving operation sequence in the structure shown in FIG. 70. Referring to FIG. 71, an operation of retrieving the to-be-retrieved patterns shown in FIG. 70 for retrieval patterns will be described below.

One retrieval cycle differs depending on the types of the pattern lengths. In the pattern arrangement shown in FIG. 70, there are the four types of pattern lengths so that one retrieval cycle includes four cycles of the clock signal CLK. When the retrieval cycle begins, in a cycle #1, the precharge indication circuit ZPRE first shifts from the L level to the H level so that a precharge operation for an internal node in each of the match signal final determination circuits MSLT is completed. Also, a data-path-precharge indication signal PREDB<3:1> is driven from the H level to the L level so that the precharging of the global read data lines GRD to the ground voltage level is completed.

A block select signal BS<4:1> is asserted so that, in the sub-blocks SB1 to SB4, after the activation of the A-port write word lines WWLA, all the read word lines RWLA and RWLB are driven into the selected state. After the potentials of the bit lines BLL and BLR are finally determined, a sense amplifier activation signal SAEN<4:1> for the sub-blocks SB1 to SB4 is activated with a predetermined timing. At this time, the remaining sense amplifier activation signal <8:5> is in an inactive state. From the sub-blocks SB1 to SB4, output signals from the sense amplifier circuits are transmitted to the corresponding global read data lines GRD.

When the signal potentials of the global read data lines GRD are finally determined, a data amplifier activation signal APEN<2:1> for the data amplifiers provided for the regions REGP1 and REGP2 is activated. As a result, a result according to the result of retrieval in each of the storage unit columns in the regions REGP1 and REGP2 is latched by the corresponding match signal final determination circuit MSLT.

When there is a matching data pattern, the output signal from the NOR gate shifts to the H level so that the match signal final determination circuit MSLT raises the retrieval determination signal MACH<i> to the H level. On the other hand, in the case of a mismatch, currents flow in the global read data lines GRD and the potential levels thereof rise. Accordingly, either of the output signals from the corresponding pair of data amplifiers AMPiL and AMPiR shifts to the H level. In response thereto, the output signal from the corresponding NOR gate NGij shifts to the L level so that the retrieval determination signal MSLT<i> from the match signal final determination circuit MSLT maintains the L level in the precharged state.

When the cycle #1 is completed, a read-data-line-precharge indication signal PREDB<2:1> for the regions REGP1 and REGP2 is asserted to precharge the global read data lines for the regions REGP1 and REGP2 to the ground voltage level. On the other hand, a data-path-precharge indication signal PREDB<3> for the region REGP3 is maintained in the inactive state and, in the region RAGP3, the global read data lines GRD maintain the result read in the cycle #1.

In the cycle #1, the cycle of retrieving a pattern of the pattern length L/2 for the patterns PATAN2 and PATAN3 stored in the sub-blocks SB1 to SB4 is completed.

When the next cycle #2 begins, the block select signal BS<4:1> is set into the non-selected state, while a block select signal BS<6:5> is driven into the selected state. Likewise, a block select signal BS<8:7> is also maintained in the non-selected state.

The data-path-precharge indication signal PREDB<2:1> is set again to the L level to complete the precharging of the global read data lines GRD for the regions REGP1 and REGP2. In the sub-blocks SB5 and SB6, the A-port read word lines RWLA and RWLB are each driven into the selected state to read the results of arithmetic operations on the data items stored in the operator cells of the individual storage units in the sub-blocks SB5 and SB6 to the corresponding bit lines BL (BLL and BLR).

With a predetermined timing, a sense amplifier activation signal SAEN<6:5> for the sub-blocks SB5 and SB6 is activated to read the results of determining matches between to-be-retrieved patterns and retrieval patterns in the sub-blocks SB5 and SB6 into the corresponding global read data lines.

At this time, in the region REGP3 also, a new retrieval result is transmitted to the corresponding global read data lines, and the potentials thereof change according to the retrieval result. After the sense amplifier activation signal SAEN<6:5> is activated, the data amplifier activation signal APEN<2:1> for the regions RAGP1 and RAGP2 is activated again with a predetermined timing. At this time, an activation signal APEN<3> for the region RAGP3 is also maintained in the inactive state. Accordingly, in each of the regions REGP1 and REGP2, the retrieval result is stored again in the match-signal final determination circuit MSLT. In this case, when there is a matching pattern, the retrieval determination signal MACH outputted from the match signal final determination circuit MSLT is at the H level. As a result, when a match for either of a data pattern of the pattern length L/2 and a pattern length of the pattern length L/4 is detected in the regions REGP1 and REGP2, the output signals from the match signal final determination circuits MSLT change from the precharged state.

On the other hand, in the region REGP3, the potentials of the corresponding global read data lines only change according to the retrieval result, and the output signal from the match-signal final determination circuit MSLT is maintained at the initially set L level. At this time, in the region REGP3, when there is a match for the data patterns stored in the regions of the sub-blocks SB1 to SB6, the corresponding global read data lines GRD maintain the precharged state. When a mismatch is detected in at least one of the sub-blocks, the potentials of the corresponding global read data lines GRD rise.

In the cycle #2, when the operation of retrieving a data pattern of the pattern length L/4 is completed, the data-path-precharge indication signal PREDB<2:1> is set again at the H level to precharge the global read data lines GRD of the regions REGP1 and REGP2 to the ground voltage level. At this time, in the region REGP3, the precharge indication signal PREDB<3> is maintained in the inactive state, and the corresponding global read data lines GRD are maintained at potentials according to the results of a L/2-pattern retrieving operation and the operation of retrieving a pattern of the L/4 pattern length.

When a cycle #3 begins, the block select signal BS<7> is driven again into the selected state, while the remaining block select signals BS<8> and BS<6:1> are each maintained in the inactive state. The data-path-precharge indication signal PREDB<2:1> is set again into the inactive state to complete a precharging operation to the global read data lines GRD of the regions RAGP1 and RAGP2.

In this manner, in the sub-block SB7, retrieval for a data pattern of the pattern length L/8 is performed. A sense amplifier activation signal SAEN<7> for the sub-block SB7 is activated so that signals according to the result of retrieval in the sub-block SB7 are transmitted to the corresponding global read data lines GRD. When the potentials of the global read data lines are finally determined, the data-amplifier activation signal APEN<2:1> is activated. By the corresponding match signal final determination circuit MSLT, a signal according to the retrieval result is held.

At this time, the amplifier activation signal APEN<3> for the region REGP3 is maintained in the inactive state, and the corresponding global read data lines GRD are held at potentials according to the results of retrieval for the pattern lengths L/2, L/4, and L/8.

When the retrieving operation for a data pattern of the pattern length L/8 is completed, the data-path-precharge indication signal PREDB<2:1> for the regions RFGP1 and REGP2 is activated again to precharge the global read data lines GRD to the ground voltage level. In the region REGP3, the precharge indication signal PRDAB<3> is maintained in the inactive state, and the global read data line GRD in the region REGP3 is held at potentials according to the results of the retrieval in the cycles #1 to #3.

In a cycle #4, the data-path-precharge indication signal PREDB<2:1> is set again into the inactive state, thereby completing the precharging operation to the global read data lines of the region REGP1 and REGP2. In the cycle #4, the block select signal BS<8> is driven into the selected state so that retrieval is performed for the data patterns stored in the sub-block SB8. In the sub-block SB8, the A-port write-word line WWLA and the read word lines RWLA and RWLB for each of the entries are driven into the selected state, and then a sense amplifier activation signal SAEN<8> is activated to read the results of retrieval for the data patterns in the sub-block SB8 into the corresponding global read data lines GRD.

Thereafter, amplifier activation signals AMPEN<2:1> and AMPEN<3> are each activated. In response thereto, in the regions REGP1 to REGP3, signals corresponding to the results of retrieval are stored in the corresponding match signal final determination circuits MSLT, and the retrieving operation for the data patterns each of the pattern length L/8 stored in the sub-block SB8 is completed.

On the other hand, by activating the data amplifier activation signal AMPEN<3> for the region REGP3 in the cycle #4, and storing the result of determination in the corresponding match signal final determination circuit MSLT, the result of retrieval for a data pattern of the pattern length L is latched.

As shown in FIG. 70, in each of the sub-blocks SB7 and SB8 of the region REGP1, no data pattern is registered (no to-be-retrieved data is mapped). In a region where no retrieval data pattern is registered, the bit "1" is stored in each of the storage nodes SNBR and SNBL (set into the "don't care state"). As a result, in the no registration region, even when an arbitrary data pattern is given as retrieval data, currents flow on the corresponding global read data lines (data items corresponding to A and /A are read to the respective global read data lines GRDL and RGDR) so that an output signal from the corresponding NOR gate shifts to the 1 level, the latching state of the match signal final determination circuit MSLT does not change, and erroneous determination is prevented.

On the other hand, with regard to the retrieval of a data pattern of the pattern length L, it can be considered that, e.g., a data pattern match does not occur in the cycle #1, and a data pattern match occurs in the next cycle #2. In this case, when the data amplifiers AMP are activated in each of the cycles, the latching state of the match signal final determination circuit MSLT is set into a state showing a match even when a data pattern match does not occur so that erroneous determination occurs (this is because, in the case of a pattern mismatch, the latching state of the match signal final determination circuit MSLT does not change).

Therefore, for a data pattern of the pattern length L, the result of retrieval therefor is simply read into the corresponding global read data lines in each of the cycles, and the results of retrieval for data patterns of the pattern lengths L/2, L/4, and L/8 are subjected to a current addition in the global read data lines. When there is a matching data pattern of the pattern length L, the corresponding global read data lines GRDL and GRDR are each at the ground voltage level in the precharged state. On the other hand, when there is no matching data pattern of the pattern length L, the potentials of the corresponding global read data lines GRD are at a level higher than that of the ground potential. In this cycle, by activating the amplifier activation signal AMPEN<3>, the result of retrieval for the pattern length L can be precisely held.

Thus, according to Embodiment 5 of the present invention, the to-be-retrieved data patterns are arranged in the column direction in the operator cell array, the retrieval patterns are aligned in the column direction and inputted to the operator cell array, and the retrieving operation is performed. As a result, it is unnecessary to perform successive pattern retrieval to each of the entries ERY1 to ERYm, and pattern retrieval can be performed in parallel to the plurality of entries. Accordingly, the number of the cycles required for retrieval can be reduced to a value according to the types of the pattern lengths of the to-be-retrieved data patterns or to the number of pattern mapping regions, and the retrieving operation can be performed at a higher speed. That is, in the case of the pattern arrangement shown in FIG. 70, the number of the pattern mapping regions is 5, one retrieval cycle is (5-1) cycles, i.e., four clock cycles.

In Embodiment 5, it is necessary to align the to-be-retrieved patterns in the column direction of the operator cell array, and store them. In this case, according to the following procedure, the to-be-retrieved data patterns aligned in the normal row direction are converted into those in the column direction. Data array conversion may be performed appropriately outside the semiconductor signal processing apparatus, but the conversion of a data array can be performed according to the following procedure. An operation of converting the data array of the to-be-retrieved data patterns will be briefly described below.

FIGS. 72 to 78 are views schematically showing a sequence of data array conversion. In FIGS. 72 to 78, for the data array conversion, a data array conversion circuit 450 formed of, e.g., an orthogonal conversion circuit is used.

Figure 72:
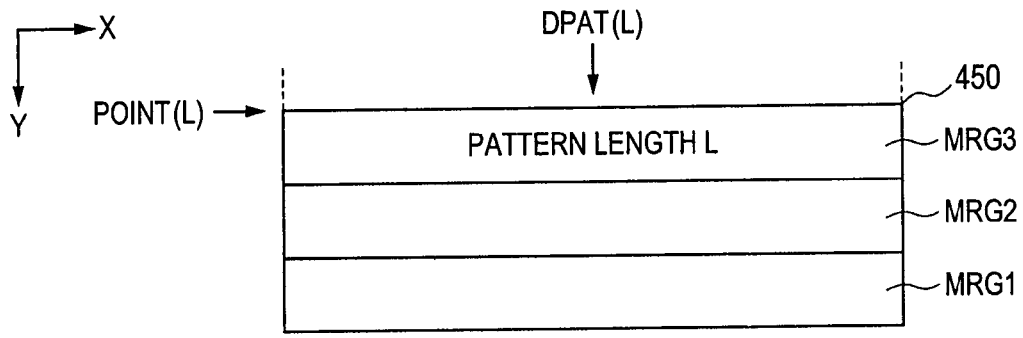
FIG. 72 is a view showing a form of the storage of data in a data array conversion circuit which converts an array of write data (to-be-retrieved data pattern) for Embodiment 5 of the present invention.

FIG. 72 is a view schematically showing an operation during the inputting of data of the pattern length L. The data array conversion circuit 450 includes an orthogonal conversion memory, and the memory region thereof is divided in the Y-direction into regions MRG1 to MRG3 correspondingly to the regions REGP1 to REGP3 (in the case corresponding to the structure of the operator cell array shown in FIG. 71). On receiving a data pattern DPAT(L) of the pattern length L, the data array conversion circuit 450 stores, according to a pointer POINT(L), the data pattern DPAT(L) aligned in the X-direction in a region of the region MRG3 specified by the pointer POINT(L).

When the data items DPAT(L) each of the pattern length L are successively stored in the region MRG3, if the number of the data items each of the pattern length L is smaller than the number of rows in the region MRG3, the same to-be-retrieved data pattern is repeatedly stored in the empty region thereof. This is because, when the to-be-retrieved data patterns are written to the operator cell array, control in writing data ("0") in the "don't care state" to the empty region on a per bit basis is difficult. It will be appreciated that, as shown in Embodiment 1 or the like, the data "0" in the "don't care" state may also be transferred on a per bit basis using the masking indication signal MSK. In this case, it is necessary to set a flag showing the empty region in each of the regions MRG1 to MRG3, and generate the masking indication signal MSK according to the empty region flag.

Figure 73:
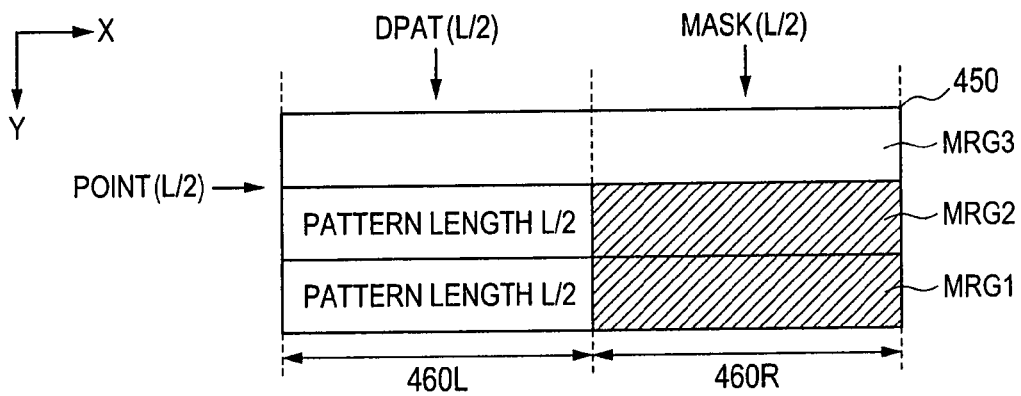
FIG. 73 is a view showing a form of the storage of a data pattern of the pattern length L/2 to the data array conversion circuit shown in FIG. 72.

FIG. 73 is a view schematically showing a form during the writing of data patterns each of the pattern length L/2. The data array conversion circuit 450 is divided in the X-direction into regions 460L and 460R each of a L/2-byte length. In this case, in the regions MRG2 and MRG1, data patterns DPAT(L/2) each of the pattern length L/2 are stored according to a pointer POINT(L/2). The region 460R corresponding to the remaining half of each of the regions MRG2 and MRG1 is masked with a mask signal MASK(L/2). In this case, as the orthogonal conversion memory, a memory device such as, e.g., a static random access memory (SRAM) or a dynamic random access memory (DRAM) is used, and data writing is masked using a masking function in the typical memory. As a result, in the respective L/2-byte-length regions 460L of the regions MRG2 and MRG1, the data patterns each of the pattern length L/2 are successively stored.

Figure 74:
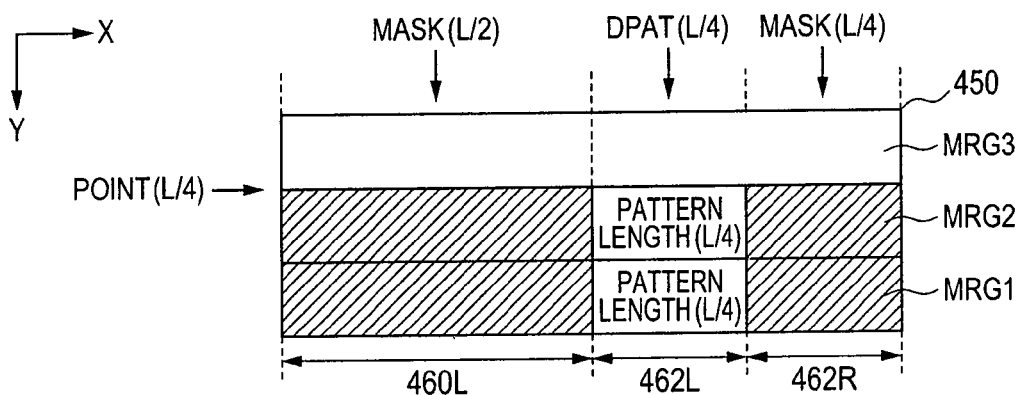
FIG. 74 is a view schematically showing a form of the storage of the pattern length L/4 to the data array conversion circuit shown in FIG. 72.

FIG. 74 is a view schematically showing the form of writing of a data pattern of the pattern length L/4. In this case, to L/2-byte-length regions 460L and L/4-byte-length regions 462R in the data array conversion circuit 450, masking indications MASK(L/2) and MASK(L/4) are respectively given so that data writing to the regions 460L and 462R is prohibited. Data patterns DPAT(L/4) each of the pattern length L/4 are successively stored in the non-masked regions 462L according to a pointer POINT(L/4).

Figure 75:
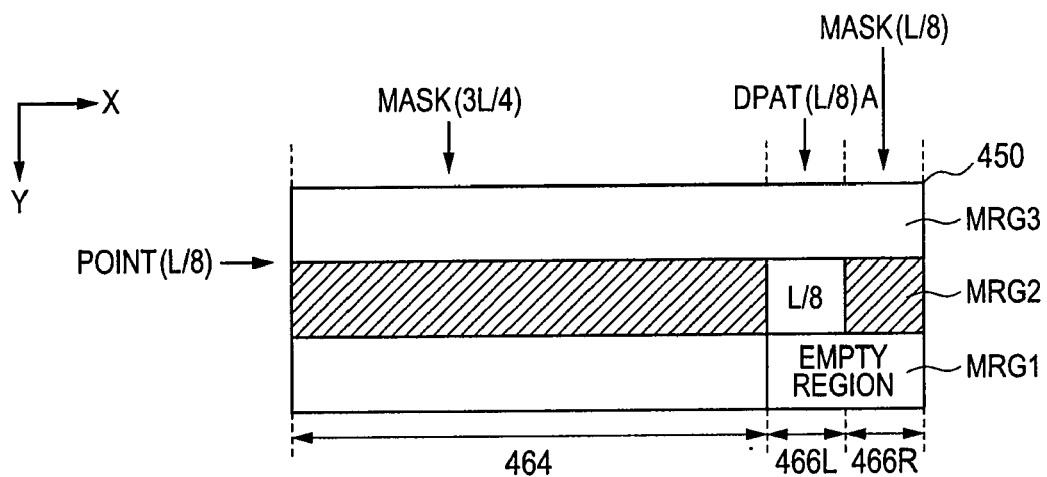
FIG. 75 is a view schematically showing a form of the storage of a data pattern of the pattern length L/8 to the data array conversion circuit shown in FIG. 72.

FIG. 75 is a view schematically showing the form of writing of data of the pattern length L/8. In FIG. 75, during the writing of a data pattern of the pattern length L/8, writing to regions 464 and 466R in the data array conversion circuit 450 is prohibited by masking indications MASK(3L/4) and MASK(L/8). According to a pointer POINT(L/8), a data pattern DPAT(L/8)A of the pattern length L/8 is successively stored in a region 466L of the memory region MRG2.

Figure 76:
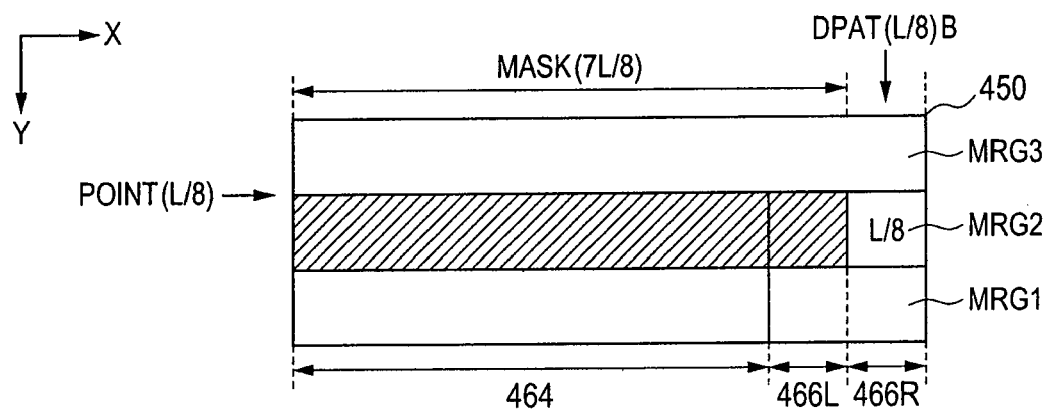
FIG. 76 is a view schematically showing a form of the storage of the pattern length L/8 to the data array conversion circuit shown in FIG. 72.

FIG. 76 is a view schematically showing the form of writing of a data pattern of the pattern length L/8. In FIG. 76, with a mask MASK(7L/8), the 3·L/4-byte region 464 and an L/8-byte region 466L in the data array conversion circuit 450 are masked from writing. A data pattern DPAT(L/8)B of the pattern length L/8 is successively stored in the region 466R of the memory region MRG2 according to the pointer POINT (L/8).

The data patterns DPAT(L/8)A and DPAT(L/8)B each of the pattern length L/8 shown in FIGS. 75 and 76 may also be alternately given or the respective columns of the data patterns DPAT(L/8)A and DPAT(L/8)B may also be successively given.

To the L/8-byte regions 466L and 466R of the memory region MRG1, no data pattern is written. In this case, information showing that the regions 466L and 466R of the memory region MRG1 are empty regions is stored in a register not shown.

The pointers POINT(L), POINT(L/2), POINT(L/4), and POINT(L/8) may be generated successively using different pointers according to the pattern lengths of the data-length input data, or may also be generated successively according to pattern length identifiers included in the input data (see Embodiment 4). In the case where data writing is performed successively to the memory regions MRG3 to MRG1 according to the pattern lengths, the write pointers may also be formed using one pointer. It is sufficient as long as the data array conversion circuit 450 is provided outside the semiconductor signal processing apparatus, and the form of generation of a pointer is determined appropriately according to the input sequence of write data.

Figure 77:
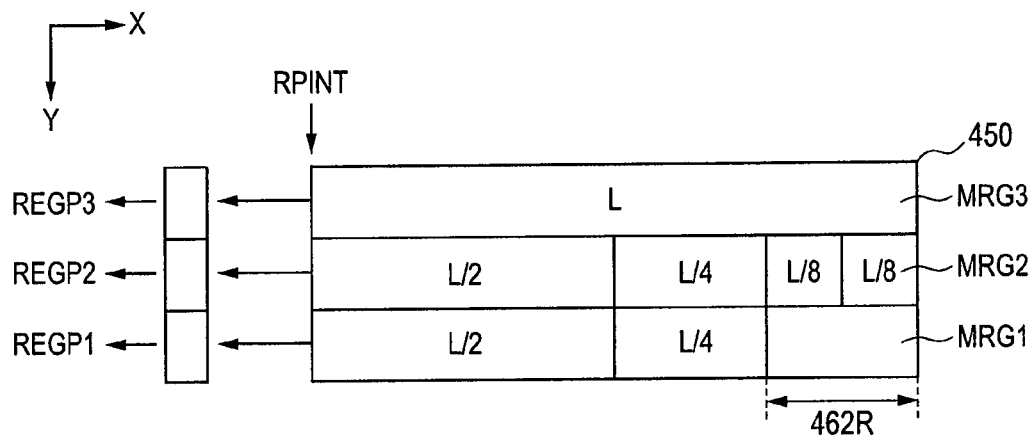
FIG. 77 is a view schematically showing a form of the reading of data stored in the data array conversion circuit shown in each of FIGS. 72 to 76.
Figure 78:
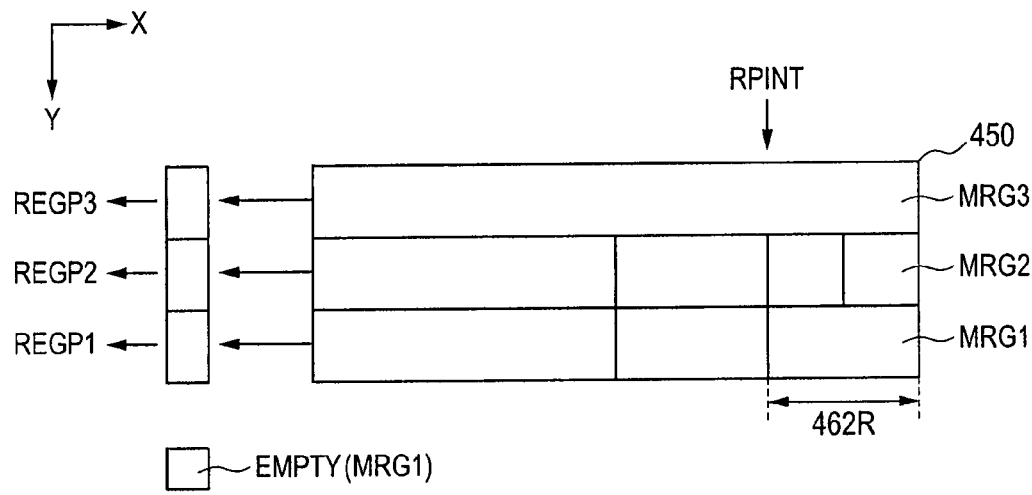
FIG. 78 is a view showing a form of the reading of data from the data array conversion circuit shown in FIG. 77.

FIGS. 77 and 78 are views each schematically showing the form of data reading in which data aligned in the Y-direction is read from the data array conversion circuit 450 and supplied to the semiconductor signal processing apparatus according to Embodiment 5 of the present invention.

First, as shown in FIG. 77, according to a read pointer RPINT, data aligned in the Y-direction over the memory regions MRG1 to MRG3 of the data array conversion circuit 450 is read. The data read from the memory regions MRG1 to MRG3 is given to the respective regions REGP1 to REGP3 of the semiconductor signal processing apparatus.

As shown in FIG. 78, when the data is successively read, and the read pointer RPINT is updated to specify the head of the region 462R of the memory region MRG1, a flag EMPTY (MRG1) is asserted. According to the read pointer RPINT, the data items aligned in the Y-direction are read from the memory regions MRG1 to MRG3, and given to the individual regions REGP1 to REGP3 of the signal processing apparatus, and the flag EMPTY(MRG1) is given in parallel to the semiconductor signal processing apparatus. In the semiconductor signal processing apparatus, during data writing to the region 462R of the memory region MRG1, data writing to the region REGP1 is masked according to the flag EMPTY(MRG1). That is, in the semiconductor signal processing apparatus, rewriting of data is executed in the inside thereof, as described in Embodiment (reading of stored data and rewriting of the read data). As the structure of the data path, the structure previously used in Embodiment 3 is used (see FIG. 49). That is, to each of the regions REGP1, REGP2, and REGP3, the local select signal SELB<1:0> is given. As a result, the empty regions (the regions REGP1 of the sub-blocks SB7 and SB8 of FIG. 70) in the operator cell array are each maintained in the "don't care" state.

The flags EMPTY are provided for the individual memory regions MRG1 to MRG3. When there is an empty region of the entry width, the corresponding flag EMPTY (memory region) is asserted.

During the writing of to-be-retrieved data patterns to the operator cell array, when a masking indication signal MSK<j> as shown in Embodiments 1 to 4 is used, it is necessary to generate an empty region flag for each of the pattern lengths in each of the memory regions MRG1 to MRG3 so that the management and control of the generation of the masking indication signal becomes slightly complicated. However, it is also possible that empty-region-flag registers for storing therein the empty region flags may be provided in the respective memory regions MRG1 to MRG3, and the masking indication signals MSK<j> may be generated by reading the contents of the empty-region-flag registers according to the read pointer RPINT to mask writing on a per bit basis.

However, a description will be given below to an operation of writing to-be-retrieved data patterns without using the masking indication signal MSK<j> and a structure therefor.

Figure 79:
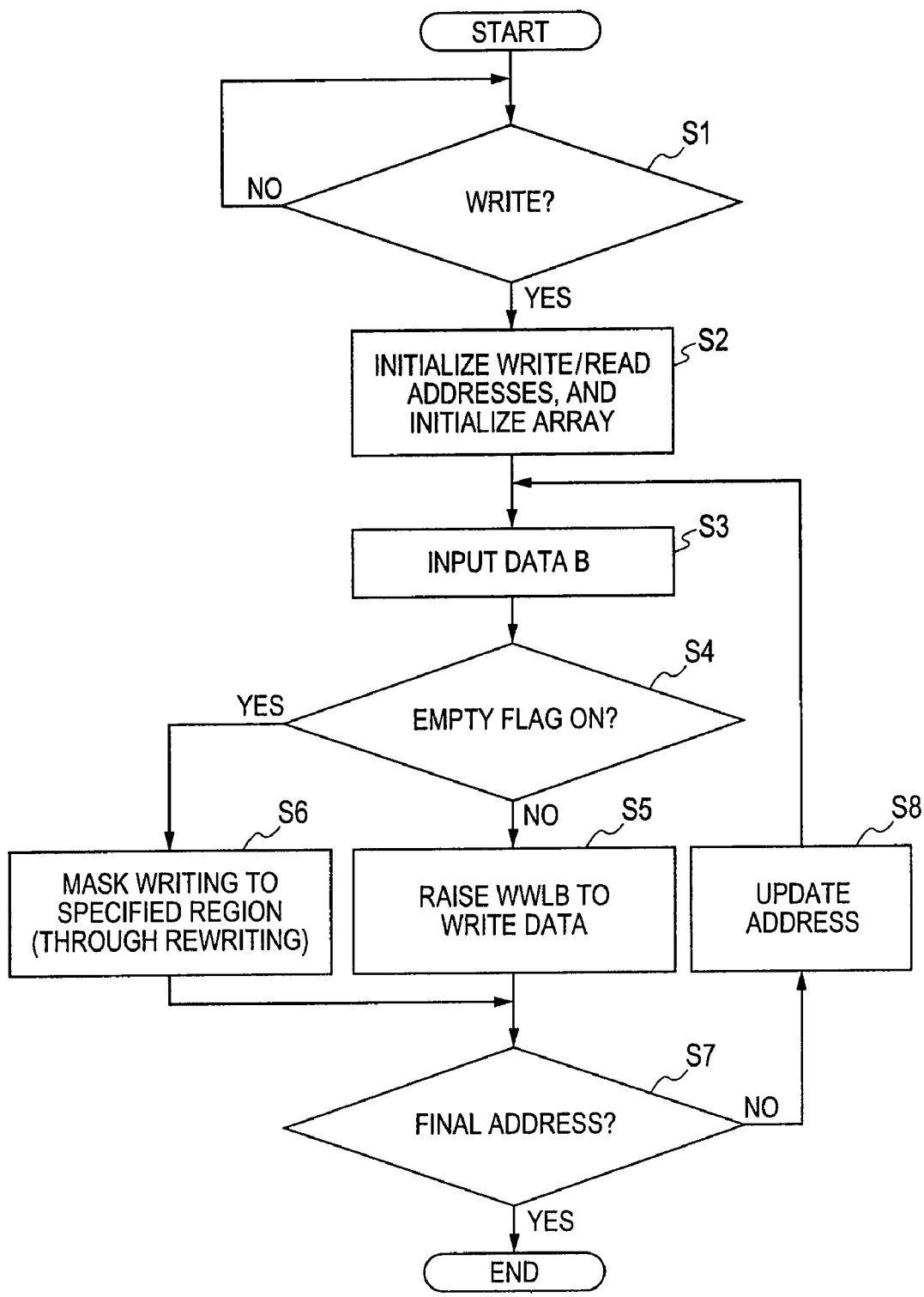
FIG. 79 is a view showing a flow of an operation of controlling the writing of data in the semiconductor signal processing apparatus according to Embodiment 5 of the present invention.

FIG. 79 is a flow chart showing a control operation during the writing of to-be-retrieved data patterns in the semiconductor signal processing apparatus according to Embodiment 5 of the present invention. Referring to FIG. 79, the operation of writing to-be-retrieved data will be described below.

The semiconductor signal processing apparatus waits till a data write command is given (Step S1). When the data write command is given, write and read addresses (counter addresses) are initialized, and the operator cell array is initialized (Step S2). By the initialization of the operator array, the storage nodes SNA and SNB of the operator cells (UOR) are initially set into states where the bits "1" and "0" are stored therein.

Next, a write data item B is inputted (Step S3). At this time, in the semiconductor signal processing apparatus, it is determined whether or not the flag EMPTY is ON (Step S4). When the flag EMPTY is in the ON state, a region specification flag in the parentheses of the flag EMPTY(MRGi) is viewed, and writing to the specified region is masked (Step S6). That is, for the region (specified in the parentheses of the EMPTY flag) for which write masking is specified in the flag EMPTY such as the EMPTY(MRG1), settings are made such that the path of the data path block transmits output signals from the sense amplifier circuits to the corresponding global B-port write data lines, and the reading and rewriting (rewriting to the storage nodes SNB) of the internal stored data is executed.

On the other hand, when the flag EMPTY is in the OFF state, write data from the outside is selected, and transmitted to the corresponding global B-port write data lines, the write B-port word line WWLB is raised according to the write word line address WAD, and the data is written (Step S5).

In Steps S5 and S6, when the writing is completed, it is determined whether or not the write address is a final address (Step S7). If the final address has not been reached yet, the address is updated (Step S8), and the process flow returns to Step S3 where the next data item B is inputted. Here, the updating of the address is performed by incrementing the count value of the internal address counter.

On the other hand, when it is determined that the write address is the final address in Step S7, the writing of the data is completed, and the operation of writing the to-be-retrieved data is ended.

Figure 80:
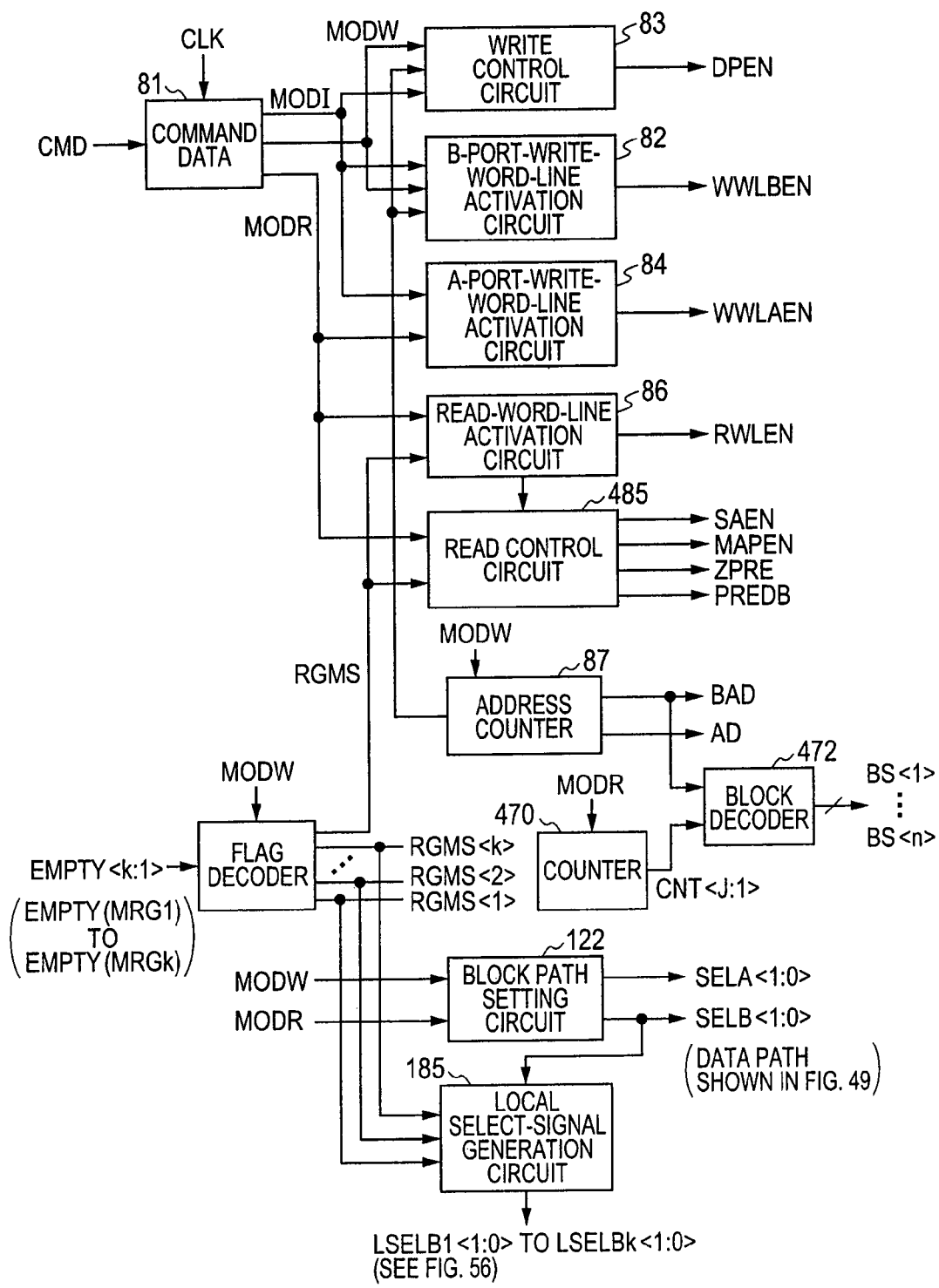
FIG. 80 is a view schematically showing a structure of the control circuit in the semiconductor signal processing apparatus according to Embodiment 5 of the present invention.

FIG. 80 is a view schematically showing a structure of the control circuit of the semiconductor signal processing apparatus according to Embodiment 5 of the present invention. In FIG. 80, similarly to the control circuit 80 shown in FIG. 31, the control circuit 80 includes the command decoder 81, the B-port-write-word-line activation circuit 82, the write control circuit 83, the A-port-write-word-line activation circuit 84, and the read-word-line activation circuit 86. The command decoder 81 takes in the command CMD in synchronization with the clock signal CLK, and decodes the command CMD to assert the write mode indication MODW and the read mode indication MODR.

The write control circuit 83 generates the data path enable signal DPEN for activating the write circuits (level shifters) included in the data path according to the write mode indication MODW. The data path is the structure shown in FIG. 49, and is capable of switching the data transfer path for each of the regions with the input switching circuits.

When the write mode indication MODW is asserted, the B-port-word-line activation circuit 82 activates the B-port-write-word-line activation signal WWLBEN. When one of the read mode indication MODR indicating a retrieval mode and the mode indication MODI indicating initialization is asserted, the A-port-write-word-line activation circuit 84 activates the A-port-write-word-line activation signal WWLAEN.

The control circuit 80 further includes the read-word-line activation circuit 86 and the address counter 87, similarly to the control circuit 80 shown in FIG. 31.

When the read mode indication signal MODR and a write masking indication flag RGMS from a flag decoder 474 are asserted, the read-word-line activation circuit 86 activates the A-port-read-word-line activation signal RWLEN.

The flag decoder 474 decodes the flag EMPTY<k:1> given during data writing, and generates region indication signals RGMS<1> to RGMS<k> indicating data rewriting. The empty flag EMPTY<k:1> corresponds to the flags EMPTY (MRG1) to EMPTY(MRGk) shown in FIG. 78 previously described, and shows a region where no to-be-retrieved pattern is registered. Here, the case is assumed where each of the sub-blocks is divided into the data storage regions REGP1 to REGPk.

During a data write mode, the address counter 87 performs a counting operation, and generates the block address BAD and the word line address (entry address) AD (=WAD). During data reading, the counting operation of the address counter 87 is halted. This is because, during a retrieving operation, all the word lines in the selected sub-block are each set into the selected state.

In the control circuit 80, a read control circuit 485, a counter 470, and a block decoder 472 are further provided.

When the read mode indication MODR is asserted, the counter 470 performs a counting operation, and generates a count value CNT<j:1>. Here, the count value J shows the number of times reading from the sub-block is performed according to the data pattern length.

During data writing, when the to-be-masked region indication flag RGMS is asserted, the read control circuit 485 activates the sense amplifier activation signal SAEN in response to the activation of the read-word-line activation signal RWLEN, and inactivates the data line precharge indication PREDB to halt the precharging of the global read data lines. A main-data-line-amplifier activation signal MAPEN and the match-determination-signal precharge indication signal ZPRE are each maintained at the H level in the inactive state.

When the read mode indication MODR is asserted, the read control circuit 485 also activates the sense amplifier activation signal SAEN and the main-data-line-amplifier activation signal MAPEN according to the activation of the read-word-line activation signal RWLEN, and inactivates the data precharge indication signal PREDB and the match-determination-signal precharge indication signal.

The block decoder 472 receives the block address BAD from the address counter 87 and the count value CNT<j:1> from the counter 470, and generates the block select signals BS<1> to BS<n>. As for a structure of the block decoder 472, it will be described later but, during data writing, the block select signals BS<1> to BS<n> are generated according to the block address signal BAD from the address counter 87 and, during a data read mode, the block select signals BS<1> to BS<n> are generated according to the count value CNT<j:1> from the counter 470.

In the control circuit 80, the block path setting circuit 122 and the local select-signal generation circuit 185 are further provided. The block path setting circuit 122 generates the path select signals SELA<1:0> and SELB<1:0> according to the data-write-mode indication MODW and the data-read-mode indication MODR.

A structure of the path setting circuit 122 is the same as the structure of the path setting circuit 122 previously described in Embodiment 2 with reference to FIG. 31.

The local select-signal generation circuit 185 generates the local select signals LSLB1<1:0> to LSLBk<1:0> according to the select signals SELA<1:0> and SELB<1:0> and to the region specification signal RGMS<k:1> from the flag decoder 474. A structure of the local select-signal generation circuit 185 is the same as each of the structures shown in FIGS. 56 and 57, and different only in that, as the region specification signal, a rewrite region specification signal RGMS<k:1> from the flag decoder 474 is used.

Figure 81:
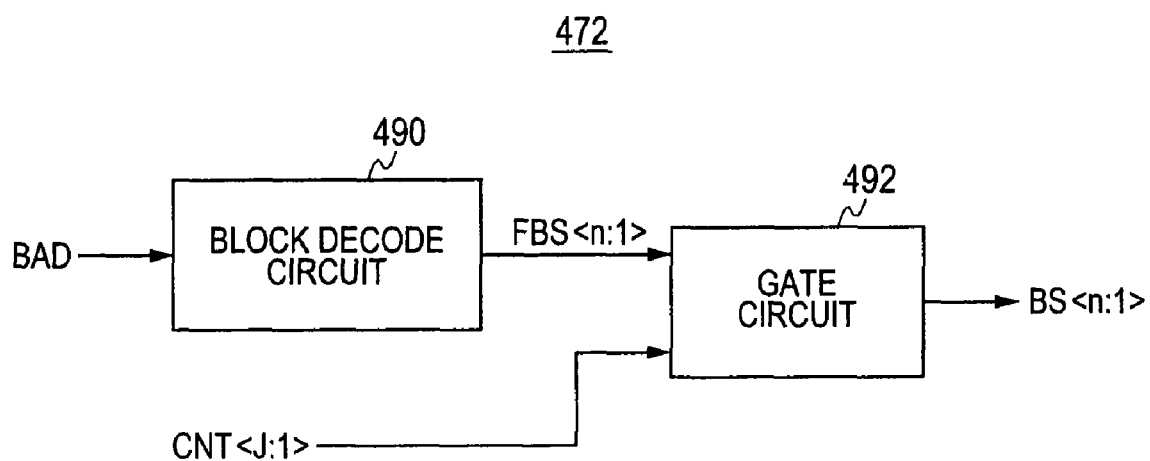
FIG. 81 is a view schematically showing a structure of the block decoder shown in FIG. 80.

FIG. 81 is a view schematically showing the structure of the block decoder 472 shown in FIG. 80. In FIG. 81, the block decoder 472 includes a block decode circuit 490 for decoding the block address signal BAD from the address counter 87, and a gate circuit 492 for receiving the count value CNT<J:1> from the counter 470 shown in FIG. 80 and a decode first signal FBS<n:1> from the block decode circuit 490, and generating the block select signal BS<n:1>.

During data writing, the block select signal BS<n:1> is generated according to the block address signal BAD. On the other hand, during the data read mode (during a retrieving operation), the block select signal BS<n:1> is generated according to the count value CNT<J:1> showing the number of times of retrieval.

FIG. 82 is a view schematically showing an example of a structure of the gate circuit 492 shown in FIG. 81. In FIG. 82, the gate circuit 492 includes OR gates OG(1) to OG(n/2) provided correspondingly to the pattern length L/2, OR gates OG(n/2+1) to OG(3·n/4) provided correspondingly to the pattern length L/4, and an OR gate OGn provided correspondingly to the pattern length L/n. The groups of OR gates are provided correspondingly to the individual pattern lengths.

The OR gates OG(1) to OG(n/2) receive the decode first signals FBS<1> to FBS<n/2> from the block decode circuit 490 and the count value CNT<1>, and respectively generate the block select signals BS<1> to BS<n+2>.

The OR gates OG(n/2+1) to OG(3·n/4) receive the decode first signals FBS<n/2+1> to FBS<n/2+n/4> and the count value CNT<2>, and generate the block select signals BS<n/2+1> to BS<n/2+n/4>. The OR gate OGn receives the count value CNT<J> and the decode signal FBS<n>, and generates the block select signal BS<n>. Here, the case is assumed where each of the count values and the output signal FBS<n+1> from the block decode circuit 490 is at the H level while being selected.

The count value CNT<J:1> is a J-bit count value, and the count value is incremented by a 1-shift operation in each retrieving operation cycle so that the count value CNT<i> corresponding to the i-th retrieval cycle is asserted.

Therefore, in the first retrieval cycle, retrieval for a data pattern of the pattern length L/2 is performed by the OR gates OG(1) to OG(n/2). In the second retrieval cycle, retrieval for a data pattern of the pattern length L/4 is performed. In the final retrieval cycle, retrieval for a data pattern of the pattern length L/n is performed. In this manner, during a retrieving operation, it is possible to select the sub-block corresponding to each of the pattern lengths, and perform the retrieving operation.

Figure 83:
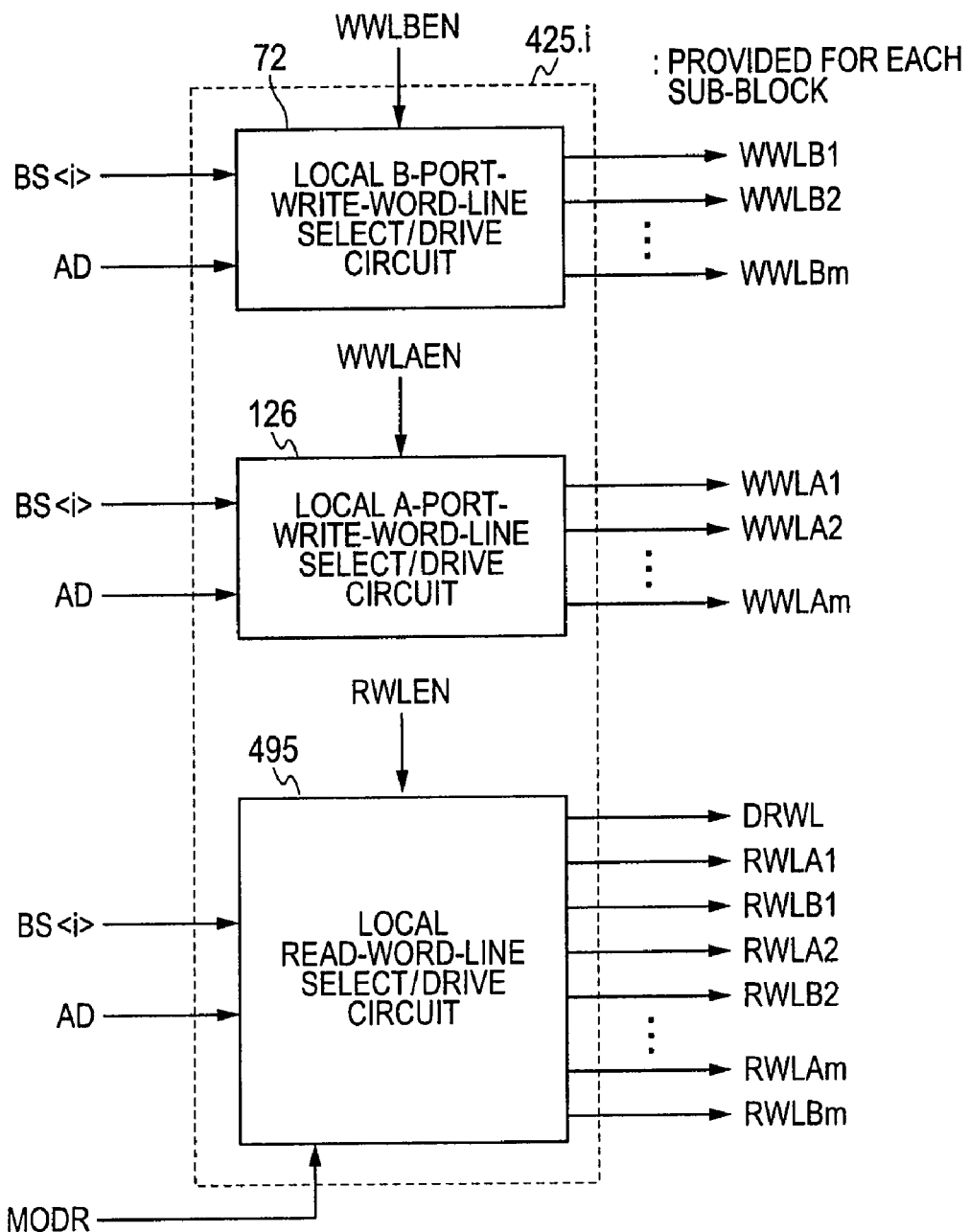
FIG. 83 is a view schematically showing a structure of a sub-row select/drive circuit according to Embodiment 5 of the present invention.

FIG. 83 is a view schematically showing a structure of each of the local row select/drive circuits provided correspondingly to the individual sub-blocks. The local row select/drive circuit 425.i shown in FIG. 83 is provided correspondingly to the sub-block SBi, and includes the local B-port-write-word-line select/drive circuit 72, the local A-port-write-word-line select/drive circuit 126, and a local read-word-line select/drive circuit 495.

During the assertion of the block select signal BS<i>, the local B-port-write-word-line select/drive circuit 72 decodes the given address signal AD, and drives the corresponding write word line among the B-port write word lines WWLB1 to WWLBm.

During the assertion of the A-port-write-word-line activation signal WWLAEN, the local A-port-write-word-line select/drive circuit 126 decodes the address signal AD when the block select signal BS<i> is in the selected state, and drives the write word line having the specified address among the A-port write word lines WWLA1 to WWLAm.

Upon activation of the read-word-line activation signal RWLEN, the local read-word-line select/drive circuit 495 drives the dummy read word line DRWL, the A-port read word lines RWLA1 to RWLAm, and the B-port read word lines RWLB1 to RWLBm into the selected state according to the block select signal BS<i> and the address signal AD. That is, during the assertion of the data read mode indication MODR, when the block select signal BS<i> is in the selected state, the local read-word-line select/drive circuit 495 drives each of the read word lines RWLA1 and RWLB1 to RWLAm and RWLBm and DRWL into the selected state. As a result, in the selected sub-block, during a retrieving operation, all the read word lines can be each driven into the selected state.

When the data read mode indication MODR is in the negated state and rewriting is performed on a per block basis during data writing, the read-word-line activation circuit 86 shown in FIG. 80 asserts the read-word-line activation signal RWLEN so that the local read-word-line select/drive circuit 495 performs the rewriting of data for the entry where writing is performed according to the block select signals BS<i> and the address signal AD. In this case, the A-port and B-port read word lines RWLA and RWLB disposed for the entry where data writing is performed are selected, the read data is transferred to the storage nodes SNB of the masked region of the selected entry via the sense amplifier circuits and the B-port global read data lines, and the rewriting of the data is performed.

Figure 84:
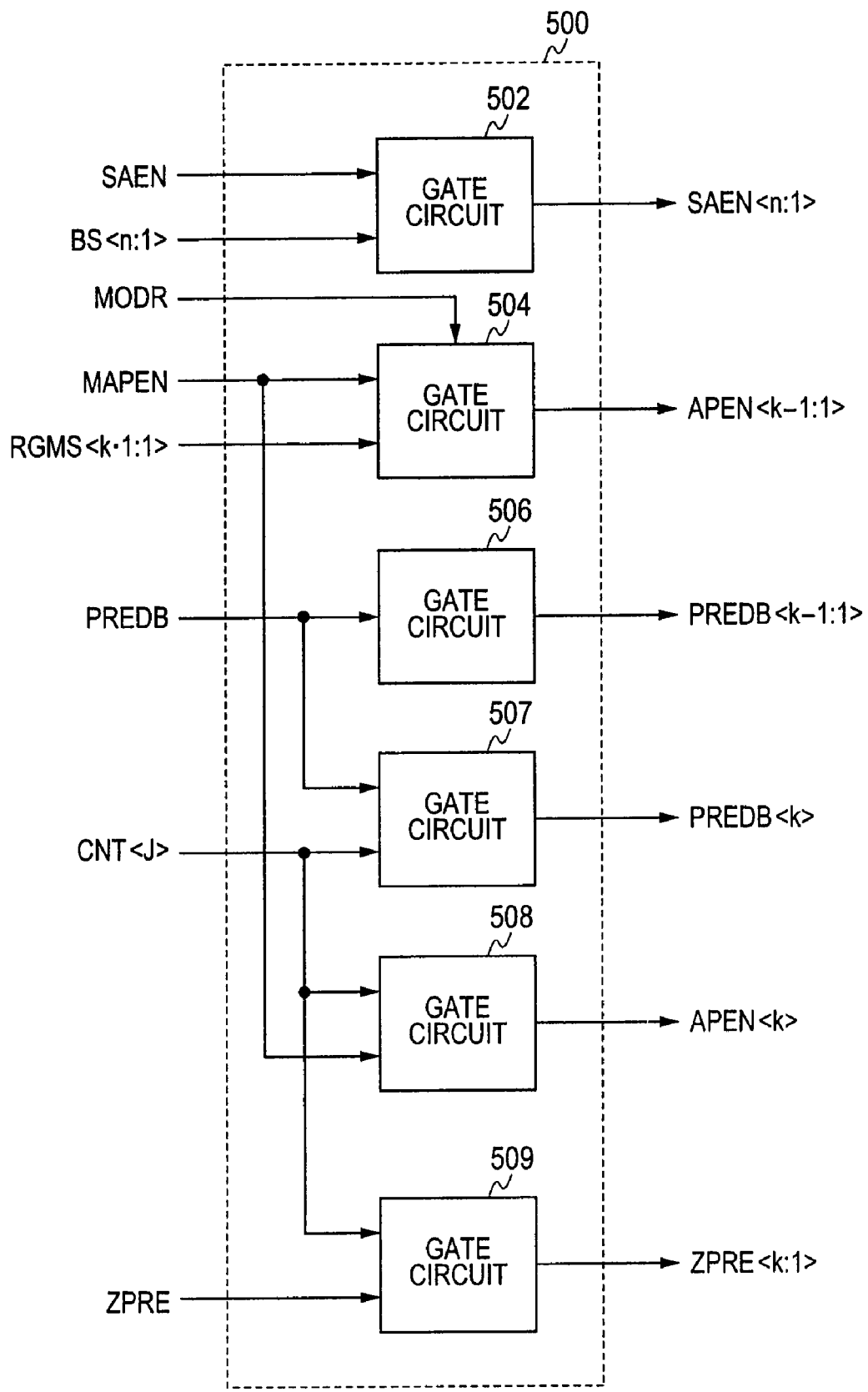
FIG. 84 is a view schematically showing a structure of a local control-signal generation portion according to Embodiment 5 of the present invention.

FIG. 84 is a view schematically showing a structure of each of local control-signal generation circuits 500 provided on a per region basis. In FIG. 84, the local control circuit 500 includes a gate circuit 502 which generates the local sense-amplifier activation signal SAEN<n:1>, a gate circuit 504 which generates a data-line-amplifier activation signal APEN<k−1:1>, a gate circuit 506 which generates a read-data-line-precharge indication signal PREDB<k−1:1>, a gate circuit 507 which generates a read-data-line-precharge indication signal PREDB<k>, and a gate circuit 508 which generates a data amplifier activation signal APEN<k>.

The data amplifier activation signal APEN<k> is an activation signal for the data amplifiers AMP disposed for a region where data of the pattern length L is stored. Likewise, the read-data-line-precharge indication signal PREDB<k> is an indication signal for the precharge gates for the global read data lines disposed for the region where data of the pattern length L is stored.

The gate circuit 502 activates the sense amplifier activation signal SAEN<n:1> for the sub-block selected according to the sense amplifier activation signal SAEN from the read control circuit shown in FIG. 80 and the block select signal BS<n:1>.

The gate circuit 504 generates the data amplifier activation signal APEN<k−1:1> according to the main-data-amplifier activation signal MAPEN and the to-be-write-masked-region indication signal RGMS<k−1:1>. When an asserted bit exists in the write masking indication signal RGMS<k−1:1>, the gate circuit 504 asserts an activation signal corresponding to the data amplifier activation signal APEN<k−1:1> according to the main-data-amplifier activation signal MAPEN. When the read mode indication signal MODR is asserted, the gate circuit 504 activates the data amplifier activation signal APEN<k−1:1> according to the main-data-amplifier activation signal MAPEN.

The gate circuit 506 activates the data-path-precharge indication signal PREDB<k−1:1> from the region 1 to the region (k−1) according to the data-path-precharge indication signal PREDB from the read control circuit 485 shown in FIG. 80. As a result, in the region other than the region to which the pattern length L is assigned, the global read data lines (GRD) are precharged to the ground voltage level upon each retrieving operation.

The gate circuit 507 generates the data-path-precharge indication signal PREDB<k> according to the data-path-precharge indication signal PREDB and the count value CNT<J>. Therefore, for the region where data of the pattern length L is stored, after retrieval to the final block thereof is performed, the corresponding read data lines are precharged and, in other situations, the corresponding global read lines are not precharged. Since the region REGPk for the pattern length L is not masked during writing, rewriting need not be performed and, even if the corresponding global read data lines are not precharged, there is no particular problem.

The gate circuit 508 generates the data amplifier activation signal APEN<k> according to the count value CNT<J> and the main-data-amplifier activation signal MAPEN. Accordingly, during data reading (during a retrieving operation), when the result of retrieval to the final sub-block in the storage region for the pattern length L is read, the data amplifiers AMP for the region REGPk are activated, and the result of retrieval for the pattern length L is amplified and latched by the corresponding final determination circuit. In this case, in the region for the pattern length L, no data empty region exists, and rewriting is not performed. Therefore, even if the region specification signal RGMS<k> is not given, there is no particular problem.

For the match signal final determination circuit MSLT, a precharge indication signal ZPRE<k:1> is generated by the gate circuit 509 according to the precharge indication signal ZPRE, and precharging (resetting) of the match signal final determination circuit MSLT is executed after each retrieving operation is completed.

Thus, according to Embodiment 5 of the present invention, the operator array is divided into the k regions, data patterns having the different pattern lengths are stored in the individual division regions, and a plurality of data patterns can be stored in a given one of the regions. In addition, the retrieval data patterns are disposed to the aligned in the column direction of the regions. Therefore, it is possible to determine matches/mismatches with the plurality of to-be-retrieved patterns in one retrieval cycle, and obtain the results of determination for all the to-be-retrieved data patterns in clock cycles according to the number of the types of the pattern lengths as retrieval cycles.

By applying the semiconductor signal processing apparatus according to the present invention to, e.g., an intrusion sensing apparatus which identifies an unauthorized access data pattern such as a data packet which performs an unauthorized access, it is possible to implement an unauthorized pattern detection apparatus which efficiently stores to-be-retrieved data patterns, and performs a retrieving operation.

In addition, the semiconductor signal processing apparatus according to the present invention is also generally applicable to a circuit which recognizes a matching data pattern in an input data packet.

What is claimed is:

1. A semiconductor signal processing apparatus, comprising:
   an operator cell array including a plurality of operator cells arranged in rows and columns, each including first and second SOI transistors coupled in series to each other, and supplying currents each showing a result of an arithmetic operation between data items stored in the first and second transistors,
   wherein the operator cells are arranged such that the first and second cells disposed to be aligned in a row direction form a storage unit,
   wherein the operator cell array includes a plurality of data entries capable of storing therein respective data patterns having different pattern lengths, and
   wherein mutually complementary to-be-retrieved data is stored in the first and second transistors of the storage unit,
   the semiconductor signal processing apparatus further comprising:
   a plurality of bit lines disposed correspondingly to the individual columns of the operator cells to receive the respective currents supplied from the operator cells in the corresponding columns;
   a row select/drive circuit for writing, during a retrieving operation, retrieval data to the second transistors of a selected one of the data entries, and selecting the first and second transistors of the selected data entry to allow currents according to data items stored in the selected first and second transistors to flow to the corresponding bit lines;

a plurality of sense amplifier circuits provided correspondingly to the individual bit lines to supply currents according to the respective currents on the corresponding bit lines; and current detection/match determination circuits each disposed according to a pattern length that can be stored in the selected data entry to determine a match/mismatch between data stored in the selected data entry and the retrieval data based on the currents supplied from the sense amplifier circuits for the corresponding data pattern length on a per pattern-length basis, and generate a signal showing a pattern match/mismatch between the data stored in the selected data entry and the retrieval data based on a result of the determination.

2. A semiconductor signal processing apparatus according to claim 1, wherein the operator cell array is divided along the column direction into a plurality of retrieval units having respective predetermined bit widths, and wherein each of the current detection/match determination circuits includes:

a plurality of match lines disposed correspondingly to the individual retrieval units, grouped correspondingly to the pattern lengths that can be stored, and supplied with the currents from the sense amplifier circuits of the respective retrieval units correspondingly thereto; and a plurality of gates disposed correspondingly to respective groups of the match lines to generate signals showing results of match determination according to potentials of the match lines in the respective groups corresponding thereto.

3. A semiconductor signal processing apparatus according to claim 2, wherein the operator cell array is divided into a plurality of sub-blocks each having the plural data entries in terms of the individual pattern lengths, and wherein the current detection/match determination circuits are disposed correspondingly to the respective sub-blocks, and each of the current detection/match determination circuits further includes:

a multiplexer for selecting, among the output signals from the gates, the output signal from the gate corresponding to a specified one of the pattern lengths according to a signal showing the pattern length assigned to the corresponding sub-block.

4. A semiconductor signal processing apparatus according to claim 2, wherein the individual data entries are capable of storing therein a plurality of data items having different pattern lengths, and wherein each of the current detection/match determination circuits further includes:

a determination gate for receiving the output signals from the gates, and generating a final determination signal.

5. A semiconductor signal processing apparatus according to claim 1, wherein each of the current detection/match determination circuits further includes:

sense amplifier circuits disposed correspondingly to the respective bit lines to sense/amplify the respective currents on the corresponding bit lines;

a plurality of match lines disposed correspondingly to the respective pattern lengths that can be stored in the data entries, and supplied with the currents from the sense amplifier circuits allocated to respective data items of the corresponding pattern lengths;

a plurality of gates disposed correspondingly to the match lines to generate signals showing results of match determination according to potentials of the corresponding match lines; and a determination gate for generating a final match determination signal according to the output signals from the gates.

6. A semiconductor signal processing apparatus according to claim 4 or 5, further comprising:

a matching-pattern-length determination circuit for receiving the output signals from the gates, and holding a flag showing a matching pattern length among the pattern lengths.

7. A semiconductor signal processing apparatus according to claim 1, wherein the operator cell array further includes:

a FIFO region for temporarily holding the given retrieval data, the FIFO region including FIFO entries each having the same structure as that of each of the data entries, the semiconductor signal processing apparatus further comprising:

global read data lines disposed correspondingly to the operator cell columns of the operator cell array;

a plurality of path switching gates disposed correspondingly to the individual sense amplifier circuits to transmit the output signals from the corresponding sense amplifier circuits to either of the current detection/match determination circuits and the corresponding global read data lines according to respective attribute indication signals;

a plurality of first global write data lines disposed correspondingly to the operator cell columns of the operator cell array to transfer the retrieval data to the first transistors of the operator cells of the respective selected data entries in the corresponding columns;

a plurality of second global write data lines disposed correspondingly to the operator cell columns of the operator cell array to transfer the retrieval data to the second transistors of the operator cells of the respective selected data entries in the corresponding columns;

a write control circuit for transferring and writing, during the retrieving operation, the given retrieval data to the operator cells of the entry specified by a write address in the FIFO region via the first global write data lines;

a read control circuit for reading, during the retrieving operation, the data stored in the first transistors of the operator cells of the entry specified by a read address in the FIFO region, and transferring the read data to the second transistors of the operator cells of the selected data entry via the second global write data lines; and a pointer for generating the write address and the read address during the retrieving operation.

8. A semiconductor signal processing apparatus according to claim 1, further comprising:

first global write data lines disposed correspondingly to the operator cell columns to transfer write data to the first transistors of the operator cells in the corresponding columns;

second global write data lines disposed correspondingly to the operator cell columns to transfer write data to the second transistors of the operator cells in the corresponding columns;

a plurality of global read data lines disposed correspondingly to the operator cell columns to receive the output signals from the sense amplifier circuits in the corresponding columns; and data path switching gates disposed correspondingly to the operator cell columns to each select, according to a select signal, one of the retrieval data from the outside and data on the corresponding global read data line, and transmit the selected one to the corresponding second global write data line.

9. A semiconductor signal processing apparatus according to claim 1, further comprising:

first global write data lines disposed correspondingly to the operator cell columns to transfer write data to the first transistors of the operator cells in the corresponding columns;

second global write data lines disposed correspondingly to the operator cell columns to transfer write data to the second transistors of the operator cells in the corresponding columns;

a plurality of global read data lines disposed correspondingly to the operator cell columns to receive the output signals from the sense amplifier circuits in the corresponding columns; and data path switching gates disposed correspondingly to the operator cell columns to each select, according to a select signal, one of data from the outside and data on the corresponding global read data line, and transmit the selected one to the corresponding first global write data line.

10. A semiconductor signal processing apparatus according to claim 1, further comprising:

a mapping flag memory region including flag entries disposed correspondingly to the individual data entries, and storing therein flags showing pattern lengths of data items stored in the corresponding data entries.

11. A semiconductor signal processing apparatus according to claim 1, wherein the first and second SOI transistors of the operator cells are formed in a first rectangular active region of a first conductivity type so as to share a first impurity region, wherein each of the operator cells further includes a second rectangular active region of a second conductivity type disposed at a position adjacent to the first active region and displaced therefrom in a lengthwise direction, and a third rectangular active region of the second conductivity type disposed at a position adjacent to the first active region and opposing the second active region via the first active region, and wherein the first, second, and third active regions are disposed at the positions displaced from each other in the lengthwise direction, and third and fourth SOI transistors of conductivity types different from those of the first and second SOI transistors are formed respectively in the second and third active regions, the semiconductor signal processing apparatus further comprising:

a first conductive line disposed so as to traverse the first and second active regions along a widthwise direction orthogonal to the lengthwise direction, and form a gate of the first SOI transistor;

a second conductive line disposed apart from the first conductive line so as to traverse the first and third active regions along the widthwise direction, and form a gate of the second SOI transistor;

a third conductive line disposed so as to traverse the second active region along the widthwise direction, and form a gate of the third SOI transistor;

a fourth conductive line disposed so as to traverse the third active region along the widthwise direction, and form a gate of the fourth SOI transistor; and a fixed voltage line disposed between the first and second conductive lines so as to traverse the first active region in the widthwise direction, and transmit a predetermined voltage to a second impurity region of the first active region different from the first impurity region, wherein a third impurity region of the first active region opposing the second impurity region via the first impurity region is coupled to a conductive line forming each of the bit lines extending in the lengthwise direction, wherein a fourth impurity region of the second active region adjacent to the first active region is electrically coupled to a region of the first active region located under the first conductive line, wherein a fifth impurity region of the second active region opposing the fourth impurity region via the third conductive line receives first write data via a first write data transmission line extending in the lengthwise direction, wherein a sixth impurity region of the third active region adjacent to the first active region is electrically coupled to a region of the first active region located under the second conductive line, and wherein a seventh impurity region of the third active region opposing the sixth impurity region via the fourth conductive line receives second write data via a second write data transmission line extending in the lengthwise direction.

12. A semiconductor signal processing apparatus, comprising:

a memory array having a plurality of operator cells which are arranged in rows and columns and in each of which first and second SOI transistors capable of storing therein information such that the stored information is accessible are coupled in series, wherein the operator cells are arranged such that each pair of the operator cells storing therein complementary data forms a storage unit, and wherein the memory array is divided into a plurality of sub-blocks along a column direction, the semiconductor signal processing apparatus further comprising:

first global write data lines disposed along the column direction commonly to the sub-blocks and correspondingly to the columns of the operator cells so as to transfer write data to the first transistors of the operator cells in the corresponding columns;

write row select/drive circuits disposed correspondingly to the rows of the operator cells so as to select the first transistors of the operator cells in the corresponding rows, and write data transferred via the corresponding first global write data lines thereto;

second global write data lines for transferring, along a row direction, complementary retrieval data commonly to the operator cell rows on a per sub-block basis;

second write row select/drive circuits disposed correspondingly to the operator cell rows to write, during retrieval, data transferred via the second global write data lines to the second transistors in the corresponding memory cell rows;

a plurality of bit lines disposed in the individual sub-blocks correspondingly to the operator cell columns, and coupled to the memory cells in the corresponding columns;

local read row select/drive circuits for selecting, during the retrieval, the operator cells in parallel in the sub-blocks to read data items stored in the selected operator cells in parallel to the corresponding bit lines;

sense amplifier circuits disposed correspondingly to the individual bit lines to read data stored in the operator cells in the corresponding columns according to potentials of the corresponding bit lines;

global read data lines disposed commonly to the sub-blocks and correspondingly to the individual operator cell columns to receive data from the sense amplifier circuits in the corresponding columns; and match final determination circuits disposed correspondingly to the individual columns of the storage units of the operator cells and commonly to the sub-blocks to generate respective signals showing matches/mismatches according to data in the global read data lines in the corresponding columns, wherein the memory array is further divided into a plurality of regions along the row direction, and retrieval data items having different pattern lengths can be stored in the individual regions, the semiconductor signal processing apparatus further comprising:

a read control circuit for controlling reading of the data from the operator cells, activation of the sense amplifier circuits, and precharging of the global read data lines each according to the pattern lengths of the data items stored in the regions.

13. A semiconductor signal processing apparatus according to claim 12, wherein the data pattern lengths to be stored are assigned in advance to the individual regions, wherein the sub-blocks are grouped correspondingly to the data pattern lengths, and wherein the read control circuit successively activates the sub-blocks in terms of individual sub-block groups corresponding to the data pattern lengths, and performs resetting of the match final determination circuits and precharging of the global read data lines in response to an end of a period during which the sub-block groups are activated except for the one of the regions where a longest data pattern is stored, while activating the corresponding match final determination circuit in response to activation of the final one of the sub-block groups, and executing precharging of the corresponding global read data lines after the activation of the final sub-block group is ended for the region where the longest data pattern is stored.

14. A semiconductor signal processing apparatus according to claim 12, wherein the first and second SOI transistors of the operator cells are formed in a first rectangular active region of a first conductivity type so as to share a first impurity region, wherein each of the operator cells further includes a second rectangular active region of a second conductivity type disposed at a position adjacent to the first active region and displaced therefrom in a lengthwise direction, and a third rectangular active region of the second conductivity type disposed at a position adjacent to the first active region and opposing the second active region via the first active region, and wherein the first, second, and third active regions are disposed at the positions displaced from each other in the lengthwise direction, and third and fourth SOI transistors of conductivity types different from those of the first and second SOI transistors are formed respectively in the second and third active regions, the semiconductor signal processing apparatus further comprising:

a first conductive line disposed so as to traverse the first and second active regions along a widthwise direction orthogonal to the lengthwise direction, and form a gate of the first SOI transistor;

a second conductive line disposed apart from the first conductive line so as to traverse the first and third active regions along the widthwise direction, and form a gate of the second SOI transistor;

a third conductive line disposed so as to traverse the second active region along the widthwise direction, and form a gate of the third SOI transistor;

a fourth conductive line disposed so as to traverse the third active region along the widthwise direction, and form a gate of the fourth SOI transistor; and a fixed voltage line disposed between the first and second conductive lines so as to traverse the first active region in the widthwise direction, and transmit a predetermined voltage to a second impurity region of the first active region different from the first impurity region, wherein a third impurity region of the first active region opposing the second impurity region via the first impurity region is coupled to a conductive line forming each of the bit lines extending in the lengthwise direction, wherein a fourth impurity region of the second active region adjacent to the first active region is electrically coupled to a region of the first active region located under the first conductive line, wherein a fifth impurity region of the second active region opposing the fourth impurity region via the third conductive line receives first write data via a first write data transmission line extending in the widthwise direction and a branch line, wherein a sixth impurity region of the third active region adjacent to the first active region is electrically coupled to a region of the first active region located under the second conductive line, and wherein a seventh impurity region of the third active region opposing the sixth impurity region via the fourth conductive line receives second write data via a second write data transmission line extending in the lengthwise direction.

* * * * *